(12) United States Patent
Chae et al.

(10) Patent No.: US 11,527,514 B2
(45) Date of Patent: Dec. 13, 2022

(54) LED UNIT FOR DISPLAY AND DISPLAY APPARATUS HAVING THE SAME

(71) Applicant: SEOUL VIOSYS CO., LTD., Ansan-si (KR)

(72) Inventors: Jong Hyeon Chae, Ansan-si (KR); Chang Yeon Kim, Ansan-si (KR); Seong Gyu Jang, Ansan-si (KR); Ho Joon Lee, Ansan-si (KR); Jong Min Jang, Ansan-si (KR); Dae Sung Cho, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/673,184

(22) Filed: Nov. 4, 2019

(65) Prior Publication Data

US 2020/0066691 A1  Feb. 27, 2020

Related U.S. Application Data

(63) Continuation of application No. 16/198,850, filed on Nov. 22, 2018.
(Continued)

(51) Int. Cl.
*H01L 25/075* (2006.01)
*H01L 33/50* (2010.01)
(Continued)

(52) U.S. Cl.
CPC .......... *H01L 25/0753* (2013.01); *H01L 33/08* (2013.01); *H01L 33/38* (2013.01); *H01L 33/50* (2013.01)

(58) Field of Classification Search
CPC .... H01L 25/0756; H01L 33/62; H01L 33/382
See application file for complete search history.

(56) References Cited

U.S. PATENT DOCUMENTS 5,583,349 A  12/1996  Norman et al.
5,583,350 A  12/1996  Norman et al.
(Continued)

FOREIGN PATENT DOCUMENTS

CN  1423345  6/2003
CN  102593290  7/2012
(Continued)

OTHER PUBLICATIONS

International Search Report dated Feb. 26, 2019, issued in International Application No. PCT/KR2018/014671.
(Continued)

*Primary Examiner* — Samuel A Gebremariam
*Assistant Examiner* — Jonas T Beardsley
(74) *Attorney, Agent, or Firm* — H.C. Park & Associates, PLC

(57) ABSTRACT

A light emitting device for a display includes a pixel region including first, second, and third LED stacks, an adhesive layer disposed between the first and second LED stacks, or between the second and third LED stacks, a metal bonding layer at least partially surrounded by the adhesive layer, and disposed between and is electrically connected to the first and second LED stacks, or the second and third LED stacks, and a common electrode pad connected to the first, second, and third LED stacks, first, second, and third electrode pads connected to the first, second, and third LED stacks, respectively, and the first, second, and third LED stacks are configured to be independently driven using the electrode pads.

19 Claims, 113 Drawing Sheets

Related U.S. Application Data

(60) Provisional application No. 62/683,553, filed on Jun. 11, 2018, provisional application No. 62/683,564, filed on Jun. 11, 2018, provisional application No. 62/638,797, filed on Mar. 5, 2018, provisional application No. 62/614,900, filed on Jan. 8, 2018, provisional application No. 62/613,333, filed on Jan. 3, 2018, provisional application No. 62/608,297, filed on Dec. 20, 2017.

(51) Int. Cl.
*H01L 33/08* (2010.01)
*H01L 33/38* (2010.01)

(56) References Cited

U.S. PATENT DOCUMENTS

| | | |
|---|---|---|
| 5,696,389 A | 12/1997 | Ishikawa et al. |
| 5,703,436 A | 12/1997 | Forrest et al. |
| 5,707,745 A | 1/1998 | Forrest et al. |
| 5,739,552 A | 4/1998 | Kimura et al. |
| 6,046,543 A | 4/2000 | Bulovic et al. |
| 6,100,103 A | 8/2000 | Shim et al. |
| 6,365,270 B2 | 4/2002 | Forrest et al. |
| 6,717,358 B1 | 4/2004 | Liao et al. |
| 6,888,305 B2 | 5/2005 | Weaver |
| 6,934,309 B2 | 8/2005 | Nishikawa et al. |
| 7,282,741 B2 | 10/2007 | Kim et al. |
| 7,514,720 B2 | 4/2009 | Kim et al. |
| 7,570,310 B2 | 8/2009 | Harada et al. |
| 7,732,803 B2 | 6/2010 | Shum et al. |
| 7,745,986 B2 | 6/2010 | Ito et al. |
| 7,982,228 B2 | 7/2011 | Choi et al. |
| 8,017,955 B2 | 9/2011 | Wang et al. |
| 8,022,421 B2 | 9/2011 | Hsueh et al. |
| 8,035,115 B2 | 10/2011 | Ogihara et al. |
| 8,058,663 B2 | 11/2011 | Fan et al. |
| 8,089,074 B2 | 1/2012 | Kim et al. |
| 8,283,191 B2 | 10/2012 | Rode et al. |
| 8,324,803 B2 | 12/2012 | Forrest et al. |
| 8,390,020 B2 | 3/2013 | Tanaka et al. |
| 8,436,346 B2 | 5/2013 | Ushikubo et al. |
| 8,466,542 B2 | 6/2013 | Kriman et al. |
| 8,546,836 B2 | 10/2013 | Kamiya et al. |
| 8,563,144 B2 | 10/2013 | Kim et al. |
| 8,618,551 B2 | 12/2013 | Nishikawa et al. |
| 8,624,274 B2 | 1/2014 | Hsueh et al. |
| 8,766,295 B2 | 7/2014 | Kim |
| 8,835,948 B2 | 9/2014 | Chang et al. |
| 8,884,316 B2 | 11/2014 | Weaver et al. |
| 8,941,566 B2 | 1/2015 | Haase |
| 9,006,752 B2 | 4/2015 | So et al. |
| 9,018,834 B2 | 4/2015 | Ide et al. |
| 9,052,096 B2 | 6/2015 | Nishimura et al. |
| 9,076,929 B2 | 7/2015 | Katsuno et al. |
| 9,099,631 B2 | 8/2015 | Yang et al. |
| 9,136,498 B2 | 9/2015 | Skipor |
| 9,142,748 B2 | 9/2015 | Ohmae et al. |
| 9,153,750 B2 | 10/2015 | Seo et al. |
| 9,202,994 B2 | 12/2015 | Hashimoto et al. |
| 9,252,380 B2 | 2/2016 | Seo et al. |
| 9,281,446 B2 | 3/2016 | Suh et al. |
| 9,312,249 B2 | 4/2016 | Choi et al. |
| 9,337,400 B2 | 5/2016 | Hashimoto et al. |
| 9,362,335 B2 | 6/2016 | Von Malm |
| 9,406,908 B2 | 8/2016 | Kim et al. |
| 9,419,031 B1 | 8/2016 | Or-Bach et al. |
| 9,443,833 B2 | 9/2016 | Oraw |
| 9,515,278 B2 | 12/2016 | Suzuki et al. |
| 9,559,263 B2 | 1/2017 | Matsui et al. |
| 9,577,012 B2 | 2/2017 | Ooki et al. |
| 9,748,313 B2 | 8/2017 | Tsuji et al. |
| 9,786,817 B2 | 10/2017 | Kim et al. |
| 9,786,859 B2 | 10/2017 | Yamae et al. |
| 9,847,051 B2 | 12/2017 | Choi et al. |
| 9,853,187 B2 | 12/2017 | Kim |
| 9,893,233 B2 | 2/2018 | Kong et al. |
| 9,905,725 B2 | 2/2018 | Lee |
| 9,960,212 B2 | 5/2018 | Gee et al. |
| 9,960,390 B2 | 5/2018 | Höfle et al. |
| 9,966,369 B2 | 5/2018 | Kim et al. |
| 10,056,535 B2 | 8/2018 | Chang et al. |
| 10,069,036 B2 | 9/2018 | Atanackovic |
| 10,079,265 B1 | 9/2018 | Wu et al. |
| 10,134,813 B2 | 11/2018 | Choi |
| 10,170,666 B2 | 1/2019 | Cha et al. |
| 10,205,058 B2 | 2/2019 | Lee |
| 10,304,811 B2 | 5/2019 | Zhang et al. |
| 10,326,056 B2 | 6/2019 | Jung et al. |
| 10,381,519 B2 | 8/2019 | Seo et al. |
| 10,388,978 B2 | 8/2019 | Morris-Cohen et al. |
| 10,418,577 B2 | 9/2019 | Yoo et al. |
| 10,475,957 B2 | 11/2019 | Cha et al. |
| 10,515,580 B2 | 12/2019 | Henry et al. |
| 10,559,557 B2 | 2/2020 | Chang et al. |
| 10,686,099 B2 | 6/2020 | Huppmann et al. |
| 10,686,149 B2 | 6/2020 | Park et al. |
| 10,811,475 B2 | 10/2020 | Zhang et al. |
| 2002/0154259 A1 | 10/2002 | Freidhoff et al. |
| 2003/0047742 A1 | 3/2003 | Hen |
| 2003/0168989 A1 | 9/2003 | Hen |
| 2003/0213967 A1* | 11/2003 | Forrest ............... H01L 27/3209 257/96 |
| 2004/0232433 A1 | 11/2004 | Doverspike et al. |
| 2005/0067627 A1 | 3/2005 | Shen et al. |
| 2005/0140278 A1 | 6/2005 | Kato |
| 2005/0264550 A1 | 12/2005 | Ohshima et al. |
| 2006/0027820 A1 | 2/2006 | Cao |
| 2006/0231852 A1 | 10/2006 | Kususe et al. |
| 2007/0069220 A1 | 3/2007 | Ogihara |
| 2007/0170444 A1 | 6/2007 | Cao |
| 2007/0222922 A1 | 9/2007 | Jin et al. |
| 2008/0068315 A1 | 3/2008 | Kurosaki et al. |
| 2008/0099770 A1 | 5/2008 | Mendendorp et al. |
| 2008/0128728 A1 | 6/2008 | Nemchuk et al. |
| 2008/0130278 A1 | 6/2008 | Ushikubo et al. |
| 2008/0251799 A1 | 10/2008 | Ikezawa |
| 2008/0308819 A1 | 12/2008 | Louwsma et al. |
| 2009/0009101 A1 | 1/2009 | Kang et al. |
| 2009/0078955 A1 | 3/2009 | Fan et al. |
| 2009/0114931 A1 | 5/2009 | Hsueh et al. |
| 2009/0272989 A1* | 11/2009 | Shum .................... H01L 27/15 257/89 |
| 2010/0032691 A1 | 2/2010 | Kim |
| 2010/0045175 A1 | 2/2010 | Mathai et al. |
| 2010/0051975 A1 | 3/2010 | Suzuki et al. |
| 2010/0065867 A1 | 3/2010 | Unno |
| 2010/0066239 A1 | 3/2010 | Spindler et al. |
| 2010/0076527 A1 | 3/2010 | Hammond et al. |
| 2010/0084668 A1 | 4/2010 | Cho et al. |
| 2010/0144073 A1 | 6/2010 | Louwsma et al. |
| 2010/0159792 A1 | 6/2010 | Visser et al. |
| 2010/0224860 A1 | 9/2010 | Ibbetson et al. |
| 2010/0276706 A1 | 11/2010 | Herrmann |
| 2011/0057211 A1 | 3/2011 | Lee et al. |
| 2011/0086486 A1 | 4/2011 | Lee et al. |
| 2011/0156114 A1 | 6/2011 | Park et al. |
| 2011/0204376 A1 | 8/2011 | Su et al. |
| 2011/0215714 A1 | 9/2011 | Seo et al. |
| 2012/0034714 A1 | 2/2012 | Tsai et al. |
| 2012/0094414 A1 | 4/2012 | Or-Bach et al. |
| 2012/0223875 A1 | 9/2012 | Lau et al. |
| 2012/0231572 A1 | 9/2012 | Or-Bach et al. |
| 2012/0236532 A1 | 9/2012 | Koo et al. |
| 2012/0305959 A1 | 12/2012 | Yu et al. |
| 2013/0056717 A1 | 3/2013 | Ishihara et al. |
| 2013/0069191 A1 | 3/2013 | Or-Bach et al. |
| 2013/0264587 A1 | 10/2013 | Chang |
| 2013/0285076 A1 | 10/2013 | Liu et al. |
| 2013/0292711 A1 | 11/2013 | Ogihara et al. |
| 2014/0184062 A1 | 7/2014 | Kolodin |
| 2014/0191243 A1 | 7/2014 | Singh et al. |
| 2014/0252382 A1 | 9/2014 | Hashimoto et al. |
| 2014/0284633 A1 | 9/2014 | Tsay et al. |

(56) References Cited

U.S. PATENT DOCUMENTS

| | | | |
|---|---|---|---|
| 2015/0001572 | A1 | 1/2015 | Katsuno et al. |
| 2015/0099728 | A1 | 4/2015 | Frank et al. |
| 2015/0221627 | A1 | 8/2015 | Nielson et al. |
| 2015/0325555 | A1 | 11/2015 | Hashimoto et al. |
| 2015/0340348 | A1 | 11/2015 | Katsuno et al. |
| 2015/0362165 | A1 | 12/2015 | Chu et al. |
| 2016/0005375 | A1 | 1/2016 | Naijo et al. |
| 2016/0043290 | A1* | 2/2016 | Sogo .................. H01L 33/483 257/98 |
| 2016/0064439 | A1 | 3/2016 | Or-Bach et al. |
| 2016/0099384 | A1 | 4/2016 | Kim et al. |
| 2016/0155378 | A1 | 6/2016 | Hack et al. |
| 2016/0155892 | A1 | 6/2016 | Li et al. |
| 2016/0163940 | A1* | 6/2016 | Huang .................. H01L 33/62 257/89 |
| 2016/0315068 | A1 | 10/2016 | Lee et al. |
| 2016/0322293 | A1 | 11/2016 | Kimura et al. |
| 2016/0336482 | A1 | 11/2016 | Lu et al. |
| 2016/0359143 | A1 | 12/2016 | Osawa et al. |
| 2017/0012173 | A1 | 1/2017 | Lee et al. |
| 2017/0025593 | A1 | 1/2017 | Bower et al. |
| 2017/0062680 | A1 | 3/2017 | Yoo et al. |
| 2017/0064785 | A1 | 3/2017 | Kim et al. |
| 2017/0069612 | A1 | 3/2017 | Zhang et al. |
| 2017/0084876 | A1 | 3/2017 | Suzuki |
| 2017/0104035 | A1 | 4/2017 | Lee et al. |
| 2017/0117259 | A1 | 4/2017 | Xu |
| 2017/0133357 | A1 | 5/2017 | Kuo et al. |
| 2017/0162746 | A1 | 6/2017 | Cha et al. |
| 2017/0194298 | A1 | 7/2017 | Negley et al. |
| 2017/0194535 | A1 | 7/2017 | Park et al. |
| 2017/0213502 | A1 | 7/2017 | Henry et al. |
| 2017/0236866 | A1 | 8/2017 | Lee et al. |
| 2017/0250329 | A1 | 8/2017 | Takeya et al. |
| 2017/0286044 | A1 | 10/2017 | Kim et al. |
| 2017/0288088 | A1 | 10/2017 | Won Cheol |
| 2017/0288093 | A1* | 10/2017 | Cha .................. H01L 33/08 |
| 2017/0331009 | A1 | 11/2017 | Shioji |
| 2017/0331021 | A1 | 11/2017 | Chae et al. |
| 2017/0338275 | A1 | 11/2017 | Banna et al. |
| 2017/0345801 | A1 | 11/2017 | Lin et al. |
| 2018/0083170 | A1 | 3/2018 | Shepherd |
| 2018/0151548 | A1 | 5/2018 | Pfeuffer et al. |
| 2018/0156965 | A1 | 6/2018 | El-Ghoroury et al. |
| 2018/0158808 | A1 | 6/2018 | Zhang et al. |
| 2018/0166499 | A1 | 6/2018 | Pfeuffer et al. |
| 2018/0233492 | A1 | 8/2018 | Liu et al. |
| 2018/0240952 | A1 | 8/2018 | Moon et al. |
| 2018/0283642 | A1 | 10/2018 | Liao et al. |
| 2019/0053347 | A1 | 2/2019 | Lee et al. |
| 2019/0074324 | A1 | 3/2019 | Kim et al. |
| 2019/0097088 | A1 | 3/2019 | Huppmann et al. |
| 2019/0148612 | A1 | 5/2019 | Lee et al. |
| 2019/0165207 | A1 | 5/2019 | Kim et al. |
| 2019/0181181 | A1 | 6/2019 | Yeon et al. |
| 2019/0229149 | A1 | 7/2019 | Yoo |
| 2019/0267436 | A1 | 8/2019 | Zhang et al. |
| 2019/0333964 | A1 | 10/2019 | Lee et al. |
| 2020/0063920 | A1 | 2/2020 | Vampola |
| 2020/0212017 | A1 | 7/2020 | Oh et al. |
| 2020/0212262 | A1 | 7/2020 | Jang et al. |
| 2020/0219858 | A1 | 7/2020 | Chang |

FOREIGN PATENT DOCUMENTS

| | | |
|---|---|---|
| CN | 102593303 | 7/2012 |
| CN | 105789237 | 7/2016 |
| CN | 106848043 | 6/2017 |
| EP | 1482566 | 12/2004 |
| EP | 3122158 | 1/2017 |
| FR | 2964498 | 3/2012 |
| JP | 01-231380 | 9/1989 |
| JP | H0613655 | 1/1994 |
| JP | 07-254732 | 10/1995 |
| JP | 08-088407 | 4/1996 |
| JP | 08-213657 | 8/1996 |
| JP | 08-274376 | 10/1996 |
| JP | 9-148628 | 6/1997 |
| JP | 2001-273979 | 10/2001 |
| JP | 2003-197968 | 7/2003 |
| JP | 2005-019874 | 1/2005 |
| JP | 2005072323 | 3/2005 |
| JP | 2006-245524 | 9/2006 |
| JP | 2006-319099 | 11/2006 |
| JP | 2006-339551 | 12/2006 |
| JP | 2006-339646 | 12/2006 |
| JP | 2007-057667 | 3/2007 |
| JP | 2008-263127 | 10/2008 |
| JP | 2009-302201 | 12/2009 |
| JP | 2010-525555 | 7/2010 |
| JP | 2011-151346 | 8/2011 |
| JP | 2011-159671 | 8/2011 |
| JP | 2012-504856 | 2/2012 |
| JP | 2012-195529 | 10/2012 |
| JP | 2012-209264 | 10/2012 |
| JP | 2012-253046 | 12/2012 |
| JP | 2013-229218 | 11/2013 |
| JP | 2014-175427 | 9/2014 |
| JP | 2014-187366 | 10/2014 |
| JP | 2015-012244 | 1/2015 |
| JP | 2015-501085 | 1/2015 |
| JP | 2016-039361 | 3/2016 |
| JP | 2017-011202 | 1/2017 |
| JP | 2017-513234 | 5/2017 |
| JP | 2017-529557 | 10/2017 |
| JP | 2019-509636 | 4/2019 |
| KR | 10-2006-0095690 | 9/2006 |
| KR | 10-2007-0089172 | 8/2007 |
| KR | 10-2008-0054626 | 6/2008 |
| KR | 10-2009-0119209 | 11/2009 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| WO | 2015073286 | 5/2015 |
| WO | 2017153123 | 9/2017 |

OTHER PUBLICATIONS

Written Opinion of the international Searching Authority dated Feb. 26, 2019, issued in International Application No. PCT/KR2018/014671.

International Search Report dated Feb. 26, 2019, issued in International Application No. PCT/KR2018/014674.

Written Opinion of the International Searching Authority dated Feb. 26, 2019, issued in International Application No. PCT/KR2018/014674.

International Search Report dated Mar. 6, 2019, issued in International Application No. PCT/KR2018/014728.

Written Opinion of the International Searching Authority dated Mar. 6, 2019, issued in International Application No. PCT/KR2018/014728.

International Searching Report dated Mar. 6, 2019, issued in International Application No. PCT/KR2018/014734.

Written Opinion of the International Searching Authority dated Mar. 6, 2019, issued in International Application No. PCT/KR2018/014734.

International Search Report dated Mar. 6, 2019, issued in International Application No. PCT/KR2018/014672.

Written Opinion of the International Searching Authority dated Mar. 6, 2019, issued in International Application No. PCT/KR2018/014672.

International Search Report dated Apr. 3, 2019, issued in International Application No. PCT/KR2018/015268.

Written Opinion of the international Searching Authority dated Apr. 3, 2019, issued in International Application No. PCT/KR2018/015268.

(56) References Cited

OTHER PUBLICATIONS

Takatoshi Tsujimura et al. Development, of a color-tunable polychromatic organic-light-emitting-diode device for roll-to-roll manufacturing. Journal of the Society for information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, p. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT/KR2019/000014.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Non-Final Office Action dated Oct. 24, 2019, in U.S. Appl. No. 16/228,621.
Non-Final Office Action dated Oct. 31, 2019, in U.S. Appl. No. 16/198,850.
Non-Final Office Action dated Nov. 4, 2019, in U.S. Appl. No. 16/198,784.
Notice of Allowance dated Nov. 7, 2019, in U.S. Appl. No. 16/207,881.
Non-Final Office Action dated Nov. 19, 2019, in U.S. Appl. No. 16/198,792.
Ex Parte Quayle Action issued on Nov. 19, 2019, in U.S. Patent Application No. 16/198,796.
Notice of Allowance dated Mar. 12, 2020, in U.S. Appl. No. 16/198,784.
Non-Final Office Action dated Mar. 23, 2020, in U.S. Appl. No. 16/219,716.
Notice of Allowance dated Mar. 31, 2020, in U.S. Appl. No. 16/234,541.
Notice of Allowance dated Feb. 10, 2020, in U.S. Appl. No. 16/198,796.
Non-Final Office Action dated Mar. 5, 2020, in U.S. Appl. No. 16/228,601.
Final Office Action dated May 29, 2020, in U.S. Appl. No. 16/198,850.
Notice of Allowance dated Apr. 9, 2020, in U.S. Appl. No. 16/198,792.
Non-Final Office Action dated Apr. 15, 2020, in U.S. Appl. No. 16/198,873.
Final Office Action dated Apr. 20, 2020, in U.S. Appl. No. 16/228,621.
Non-Final Office Action dated Jun. 24, 2020, in U.S. Appl. No. 16/236,737.
Final Office Action dated Jun. 25, 2020, in U.S. Appl. No. 16/228,601.
Nan-Final Office Action for U.S. Appl. No. 16/200,036 dated Sep. 24, 2020.
Notice of Allowance for U.S. Appl. No. 16/198,796 dated Aug. 26, 2020.
Notice of Allowance for U.S. Appl. No. 16/219,716 dated Sep. 3, 2020.
Non-Final Office Action for U.S. Appl. No. 16/673,114 dated Sep. 3, 2020.
Non-Final Office Action for U.S. Appl. No. 16/228,621 dated Sep. 29, 2020.
Notice of Allowance for U.S. Appl. No. 16/236,737 dated Oct. 28, 2020.
Non-Final Office Action for U.S. Appl. No. 16/198,784 dated Nov. 19, 2020.
Final Office Action for U.S. Appl. No. 16/198,873 dated Oct. 15, 2020.
Final Office Action dated Mar. 4, 2021 in U.S. Appl. No. 16/673,114.
Final Office Action dated Mar. 25, 2021 in U.S. Appl. No. 16/200,036.
Non-Final Office Action dated Apr. 7, 2021, in U.S. Appl. No. 16/915,384.
Non-Final Office Action dated Mar. 18, 2021 in U.S. Appl. No. 16/228,601.
Non-Final Office Action dated Feb. 19, 2021, in U.S. Appl. No. 16/198,850.
Final Office Action dated Feb. 23, 2021, in U.S. Appl. No. 16/228,621.
Non-Final Office Action dated Mar. 1, 2021, in U.S. Appl. No. 16/899,522.
Final Office Action dated Apr. 21, 2021, in U.S. Appl. No. 16/198,784.
Notice of Allowance dated Aug. 26, 2021, in U.S. Appl. No. 16/789,877.
Non-Final Office Action dated Jun. 10, 2021, in U.S. Appl. No. 16/198,873.
Non-Final Office Action dated Jul. 8, 2021, in U.S. Appl. No. 16/228,621.
Notice of Allowance dated Jul. 12, 2021, in U.S. Appl. No. 16/198,784.
Extended European Search Report dated Aug. 9, 2021, in European Patent Application No. 18890359.5.
Extended European Search Report dated Sep. 6, 2021, in European Patent Application No. 19736098.5.
Extended European Search Report dated Sep. 29, 2021, in European Patent Application No. 18891199.4.
Extended European Search Report dated Oct. 5, 2021, in European Patent Application No. 18882087.2.
Extended European Search Report dated Sep. 14, 2021, in European Patent Application No. 18881496.6.
Extended European Search Report dated Oct. 5, 2021, in European Patent Application No. 19736023.3.
Extended European Search Report dated Oct. 7, 2021, in European Patent Application No. 21182984.1.
Notice of Reasons for Refusal drafted on Sep. 14, 2021, in Japanese Patent Application No. 2020-532747.
Notice of Allowance dated Sep. 14, 2021, in U.S. Appl. No. 16/899,522.
Final Office Action dated Sep. 30, 2021, in U.S. Appl. No. 16/198,850.
Notice of Allowance dated Sep. 22, 2021, in U.S. Appl. No. 16/200,036.
Final Office Action dated Sep. 27, 2021, in U.S. Appl. No. 16/915,384.
Final Office Action dated Sep. 30, 2021, in U.S. Appl. No. 16/228,601.
Final Office Action dated Dec. 2, 2021, in U.S. Appl. No. 16/228,621.
Notice of Allowance dated Dec. 9, 2021, in U.S. Appl. No. 16/915,384.
Final Office Action dated Dec. 24, 2021, in U.S. Appl. No. 16/198,873.
Non-Final Office Action dated Jan. 12, 2022, in U.S. Appl. No. 16/988,272.
Non-Final Office Action dated Jan. 21, 2022, in U.S. Appl. No. 16/673,114.
Notice of Allowance dated Feb. 17, 2022, in U.S. Appl. No. 16/228,621.
Examination Report issued in Indian Patent Application 202037026094 dated Mar. 28, 2022.
Extended European Search Report issued in European Patent Application 18886954.9 dated Aug. 3, 2021.

(56) References Cited

OTHER PUBLICATIONS

Notice of Allowance issued in U.S. Appl. No. 16/198,873 dated Mar. 16, 2022.
Notice of Allowance issued in U.S. Appl. No. 16/228,601 dated Mar. 17, 2022.
Notice of Allowance issued in U.S. Appl. No. 16/198,850 dated Mar. 30, 2022.
Search Report issued in European Patent Application 21182998.1 dated Oct. 12, 2021.
Search Report issued in European Patent Application 21182996.5 dated Oct. 22, 2021.
Examination Report issued in Indian Patent Application 202037026000 dated Mar. 25, 2022.
Examination Report issued in Indian Patent Application 202037028070 dated Mar. 30, 2022.
Notice of Allowance issued in U.S. Appl. No. 16/915,384 dated Apr. 21, 2022.
Non-Final Office Action dated May 11, 2022, in U.S. Appl. No. 17/164,829.
Notice of Allowance issued in U.S. Appl. No. 16/988,272 dated Jun. 8, 2022.
Notice of Allowance issued in U.S. Appl. No. 16/228,621 dated Jun. 15, 2022.
Substantive Examination Report Notice dated Jun. 15, 2022, in Saudi Arabian Patent Application No. 520412046.
Office Action dated Jul. 5, 2022 for Japanese Patent Application No. 2020-536804(with English Translation).
Office Action dated Jul. 19, 2022 for Japanese Patent Application No. 2020-528916(with English Translation).
Notice of Allowance issued in U.S. Appl. No. 16/673,114 dated Jul. 27, 2022.
Office Action dated Aug. 2, 2022 for Japanese Patent Application No. 2020-529153(with English Translation).
Office Action dated Aug. 2, 2022 for Japanese Patent Application No. 2020-527964(with English Translation).
Notice of Allowance issued in U.S. Appl. No. 16/198,873 dated Aug. 9, 2022.
Notice of Allowance issued in U.S. Appl. No. 16/228,601 dated Aug. 9, 2022.
Non-Final Office Action dated Aug. 23, 2022, in U.S. Appl. No. 16/200,036.
Office Action dated Aug. 30, 2022 for Japanese Patent Application No. 2020-529553(with English Translation).
Office Action dated Aug. 30, 2022 for Japanese Patent Application No. 2020-534346(with English Translation).
Office Action dated Aug. 30, 2022 for Japanese Patent Application No. 2020-532579(with English Translation).
Substantive Examination Report Notice dated Aug. 29, 2022, in Saudi Arabian Patent Application No. 520412047.
Notice of Allowance issued in U.S. Appl. No. 16/198,850 dated Sep. 8, 2022.
Substantive Examination Report Notice dated Aug. 28, 2022, in Saudi Arabian Patent Application No. 520412187.
Takatoshi Tsujimura et al., Development of a color-tunable polychromatic organic-light-emitting-diode device for roll-to-roll manufacturing, Apr. 14, 2016, pp. 262-269, Journal of the SID.
Office Action dated Sep. 20, 2022 for Japanese Patent Application No. 2020-528905(with English Translation).
Office Action dated Sep. 20, 2022 for Japanese Patent Application No. 2020-528919(with English Translation).

* cited by examiner

LED UNIT FOR DISPLAY AND DISPLAY APPARATUS HAVING THE SAME

CROSS-REFERENCE TO RELATED APPLICATIONS

This application is a Continuation of U.S. patent application Ser. No. 16/198,850, filed on Nov. 22, 2018, and claims priority from and the benefit of U.S. Provisional Patent Application No. 62/608,297, filed on Dec. 20, 2017, U.S. Provisional Patent Application No. 62/613,333, filed on Jan. 3, 2018, U.S. Provisional Patent Application No. 62/614,900, filed on Jan. 8, 2018, U.S. Provisional Patent Application No. 62/638,797, filed on Mar. 5, 2018, U.S. Provisional Patent Application No. 62/683,553, filed on Jun. 11, 2018, and U.S. Provisional Patent Application No. 62/683,564, filed on Jun. 11, 2018, the disclosures each of which are hereby incorporated by reference for all purposes as if fully set forth herein.

BACKGROUND

Field

Exemplary implementations of the invention relate generally to a light emitting stacked structure and a display device including the same, and more specifically, to a micro light-emitting diode for a display and a display apparatus including the same.

Discussion of the Background

Recently, display devices using light emitting diodes (LEDs) have been developed. A display device using LEDs may be generally formed by forming individually-grown red (R), green (G), and blue (B) LED structures on a final substrate.

However, in addition to satisfying the needs for high-resolution and full-color in a display device, there are continuously increasing needs for a display device with a high level of color purity and color reproducibility that can be manufactured in a relatively simple manufacturing method.

A light-emitting diode (LED) generally refers to an inorganic light source and has been used in a wide range of fields, such as display devices, lamps for vehicles, and general lighting. Since an LED has advantages such as longer lifespan, lower power consumption, and quicker than an existing light source, it has been quickly replacing the existing light source.

To date, conventional LEDs have been mainly used as backlight sources in display devices. However, recently, micro LEDs have been developed as a next-generation display that is capable of generating images directly from light emitting diodes.

Display devices generally emit various colors using mixed colors of blue, green, and red. Each of the pixels of a display device includes blue, green, and red sub-pixels. A color of a specific pixel is determined based on the colors of these sub-pixels, and an image is implemented by a combination of these pixels.

In a micro LED display, micro LEDs are arranged on a two-dimensional (2D) plane to correspond to each sub-pixel, and thus, may require an arrangement of a large number of micro LEDs on a single substrate. However, a micro LED generally has a small form factor, such as a surface area of about 10,000 square micrometers or less, which may cause various issues during manufacture due to its small form factor. For example, handling a micro LED is difficult due to the small form factor, and thus, it is difficult to mount the large number of micro LEDs required for a typical display panel, which can exceed millions of micro LEDs.

Further, since the sub-pixels are arranged on a two-dimensional plane, an area occupied by one pixel that includes blue, green, and red sub-pixels is relatively large. As such, arranging sub-pixels within a limited area may require reducing the area of each LED chip, which in turn may deteriorate brightness of sub-pixels due to reduction of a light emitting area.

The above information disclosed in this Background section is only for understanding of the background of the inventive concepts, and, therefore, it may contain information that does not constitute prior art.

SUMMARY

Light emitting diodes constructed according to the principles and some exemplary implementations of the invention and displays using the same have a stacked, light emitting structure that is simple and can be made in a simple manufacturing method. For example, the sides of the LED stacks may have a predetermined inclination to facilitate forming an optically non-transmissive film disposed on the sides of the LED stacks to prevent light leakage. Further, when each of the LED stacks has a tapered shape at a predetermined angle, the light reflection effect of the optically non-transmissive film may be maximized or substantially increased. As such, the angles between the sides of each of the LED stacks and the one surface of the substrate may be the same or different from each other.

Light emitting diodes and display using the light emitting diodes, e.g., micro LEDs, constructed according to the principles and some exemplary implementations of the invention provide a light-emitting diode pixel for a display which allow a plurality of pixels to be simultaneously manufactured so as to obviate the process of individually mounting the plurality of pixels.

Light emitting diodes and display using the light emitting diodes, e.g., micro LEDs constructed according to the principles and some exemplary implementations of the invention provide a light emitting device for a display capable of increasing the luminous area of each sub-pixel without increasing the pixel area.

Light emitting diodes and display using the light emitting diodes, e.g., micro LEDs constructed according to the principles and some exemplary implementations of the invention provide a light emitting device for a display capable of reducing the process time associated with mounting the LEDs.

Light emitting diodes and display using the light emitting diodes, e.g., micro LEDs constructed according to the principles and some exemplary implementations of the invention provide a light emitting diode for a display having a high reliability and a stable structure. For example, providing LED stacks and bonding layers with inclined side surfaces may reduce or prevent the likelihood of disconnection of a connector electrically communicating with the LED stacks, as compared to when the LED stacks and the bonding layers have vertical side surfaces, and thus, reliability of the pixel may be enhanced. As another example, one or more hydrophilic material layers may be used to improve the adhesion of one or more bonding layer provided in or between the LED stacks, thereby reducing or preventing the occurrence of the peeling. As yet another example, one of more shock absorbing layers may be used in the LED stacks to reduce or prevent the occurrence of defects, such as peel-off.

Light emitting diodes and display using the light emitting diodes, e.g., micro LEDs constructed according to the principles and some exemplary implementations of the invention are capable of being driven in one of a passive matrix driving manner and an active matrix driving manner.

Additional features of the inventive concepts will be set forth in the description which follows, and in part will be apparent from the description, or may be learned by practice of the inventive concepts.

A light emitting stacked structure according to an exemplary embodiment includes a substrate including an upper surface and a lower surface, a plurality of sequentially stacked epitaxial sub-units disposed on the substrate and configured to emit light of different wavelength bands, each epitaxial sub-unit has a light emitting region that overlaps with the light emitting region of an adjacent epitaxial sub-unit, and a substantially, non-transmissive film covering at least a portion of side surfaces of the epitaxial sub-units, in which the side surfaces of the epitaxial sub-units are inclined with respect to one of the upper and lower surfaces of the substrate.

A light-emitting diode (LED) pixel for a display according to an exemplary embodiment includes a first LED sub-unit, a second LED sub-unit disposed on the first LED sub-unit, a third LED sub-unit disposed on the second LED sub-unit, a connector disposed on at least one side surface of the first, second, and third LED sub-units and electrically connected to at least one of the LED sub-units, and an insulating layer to insulate the connector from the at least one side surface of the LED sub-units, in which the at least one side surface of the LED sub-units is inclined with respect to a bottom surface of one of the first, second, and third LED sub-units, and the connector is disposed on the inclined side surface of the LED sub-units.

A light emitting device for a display according to an exemplary embodiment includes a first LED sub-unit, a second LED sub-unit disposed below the first LED sub-unit, a third LED sub-unit disposed below the second LED sub-unit, an insulating layer substantially covering the first, second, and third LED sub-units, and electrode pads electrically connected to the first, second, and third LED sub-units, the electrode pads including a common electrode pad, a first electrode pad, a second electrode pad, and a third electrode pad, in which the first LED sub-unit is disposed on a partial region of the second LED sub-unit, the second LED sub-unit is disposed on a partial region of the third LED sub-unit, the insulating layer has openings for electrical connection between the electrode pads, the common electrode pad is connected to the first, second, and third LED sub-units through the openings in the insulating layer, the first, second, and third electrode pads are connected to the first, second, and third LED sub-units, respectively, through at least one of the openings, and the first, second, and third LED sub-units are configured to be independently driven using the electrode pads.

A light emitting diode (LED) stack for a display according to an exemplary embodiment includes a first LED sub-unit including a first conductivity type semiconductor layer and a second conductivity type semiconductor layer, a second LED sub-unit disposed on the first LED sub-unit, a third LED sub-unit disposed on the second LED sub-unit, a first bonding layer disposed between the first and second LED sub-units, a second bonding layer disposed between the second LED and third LED sub-units, and at least one buffer layer disposed between adjacent LED sub-units.

A light emitting device for a display according to another exemplary embodiment includes a pixel region including a first LED stack, a second LED stack disposed on the first LED stack, a third LED stack disposed on the second LED stack, a first adhesive layer disposed between the first LED stack and the second LED stack, or between the second LED stack and the third LED stack, a first metal bonding layer at least partially surrounded by the adhesive layer, and disposed between and is electrically connected to the first LED stack and the second LED stack, or the second LED stack and the third LED stack, and upper electrode pads electrically connected to the first, second, and third LED stacks, the upper electrode pads including a common electrode pad, a first electrode pad, a second electrode pad, and a third electrode pad, in which the common electrode pad is connected to the first, second, and third LED stacks, the first, second, and third electrode pads are connected to the first, second, and third LED stacks, respectively, and the first, second, and third LED stacks are configured to be independently driven using the upper electrode pads.

The first metal bonding layer may have a thickness less than that of the first adhesive layer.

The pixel region may further include connectors electrically connected to the upper electrode pads, and the first metal bonding layer may be disposed between the upper electrode pads and the connectors.

The connectors may pass through the first LED stack or the second LED stack.

The light emitting device may further include a substrate, a second adhesive layer disposed between the first LED stack and the substrate, and a second metal bonding layer at least partially surrounded by the second adhesive layer.

The light emitting device may further include lower electrode pads disposed on the substrate, in which the second metal bonding layer may be disposed between one of the second electrode pad disposed on the substrate and one of the upper electrode pads disposed on the first LED stack.

The substrate may include thin film transistors.

The light emitting device may further include a first transparent electrode in ohmic contact with the first LED stack, a second transparent electrode in ohmic contact with the second LED stack, and a third transparent electrode disposed in ohmic contact the third LED stack.

Each of the first, second, and third LED stacks may include a first conductivity type semiconductor layer and a second conductivity type semiconductor layer, and the first, second, and third transparent electrodes may be electrically connected to the second conductivity type semiconductor layers of the first, second, and third LED stacks, respectively.

The first, second, and third LED stacks may each have sides, and the light emitting device may further include an optically non-transmissive film disposed on at least one of the sides of the first, second, and third LED stacks.

A light emitting stacked structure according to another exemplary embodiment includes a substrate, and a plurality of pixel regions defined on the substrate, in which each of the pixel regions includes a first LED stack, a second LED stack disposed on the first LED stack, a third LED stack disposed on the second LED stack, an adhesion layer disposed between the first LED stack and the second LED stack or between the second LED stack and the third LED stack, the adhesion layer having conductivity at least in a partial area thereof.

The light emitting stacked structure may further include a barrier disposed in a separation region defined between the pixel regions.

The adhesion layer may be disposed between and be electrically connected to the first LED stack and the second LED stack, or the second LED stack and the third LED stack.

The adhesion layer may include a first region and a second region surrounding the first region, the second region having a thickness greater than that of the first region.

The light emitting stacked structure may further include a pad disposed on one of the first, second, and third LED stacks and electrically connected thereto, in which the second region of the adhesion layer may contact a side surface of the pad.

The first region and the second region of the adhesion layer may contact the same surface of the pad.

Each of the pixel regions may further include electrode pads electrically connected to the first, second, and third LED stacks, the electrode pads including a common electrode pad, a first electrode pad, a second electrode pad, and a third electrode pad, the common electrode pad may be connected to the first, second, and third LED stacks, the first, second, and third electrode pads may be connected to the first, second, and third LED stacks, respectively, and the first, second, and third LED stacks may be configured to be independently driven using the electrode pads.

Each of the pixel regions may further include connectors electrically connected to the electrode pads, and the adhesion layer may be disposed between the electrode pads and the connectors.

The connectors may pass through the first LED stack or the second LED stack.

The adhesion layer may include an organic material and a conductive material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
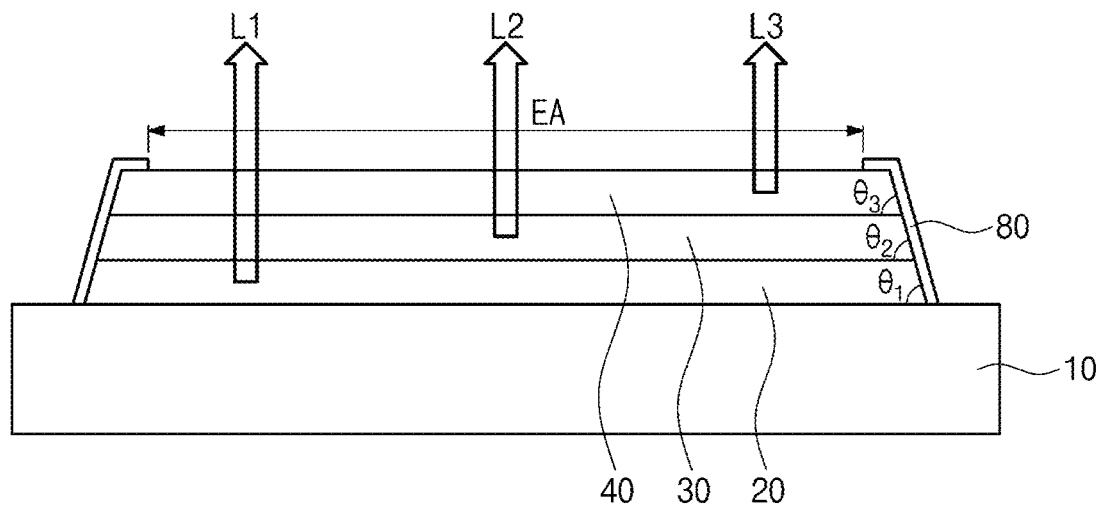
FIG. 1 is a cross-sectional view of a light emitting stacked structure according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings. As used herein, a light emitting device or a light emitting diode according to exemplary embodiments may include a micro LED, which has a surface area less than about 10,000 square μm as known in the art. In other exemplary embodiments, the micro LED's may have a surface area of less than about 4,000 square μm, or less than about 2,500 square μm, depending upon the particular application.

FIG. 1 is a cross-sectional view of a light emitting stacked structure according to an exemplary embodiment.

Referring to FIG. 1, a light emitting stacked structure according to an exemplary embodiment includes a plurality of sequentially stacked epitaxial stacks, and optically non-transmissive films covering sides of the epitaxial stacks. The plurality of epitaxial stacks is provided on the substrate 10. The substrate 10 may substantially have a plate shape including an upper surface and a lower surface. As used herein, a light emitting stacked structure according to exemplary embodiments may include a micro light emitting structure or a micro LED, which generally has a form factor of about 200 square micrometers or less, or about 100 square micrometers or less in surface area, as is known in the art.

A plurality of epitaxial stacks may be mounted on the upper surface of the substrate 10, and the substrate 10 may be provided in various forms. The substrate 10 may be formed of an insulating material. Examples of the material of the substrate 10 may include glass, quartz, silicon, organic polymer, organic-inorganic composite, or others. However, the inventive concepts are not limited a particular material of the substrate 10, as long as it has an insulation property. In an exemplary embodiment, the substrate 10 may further include a wiring part that may provide a light emitting signal and a common voltage to the respective epitaxial stacks. In particular, when each of the epitaxial stacks is driven in an active matrix type, a driving element including a thin film transistor may be further disposed on the substrate 10 in addition to the wiring part. To this end, the substrate 10 may be provided as a printed circuit board 10 or as a composite substrate 10 having a wiring part and/or a drive element formed on glass, silicon, quartz, organic polymer, or organic/inorganic composite.

The epitaxial stacks are sequentially stacked on the upper surface of the substrate 10, and may respectively emit light. In an exemplary embodiment, two or more epitaxial stacks may be provided to emit light of different wavelength bands from each other, respectively. More particularly, a plurality of epitaxial stacks may be provided, respectively having different energy bands from each other. The epitaxial stack on the substrate 10 may be sequentially disposed over one another. According to an exemplary embodiment, the epitaxial stack may include first, second, and third epitaxial stacks 20, 30, and 40 sequentially disposed on the substrate 10.

Each of the epitaxial stacks may emit light towards the front side of the substrate 10. Light emitted from one epitaxial stack may pass through another epitaxial stack located in the light path, and travels to the front direction. For example, the front direction may correspond to a direction along which the first to third epitaxial stacks 20, 30, and 40 are stacked, as shown in FIG. 1.

Each of the epitaxial stacks may emit a color light of a visible light band of various wavelength bands. For example, light emitted from the lowermost epitaxial stack may be a color light having the longest wavelength (e.g., the lowest energy band), and the wavelength of the light emitted the epitaxial stacks may become shorter along a direction away from the substrate 10. Light emitted from the uppermost epitaxial stack may have a color light having the shortest wavelength (e.g., the highest energy band). For example, the first epitaxial stack 20 may emit the first color light L1, the second epitaxial stack 30 may emit the second color light L2, and the third epitaxial stack 40 may emit the third color light L3. The first to third color light L1, L2, and L3 may correspond to different color light from each other, and the first to third color light L1, L2, and L3 may be color light of different wavelength bands from each other which have sequentially decreasing wavelengths. In particular, the first to third color light L1, L2, and L3 may have different wavelength bands from each other, and the color light may be a shorter wavelength band (e.g., a higher energy) in the order of the first color light L1 to the third color light L3. However, the inventive concepts are not limited thereto, and the wavelength of light emitted from each epitaxial stack may be variously modified.

In an exemplary embodiment, the first color light L1 may be red light, the second color light L2 may be green light, and the third color light L3 may be blue light.

Hereinafter, in addition to the front direction and the back direction mentioned above, the "front" direction of the substrate 10 will be referred to as the "upper" direction, and "back" direction of the substrate 10 will be referred to as the "lower" direction. The terms "upper" or "lower" refer to relative directions, which may vary according to the placement and the direction of the light emitting stacked structure.

Each of the epitaxial stacks emits light in an upper direction, and each of the epitaxial stacks transmits most of light emitted from the underlying epitaxial stacks. In particular, light emitted from the first epitaxial stack 20 passes through the second epitaxial stack 30 and the third epitaxial stack 40, and travels to the front direction. Light emitted from the second epitaxial stack 30 passes through the third epitaxial stack 40 and travels to the front direction. To this end, at least some, or desirably, all of the epitaxial stacks other than the lowermost epitaxial stack 20 may be composed of an optically transmissive material. As used herein, the material being "optically transmissive" may refer to transmitting the entire light or transmitting at least a portion of light having a predetermined wavelength. In an exemplary embodiment, each of the epitaxial stacks may transmit about 60% or more of light emitted from the epitaxial stack disposed thereunder, or about 80% or more in another exemplary embodiment, or about 90% or more in yet another exemplary embodiment.

An optically non-transmissive (substantially, total reflective) film 80 may be provided on the sides of the epitaxial stacks, more particularly, on the sides of the first to third epitaxial stacks 20, 30, and 40. The optically non-transmissive film 80 may substantially cover the entire sides of the first to third epitaxial stacks 20, 30, and 40 to prevent light from being emitted therefrom.

The optically non-transmissive film 80 is not particularly limited as long as it is blocks light transmission by absorbing or reflecting light. In an exemplary embodiment, the optically non-transmissive film 80 may be a distributed Bragg reflector (DBR), a metal reflective film formed on an insulating film, or an organic polymer film having a black color. When a metal reflective film is used as the optically non-transmissive film, the metal reflective film may be in a floating state that is electrically isolated from the components within other pixels. The metal reflective film may also be provided in a form of an extension from one of the components within other pixels, for example, as an extension from one of the other lines, in which case the metal reflective film is provided within a range that is not electrically connected to the other conductive components.

In an exemplary embodiment, the optically non-transmissive film 80 may have a single or a multi-layered film structure, and may include two or more different types of materials when provided as a multilayer film. In an exemplary embodiment, the optically non-transmissive film 80 may be formed by depositing two or more insulating films of different refractive indices from each other. For example, the optically non-transmissive film 80 may be formed by stacking a material having a low refractive index and a material having a high refractive index in sequence, or alternatively by stacking insulating films having different refractive indices from each other. Materials having different refractive indices may include $SiO_2$ or $SiN_x$, but the inventive concepts are not limited thereto. The wavelength of light absorbed or reflected by the optically non-transmissive film 80 may be controlled by way of changing the materials thereof, the thickness of stack, the frequency of stacking, or the like.

In an exemplary embodiment, the optically non-transmissive film 80 may be provided on the sides of the pixels to prevent the phenomenon in which light emitted from a certain pixel affects adjacent pixels, or the phenomenon in which color is mixed with light emitted from the adjacent pixels. Accordingly, each of the epitaxial stacks has a side in a tapered shape to facilitate depositing of the optically non-transmissive film 80. In particular, the side of each of the epitaxial stacks may have an inclined shape relative to one surface of the substrate 10 (e.g., an upper surface or lower surface of the substrate).

In an exemplary embodiment, the side of each of the epitaxial stacks has an inclined shape relative to one surface of the substrate 10. According to an exemplary embodiment, an angle between the sides of the first to third epitaxial stacks 20, 30, and 40 and the one surface of the substrate 10 may be greater than about 0 degrees and less than about 90 degrees in a cross-sectional view. For example, when angles between the sides of the first to third epitaxial stacks 20, 30, and 40 and the one surface of the substrate 10 is first to third angles $\theta_1$, $\theta_2$, and $\theta_3$, the first to third angles $\theta_1$, $\theta_2$, and $\theta_3$ may have values in a range from about 45 degrees to about 85 degrees, respectively.

When the sides of the first to third epitaxial stacks 20, 30 and 40 have a predetermined inclination as described above, it may be relatively easy to form the optically non-transmissive film 80. Further, when each of the epitaxial stacks has a tapered shape at a predetermined angle, the light reflection effect by the optically non-transmissive film 80 may be maximized or substantially increased. The optically non-transmissive film 80 may be formed using physical and/or chemical vapor deposition, but when the sides of the first to third epitaxial stacks 20, 30, and 40 are perpendicular or nearly perpendicular to the substrate 10 surface, it may be difficult to sufficiently cover the sides of the first to third epitaxial stacks 20, 30, and 40 with the optically non-transmissive film 80. In particular, if the sides of the first to third epitaxial stacks 20, 30, and 40 are perpendicular to or nearly perpendicular to the substrate 10 surface, even when the optically non-transmissive film 80 is formed by physical and/or chemical vapor deposition, the thickness of the optically non-transmissive film formed on the sides may be thinner than the thickness of the optically non-transmissive film 80 formed on the upper surface, and there is a high possibility that the optically non-transmissive film 80 formed on the side have cracks. As such, the side portions of the first to third epitaxial stacks 20, 30, and 40 may not be sufficiently covered by the optically non-transmissive film 80, which may cause light leakage from the epitaxial stacks.

According to an exemplary embodiment, when the side of each of the first to third epitaxial stacks 20, 30, and 40 and the one surface of the substrate 10 are at an angle of inclination between about 45 degrees and about 85 degrees, the optically non-transmissive film 80 may be sufficiently formed on each side of the first to third epitaxial stacks 20, 30, and 40. Further, when each of the epitaxial stacks has a tapered shape at a predetermined angle, the light reflection effect by the optically non-transmissive film 80 may be maximized or substantially increased. As such, the angles between the sides of each of the first to third epitaxial stacks 20, 30, and 40 and the one surface of the substrate 10 may be the same or different from each other. The angles between the sides of the first to third epitaxial stacks 20, 30, and 40 and the one surface of the substrate 10 may be determined in consideration of the materials of each of the epitaxial stacks, the etching rate during patterning, the degree of reflection of light emitted from each of the epitaxial stacks, or others. For example, among the angles formed between the sides of the first to third epitaxial stacks 20, 30, and 40 and the one surface of the substrate 10, the first angle $\theta_1$, the second angle $\theta_2$, and the third angle $\theta_3$ may be different from one another, or alternatively, the second angle $\theta_2$ and the third angle $\theta_3$ may be the same as each other and different from the first angle $\theta_1$. In an exemplary embodiment, the angle between the sides of each of the first to third epitaxial stacks 20, 30, and 40 and the one surface of the substrate 10 may be determined in consideration of the difference of wavelength of light emitted. For example, the angles may be determined to allow the highest total internal reflection to occur when light emitted from each of the epitaxial stacks travels to the direction of the sides.

In an exemplary embodiment, the optically non-transmissive film 80 may be provided only on the sides of the epitaxial stacks, but the inventive concepts are not limited thereto. For example, the optically non-transmissive film 80 may extend over a portion of the upper surface of the uppermost epitaxial stack to cover at least a portion of the upper surface of the uppermost epitaxial stack where emission of light is not desired. More particularly, as shown in FIG. 1, the optically non-transmissive film 80 has a window for exposing the upper surface of the epitaxial stack at the top corresponding to a region where emission of light is desired. As used herein, a light emitting region that is visible to the user may be referred to as a "light emitting region (EA)", and the remaining light emitting region may be referred to as a "peripheral region". The optically non-transmissive film 80 has a window in the light emitting region, and may cover a portion of the upper surface of the third epitaxial stack 40 and the entire sides in the peripheral region except for the light emitting region. Accordingly, the optically non-transmissive film 80 may cover a portion of an edge of the upper surface of the epitaxial stack to reduce the directivity angle of the emitted light, and thus, interference with light from the adjacent light emitting stacked structures may be minimized.

In the light emitting stacked structure according to an exemplary embodiment, signal lines for applying emitting signals to the respective epitaxial stacks may be independently connected. Accordingly, the respective epitaxial stacks can be independently driven, and the light emitting stacked structure can implement various colors according to whether light is emitted from each of the epitaxial stacks. In addition, the epitaxial stacks that may emit light of different wavelengths from each other are overlapped vertically on one another, and thus, can be formed in a narrow area. In addition, since the sides of the epitaxial stacks are inclined, it is possible to easily form the non-transmissive film 80 with a sufficient thickness, and the non-transmissive film 80 can prevent the phenomenon in which light emitted from a certain pixel affects the adjacent pixels, or the phenomenon in which color is mixed with the light emitted from the adjacent pixels.

Figure 2:
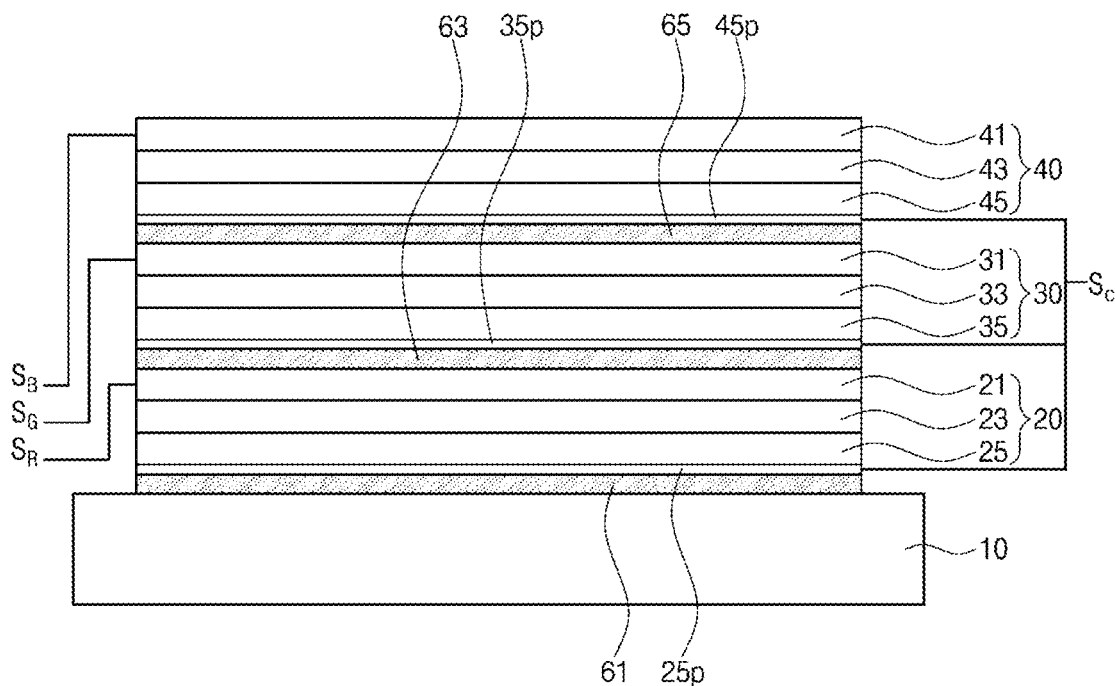
FIG. 2 is a cross-sectional view of a light emitting stacked structure including a wiring part according to an exemplary embodiment.

FIG. 2 is a cross-sectional view of a light emitting stacked structure including a wiring part according to an exemplary embodiment. In FIG. 2, the inclined shapes of each of the epitaxial stacks and the insulating films shown in FIG. 1 are omitted.

Referring to FIG. 2, in a light emitting stacked structure according to an exemplary embodiment, each of the first to third epitaxial stacks 20, 30, and 40 may be provided on the substrate 10, via the first to third adhesive layers 61, 63, and 65 interposed therebetween. The first adhesive layer 61 may include a conductive or non-conductive material. The first adhesive layer 61 may have conductivity in some regions when it needs to be electrically connected to the substrate 10 provided thereunder. The first adhesive layer 61 may also include a transparent or opaque material. In an exemplary embodiment, when the substrate 10 is provided with an opaque material and has a wiring part or the like formed thereon, the first adhesive layer 61 may include an opaque material, for example, a light absorbing material. For the light absorbing material that forms the first adhesive layer 61, various polymer adhesives may be used, including, for example, an epoxy-based polymer adhesive.

The second and third adhesive layers 63 and 65 may include a non-conductive material and may also include an optically transmissive material. For example, an optically clear adhesive may be used for the second and third adhesive layers 65. The material for forming the second and third adhesive layers 63 and 65 is not particularly limited, as long as it is optically transparent and is capable of attaching each of the epitaxial stacks stably. For example, the second and third adhesive layers 63 and 65 may be formed of an organic material including an epoxy-based polymer such as SU-8, various resists, parylene, poly(methyl methacrylate) (PMMA), benzocyclobutene (BCB), spin on glass (SOG), or others, and inorganic material such as silicon oxide, aluminum oxide, or the like. According to an exemplary embodiment, a conductive oxide may also be used as an adhesive layer, in which case the conductive oxide may be insulated from other components. When an organic material is used as the adhesive layer, the organic material may be applied to the adhesive surface and then bonded at a high temperature and a high pressure in a vacuum state. When an inorganic material is used as the adhesive layer, the inorganic material may be deposited on the adhesive surface and then planarized by chemical-mechanical planarization (CMP) or the like, after which the surface is subjected to the plasma treatment and then bonded by bonding under a high vacuum.

Each of the first to third epitaxial stacks 20, 30, and 40 includes p-type semiconductor layers 25, 35, and 45, active layers 23, 33, and 43, and n-type semiconductor layers 21, 31, and 41, which are sequentially disposed.

According to an exemplary embodiment, the p-type semiconductor layer 25, the active layer 23, and the n-type semiconductor layer 21 of the first epitaxial stack 20 may include a semiconductor material that emits red light. However, the inventive concepts are not limited to a particular color of light emitted from the first epitaxial stack 20.

Examples of a semiconductor material that emits red light may include aluminum gallium arsenide (AlGaAs), gallium arsenide phosphide (GaAsP), aluminum gallium indium phosphide (AlGaInP), gallium phosphide (GaP), or others. However, the semiconductor material that emits red light is not limited thereto, and various other materials may be used.

A first p-type contact electrode 25p may be provided under the p-type semiconductor layer 25 of the first epitaxial stack 20. The first p-type contact electrode 25p of the first epitaxial stack 20 may be a single layer or a multi-layer metal. For example, the first p-type contact electrode 25p may include various materials including metals, such as Al, Ti, Cr, Ni, Au, Ag, Ti, Sn, Ni, Cr, W, Cu, or others, or alloys thereof. The first p-type contact electrode 25p may include metal having a high reflectivity, and accordingly, since the first p-type contact electrode 25p is formed of a metal having high reflectivity, it is possible to increase the emission efficiency of light emitted from the first epitaxial stack 20 in the upper direction.

The second epitaxial stack 30 includes a p-type semiconductor layer 35, an active layer 33, and an n-type semiconductor layer 31, which are sequentially disposed. The p-type semiconductor layer 35, the active layer 33, and the n-type semiconductor layer 31 may include a semiconductor material that emits green light. However, the inventive concepts are not limited to a particular color of light emitted from the second epitaxial stack 30.

Examples of materials for emitting green light include indium gallium nitride (InGaN), gallium nitride (GaN), gallium phosphide (GaP), aluminum gallium indium phosphide (AlGaInP), and aluminum gallium phosphide (AlGaP). However, the semiconductor material that emits green light is not limited thereto, and various other materials may be used.

A second p-type contact electrode 35p is provided under the p-type semiconductor layer 35 of the second epitaxial stack 30. The second p-type contact electrode 35p is provided between the first epitaxial stack 20 and the second epitaxial stack 30, or specifically, between the second adhesive layer 63 and the second epitaxial stack 30.

The third epitaxial stack 40 includes a p-type semiconductor layer 45, an active layer 43, and an n-type semiconductor layer 41, which are sequentially disposed. The p-type semiconductor layer 45, the active layer 43, and the n-type semiconductor layer 41 may include a semiconductor material that emits blue light. However, the inventive concepts are not limited to a particular color of light emitted from the third epitaxial stack 40.

The examples of the materials that emit blue light may include gallium nitride (GaN), indium gallium nitride (InGaN), zinc selenide (ZnSe), or others. However, the semiconductor material that emits blue light is not limited thereto, and various other materials may be used.

A third p-type contact electrode 45p is provided under the p-type semiconductor layer 45 of the third epitaxial stack 40. The third p-type contact electrode 45p is provided between the second epitaxial stack 30 and the third epitaxial stack 40, or specifically, between the third adhesive layer 65 and the third epitaxial stack 40.

In FIG. 2, although the n-type semiconductor layers 21, 31, and 41 and the p-type semiconductor layers 25, 35, and 45 of the first to third epitaxial stacks 20, 30, and 40 are each shown as a single layer, the inventive concepts are not limited thereto, and these layers may be multilayers and may also include superlattice layers. In addition, the active layers of the first to third epitaxial stacks 20, 30, and 40 may include a single quantum well structure or a multi-quantum well structure.

In an exemplary embodiment, the second and third p-type contact electrodes 35p and 45p may substantially cover the second and third epitaxial stacks 30 and 40. The second and third p-type contact electrodes 35p and 45p may include a transparent conductive material to transmit light from the epitaxial stack below. For example, each of the second and third p-type contact electrodes 35p and 45p may include a transparent conductive oxide (TCO). The transparent conductive oxide may include tin oxide (SnO), indium oxide ($InO_2$), zinc oxide (ZnO), indium tin oxide (ITO), indium tin zinc oxide (ITZO) or the like. The transparent conductive compound may be deposited by the chemical vapor deposition (CVD), the physical vapor deposition (PVD), such as an evaporator, a sputter, or the like. The second and third p-type contact electrodes 35p and 45p may be provided with a sufficient thickness so as to function as an etch stopper during the fabrication process which will be described in more detail below, for example, with a thickness of about 2000 angstroms to about 2 micrometers to the extent that the transparency is satisfied.

In an exemplary embodiment, common lines may be connected to the first to third p-type contact electrodes 25p, 35p, and 45p. The common line may be a line to which the common voltage is applied. In addition, the light emitting signal lines may be connected to the n-type semiconductor layers 21, 31, and 41 of the first to third epitaxial stacks 20, 30, and 40, respectively. For example, a common voltage $S_C$ may be applied to the first p-type contact electrode 25p, the second p-type contact electrode 35p, and the third p-type contact electrode 45p through the common line, and light emitting signal is applied to the n-type semiconductor layers 21, 31, and 41 of the first to third epitaxial stacks 20, 30, and 40, thereby controlling the light emission of the first to third epitaxial stacks 20, 30, and 40. The light emitting signal may include first to third light emitting signals $S_R$, $S_G$, and $S_B$ corresponding to the first to third epitaxial stacks 20, 30, and 40, respectively. In an exemplary embodiment, the first light emitting signal $S_R$ may be a signal corresponding to red light, the second light emitting signal $S_G$ may be a signal corresponding to green light, and the third light emitting signal $S_B$ may be a signal corresponding to an emission of blue light.

According to the exemplary embodiment, the first to third epitaxial stacks 20, 30, and 40 may be driven according to a light emitting signal applied to each of the epitaxial stacks. In particular, the first epitaxial stack 20 is driven according to a first light emitting signal $S_R$, the second epitaxial stack 30 is driven according to a second light emitting signal $S_G$, and the third epitaxial stack 40 is driven according to the third light emitting signal $S_B$. In particular, the first, second, and third driving signals $S_R$, $S_G$, and $S_B$ may be independently applied to the first to third epitaxial stacks 20, 30, and 40, such that each of the first to third epitaxial stacks 20, 30 and 40 may be independently driven. The light emitting stacked structure may finally provide light of various colors by combining the first to third color light emitted upward from the first to third epitaxial stacks 20, 30 and 40.

In FIG. 2, a common voltage is described as being applied to the p-type semiconductor layers 25, 35, and 45 of the first to third epitaxial stacks 20, 30, and 40, and the light emitting signal is described as being applied to the n-type semiconductor layers 21, 31, and 41 of the first to third epitaxial stacks 20, 30, and 40, however, the inventive concepts are not limited thereto. In another exemplary embodiment, a common voltage may be applied to the n-type semiconductor layers 21, 31, and 41 of the first to third epitaxial stacks 20, 30, and 40, and light emitting signals may be applied to the p-type semiconductor layers 25, 35, and 45 of the first to third epitaxial stacks 20, 30, and 40.

In this manner, the light emitting stacked structure of FIG. 2 may implement a color in a manner such that portions of different color light are provided on the overlapped region, rather than implementing different color light on different planes spaced apart from each other. Accordingly, the light emitting stacked structure may advantageously have compactness and integration of the light emitting element. In general, conventional light emitting elements emitting different colors, such as red, green, and blue light, are spaced apart from each other on a plane to realize full color. As such, each of the conventional light emitting elements is generally arranged on a plane, occupying a larger area. However, according to exemplary embodiments, it is possible to realize a full color in a remarkably smaller area by providing a stacked structure having the portions of the light emitting elements that emit different color light overlapped in a one region. Accordingly, it is possible to manufacture a high-resolution device even in a small area.

In addition, conventional light emitting device may have a complex structure and manufacturing thereof is also not easy, because the conventional light emitting device, including the conventional stacked light emitting device, is manufactured by separately preparing respective light emitting elements and then forming separate contacts such as connecting by interconnection lines, or others, for each of the light emitting elements. However, according to an exemplary embodiment, the light emitting stacked structure is formed by stacking multi-layers of epitaxial stacks sequentially on a single substrate 10, and then forming contacts on the multi-layered epitaxial stacks and connecting by lines through a minimum process. In addition, as compared to the conventional manufacturing method of display devices in which light emitting elements of individual colors are separately manufactured and mounted separately, according to exemplary embodiments, only a single light emitting stacked structure is mounted instead of a plurality of light emitting elements, which significantly simplifies its manufacturing method.

The light emitting stacked structure according to an exemplary embodiment may additionally employ various components to provide high purity and color light of high efficiency. For example, a light emitting stacked structure according to an exemplary embodiment may further include a wavelength pass filter to block shorter wavelength light from proceeding toward the epitaxial stack that emits relatively longer wavelength light.

In the following exemplary embodiments, differences from the exemplary embodiments described above will be mainly described, in order to avoid redundancy.

Figure 3:
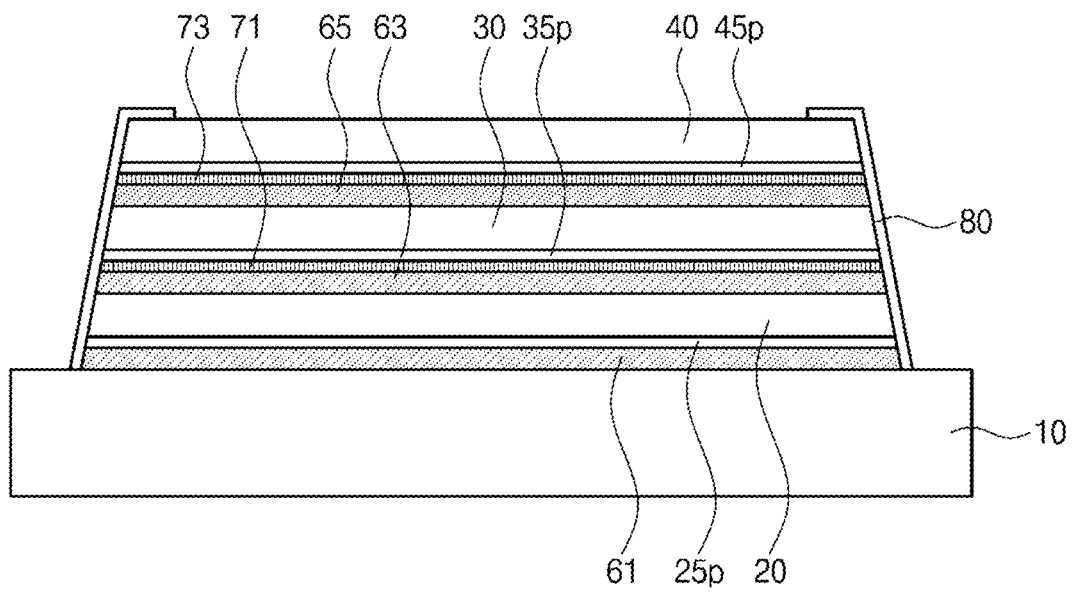
FIG. 3 is a cross-view of a light emitting stacked structure according to an exemplary embodiment.

FIG. 3 is a cross-sectional view of a light emitting stacked structure including a predetermined wavelength pass filter according to an exemplary embodiment. In FIG. 3, some components shown in FIGS. 1 and 2 are omitted.

Referring to FIG. 3, a light emitting stacked structure according to an exemplary embodiment includes a first wavelength pass filter 71 disposed between the first epitaxial stack 20 and the second epitaxial stack 30.

The first may selectively transmit a certain wavelength light. In particular, the first wavelength pass filter 71 may transmit a first color light emitted from the first epitaxial stack 20 while block or reflect light other than the first color light. Accordingly, the first color light emitted from the first epitaxial stack 20 may travel in an upper direction, while the second and third color light emitted from the second and third epitaxial stacks 30 and 40 are blocked from traveling toward the first epitaxial stack 20 and be reflected or blocked by the first wavelength pass filter 71.

The second and third color light may be high-energy light, which have a relatively shorter wavelength than the first color light. As such, when entering the first epitaxial stack 20, the second and third color light may induce additional light emission in the first epitaxial stack 20. In an exemplary embodiment, however, the second and the third color light are blocked from entering the first epitaxial stack 20 by the first wavelength pass filter 71.

In an exemplary embodiment, a second wavelength pass filter 73 may also be provided between the second epitaxial stack 30 and the third epitaxial stack 40. The second wavelength pass filter 73 transmits the first color light and the second color light emitted from the first and second epitaxial stacks 20 and 30, while blocking or reflecting light other than the first and second color light. Accordingly, the first and second color light emitted from the first and second epitaxial stacks 20 and 30 may travel in the upper direction, while the third color light emitted from the third epitaxial stack 40 is not allowed to travel in a direction toward the first and second epitaxial stacks 20 and 30, but reflected or blocked by the second wavelength pass filter 73.

As described above, the third color light may be a relatively high-energy light which has a shorter wavelength than the first and second color light. As such, when entering the first and second epitaxial stacks 20 and 30, the third color light may induce additional emission in the first and second epitaxial stacks 20 and 30. In the exemplary embodiment, however, the second wavelength pass filter 73 prevents the third light from entering the first and second epitaxial stacks 20 and 30.

The first and second wavelength pass filters 71 and 73 may be formed in various shapes, but may be formed by alternately stacking insulating films having different refractive indices. For example, the wavelength of transmitted light may be determined by alternately stacking $SiO_2$ and $TiO_2$, and adjusting the thickness and number of stacking of $SiO_2$ and $TiO_2$. The insulating films having different refractive indices may include $SiO_2$, $TiO_2$, $HfO_2$, $Nb_2O_5$, $ZrO_2$, $Ta_2O_5$, or the like.

In an exemplary embodiment, the first to third p-type contact electrodes 25p, 35p, and 45p, the first to third adhesive layers 61, 63, and 65, and the first and second wavelength pass filters 71 and 73 may be patterned together in the same step of patterning one of the first to third epitaxial stacks 20, 30 and 40, or alternatively, may be patterned in a separate step. For example, the above layers may be inclined at substantially the same or similar angle as the first to third epitaxial stacks 20, 30, and 40. FIG. 3 shows that the first to third p-type contact electrodes 25p, 35p, and 45p, the first to third adhesive layers 61, 63, and 65, and the first and second wavelength pass filters 71 and 73 are patterned at the same angle as the first to third epitaxial stacks 20, 30 and 40. However, the inventive concepts are not limited thereto, and the inclination angles of the first to third p-type contact electrodes 25p, 35p, and 45p, the first to third adhesive layers 61, 63, and 65 and the first and second wavelength pass filters 71 and 73 may be formed differently from that of the first to third epitaxial stacks 20, 30, and 40, depending on the materials, conditions for patterning process, or the like of each of the first to third p-type contact electrodes 25p, 35p, and 45p, the first to third adhesive layers 61, 63, and 65, and the first and second wavelength pass filters 71 and 73.

The light emitting stacked structure according to an exemplary embodiment may additionally employ various components to provide uniform light of high efficiency. For example, a light emitting stacked structure according to an exemplary embodiment may have various irregularities on the light exit surface. For example, a light emitting stacked structure according to an exemplary embodiment may have irregularities formed on an upper surface of at least one n-type semiconductor layer of the first to third epitaxial stacks 20, 30, and 40.

The irregularities of each of the epitaxial stacks may be selectively formed. For example, irregularities may be provided on the first epitaxial stack 20, and irregularities may be provided on the first and third epitaxial stacks 20 and 40, and irregularities may be provided on the first to third epitaxial stacks 20, 30 and 40. The irregularities of each of the epitaxial stacks may be provided on an n-type semiconductor layer corresponding to the emission surface of each of the epitaxial stacks.

The irregularities formed on the epitaxial stacks may increase light emission efficiency, and may be provided in various forms such as a polygonal pyramid, a hemisphere, or planes with a surface roughness in a random arrangement. The irregularities may be textured through various etching processes or may be formed using a patterned sapphire substrate.

In an exemplary embodiment, the first to third color light from the first to third epitaxial stacks 20, 30, and 40 may have different light intensities, and this difference in intensity may lead to differences in visibility. For example, the light emission efficiency may be improved by selectively forming irregularities on the light exit surface of the first to third epitaxial stacks 20, 30 and 40, which results in reduction of the visibility differences between the first to third color light. The color light corresponding to red and/or blue color may have lower visibility than the green color, in which case the first epitaxial stack 20 and/or the third epitaxial stack 40 may be textured to decrease the difference of visibility. Particularly, in the case of red color light, since light may be provided from the lowermost of the light emitting stacks, light intensity may be small, and light efficiency may be increased by forming irregularities on the upper surface thereof.

The light emitting stacked structure having the structure described above may be capable of expressing various colors, and thus may be employed as a pixel in a display device. In the following exemplary embodiments, a display device will be described as including the light emitting stacked structure described above.

Figure 4:
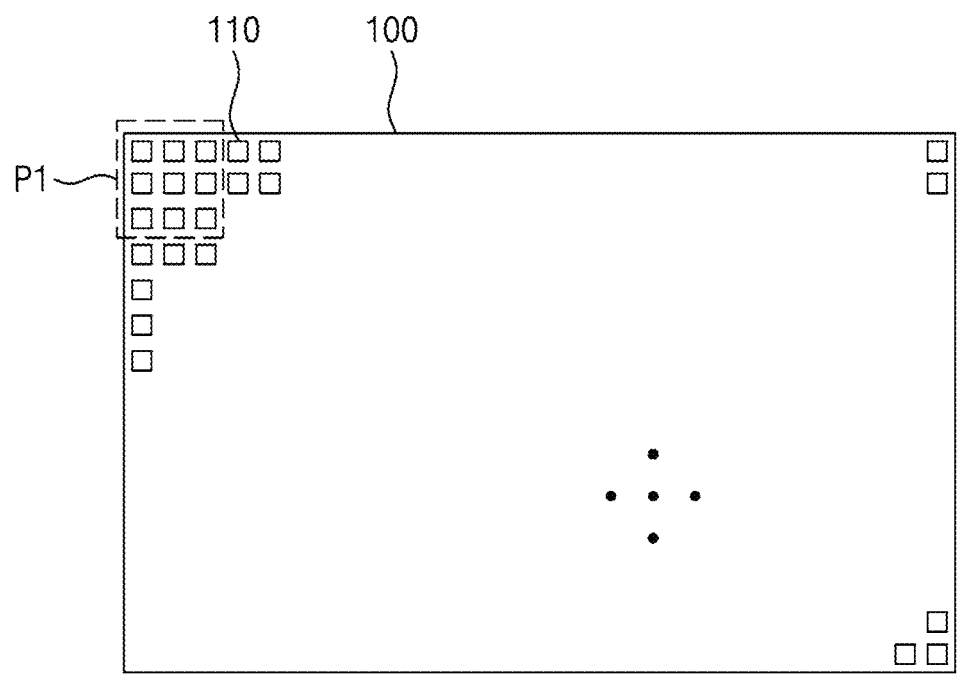
FIG. 4 is a plan view of a display device according to an exemplary embodiment.
Figure 5:
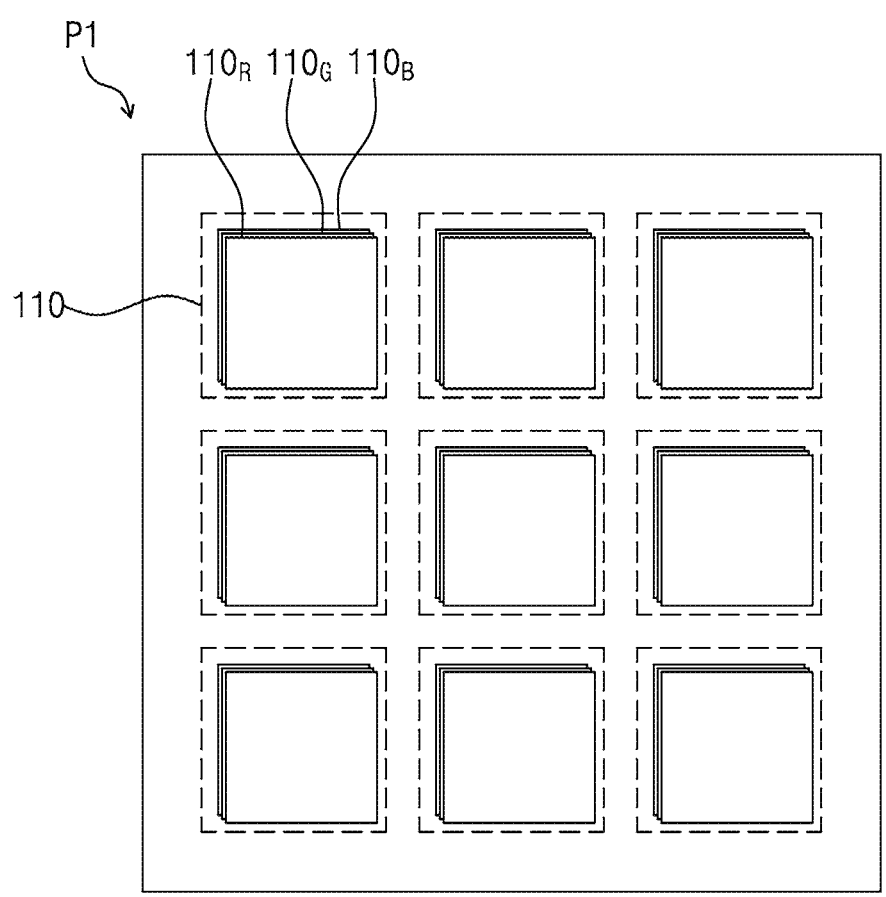
FIG. 5 is an enlarged plan view of portion P1 of FIG. 4.

FIG. 4 is a plan view of a display device according to an exemplary embodiment, and FIG. 5 is an enlarged plan view illustrating portion P1 of FIG. 4.

Referring to FIGS. 4 and 5, the display device 100 according to an exemplary embodiment may displays any visual information such as text, video, photographs, two or three-dimensional images, or the like.

The display device 100 may have various shapes including a closed polygon that includes a straight side, such as a rectangle, or a circle, an ellipse, or the like, or that includes a curved side, or a semi-circle or semi-ellipse that includes a combination of straight and curved sides. In an exemplary embodiment, the display device will be described as having substantially a rectangular shape.

The display device 100 has a plurality of pixels 110 for displaying images. Each of the pixels 110 may be a minimum unit for displaying an image. Each pixel 110 includes the light emitting stacked structure having the structure described above, and may emit white light and/or color light.

In an exemplary embodiment, each pixel includes a first pixel $110_R$ that emits red light, a second pixel $110_G$ that emits green light, and a third pixel $110_B$ that emits blue light. The first to third pixels $110_R$, $110_G$, and $110_B$ may correspond to the first to third epitaxial stacks 20, 30, and 40 of the light emitting stacked structure described above, respectively.

The pixels 110 are arranged in a matrix. As used herein, pixels having a matrix arrangement may refer to that the pixels are arranged in a line along the row or column, or that the pixels 110 are arranged generally along the rows and columns, with certain modifications in details, such as the pixels 110 being arranged in a zigzag shape, for example.

Figure 6:
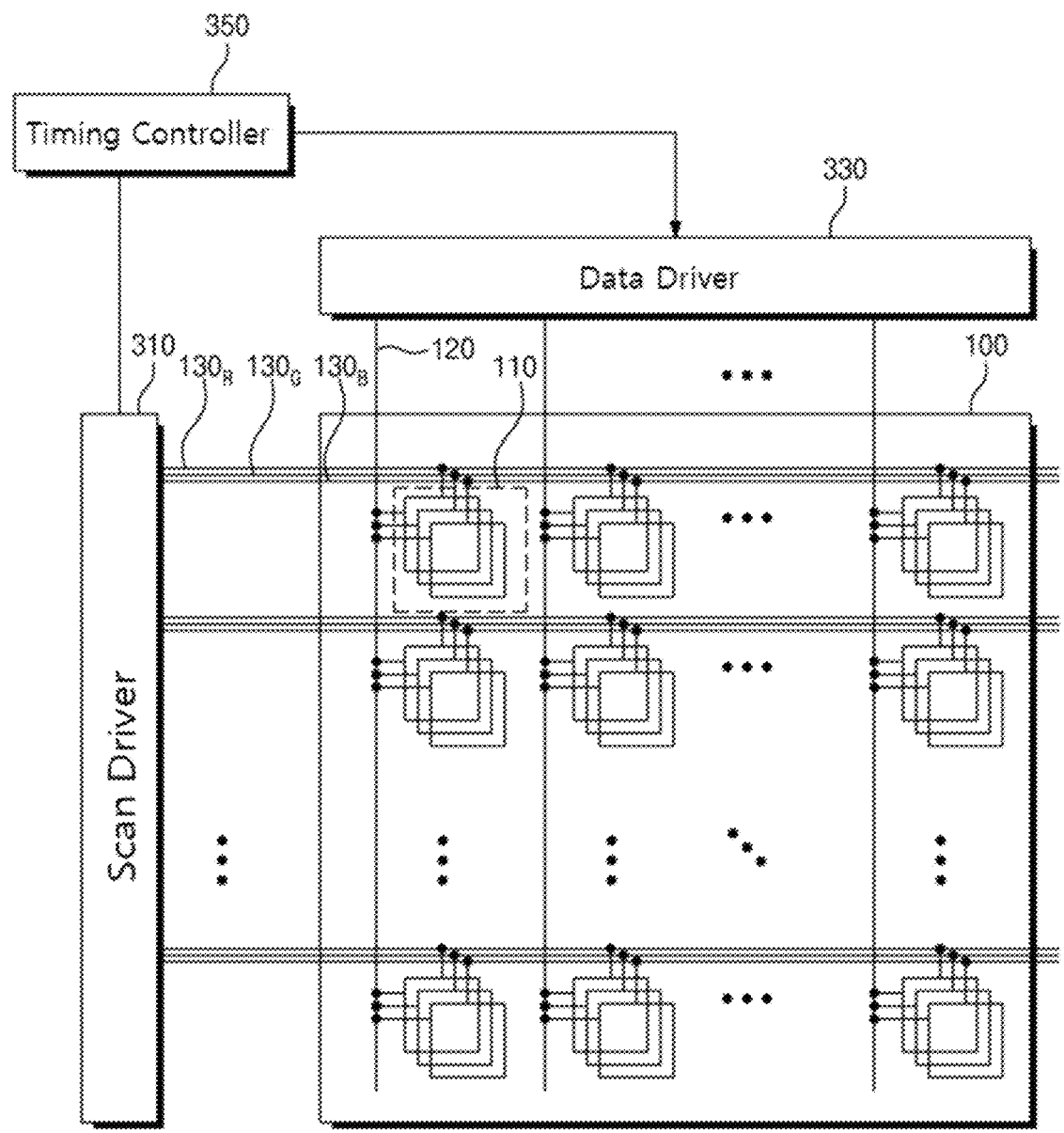
FIG. 6 is a structural diagram of a display device according to an exemplary embodiment.

FIG. 6 is a structural diagram of a display device according to an exemplary embodiment.

Referring to FIG. 6, a display device 100 according to an exemplary embodiment includes a timing controller 350, a scan driver 310, a data driver 330, a wiring part, and pixels. Each of the pixels may be individually connected to the scan driver 310, the data driver 330, or the like through a wiring part.

The timing controller 350 receives various control signals and image data necessary for driving a display device from outside (e.g., from a system for transmitting image data). The timing controller 350 rearranges the received image data and transmits the image data to the data driver 330. In addition, the timing controller 350 generates scan control signals and data control signals necessary for driving the scan driver 310 and the data driver 330, and outputs the generated scan control signals and data control signals to the scan driver 310 and the data driver 330.

The scan driver 310 receives scan control signals from the timing controller 350 and generates corresponding scan signals. The data driver 330 receives data control signals and image data from the timing controller 350 and generates corresponding data signals.

The wiring part includes a plurality of signal lines. The wiring part specifically includes scan lines 130 connecting the scan driver 310 and the pixels, and data lines 120 connecting the data driver 330 and the pixels. The scan lines 130 may be connected to respective pixels, and accordingly, the scan lines 130 that correspond to the respective pixels are indicated as first to third scan lines $130_R$, $130_G$, and $130_B$ (hereinafter, collectively referred to as '130').

In addition, the wiring part further includes lines connecting between the timing controller 350 and the scan driver 310, the timing controller 350 and the data driver 330, or other components, and transmitting the signals.

The scan lines 130 provide the scan signals generated from the scan driver 310 to pixels. The data signals generated at the data driver 330 is outputted to the data lines 120.

The pixels are connected to the scan lines 130 and data lines 120. The pixels selectively emit light in response to the data signals provided from the data lines 120 when the scan signals are supplied from scan lines 130. For example, during each frame period, each of the pixels emits light with the luminance corresponding to the input data signals. The pixels supplied with data signals corresponding to black luminance may display black by emitting no light during the corresponding frame period.

In an exemplary embodiment, the pixels may be driven as either passive or active type. When the display device is driven as the active type, the display device may be supplied with the first and second pixel powers in addition to the scan signals and the data signals.

Figure 7:
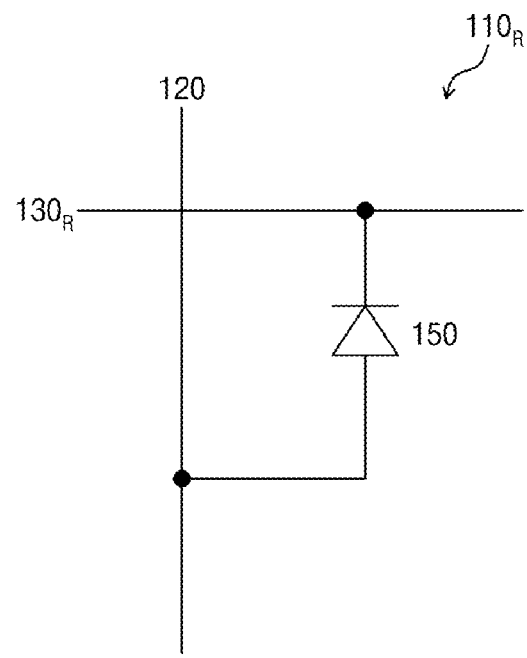
FIG. 7 is a circuit diagram of one pixel of a passive type display device according to an exemplary embodiment.

FIG. 7 is a circuit diagram of one pixel in a passive type display device. The pixel may be one of the pixels, for example, one of R, G, B pixels, and FIG. 7 shows the first pixel $110_R$ as an example. Since the second and third pixels may be driven in substantially the same manner as the first pixel, the circuit diagrams for the second and third pixels will be omitted to avoid redundancy.

Referring to FIG. 7, a first pixel $110_R$ includes a light emitting element 150 connected between a scan line 130 and a data line 120. The light emitting element 150 may correspond to the first epitaxial stack 20. The first epitaxial stack 20 emits light with a luminance corresponding to the magnitude of the applied voltage when a voltage equal to or higher than a threshold voltage is applied between the p-type semiconductor layer and the n-type semiconductor layer. In particular, the emission of the first pixel $110_8$ may be controlled by controlling the voltages of the scan signal applied to the first scan line $130_R$ and/or the data signal applied to the data line 120.

Figure 8:
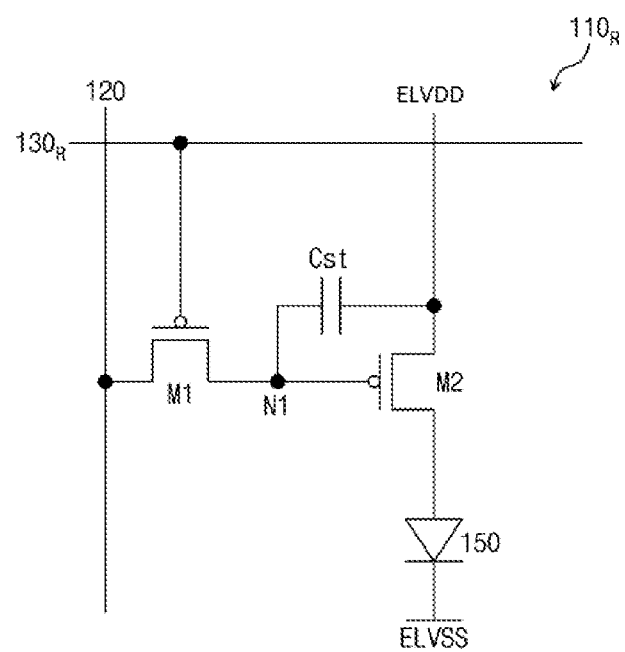
FIG. 8 is a circuit diagram of one pixel of an active type display device according to an exemplary embodiment.

FIG. 8 is a circuit diagram illustrating a first pixel of an active type display device.

When the display device is the active type, the first pixel $110_8$ may be further supplied with the first and second pixel powers (ELVDD and ELVSS) in addition to the scan signal and the data signal.

Referring to FIG. 8, the first pixel $110_R$ includes a light emitting element 150 and a transistor part connected thereto.

The light emitting element 150 corresponds to the first epitaxial stack 20, and the p-type semiconductor layer of the light emitting element 150 may be connected to the first pixel power ELVDD via the transistor part, and the n-type semiconductor layer may be connected to a second pixel power ELVSS. The first pixel power ELVDD and the second pixel power ELVSS may have different potentials from each other. For example, the second pixel power ELVSS may have potential lower than that of the first pixel power ELVDD, by at least the threshold voltage of the light emitting element 150. Each of these light emitting elements 150 emits light with a luminance corresponding to the driving current controlled by the transistor part.

According to an exemplary embodiment, the transistor part includes first and second transistors M1 and M2 and a storage capacitor Cst. However, the inventive concepts are not limited, and the circuit configuration of a pixel may be variously modified.

The source electrode of the first transistor M1 (e.g., switching transistor) is connected to the data line 120, and the drain electrode is connected to the first node N1. Further, the gate electrode of the first transistor M1 is connected to the first scan line $130_R$. The first transistor M1 may be turned on when a scan signal having a voltage capable of turning on the first transistor M1 is supplied from the first scan line $130_R$ to the data line 120, to electrically connect the first node N1. For example, the data signal of the corresponding frame is supplied to the data line 120, and accordingly, the data signal is transmitted to the first node N1. The data signal transmitted to the first node N1 is charged in the storage capacitor Cst.

The source electrode of the second transistor M2 is connected to the first pixel power ELVDD and the drain electrode is connected to the n-type semiconductor layer of the light emitting element 150. The gate electrode of the second transistor M2 is connected to the first node N1. The second transistor M2 controls an amount of driving current supplied to the light emitting element 150 to correspond to the voltage of the first node N1.

One electrode of the storage capacitor Cst is connected to the first pixel power ELVDD, and the other electrode is connected to the first node N1. The storage capacitor Cst charges the voltage corresponding to the data signal supplied to the first node N1 and maintains the charged voltage until the data signal of the next frame is supplied.

FIG. 8 shows a transistor part including two transistors, however, the inventive concepts are not limited thereto, and various modifications may be applicable to the structure of the transistor part. For example, the transistor part may include more transistors, capacitors, or the like each having various structures.

The pixels may be implemented in various structures within the scope of the inventive concepts. Hereinafter, a pixel will be described as having a passive matrix type pixel.

Figure 9:
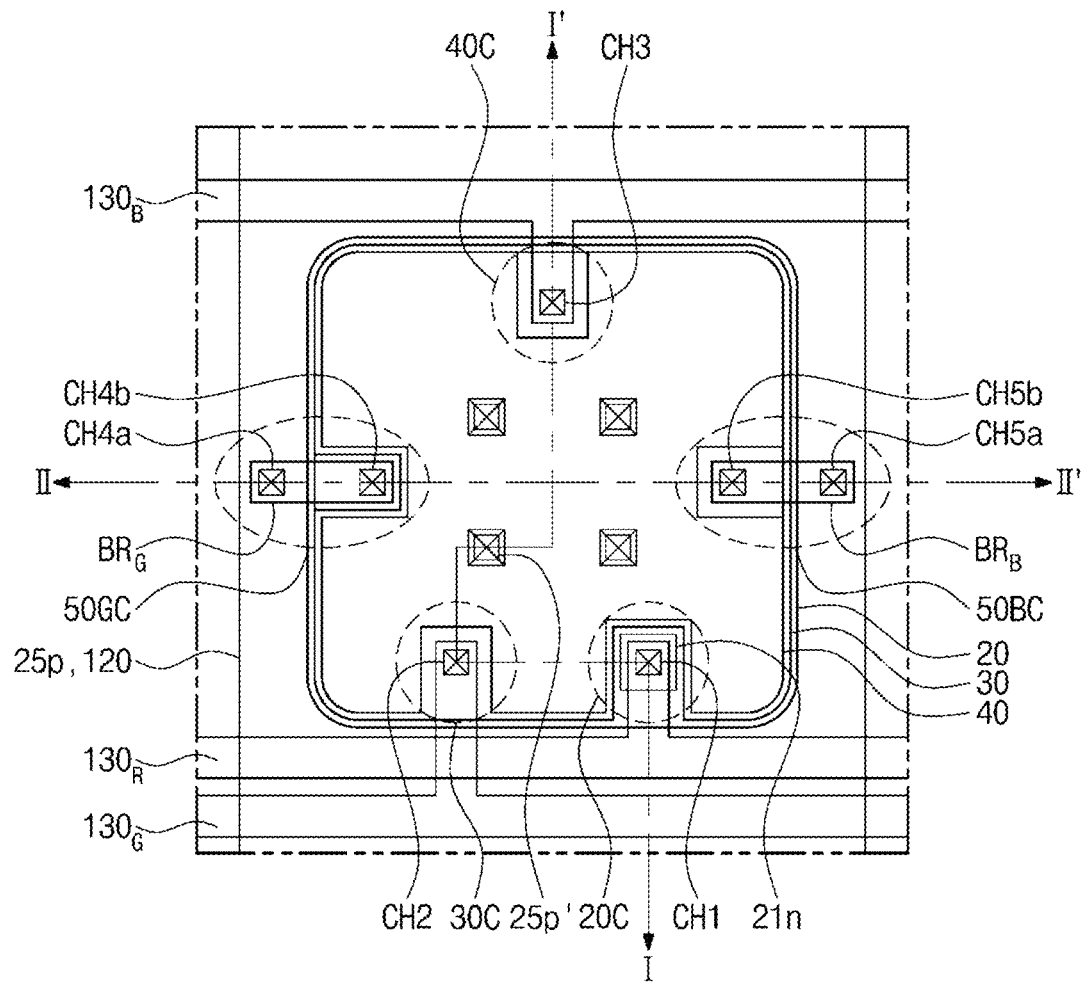
FIG. 9 is a plan view of a pixel according to an exemplary embodiment.
Figure 10A:
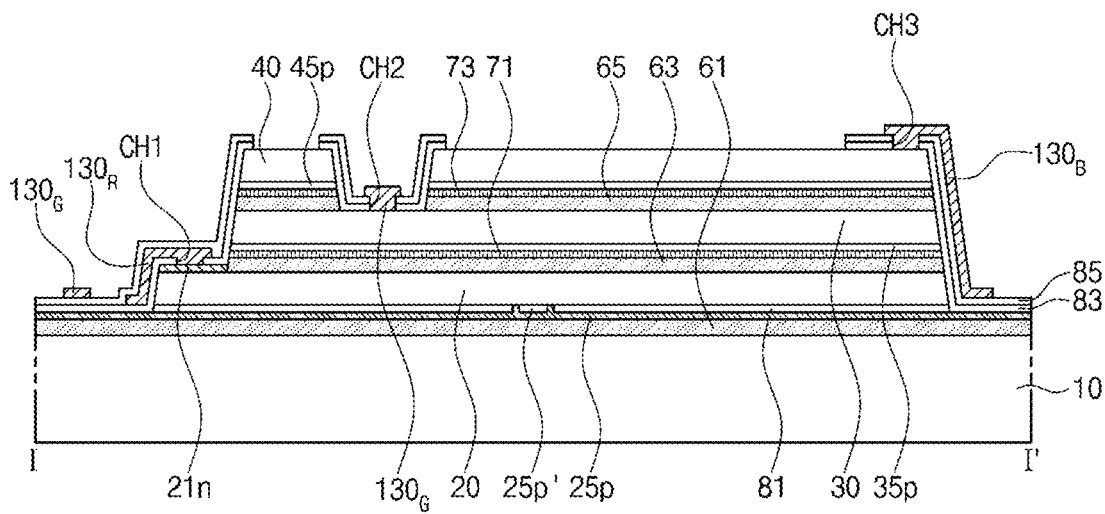
FIG. 10A and FIG. 10B are cross-sectional views taken along lines I-I' and II-II' in FIG. 10, respectively.
Figure 10B:
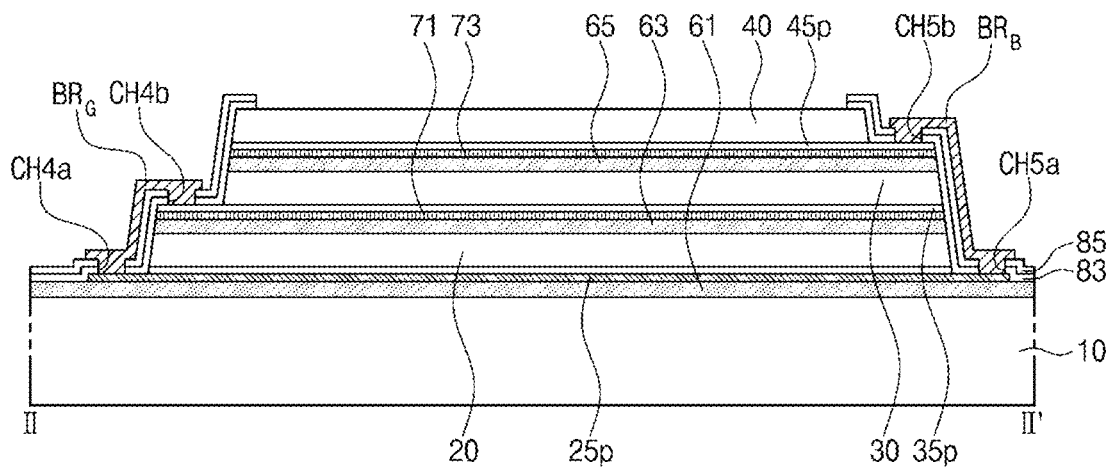

FIG. 9 is a plan view of a pixel according to an exemplary embodiment, and FIGS. 10A and 10B are cross-sectional views taken along lines I-I' and of FIG. 9, respectively.

Referring to FIGS. 9, 10A and 10B, a pixel according to an exemplary embodiment a light emitting region in which a plurality of epitaxial stacks are stacked, and a peripheral region surrounding the light emitting region. The plurality of epitaxial stacks may include first to third epitaxial stacks 20, 30, and 40.

The pixel according to an exemplary embodiment has a light emitting region in which a plurality of epitaxial stacks are stacked. At least one side of the light emitting region is provided with a contact for connecting the wiring part to the first to third epitaxial stacks 20, 30, and 40. The contact includes first and second common contacts 50GC and 50BC for applying a common voltage to the first to third epitaxial stacks 20, 30, and 40, a first contact 20C for providing a light emitting signal to the first epitaxial stack 20, a second contact 30C for providing a light emitting signal to the second epitaxial stack 30, and a third contact 40C for providing a light emitting signal to the third epitaxial stack 40.

In an exemplary embodiment, the stacked structure may vary depending on the polarity of the semiconductor layers of the first to third epitaxial stacks 20, 30m and 40 to which the common voltage is applied. Hereinafter, the stacked structure will be described as being applied with a common voltage to a p-type semiconductor layer. In particular, the first to third common contact electrodes will be described as corresponding to the first to third p-type contact electrodes, respectively.

In an exemplary embodiment, the first and second common contacts 50GC and 50BC, and the first to third contacts 20C, 30C, and 40C may be provided at various positions. For example, when the light emitting stacked structure has substantially a square shape, the first and second common contacts 50GC and 50BC, and the first to third contacts 20C, 30C, and 40C may be disposed in regions corresponding to respective dies of the square in a plan view. However, the positions of the first and second common contacts 50GC and 50BC and the first to third contacts 20C, 30C and 40C are not limited thereto, and various modifications are applicable according to the shape of the light emitting stacked structure.

The plurality of epitaxial stacks includes first to third epitaxial stacks 20, 30, and 40. The first to third epitaxial stacks 20, 30, and 40 are connected with first to third light emitting signal lines for providing light emitting signals to each of the first to third epitaxial stacks 20, 30, and 40, and common line for providing a common voltage to each of the first to third epitaxial stacks 20, 30, and 40. The first to third light emitting signal lines may correspond to the first to third scan lines $130_R$, $130_G$, and $130_B$, and the common line may correspond to the data line 120. Accordingly, the first to third scan lines $130_R$, $130_G$, and $130_E$ and the data line 120 are connected to the first to third epitaxial stacks 20, 30, and 40, respectively.

Referring to FIG. 9, the first to third scan lines $130_R$, $130_G$, and $130_E$ may extend in a first direction (e.g., in a horizontal direction). The data line 120 may extend in a second direction intersecting with the first to third scan lines $130_R$, $130_G$, and $130_E$ (e.g., in a vertical direction). However, the extending directions of the first to third scan lines $130_R$, $130_G$, and $130_E$ and the data line 120 are not limited thereto, and various modifications are applicable according to the arrangement of the pixels.

The data line 120 and the first p-type contact electrode 25p may extend in a second direction intersecting the first direction, while concurrently providing a common voltage to the p-type semiconductor layer of the first epitaxial stack 20. Accordingly, the data line 120 and the first p-type contact electrode 25p may be substantially the same component. Hereinafter, the first p-type contact electrode 25p may be referred to as the data line 120, or vice versa.

An ohmic electrode 25p' for ohmic contact between the first p-type contact electrode 25p and the first epitaxial stack 20 is provided on the light emitting region provided with the first p-type contact electrode 25p. A plurality of ohmic electrodes 25p' may be provided. The ohmic electrode 25p' is provided for ohmic contact, and may include a variety of materials. For example, the ohmic electrode 25p' corresponding to the p-type ohmic electrode 25p' may include an Au/Zn alloy or an Au/Be alloy. In this case, since the material of the ohmic electrode 25p' has lower reflectivity than Ag, Al, Au, or the like, additional reflective electrodes may be further disposed. As an additional reflective electrode, Ag, Au, or the like may be used, and Ti, Ni, Cr, Ta, or the like may be disposed as a buffer layer for adhesion to adjacent components. In this case, the buffer layer may be thinly deposited on the upper and lower surfaces of the reflective electrode including Ag, Au, or the like.

The first scan line $130_R$ is connected to the first epitaxial stack 20 through the first contact hole CH1, and the data line 120 is connected via the ohmic electrode 25p'. The second scan line $130_G$ is connected to the second epitaxial stack 30 through the second contact hole CH2, and the data line 120 is connected through the $4a^{th}$ and $4b^{th}$ contact holes CH4a and CH4b. The third scan line $130_B$ is connected to the third epitaxial stack 40 through the third contact hole CH3, and the data line 120 is connected through the $5a^{th}$ and $5b^{th}$ contact holes CH5a and CH5b.

An adhesive layer, a contact electrode, a wavelength pass filter, or the like are provided between the substrate 10 and the first to third epitaxial stacks 20, 30 and 40, respectively. Hereinafter, a pixel according to an exemplary embodiment will be described with reference to an order of stacking.

According to the exemplary embodiment, a first epitaxial stack 20 is provided on the substrate 10 with an adhesive layer 61 interposed therebetween. The first epitaxial stack 20 may include a p-type semiconductor layer, an active layer, and an n-type semiconductor layer disposed in sequence from lower to upper sides.

An insulating film 81 is stacked on a lower surface of the first epitaxial stack 20 to face the substrate 10. The insulating film 81 formed on the lower surface of the first epitaxial stack 20 may include a material that transmits or absorbs light. A plurality of contact holes are formed in the insulating film 81. The contact holes are provided with an ohmic electrode 25p' in contact with the p-type semiconductor layer of the first epitaxial stack 20. The ohmic electrode 25p' may include a variety of materials. The first p-type contact electrode 25p and the data line 120 are in contact with the ohmic electrode 25p'. The first p-type contact electrode 25p (also serving as the data line 120) is provided between the insulating film 81 and the adhesive layer 61.

When viewed from plan view, the first p-type contact electrode 25p may be provided in a form such that the first p-type contact electrode 25p overlaps the first epitaxial stack 20, or more particularly, overlaps the light emitting region of the first epitaxial stack 20, while covering most, or all of the light emitting region. The first p-type contact electrode 25p may include a reflective material so that the first p-type contact electrode 25p may reflect light from the first epitaxial stack 20. The insulating film 81 may also be formed to have a reflective property to facilitate the reflection of light from the first epitaxial stack 20. For example, the insulating film 81 may have an omni-directional reflector (ODR) structure.

The material of the first p-type contact electrode layer 25p is selected from metals having high reflectivity to light emitted from the first epitaxial stack 20, to maximize the reflectivity of light emitted from the first epitaxial stack 20. For example, when the first epitaxial stack 20 emits red light, a metal having a high reflectivity to red light, for example, Au, Al, Ag, or the like may be used as the material of the first p-type contact electrode layer 25p. Au does not have a high reflectivity to light emitted from the second and third epitaxial stacks 30 and 40 (e.g., green light and blue light), and thus, can reduce a mixture of colors by light emitted from the second and third epitaxial stacks 30 and 40.

The first n-type contact electrode 21n is provided on an upper surface of the first epitaxial stack 20. In an exemplary embodiment, the first n-type contact electrode 21n may include various metals and metal alloys, including Au/Te alloy or Au/Ge alloy, for example.

The first n-type contact electrode 21n is provided in a region corresponding to the first contact 20C and may include a conductive material.

The second adhesive layer 63 is provided on the first epitaxial stack 20. The first wavelength path filter 71, the second p-type contact electrode 35p, and the second epitaxial stack 30 are sequentially provided on the second adhesive layer 63. The second epitaxial stack 30 may include an n-type semiconductor layer, an active layer, and a p-type semiconductor layer sequentially disposed from lower to upper sides.

The first wavelength pass filter 71 is provided on the upper surface of the first epitaxial stack 20 to cover substantially all the light emitting region of the first epitaxial stack 20.

In an exemplary embodiment, the region corresponding to the first contact 20C of the second epitaxial stack 30 is removed, thereby exposing a portion of the upper surface of the first n-type contact electrode 21n. In addition, the second epitaxial stack 30 may have a smaller area than the second p-type contact electrode 35p. The region corresponding to the first common contact 50GC is removed from the second epitaxial stack 30, thereby exposing a portion of the upper surface of the second p-type contact electrode 35p.

The third adhesive layer 65 is provided on the second epitaxial stack 30. The second wavelength path filter 73 and the third p-type contact electrode 45p are sequentially provided on the third adhesive layer 65. The third epitaxial stack 40 is provided on the third p-type contact electrode 45p. The third epitaxial stack 40 may include a p-type semiconductor layer, an active layer, and an n-type semiconductor layer sequentially stacked from lower to upper sides.

The third epitaxial stack 40 may have a smaller area than the second epitaxial stack 30. The third epitaxial stack 40 may have a smaller area than the third p-type contact electrode 45p. The region corresponding to the second common contact 50BC is removed from the third epitaxial stack 40, thereby exposing a portion of the upper surface of the third p-type contact electrode 45p.

The first optically non-transmissive film 83 covering the stacked structure of the first to third epitaxial stacks 20, 30, and 40 is provided on portions of the sides and the upper surfaces of the first to third epitaxial stacks 20, 30, and 40. The first optically non-transmissive film 83 may include various organic/inorganic insulating materials, and is not limited thereto. For example, the first optically non-transmissive film 83 may be a DBR or an organic polymer film having a black color. In an exemplary embodiment, a floating metal reflective film may further be provided on the first optically non-transmissive film 83. In an exemplary embodiment, the optically non-transmissive film may be formed by depositing two or more insulating films having refractive indices different from each other.

The first contact hole CH1 is formed in the first optically non-transmissive film 83 to expose an upper surface of the first n-type contact electrode 21n provided in the first contact 20C.

A first scan line $130_R$ is provided on the first optically non-transmissive film 83. The first scan line $130_R$ is connected to the first n-type contact electrode 21n through the first contact hole CH1.

A second optically non-transmissive film 85 is provided on the first optically non-transmissive film 83. The second optically non-transmissive film 85 is also provided on portions of the sides and the upper surfaces of the first to third epitaxial stacks 20, 30, and 40, covering the stacked structure of the first to third epitaxial stacks 20, 30, and 40. The second optically non-transmissive film 85 may include substantially the same or different materials from the first optically non-transmissive film 83. The second optically non-transmissive film 85 may also be a DBR or an organic polymer film having a black color. In an exemplary embodiment, a floating metal reflective film may further be provided on the second optically non-transmissive film 85. In an exemplary embodiment, the optically non-transmissive film may be formed by depositing two or more insulating films having different refractive indices from each other.

The second and third scan lines $130_G$ and $130_B$ and the first and second bridge electrodes $BR_G$ and $BR_B$ are provided on the second optically non-transmissive film 85. The second optically non-transmissive film 85 is provided with a second contact hole CH2 for exposing an upper surface of the second epitaxial stack 30 at the second contact 30C, that is, exposing the n-type semiconductor layer of the second epitaxial stack 30, a third contact hole CH3 for exposing an upper surface of the third epitaxial stack 40 at the third contact 40C, that is, exposing an n-type semiconductor layer of the third epitaxial stack 40, $4a^{th}$ and $4b^{th}$ contact holes CH4a and CH4b for exposing an upper surface of the first p-type contact electrode 25p and an upper surface of the second p-type contact electrode 35p, at the first common contact 50GC, and $5a^{th}$ and $5b^{th}$ contact holes CH5a and CH5b for exposing an upper surface of the first p-type contact electrode 25p and an upper surface of the third p-type contact electrode 45p, at the second common contact 50BC.

The second scan line $130_G$ is connected to the n-type semiconductor layer of the second epitaxial stack 30 through the second contact hole CH2. The third scan line $130_B$ is connected to the n-type semiconductor layer of the third epitaxial stack 40 through the third contact hole CH3. The data line 120 is connected to the second p-type contact electrode 35p through the $4a^{th}$ and $4b^{th}$ contact holes CH4a and CH4b and the first bridge electrode $BR_G$. The data line 120 is also connected to the third p-type contact electrode 45p through the $5a^{th}$ and $5b^{th}$ contact holes CH5a and CH5b and the second bridge electrode $BR_B$.

FIGS. 9 to 10B show that the second and third scan lines $130_G$ and $130_E$ are electrically connected to the n-type semiconductor layer of the second and third epitaxial stacks 30 and 40 in direct contact with each other. However, the inventive concepts are not limited thereto, the second and third n-type contact electrodes may be further provided between the second and third scan lines $130_G$ and $130_E$ and the n-type semiconductor layers of the second and third epitaxial stacks 30 and 40.

Irregularities may be selectively provided on the upper surfaces of the first to third epitaxial stacks 20, 30, and 40, that is, on the upper surfaces of the first to third epitaxial stacks 20, 30, and 40. Each of the irregularities may be provided only at a portion corresponding to the light emitting region, or may be provided over substantially the entire upper surface of the respective semiconductor layers.

In an exemplary embodiment, the first and second optically non-transmissive films 83 and 85 may completely cover the sides of the first to third epitaxial stacks 20, 30, and 40. The first and second optically non-transmissive films 83 and 85 may cover a portion of the upper surface of the third epitaxial stack 40. Accordingly, the first and second optically non-transmissive films 83 and 85 are not provided in the light emitting region so that light emitted from the first to third epitaxial stacks may travel in upper direction.

In addition, in an exemplary embodiment, a metal-based additional optically non-transmissive film may be further provided on the sides of the first and/or second optically non-transmissive films 83 and 85 that correspond to the sides of the pixels. The additional optically non-transmissive film is an additional light blocking film that includes a light absorbing or reflective material, which is provided to prevent the light from the first to third epitaxial stacks 20, 30, and 40 from emerging through the sides of the pixels.

In an exemplary embodiment, the additional optically non-transmissive film may be formed as a single or multi-layered metal. For example, the additional optically non-transmissive film may be formed of a variety of materials including metals such as Al, Ti, Cr, Ni, Au, Ag, Ti, Sn, Ni, Cr, W, Cu, or others, or alloys thereof. The additional optically non-transmissive film may be provided on the sides of the first and/or second insulating films 83 and 85 as a separate layer formed of a material, such as metal or alloy thereof.

The additional optically non-transmissive film may be formed separately from the first to third scan lines $130_R$, $130_G$, and $130_B$ and the first and second bridge electrodes $BR_G$ and $BR_B$, on the same layer and using substantially the same material during the same process of forming at least one of the first to third scan lines $130_R$, $130_G$, and $130_E$ and the first and second bridge electrodes $BR_G$ and $BR_B$. In this case, the optically non-transmissive film may be electrically insulated from the first to third scan lines $130_R$, $130_G$, and $130_E$ and the first and second bridge electrodes $BR_G$ and $BR_B$.

In an exemplary embodiment, the additional optically non-transmissive film may be provided in such a form that is laterally extending from at least one of the first to third scan lines $130_R$, $130_G$ and $130_E$ and the first and second bridge electrodes $BR_G$ and $BR_B$. In this case, the optically non-transmissive film extending from one of the first to third scan lines $130_R$, $130_G$, and $130_E$ and the first and second bridge electrodes $BR_G$ and $BR_B$ may not be electrically connected to other conductive components.

The pixel having the structure described above may be manufactured by stacking the first to third epitaxial stacks 20, 30, and 40 on the substrate 10 sequentially and patterning the same, which will be described in detail below with reference to the drawings.

FIGS. 11 to 21 are plan views sequentially showing a method of manufacturing a pixel on a substrate. FIGS. 12A and 12B to 22A and 22B are cross-sectional views taken along line I-I' and line II-IF of corresponding figures, such as FIGS. 11 and 21, respectively.

Figure 11:
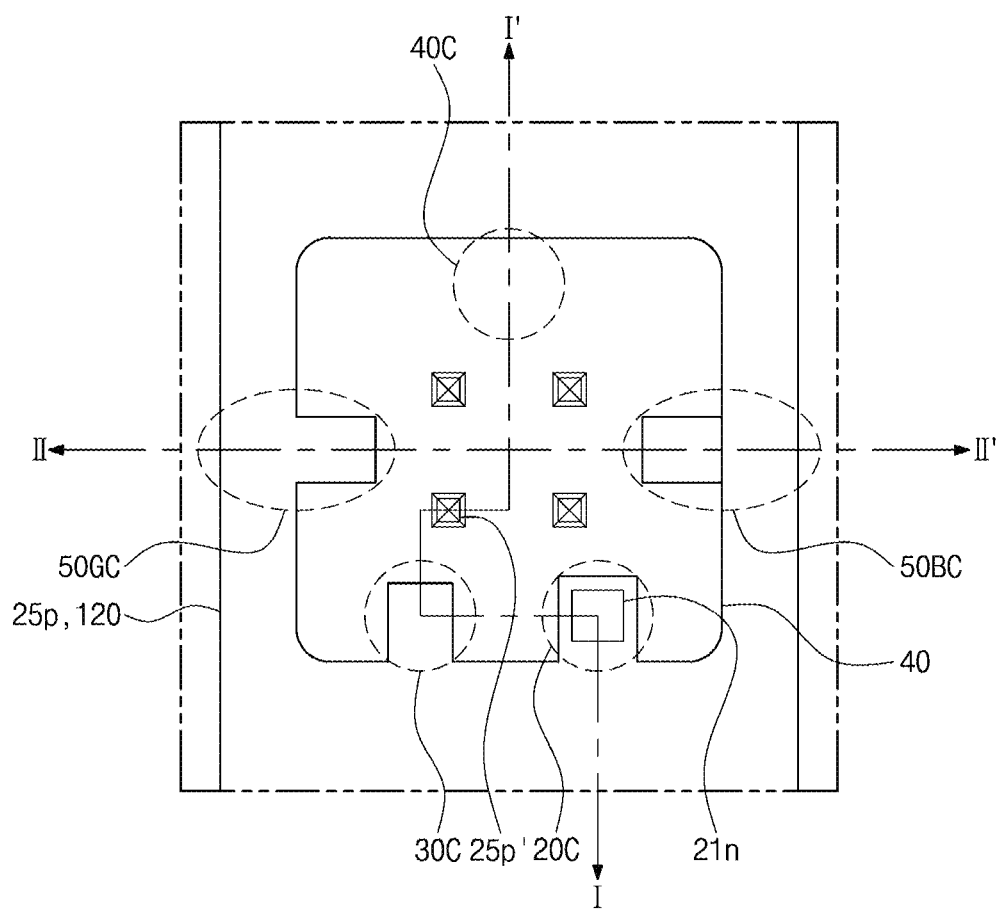
FIG. 11, FIG. 13, FIG. 15, FIG. 17, FIG. 19, FIG. 21 are plan views illustrating a method of manufacturing a pixel on a substrate according to an exemplary embodiment.
Figure 12A:
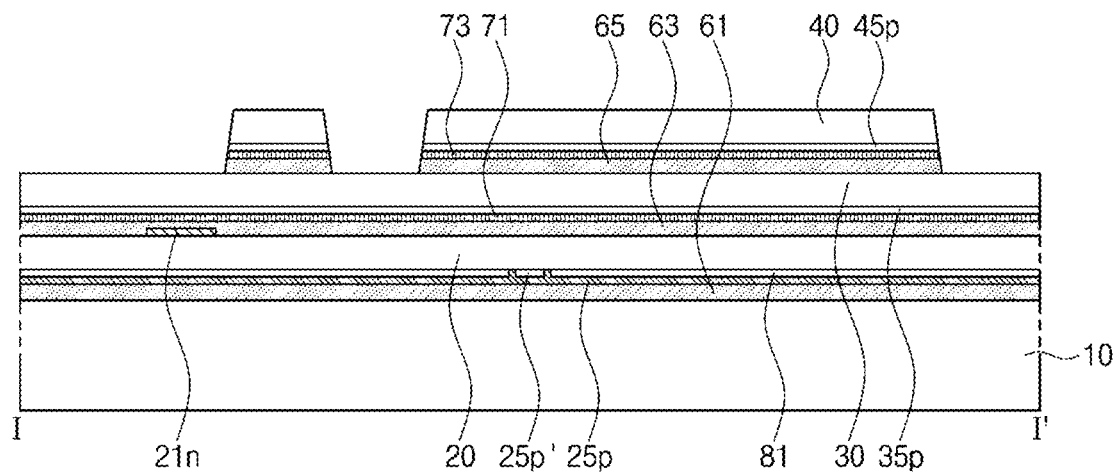
FIG. 12A and FIG. 12B are cross-sectional views taken along line I-I' and line II-II' of FIG. 11, respectively.
Figure 12B:
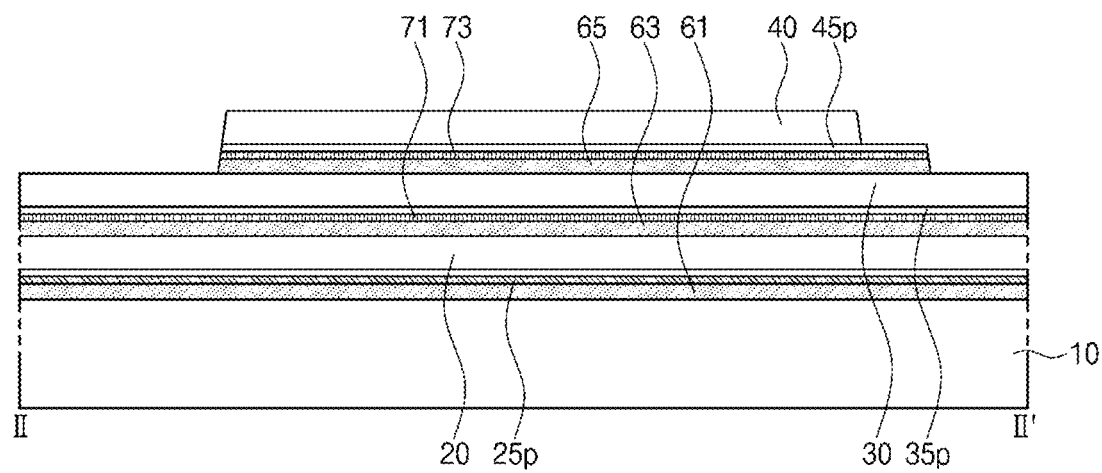

Referring to FIGS. 11, 12A and 12B, the first to third epitaxial stacks 20, 30, and 40 are sequentially formed on the substrate 10, and the third epitaxial stack 40 is patterned.

In order to sequentially form the first to third epitaxial stacks 20, 30, and 40 on the substrate 10, the first epitaxial stack 20 and the ohmic electrode 25p' are formed on a first temporary substrate. In an exemplary embodiment, the first temporary substrate may be a semiconductor substrate, such as a GaAs substrate for forming the first epitaxial stack 20. The first epitaxial stack 20 is fabricated by stacking the n-type semiconductor layer, the active layer, and the p-type semiconductor layer on the first temporary substrate. The insulating film 81 having a contact hole is formed on the first temporary substrate, and the ohmic electrode 25p' is formed within the contact hole of the insulating film 81.

The ohmic electrode 25p' is formed by forming the insulating film 81 on the first temporary substrate, applying photoresist, patterning the photoresist, depositing an ohmic electrode 25p' material on the patterned photoresist, and then lifting off the photoresist pattern. However, the method of forming the ohmic electrode 25p' is not limited thereto. For example, the insulating film 81 may be formed by forming the insulating film 81, patterning the insulating film 81 by photolithography, forming the ohmic electrode film 25p' with the ohmic electrode film 25p' material, and then patterning the ohmic electrode film 25p' by photolithography.

The first p-type contact electrode layer 25p (also serving as the data line 120) is formed on the first temporary substrate on which the ohmic electrode 25p' is formed. The first p-type contact electrode layer 25p may include a reflective material. The first p-type contact electrode layer 25p may be formed by, for example, depositing a metallic material and then patterning the same using photolithography.

The first epitaxial stack 20 formed on the first temporary substrate is inverted and attached to the substrate 10 via the first adhesive layer 61 interposed therebetween.

After the first epitaxial stack 20 is deposited on the substrate 10, the first temporary substrate is removed. The first temporary substrate may be removed by various methods such as wet etching, dry etching, physical removal, laser lift-off, or the like.

After the removal of the first temporary substrate, the first n-type contact electrode 21n is provided on an upper surface of the first epitaxial stack 20. The first n-type contact electrode 21n may be formed by depositing a conductive material and then patterning by the photolithography process.

After removing the first temporary substrate, irregularities may be formed on an upper surface (n-type semiconductor layer) of the first epitaxial stack 20. The irregularities may be formed by texturing with various etching processes. For example, the irregularities may be formed by various methods such as dry etching using a micro photo process, wet etching using a crystal characteristic, texturing using a physical method, such as sand blasting, ion beam etching, texturing based on difference in etching rates of block copolymers, or the like.

The second epitaxial stack 30, the second p-type contact electrode layer 35p, and the first wavelength pass filter 71 are formed on a separate second temporary substrate.

The second temporary substrate may be a sapphire substrate. The second epitaxial stack 30 may be fabricated by forming the n-type semiconductor layer, the active layer, and the p-type semiconductor layer on the second temporary substrate.

The second epitaxial stack 30 formed on the second temporary substrate is inverted and attached to the first epitaxial stack 20 via the second adhesive layer 63 interposed therebetween.

After the attachment, the second temporary substrate is removed. The second temporary substrate may be removed by various methods such as wet etching, dry etching, physical removal, laser lift-off, or the like.

After removing the second temporary substrate, irregularities may be formed on an upper surface (n-type semiconductor layer) of the second epitaxial stack 30. The irregularities may be textured through various etching processes, or may be formed by using a patterned sapphire substrate for the second temporary substrate.

The third epitaxial stack 40, the third p-type contact electrode layer 45p, and the second wavelength pass filter 73 are formed on a separate third temporary substrate.

The third temporary substrate may be a sapphire substrate. The third epitaxial stack 40 may be fabricated by forming the n-type semiconductor layer, the active layer, and the p-type semiconductor layer on the third temporary substrate.

The third epitaxial stack 40 formed on the third temporary substrate is inverted and attached to the second epitaxial stack 30 via the third adhesive layer 65 interposed therebetween.

After attachment, the third temporary substrate is removed. The third temporary substrate may be removed by various methods such as wet etching, dry etching, physical removal, laser lift-off, or the like. After the third temporary substrate is removed, irregularities may be formed on an upper surface (n-type semiconductor layer) of the third epitaxial stack 40. The irregularities may be textured through various etching processes, or may be formed by using a patterned sapphire substrate for the third temporary substrate.

Next, the third epitaxial stack 40 is patterned. Portions of the third epitaxial stack 40 except for the light emitting region are removed. In particular, the portions corresponding to the first and second contacts 20C and 30C and the first and second common contacts 50GC and 50BC are removed. As such, a portion of the upper surface of the third p-type contact electrode 45p is exposed to the outside at the second common contact 50BC. The third epitaxial stack 40 may be removed by various methods, such as wet etching or dry etching using photolithography, and the third p-type contact electrode 45p may function as an etch stopper.

According to an exemplary embodiment, the side of the third epitaxial stack 40 is obliquely patterned with respect to one side of the substrate 10, and the angle formed between the third epitaxial stack 40 and one side of the substrate 10 may be between about 45 degrees and about 85 degrees.

The third p-type contact electrode 45p, the second wavelength pass filter 73, and the third adhesive layer 65 are then patterned. As such, a portion of the upper surface of the second epitaxial stack 30 is exposed.

The third p-type contact electrode 45p, the second pass filter 73, and the third adhesive layer 65 may be removed by various methods such as wet etching or dry etching using photolithography.

Figure 13:
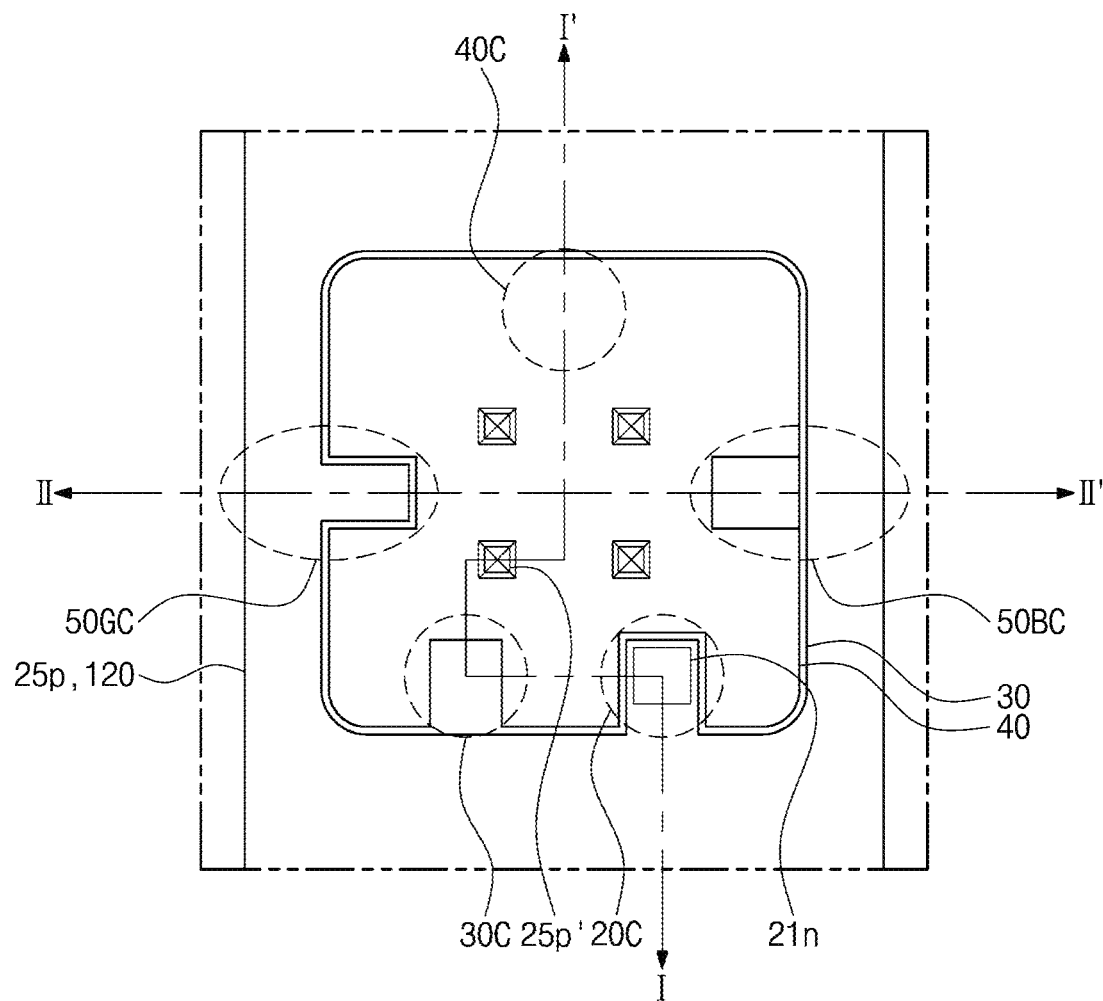
Figure 14A:
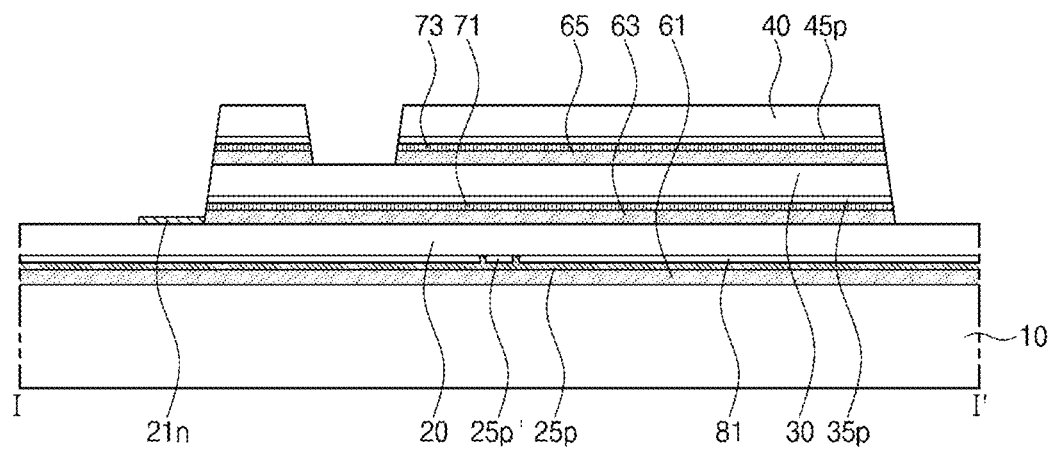
FIG. 14A and FIG. 14B are cross-sectional views taken along line I-I' and line II-II' of FIG. 13, respectively.
Figure 14B:
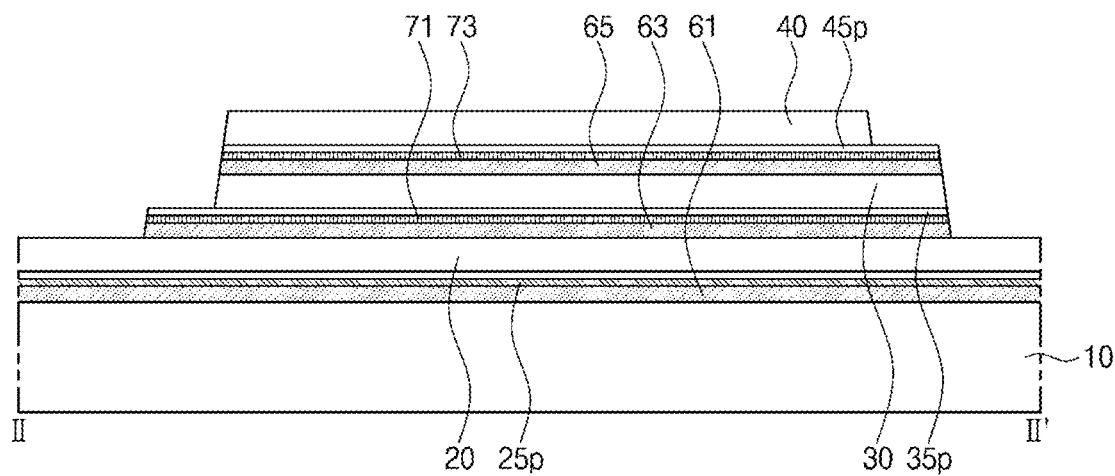

Referring to FIGS. 13, 14A and 14B, a portion of the second epitaxial stack 30 is removed, exposing a portion of the upper surface of the second p-type contact electrode 35p at the second common contact 50GC to the outside. The third p-type contact electrode 45p may function as an etch stopper during etching.

The side of the second epitaxial stack 30 is obliquely patterned with respect to one side of the substrate 10, and the angle formed between the second epitaxial stack 30 and one side of the substrate 10 may be between about 45 degrees and about 85 degrees.

Next, portions of the second p-type contact electrode 35p, the first wavelength pass filter 71, and the second adhesive layer 63 are etched. Accordingly, the upper surface of the first n-type contact electrode 21n is exposed at the first contact 20C, and the upper surface of the first epitaxial stack 20 is exposed at the portions other than the light emitting region.

The second epitaxial stack 30, the second p-type contact electrode 35p, the first wavelength pass filter 71, and the second adhesive layer 63 may be removed by various methods such as wet etching or dry etching using photolithography.

Figure 15:
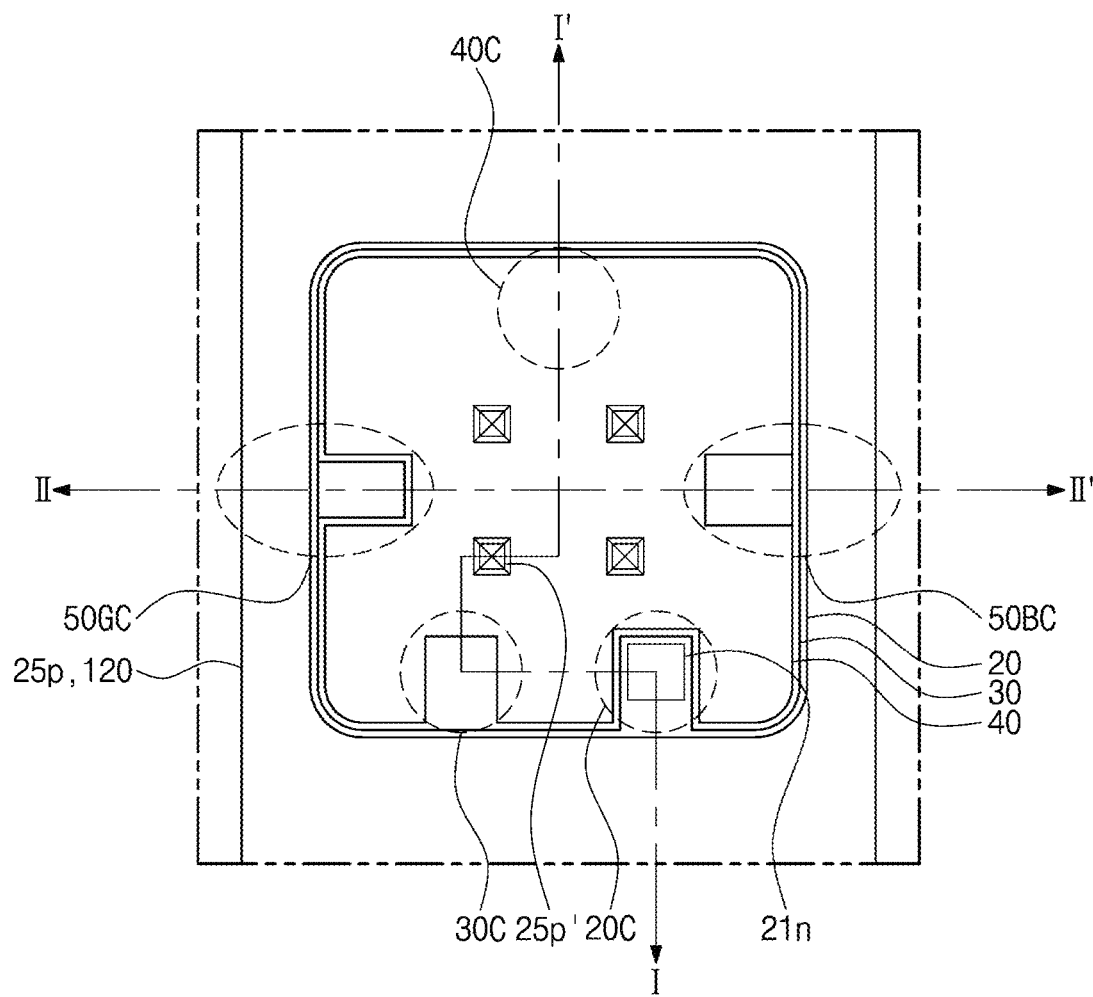
Figure 16A:
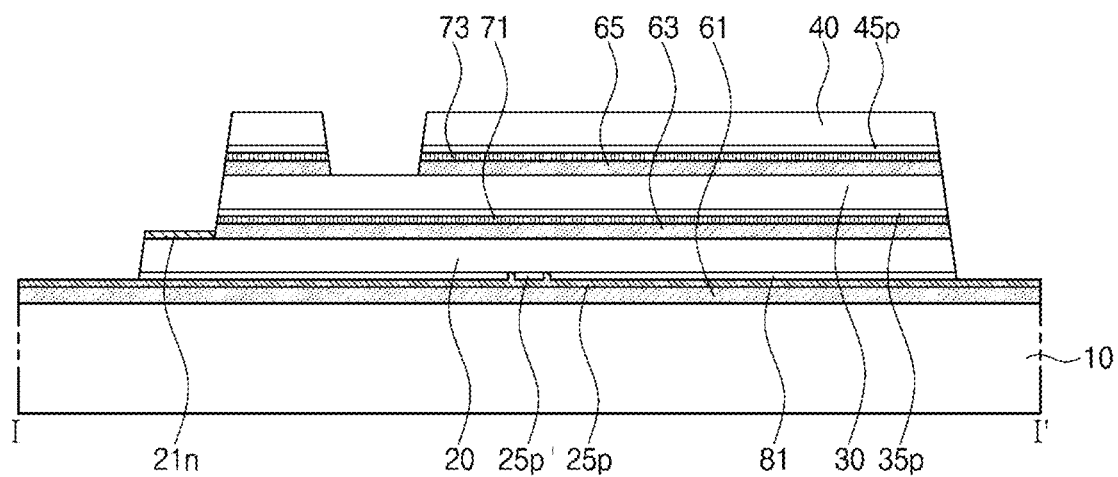
FIG. 16A and FIG. 16B are cross-sectional views taken along line I-I' and line II-II' of FIG. 15, respectively.
Figure 16B:
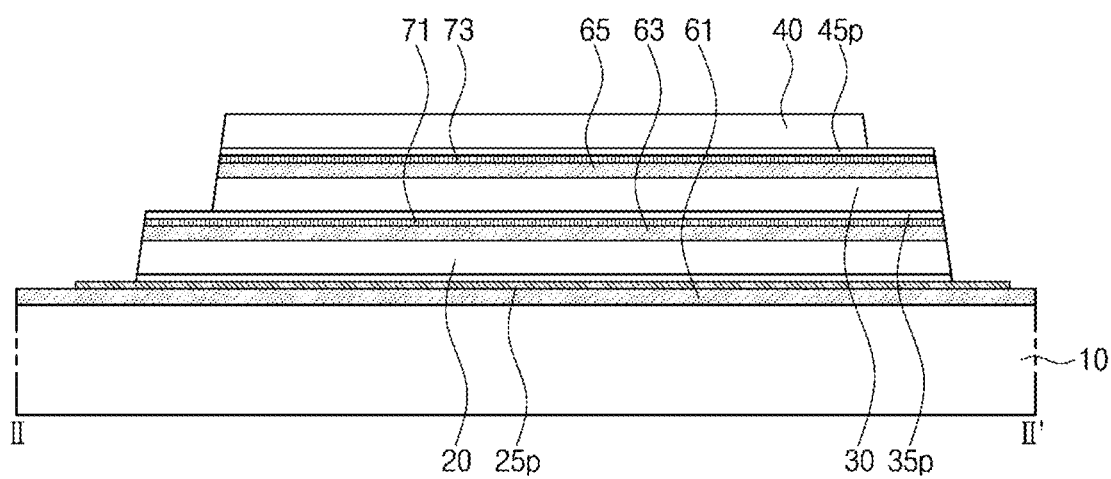

Referring to FIGS. 15, 16A and 16B, the first epitaxial stack 20 and the insulating film 81 are removed from the region excluding the light emitting region. The upper surface of the first p-type contact electrode 25p is exposed at the first and second common contacts 50GC and 50BC.

The side of the first epitaxial stack 20 is obliquely patterned with respect to one side of the substrate 10, and the angle formed between the first epitaxial stack 20 and one side of the substrate 10 may be between about 45 degrees and about 85 degrees.

The angles formed by the first to third epitaxial stacks 20, 30 and 40 with respect to one surface of the substrate may be substantially the same or different from each other, although substantially the same angles are illustrated in the drawing for convenience of explanation. The components excluding the first to third epitaxial stacks 20, 30, and 40, e.g., the first and second p-type contact electrodes 25p and 35p, the first and second adhesive layers 61 and 63, and the first and second wavelength pass filters 71 and 73 may be obliquely patterned to have a predetermined angle with respect to one side of the substrate. According to another exemplary embodiment, the angles formed by the first and second p-type contact electrodes 25p and 35p, the first and second adhesive layers 61 and 63, the first and second wavelength pass filters 71 and 73 with respect to one side of the substrate are not limited thereto, and accordingly, the angles may be varied depending on the components being etched together in the same process, or may have individually different angles from each other, as long as the angle formed between each of the components and one side of the substrate may be between about 45 degrees and about 85 degrees.

Figure 17:
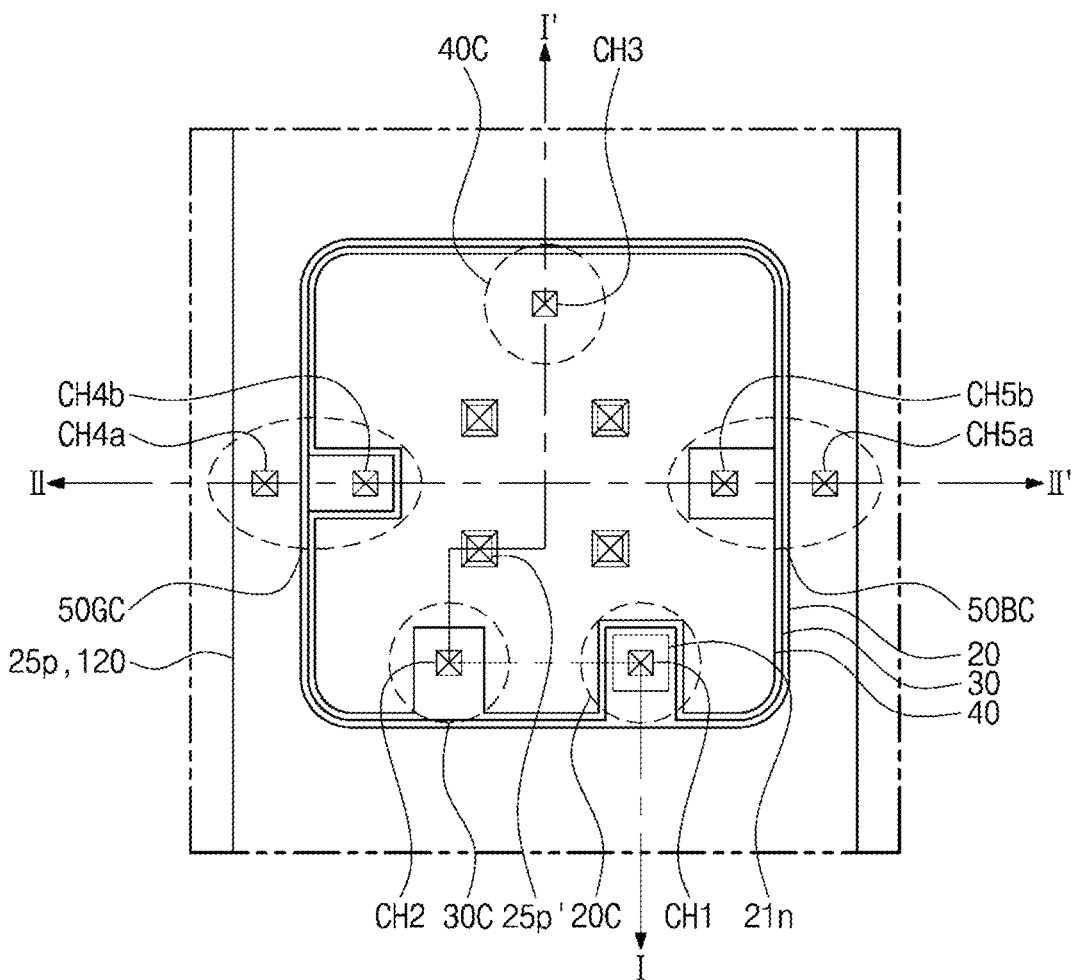
Figure 18A:
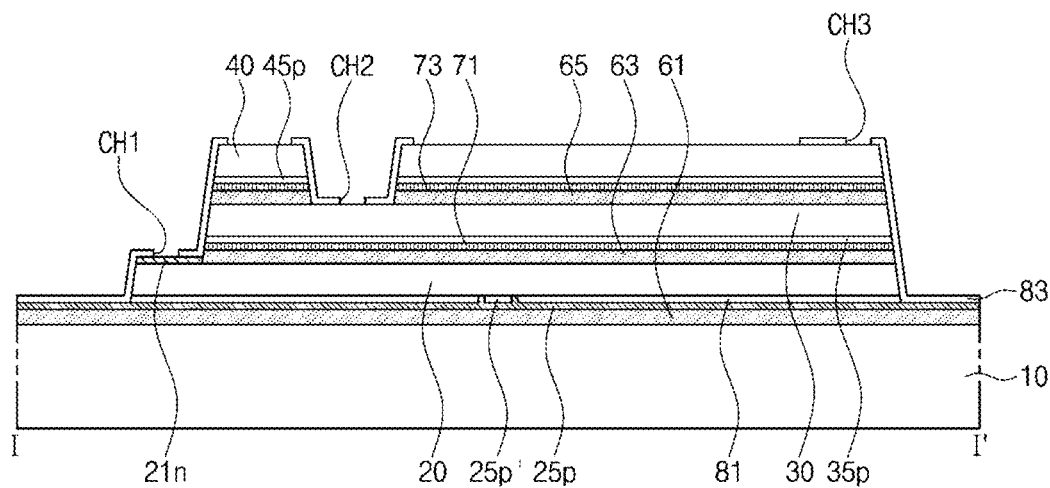
FIG. 18A and FIG. 18B are cross-sectional views taken along line I-I' and line II-II' of FIG. 17, respectively.
Figure 18B:
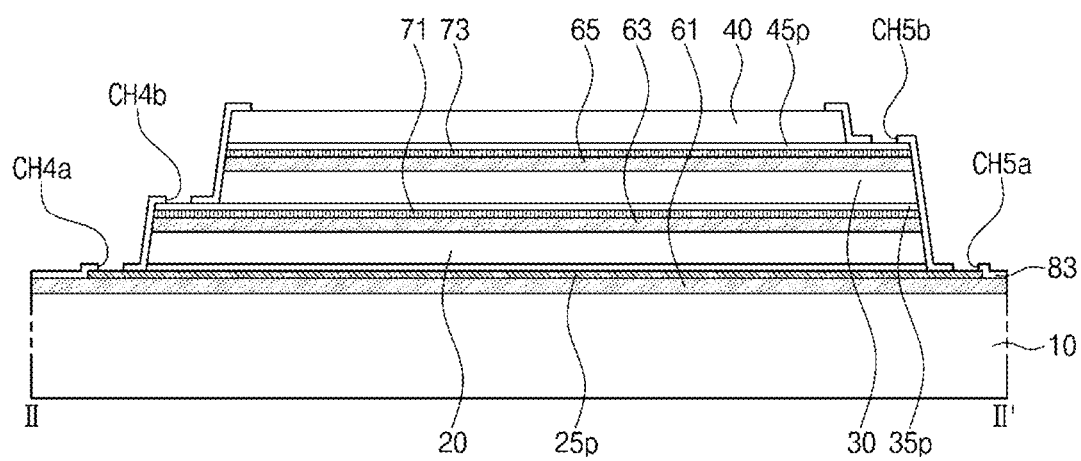

Referring to FIGS. 17, 18A and 18B, the first optically non-transmissive film 83 is formed on a front side of the substrate 10. Next, upon removal of the first optically non-transmissive film 83 from the upper surface of the substrate 10 that corresponds to the light emitting region, the first to third contact holes CH1, CH2, and CH3, the $4a^{th}$ and $4b^{th}$ contact holes CH4a and CH4b, and the $5a^{th}$ and $5b^{th}$ contact holes CH5a and CH5b are formed.

After deposition, the first optically non-transmissive film 83 may be patterned by various methods such as wet etching or dry etching using photolithography.

Figure 19:
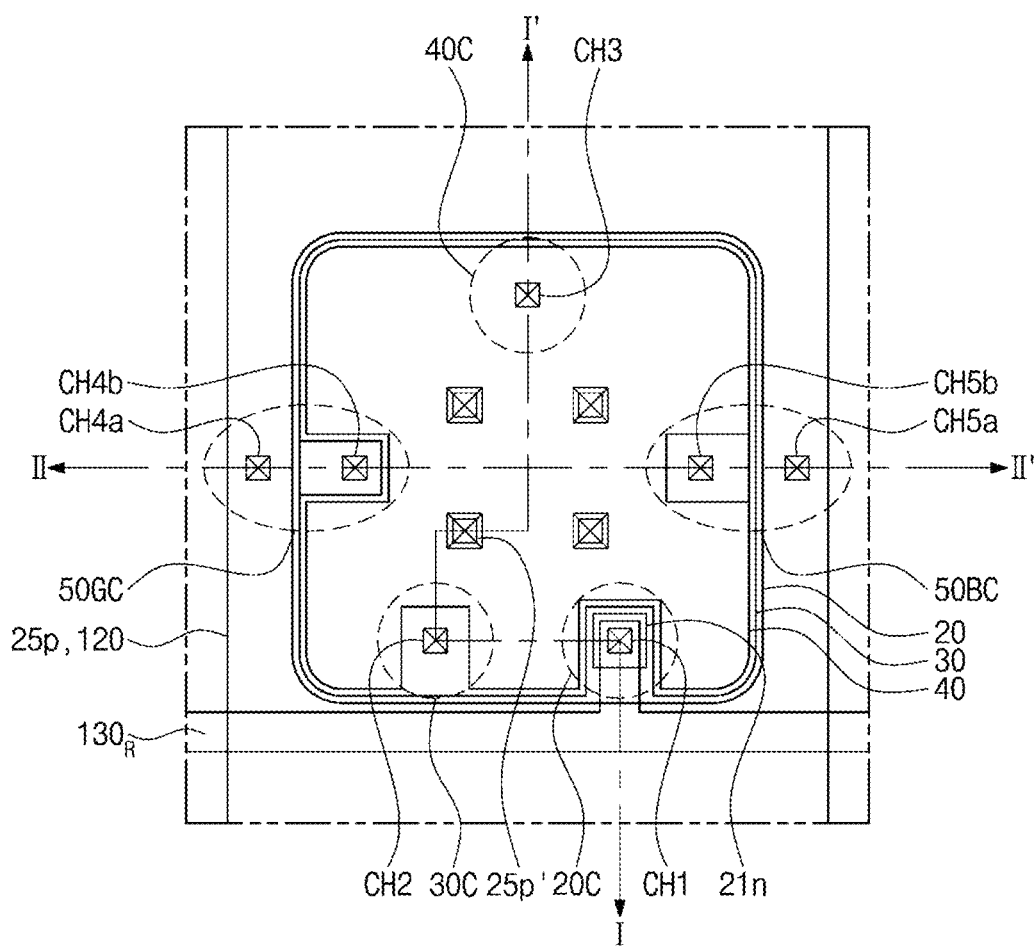
Figure 20A:
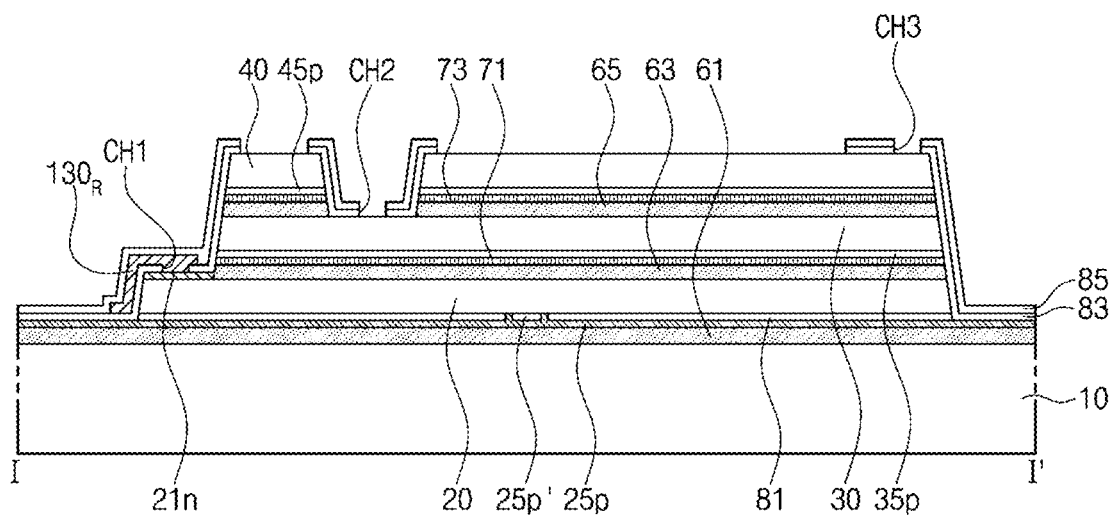
FIG. 20A and FIG. 20B are cross-sectional views taken along line I-I' and line II-II' of FIG. 19, respectively.
Figure 20B:
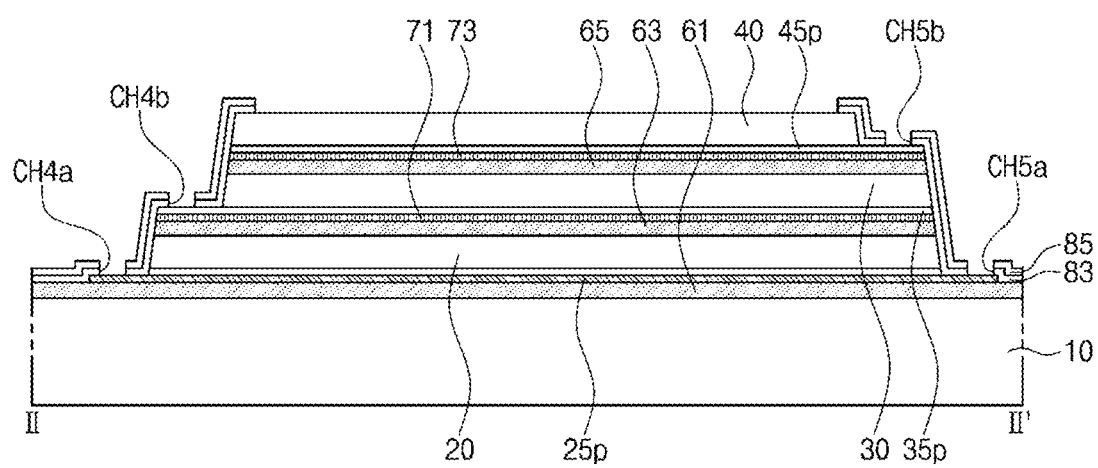

Referring to FIGS. 19, 20A and 20B, the first scan line $130_R$ is formed on the patterned first optically non-transmissive film 83. The first scan line $130_R$ is connected to the first n-type contact electrode 21n through the first contact hole CH1 at the first contact 20C. The first scan line $130_R$ may be formed in various ways. For example, the first scan line $130_R$ may be formed by photolithography.

Next, the second optically non-transmissive film 85 is formed on the front side of the substrate 10. Next, preferably simultaneously with removal of the first optically non-transmissive film 83 from the upper surface of the substrate 10 that corresponds to the light emitting region, the second and third contact holes CH2 and CH3, the $4a^{th}$ and $4b^{th}$ contact holes CH4a and CH4b, and the $5a^{th}$ and $5b^{th}$ contact holes CH5a and CH5b are formed. After deposition, the second optically non-transmissive film 85 may be patterned by various methods such as wet etching or dry etching using photolithography.

Figure 21:
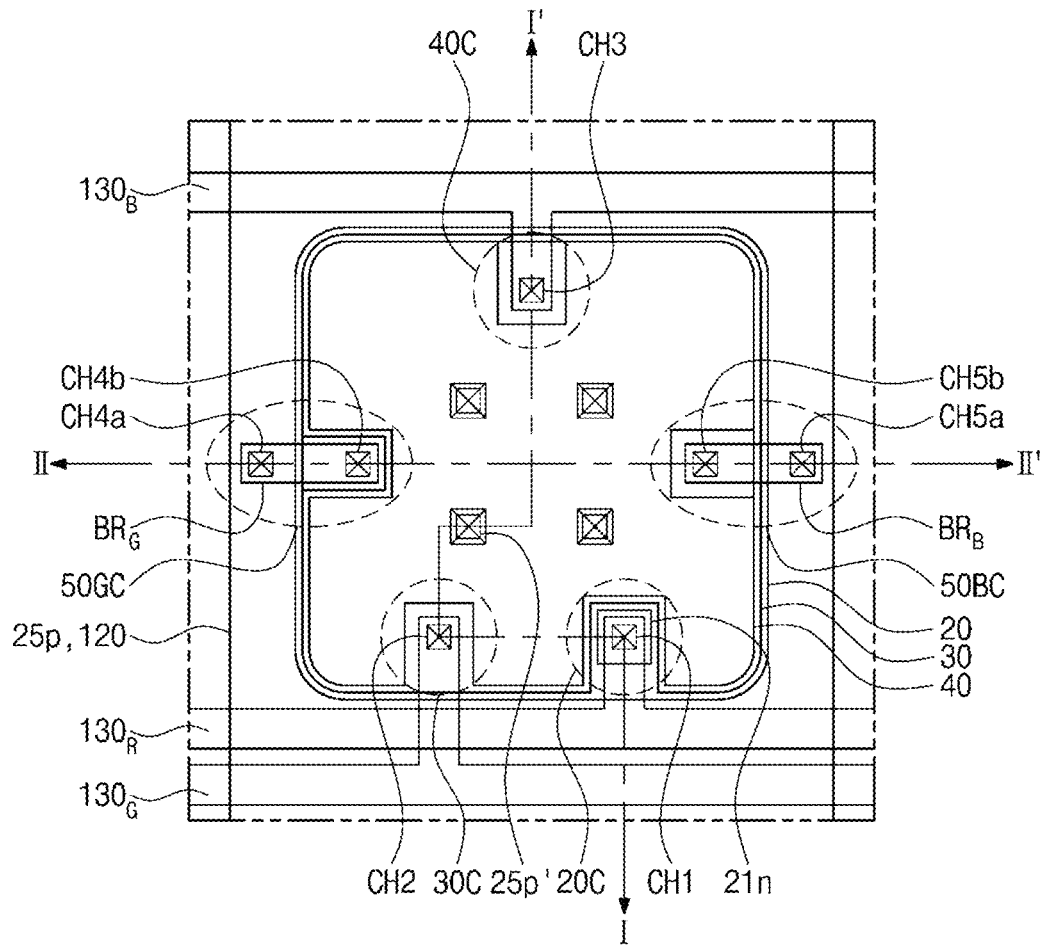
Figure 22A:
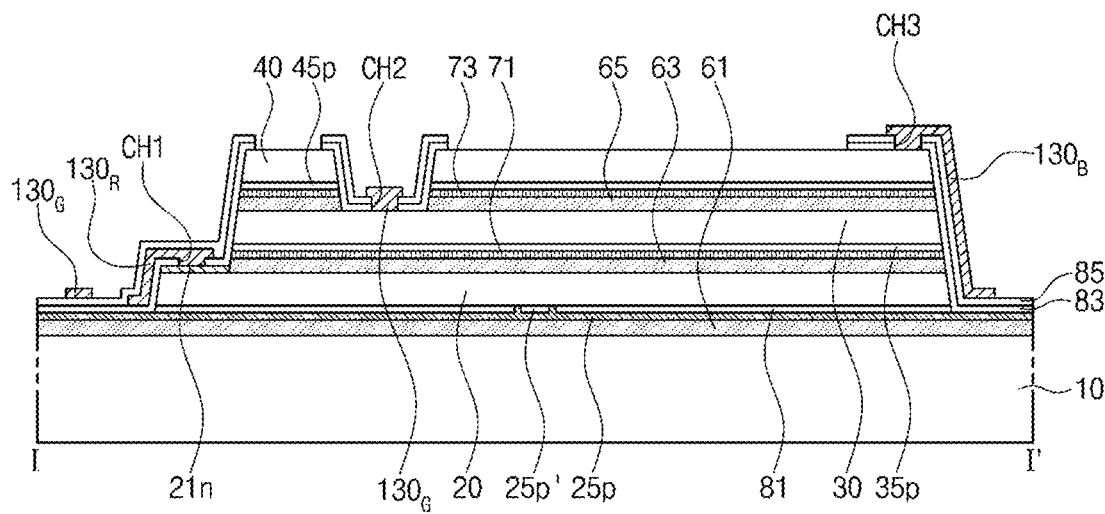
FIG. 22A and FIG. 22B are cross-sectional views taken along line I-I' and line II-II' of FIG. 21, respectively.
Figure 22B:
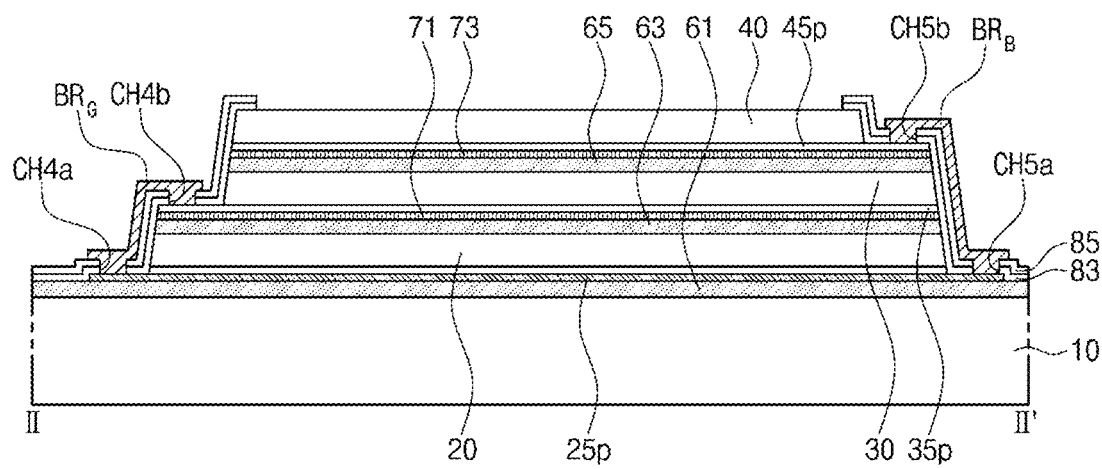

Referring to FIGS. 21, 22A and 22B, the second scan line $130_G$, the third scan line $130_B$, the first bridge electrode $BR_G$, and the second bridge electrode $BR_B$ are formed on the patterned second optically non-transmissive film 85.

The second scan line $130_G$ is connected to the n-type semiconductor layer of the second epitaxial stack 30 through the second contact hole CH2 at the second contact 30C. The third scan line $130_E$ is connected to the n-type semiconductor layer of the third epitaxial stack 40 through a third contact hole CH3 at the third contact 40C. The first bridge electrode $BR_G$ is connected to the first p-type contact electrode 25p through the 4a$^{th}$ and 4b$^{th}$ contact holes CH4a and CH4b at the fourth common contact 50GC. The second bridge electrode BR$_B$ is connected to the first p-type contact electrode 25p through the 5a$^{th}$ and 5b$^{th}$ contact holes CH5a and CH5b at the second common contact 50BC.

The second scan line 130$_G$, the third scan line 130$_B$, and the bridge electrode 120b may be formed on the second non-transmissive film 85 in various ways, for example, by photolithography.

The second scan line 130$_G$, the third scan line 130$_B$, and the first and second bridge electrodes BR$_G$ and BR$_B$ may be formed by applying photoresist on the substrate 10 on which the second optically non-transmissive film 85 is formed, and then patterning the photoresist, and depositing materials of the second scan line 130$_G$, the third scan line 130$_B$, and the bridge electrode on the patterned photoresist and then lifting off the photoresist pattern.

According to an exemplary embodiment, the order of forming the first to third scan lines 130$_R$, 130$_G$, and 130$_E$ and the first and second bridge electrodes BR$_G$ and BR$_B$ of the wiring part is not particularly limited, and may be formed in different sequences. More particularly, the second scan line 130$_G$, the third scan line 130$_B$, and the first and second bridge electrodes BR$_G$ and BR$_B$ are described as being formed on the second optically non-transmissive film 85 during the same stage, but they may be formed in a different order. For example, the first scan line 130$_R$ and the second scan line 130$_G$ may be first formed in the same step, followed by the formation of the additional insulating film and then the third scan line 130$_B$. Alternatively, the first scan line 130$_R$ and the third scan line 130$_E$ may be formed first in the same step, followed by the formation of the additional insulating film, and then the formation of the second scan line 130$_G$. In addition, the first and second bridge electrodes BR$_G$ and BR$_B$ may be formed together at any of the steps of forming the first to third scan lines 130$_R$, 130$_G$, and 130$_B$.

In addition, in an exemplary embodiment, the positions of the contacts of the respective epitaxial stacks 20, 30, and 40 may be formed differently, in which case the positions of the first to third scan lines 130$_R$, 130$_G$, and 130$_B$ and the first and second bridge electrodes BR$_G$ and BR$_B$ may also be changed.

In an exemplary embodiment, an additional optically non-transmissive film may be further provided on the first optically non-transmissive film 83 or the second optically non-transmissive film 85, on a portion that corresponds to the side of the pixel.

As described above, in a display device according to an exemplary embodiment, it is possible to sequentially stack a plurality of epitaxial stacks and then form contacts with a wiring part at a plurality of epitaxial stacks at the same time.

A light emitting stacked structure according to an exemplary embodiment may be modified into various forms. In the following exemplary embodiments, differences from the light emitting stacked structure described above will be mainly described to avoid redundancy.

Figure 23:
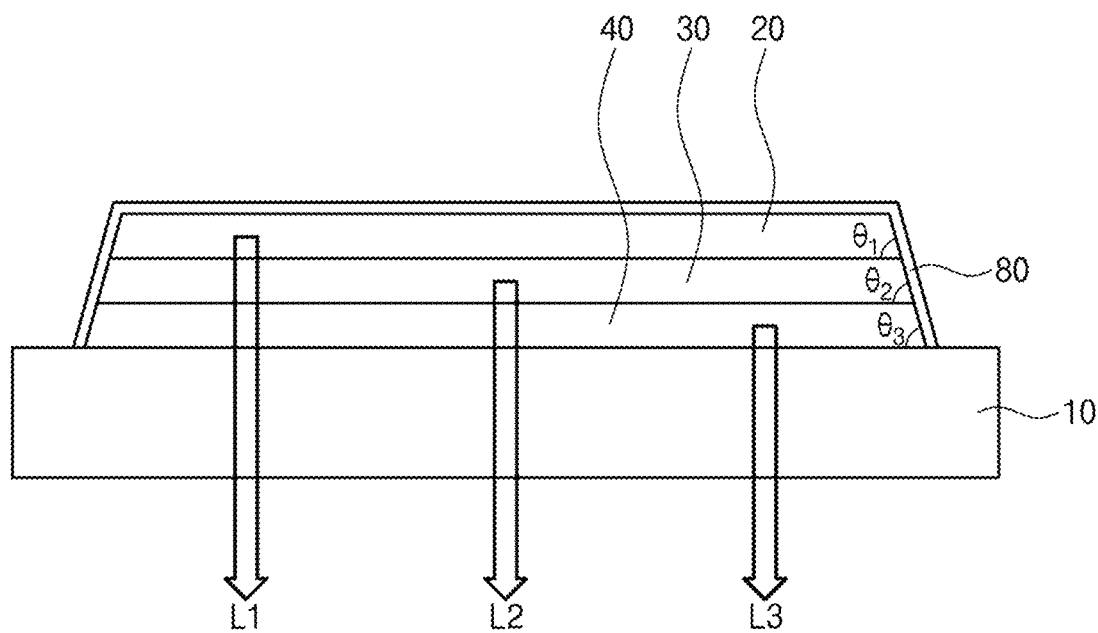
FIG. 23 is a cross-sectional view of a light emitting stacked structure according to an exemplary embodiment.

FIG. 23 is a cross-sectional view of a light emitting stacked structure according to an exemplary embodiment.

Referring to FIG. 23, a light emitting stacked structure according to an exemplary embodiment includes a plurality of sequentially stacked epitaxial stacks, and optically non-transmissive films covering sides of the epitaxial stacks, and a plurality of epitaxial stacks disposed sequentially on the upper surface of the substrate 10.

A plurality of epitaxial stacks are stacked on the upper surface of the substrate 10 in the order of the third epitaxial stack 40, the second epitaxial stack 30, and the first epitaxial stack 20.

The substrate 10 may be formed of an optically transmissive insulating material. As used herein, the substrate 10 being "optically transmissive" not only refers to a transparent substrate that transmits the entire light, but also a semi-transparent or partially transparent substrate that transmits only a light of a predetermined wavelength, or transmits only a portion of a light of a predetermined wavelength, or the like.

The substrate 10 may be allow the third epitaxial stack 40 to be grown thereon. For example, the substrate 10 may be a sapphire substrate. However, the inventive concepts are not limited to a particular type of the substrate 10, and may be any type of a substrate as long as epitaxial stack may be grown thereon and has optically transmissive and insulating properties. Examples of the material of the substrate 10 include glass, quartz, organic polymer, organic/inorganic composite, and so on. In an exemplary embodiment, the substrate 10 may further include a wiring part that may provide a light emitting signal and a common voltage to the respective epitaxial stacks. As such, the substrate 10 may be provided as a printed circuit board or as a composite substrate having a wiring part and/or a drive element formed on glass, silicon, quartz, organic polymer, or organic/inorganic composite.

Each of the epitaxial stacks emits light to the back direction of the substrate 10, as shown in FIG. 23. Light emitted from one epitaxial stack is passed through another epitaxial stack located in the light path, and travels to the back direction. In this case, the back direction corresponds to a direction along which the first to third epitaxial stacks 20, 30 and 40 are stacked.

In the exemplary embodiment, the first epitaxial stack 20 may emit a first color light L1, the second epitaxial stack 30 may emit a second color light L2, and the third epitaxial stack 40 may emit the third color light L3. The first to third color light L1, L2, and L3 correspond to different color light from each other, and the first to third color light L1, L2, and L3 may be color light of different wavelength bands from each other, which have sequentially decreasing wavelengths. In particular, the first to third color light L1, L2, and L3 may have different wavelength bands from each other, and the color light may be a shorter wavelength band of a higher energy in the order of the first color light L1 to the third color light L3. In the exemplary embodiment, the first color light L1 may be red light, the second color light L2 may be green light, and the third color light L3 may be blue light. However, the inventive concepts are not limited to a particular color of light emitted from each epitaxial stack, and the epitaxial stacks may emit different colors of light.

An optically non-transmissive film 80 is provided on the sides of the first to third epitaxial stacks 20, 30, and 40. The optically non-transmissive film 80 may substantially completely covers the sides of the first to third epitaxial stacks 20, 30, and 40. Also, in an exemplary embodiment, the optically non-transmissive film 80 covers the sides of the epitaxial stacks as well as the upper surface of the uppermost epitaxial stack positioned on top of the rest epitaxial stacks. In particular, the optically non-transmissive film 80 overlaps the epitaxial stacks in plan view. Accordingly, among light emitted from the respective epitaxial stacks, light directed in an upper direction is reflected from or absorbed by the optically non-transmissive film 80, and in particular, when light is reflected by the optically non-transmissive film 80, the reflected light travels to the back direction, resulting in enhanced efficiency of the light emission to the back direction. The optically non-transmissive film 80 is not particularly limited as long as it blocks a transmission of light by absorbing or reflecting light.

In an exemplary embodiment, the side of each of the epitaxial stacks has an inclined shape relative to one side of the substrate 10. According to an exemplary embodiment, an angle between the sides of the first to third epitaxial stacks 20, 30, and 40 and one side of the substrate 10 is greater than about 0 degrees and less than about 90 degrees. For example, when the angles between the sides of the first to third epitaxial stacks 20, 30, and 40 and one side of the substrate is first to third angles $\theta_1$, $\theta_2$, and $\theta_3$, the first to third angles $\theta_1$, $\theta_2$, and $\theta_3$ may have values in a range from about 45 degrees to about 85 degrees, respectively.

When the sides of the first to third epitaxial stacks 20, 30 and 40 have a predetermined inclination, the optically non-transmissive film 80 may be easily formed. Further, in an exemplary embodiment, each of the epitaxial stacks has a tapered shape at a predetermined angle, which can maximize the light reflection effect by the optically non-transmissive film 80. In particular, according to an exemplary embodiment, it is possible to easily adjust the angles of the sides of the first to third epitaxial stacks 20, 30, and 40, to enhance the extraction efficiency of light emitted from the first to third epitaxial stacks 20, 30, and 40.

In an exemplary embodiment, the angles between the sides of each of the first to third epitaxial stacks 20, 30, and 40 and one side of the substrate 10 may be substantially the same or different from each other. For example, among the angles formed between the sides of the first to third epitaxial stacks 20, 30, and 40 and one side of the substrate 10, the first angle $\theta_1$, the second angle $\theta_2$, and the third angle $\theta_3$ may all be different from one another, or alternatively, the second angle $\theta_2$ and the third angle $\theta_3$ may be substantially the same as each other and different from the first angle $\theta_1$.

In the light emitting stacked structure according to an exemplary embodiment, the signal lines for applying emitting signals to the respective epitaxial stacks are independently connected, and accordingly, the respective epitaxial stacks can be independently driven, and thus, the light emitting stacked structure can implement various colors according to whether light is emitted from each of the epitaxial stacks. In addition, the epitaxial stacks for emitting the light of different wavelengths from each other are overlapped vertically on one another, and thus, can be formed in a narrow area. In addition, since the sides of the epitaxial stacks are inclined, it is possible to easily form the non-transmissive film with a sufficient thickness, and the non-transmittance film can prevent the phenomenon in which light emitted from a certain pixel affects the adjacent pixels, or in which color is mixed with the light emitted from the adjacent pixels.

Figure 24:
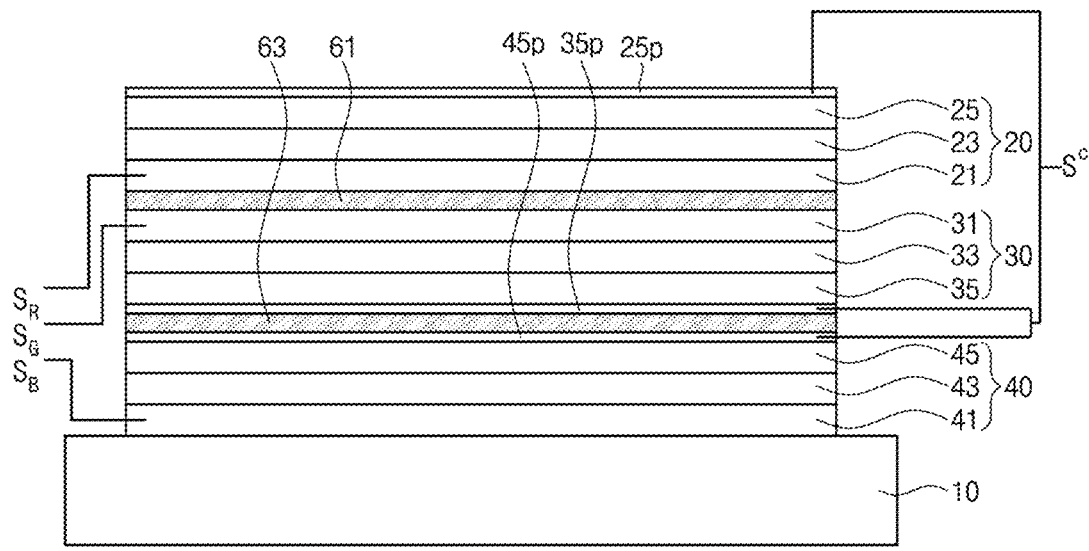
FIG. 24 is a cross-sectional view illustrating a light emitting stacked structure including a wiring part according to an exemplary embodiment.

FIG. 24 is a cross-sectional view of a light emitting stacked structure including a wiring part according to an exemplary embodiment. In FIG. 24, the inclined shapes of each of the epitaxial stacks and the insulating films shown in FIG. 23 are omitted.

Referring to FIG. 24, in the light emitting stacked structure according to an exemplary embodiment, the third epitaxial stack 40 may be provided on the substrate 10, and the second adhesive layer 63 may be provided on the third epitaxial stack 40 via the second epitaxial stack 30 interposed therebetween, and the first epitaxial stack 20 may be provided on the second epitaxial stack 30 via the first adhesive layer 61 interposed therebetween.

The first and second adhesive layers 61 and 63 may include a non-conductive material and an optically transmissive material. For example, an optically clear adhesive may be used for the first and second adhesive layers 61 and 63. The material for forming the first and second adhesive layers 61 and 63 is not particularly limited, as long as it is optically transparent and capable of attaching each of the epitaxial stacks stably.

The third epitaxial stack 40 includes the n-type semiconductor layer 41, the active layer 43, and the p-type semiconductor layer 45, which are sequentially disposed from lower to upper sides. The n-type semiconductor layer 41, the active layer 43, and the p-type semiconductor layer 45 of the third epitaxial stack 40 may include a semiconductor material that emits blue light. However, the inventive concepts are not limited thereto, and the third epitaxial stack 40 may emit color of light other than blue. A third p-type contact electrode 45p is provided above the p-type semiconductor layer 45 of the third epitaxial stack 40.

The second epitaxial stack 30 includes the p-type semiconductor layer 35, the active layer 33, and the n-type semiconductor layer 31, which are sequentially disposed from lower to upper sides. The p-type semiconductor layer 35, the active layer 33, and the n-type semiconductor layer 31 of the second epitaxial stack 30 may include a semiconductor material that emits green light. However, the inventive concepts are not limited thereto, and the second epitaxial stack 30 may emit color of light other than green. A second p-type contact electrode 35p is provided under the p-type semiconductor layer 35 of the second epitaxial stack 30.

The first epitaxial stack 20 includes the n-type semiconductor layer 21, the active layer 23, and the p-type semiconductor layer 25, which are sequentially disposed from lower to upper sides. The n-type semiconductor layer 21, the active layer 23, and the p-type semiconductor layer 25 of the first epitaxial stack 20 may include a semiconductor material that emits red light. However, the inventive concepts are not limited thereto, and the first epitaxial stack 20 may emit color of light other than red. A first p-type contact electrode 25p is provided above the p-type semiconductor layer 25 of the first epitaxial stack 20.

In an exemplary embodiment, common lines may be connected to the third p-type contact electrodes 45p, the second p-type contact electrode 35p, and the first p-type contact electrodes 25p. The common line may be a line to which the common voltage is applied. In addition, the light emitting signal lines may be connected to the n-type semiconductor layers 21, 31, and 41 of the first to third epitaxial stacks 20, 30, and 40, respectively. In the exemplary embodiment, a common voltage $S_C$ is applied to the first to third p-type contact electrodes 25p, 35p, and 45p through the common line, and the light emitting signal is applied to the n-type semiconductor layers 21, 31, and 41 of the first to third epitaxial stacks 20, 30, and 40 through the light emitting signal lines, thereby controlling the light emission of the first to third epitaxial stacks 20, 30, and 40. In this case, the light emitting signal includes first to third light emitting signals $S_R$, $S_G$, and $S_B$ corresponding to the first to third epitaxial stacks 20, 30, and 40, respectively. In an exemplary embodiment, the first light emitting signal $S_R$ may be a signal corresponding to red light, the second light emitting signal $S_G$ may be a signal corresponding to green light, and the third light emitting signal $S_B$ may be a signal corresponding to an emission of blue light.

According to the exemplary embodiment, the first to third epitaxial stacks 20, 30, and 40 are driven according to a light emitting signal applied to each of the epitaxial stacks.

In the exemplary embodiment described above, a common voltage is described as being applied to the p-type semiconductor layers 25, 35, and 45 of the first to third epitaxial stacks 20, 30 and 40, and the light emitting signal is described as being applied to the n-type semiconductor layers 21, 31, and 41 of the first to third epitaxial stacks 20, 30, and 40, however, the inventive concepts are not limited thereto.

The light emitting stacked structure according to an exemplary embodiment may be capable of implementing a color such that portions of different color light are provided on the overlapped region, rather than implementing different color light on different planes spaced apart from each other. Accordingly, the light emitting stacked structure according to an exemplary embodiment may advantageously provide compactness and integration of the light emitting element. In addition, according to an exemplary embodiment, since only one light emitting stacked structure, instead of a plurality of light emitting elements, is mounted to the light emitting stacked structure, the manufacturing method is significantly simplified.

The light emitting stacked structure may be a light emitting element capable of expressing various colors, and thus, may be employed as a pixel in a display device. Hereinafter, a light emitting stacked structure that can be employed as a pixel in a display device will be described.

Figure 25:
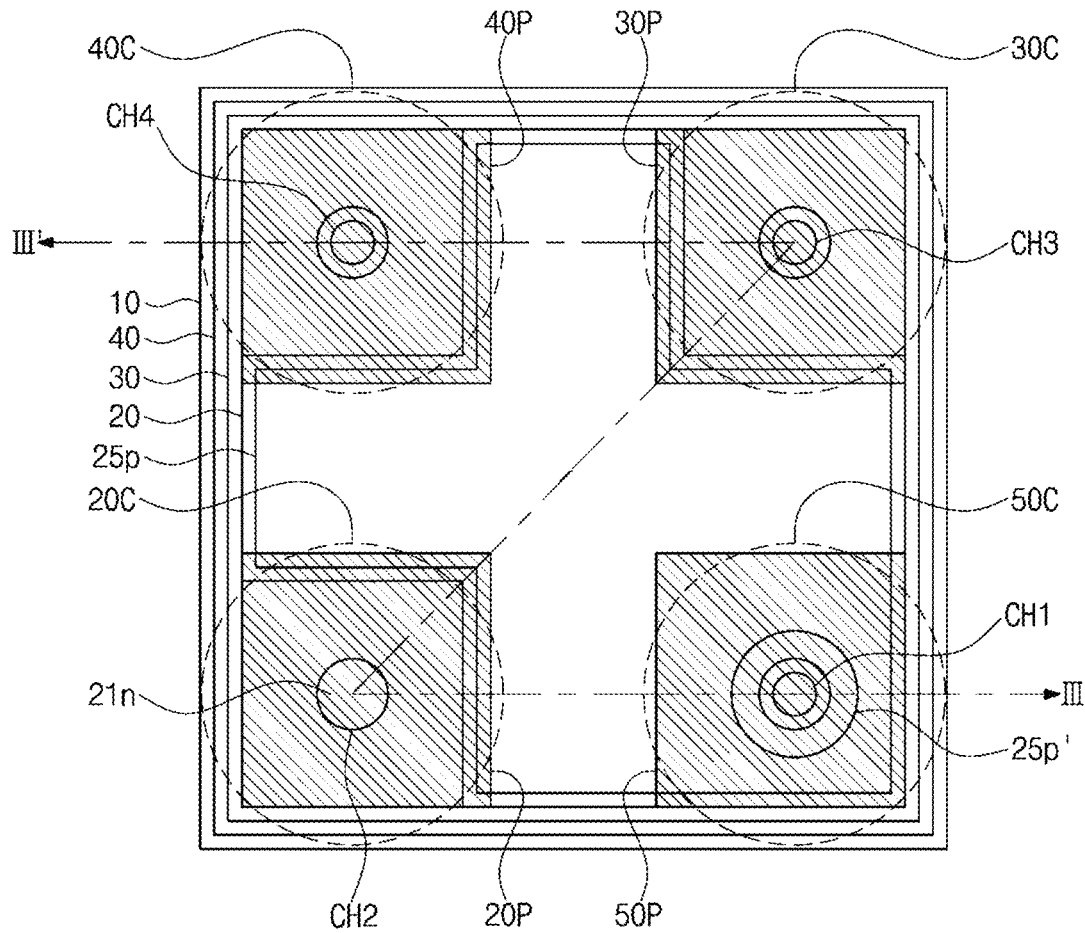
FIG. 25 is a plan view of a light emitting stacked structure according to an exemplary embodiment.
Figure 26:
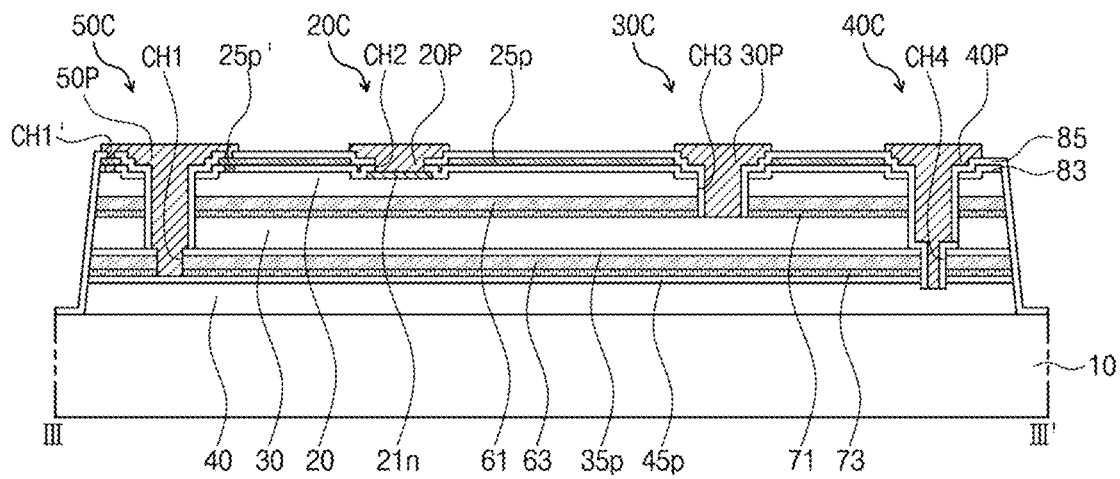
FIG. 26 is a cross-sectional view taken along line of FIG. 25.

FIG. 25 is a plan view of a light emitting stacked structure according to an exemplary embodiment, and FIG. 26 is a cross-sectional view taken along line of FIG. 25.

Referring to FIGS. 25 and 26, a light emitting stacked structure according to an exemplary embodiment includes a light emitting region in which a plurality of epitaxial stacks are stacked, and a peripheral region surrounding the light emitting region. The plurality of epitaxial stacks includes first to third epitaxial stacks 20, 30, and 40.

At least one side of the light emitting region is provided with a contact for connecting the wiring part to the first to third epitaxial stacks 20, 30, and 40. The contact includes a first common contact 50C for applying a common voltage to the first to third epitaxial stacks 20, 30, and 40, a first contact 20C for providing a light emitting signal to the first epitaxial stack 20, a second contact 30C for providing a light emitting signal to the second epitaxial stack 30, and a third contact 40C for providing a light emitting signal to the third epitaxial stack 40.

In an exemplary embodiment, when the light emitting stacked structure has substantially a square shape in a plan view, the common contact 50C and the first to third contacts 20C, 30C, and 40C may be disposed in regions corresponding to respective corners of the square. However, the positions of the common contact 50C and the first to third contacts 20C, 30C, and 40C are not limited thereto and various modifications are applicable according to the shape of the light emitting stacked structure.

The first contact 20C is provided with a first pad 20p electrically connected to the first epitaxial stack 20 through the first n-type contact electrode 21n. The second contact 30C is provided with a second pad 30p electrically connected to the n-type semiconductor layer of the second epitaxial stack 30. The third contact 40C is provided with a third pad 40p electrically connected to the n-type semiconductor layer of the third epitaxial stack 40.

The common contact 50C is provided with a common pad 50P. The common pad 50P is electrically connected to the first to third epitaxial stacks 20, 30, and 40 through the first to third p-type contact electrodes 25p, 35p, and 45p, respectively.

The common contact 50C is provided with an ohmic electrode 25p' at a position overlapping the first p-type contact electrode 25p. The ohmic electrode 25p' is provided to electrically connect the p-type semiconductor layer of the first epitaxial stack 20 and the first p-type contact electrode 25p, and may be provided at various positions in various forms. For example, while the ohmic electrode 25p' is provided in the common contact 50C, the inventive concepts are not limited thereto, and the ohmic electrode 25p' may be provided in the light emitting region.

The ohmic electrode 25p' may be have substantially a donut shape. The ohmic electrode 25p' is provided for ohmic contact and may include various materials. In an exemplary embodiment, the ohmic electrode 25p' corresponding to the p-type ohmic electrode may include an Au/Zn alloy or an Au/Be alloy. In this case, since the material of the ohmic electrode 25p' is lower in reflectivity than Ag, Al, Au, or the like, additional reflective electrodes may be further disposed. As an additional reflective electrode, Ag, Au, or the like may be used, and Ti, Ni, Cr, Ta, or the like may be disposed as a metal adhesive layer for adhesion to adjacent components. In this case, the metal adhesive layer may be thinly deposited on the upper and lower surfaces of the reflective electrode including Ag, Au, or the like.

An adhesive layer, a contact electrode, a wavelength pass filter, or the like are provided between the substrate 10 and the first to third epitaxial stacks 20, 30 and 40, respectively.

Referring to FIG. 26, the third to first epitaxial stacks 40, 30, and 20 are sequentially provided on the substrate 10.

The third p-type contact electrode 45p is provided on the third epitaxial stack 40. Specifically, the third p-type contact electrode 45p is provided, which contacts the p-type semiconductor layer of the third epitaxial stack 40. The third p-type contact electrode 45p may include a transparent conductive material such as transparent conductive oxide (TCO), for example.

In an exemplary embodiment, a second wavelength pass filter 73 may be provided on the third p-type contact electrode 45p. The second wavelength pass filter 73 is configured to provide high-purity and high-efficiency color light, and may be selectively employed in the light emitting stacked structure. The second wavelength pass filter 73 is configured to block light with a relatively short wavelength from traveling toward the epitaxial stack that emits light with a longer wavelength.

In an exemplary embodiment, the second wavelength pass filter 73 may transmit the second color light emitted from the second epitaxial stacks 30, while blocking or reflecting light other than the second color light. Accordingly, the second color light emitted from the second epitaxial stack 30 may travel in a direction from upper to lower sides, while the third color light emitted from the third epitaxial stack 40 is blocked from traveling toward the second epitaxial stack 30 and is reflected or blocked by the second wavelength pass filter 73.

The second epitaxial stack 30 is provided on the third epitaxial stack 40 formed with the third p-type contact electrode 45p, via the second adhesive layer 63 interposed therebetween.

The second p-type contact electrode 35p is provided under the second epitaxial stack 30, that is, between the second epitaxial stack 30 and the second adhesive layer 63.

The first wavelength pass filter 71 may be provided on the second epitaxial stack 30. The first wavelength pass filter 71 is configured to block light with relatively short wavelengths from traveling toward the epitaxial stack that emits light with longer wavelengths, and as will be described below, the first wavelength pass filter 71 may transmit a first color light emitted from the first epitaxial stack 20, while blocking or reflecting light other than the first color light. Accordingly, the second color light emitted from the first epitaxial stack 20 may travel in a direction from upper to lower sides, while the second color light emitted from the second epitaxial stack 30 is blocked from traveling toward the first epitaxial stack 20 and is reflected or blocked by the first wavelength pass filter 71.

The first epitaxial stack 20 is provided on the second epitaxial stack 30 formed with the second p-type contact electrode 35*p*, via the second adhesive layer 63 interposed therebetween.

Portions of the n-type semiconductor layer, the active layer, and the p-type semiconductor layer are removed, thereby forming a mesa on the first epitaxial stack 20. The non-mesa region where the mesa is not formed is removed when a portion of the semiconductor layer (specifically, portion of the n-type semiconductor layer and active layer) is removed, which may expose the upper surface of the n-type semiconductor layer. The mesa region generally overlaps with the light emitting region, and the non-mesa region may overlap the surrounding region in general, and particularly overlapping with the contact.

The first n-type contact electrode 21*n* is provided on the upper surface of the exposed n-type semiconductor layer. The first p-type contact electrode 25*p* is provided above the p-type semiconductor layer that has the mesa, via the ohmic electrode 25*p*' and the first optically non-transmissive film 83 interposed therebetween.

The first optically non-transmissive film 83 covers the upper surface of the first epitaxial stack 20 and has a contact hole in a portion provided with the ohmic electrode 25*p*'. The ohmic electrode 25*p*' is provided to correspond to the region where the common contact 50C is provided, and may be provided in various shapes, for example, substantially a donut shape.

The first p-type contact electrode 25*p* is provided on the first optically non-transmissive film 83. When viewed from plan view, the first p-type contact electrode 25*p* may be provided in a form such that the first p-type contact electrode 25*p* overlaps the light emitting region, while covering the entire light emitting region. The first p-type contact electrode 25*p* may include a reflective material to reflect the light from the first epitaxial stack 20 in a lower direction. Various reflective metals may be used as a reflective material for forming the first p-type contact electrode 25*p*, such as Ag, Al, Au, or the like. If necessary, Ti, Ni, Cr, Ta, or others may be disposed as an adhesive layer for adhesion with the adjacent components.

According to an exemplary embodiment, the first p-type contact electrode 25*p* may be selected from a material having high reflectivity in the wavelength band of red light of the first epitaxial stack 20. For example, the first p-type contact electrode 25*p* may include Au that has high reflectivity in the wavelength band of red light, in which case Au can absorb the blue light leaked from thereunder, thus minimizing unnecessary color interference.

The first optically non-transmissive film 83 may also be formed to have a reflective property to facilitate the reflection of light from the first epitaxial stack 20. For example, the first optically non-transmissive film 83 may have an omni-directional reflector (ODR) structure.

A second optically non-transmissive film 85 is provided on the first optically non-transmissive film 83 where the first p-type contact electrode 25*p* is provided. The second optically non-transmissive film 85 covers the upper surface of the first epitaxial stack 20 and the sides of each of the components under the second optically non-transmissive film 85. The second optically non-transmissive film 85 may include a material that blocks an emission of light by absorbing or reflecting the same, in order to prevent the mixture of light emitted from the sides of the first to third epitaxial stacks 20, 30, and 40 with light emitted from the adjacent light emitting structures. The second optically non-transmissive film 85 may include substantially the same or different from the first optically non-transmissive film 83. The second optically non-transmissive film 85 may also be a DBR or an organic polymer film having a black color. In an exemplary embodiment, a floating metal reflective film may further be provided on the second optically non-transmissive film 85. In an exemplary embodiment, the optically non-transmissive film may be formed by depositing two or more insulating films having different refractive indices from each other.

The first to third pads 20P, 30P, and 40P and the common pad 50P are provided on the second optically non-transmissive film 85. The first to third pads 20P, 30P, and 40P and the common pad 50P may be connected to the first to third scan lines and data lines, respectively.

The first to third pads 20P, 30P, and 40P and the common pad 50P may be formed of single-layered or multi-layered metals. For example, the first to third pads 20P, 30P, and 40P and the common pad 50P may be formed of various materials, such as Al, Ti, Cr, Ni, Au, Ag, Ti, Sn, Ni, Cr, W, Cu, or others, or alloys thereof.

Each of the first to third pads 20P, 30P, and 40P and the common pad 50P are connected to the respective corresponding components through the holes provided thereunder, such as the first to fourth contact holes CH1, CH2, CH3, and CH4 and a first contact hole CH1'.

The common pad 50P is connected to the first p-type contact electrode 25*p* through the first contact hole CH1' and connected to the second and third p-type contacts 35*p* and 45*p* through the first contact hole CH1. The first pad 20P is connected to the n-type semiconductor layer of the first epitaxial stack 20 through the second contact hole CH2. The second pad 30P is connected to the n-type semiconductor layer of the second epitaxial stack 30 through the third contact hole CH3. The third pad 40P is connected to the n-type semiconductor layer of the second epitaxial stack 30 through the fourth contact hole CH4.

The light emitting stacked structure described above may emit light in the lower direction by emitting light from the first to third epitaxial stacks 20, 30, and 40. The first to third pads 20P, 30P, and 40P and the common pad 50P may each be connected to the first to third scan lines and the data lines, and accordingly, separate driving signals may be applied to the first to third epitaxial stacks 20, 30, and 40 through the first to third pads 20P, 30P, and 40P, and a common voltage may be applied through the common pad 50P. In this manner, the emission of the light from the first to third epitaxial stacks 20, 30, and 40 can be independently controlled.

FIGS. 27, 29, 31, and 33 are plan views illustrating a method of manufacturing an epitaxial stack according to an exemplary embodiment, and FIGS. 28, 30A and 30B, 32A and 32B, and 34 are cross-sectional views taken along line in FIGS. 27, 29, 31 and 33, respectively, according to exemplary embodiments.

Figure 27:
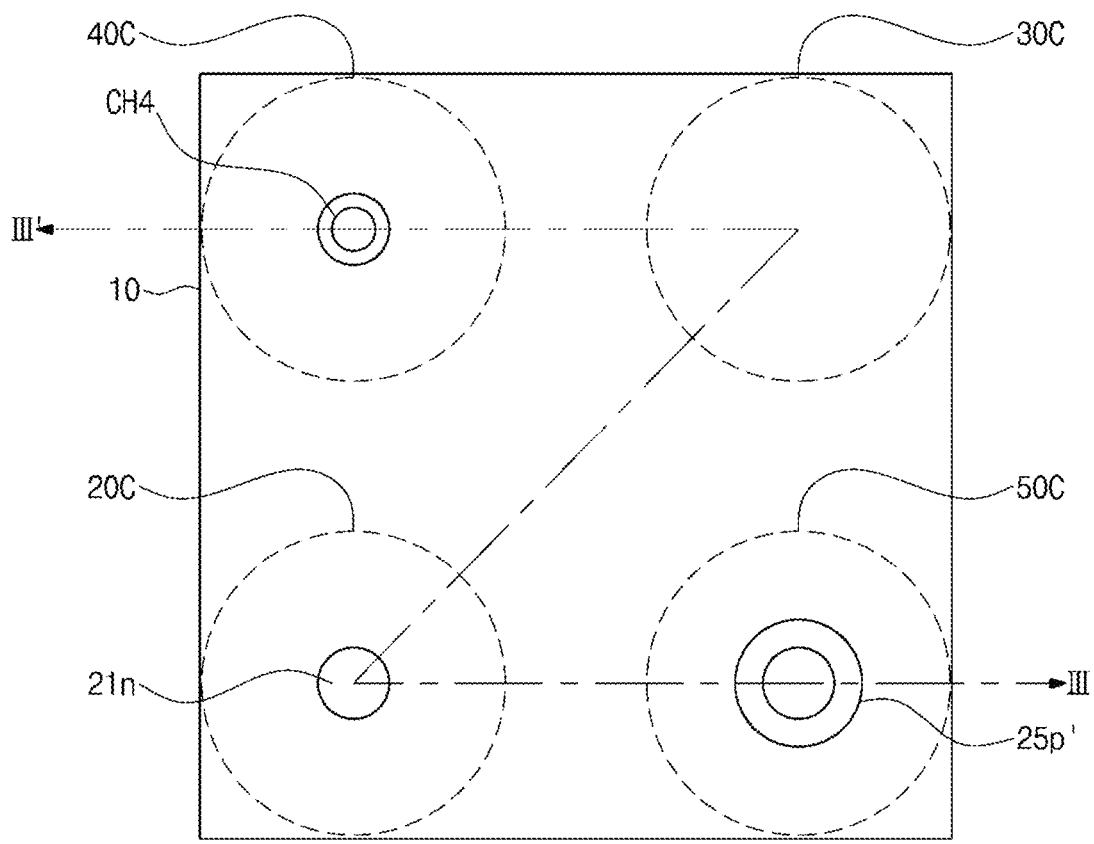
FIG. 27, FIG. 29, FIG. 31, and FIG. 33 are plan views illustrating a method of manufacturing an epitaxial stack according to an exemplary embodiment.
Figure 28:
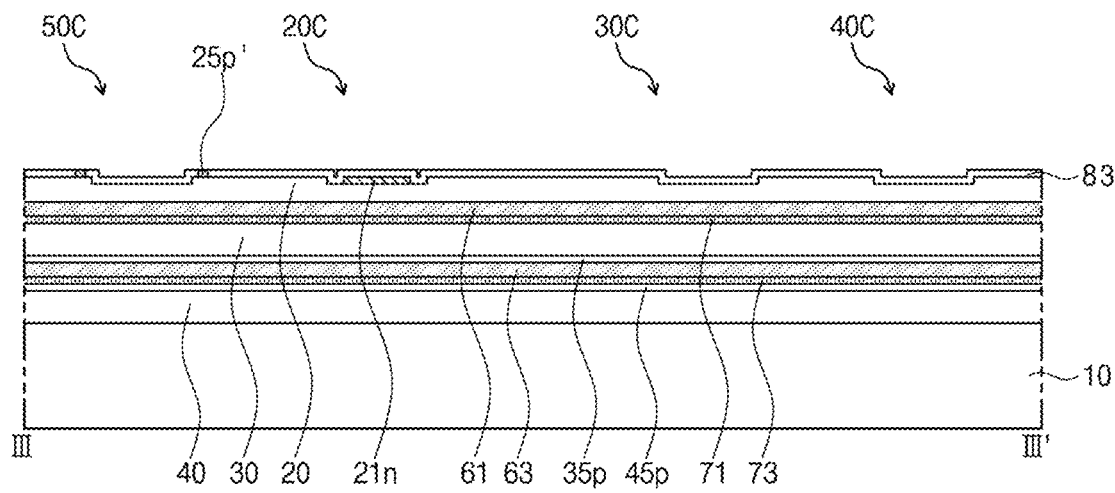
FIG. 28 is a cross-sectional view taken along line of FIG. 27.

Referring to FIGS. 27 and 28, a light emitting stacked structure according to an exemplary embodiment has a third epitaxial stack 40 formed on the substrate 10. The third p-type contact electrode 45p and the second wavelength pass filter 73 are formed on the third epitaxial stack 40.

Next, the second epitaxial stack 30 is formed on a fourth temporary substrate. The fourth temporary substrate may be a semiconductor substrate on which the second epitaxial stack 30 may be formed thereon. The fourth temporary substrate may be set differently depending on the semiconductor layer desired to be formed. The second epitaxial stack 30 may be fabricated by forming the n-type semiconductor layer, the active layer, and the p-type semiconductor layer on the fourth temporary substrate. The second p-type contact electrode 35p is formed on an upper surface of the second epitaxial stack 30.

The second epitaxial stack 30 formed on the fourth temporary substrate is inverted and then adhered onto the third epitaxial stack 40 formed with the second adhesive layer 63, and then the fourth temporary substrate is removed. The fourth temporary substrate may be removed by various methods, such as wet etching, dry etching, physical removal, laser lift-off, or the like.

Next, the first epitaxial stack 20 is formed on the second epitaxial stack 30. The first epitaxial stack 20 may be formed on a fifth temporary substrate, and the fifth temporary substrate may be a semiconductor substrate on which the second epitaxial stack 30 may be formed. The fifth temporary substrate may be set differently depending on the semiconductor layer desired to be formed. The first epitaxial stack 20 is fabricated by forming the n-type semiconductor layer, the active layer, and the p-type semiconductor layer on the fifth temporary substrate.

The first epitaxial stack 20 formed on the fifth temporary substrate is inverted and then adhered onto the second epitaxial stack 30 formed with the first adhesive layer 61, and then the fifth temporary substrate is removed. The fifth temporary substrate may be removed by various methods, such as wet etching, dry etching, physical removal, laser lift-off, or the like.

Next, the active layer of the first epitaxial stack 20, a portion of the p-type semiconductor layer, and, if necessary, a portion of the n-type semiconductor layer are removed to form a mesa structure. Forming the mesa structure allows the upper surface of the n-type semiconductor layer of the first epitaxial stack 20 to be exposed.

The first n-type contact electrode 21n is formed on the exposed upper surface of the n-type semiconductor layer, and a first optically non-transmissive film 83 is formed on the first n-type contact electrode 21n. The contact hole is provided on the first optically non-transmissive film 83 to expose a portion of the upper surface of the first epitaxial stack 20, and the ohmic electrode 25p' is formed in the contact hole.

In an exemplary embodiment, component such as the mesa structure are described as being form on the first epitaxial stack 20, the first n-type contact electrode 21n, ohmic electrode 25p', or the like after the transfer of the first epitaxial stack 20 onto the second epitaxial stack 30, but the inventive concepts are not limited thereto. According to an exemplary embodiment, the first n-type contact electrode 21n, the ohmic electrode 25p', or the like may be first formed on the first epitaxial stack 20 on the first temporary substrate or by using a separate additional temporary substrate, and then transferring the patterned first epitaxial stack 20 onto the second epitaxial stack 30.

Figure 29:
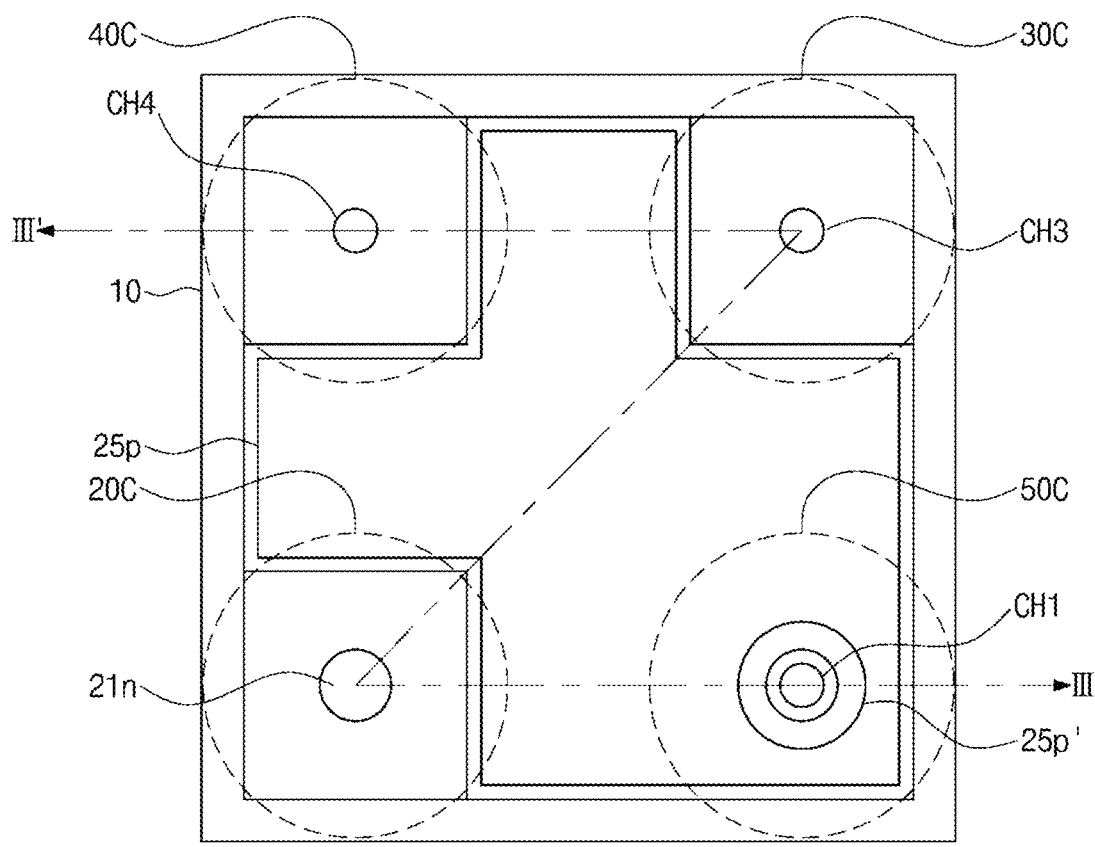
Figure 30A:
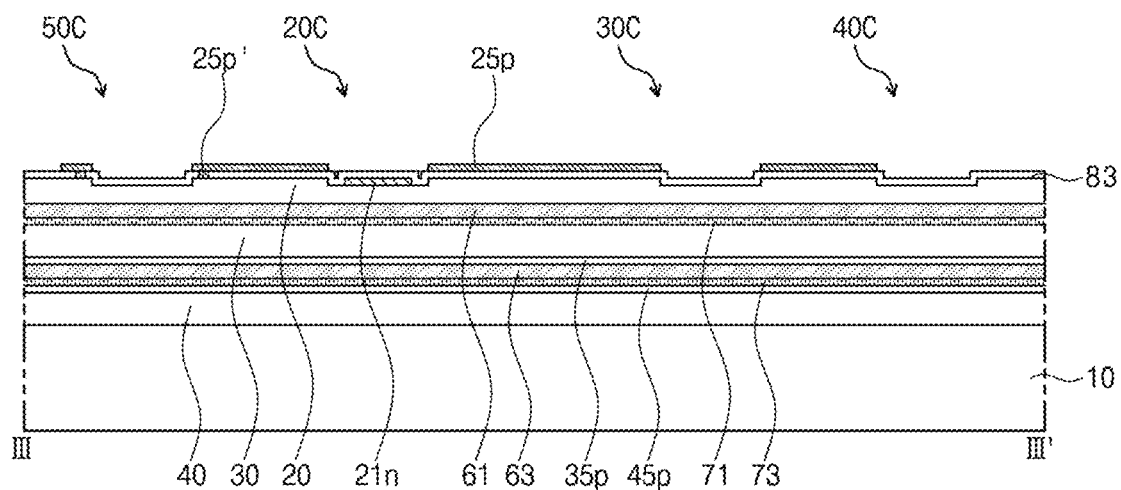
FIG. 30A and FIG. 30B are cross-sectional views taken along line of FIG. 29, respectively, according to exemplary embodiments.
Figure 30B:
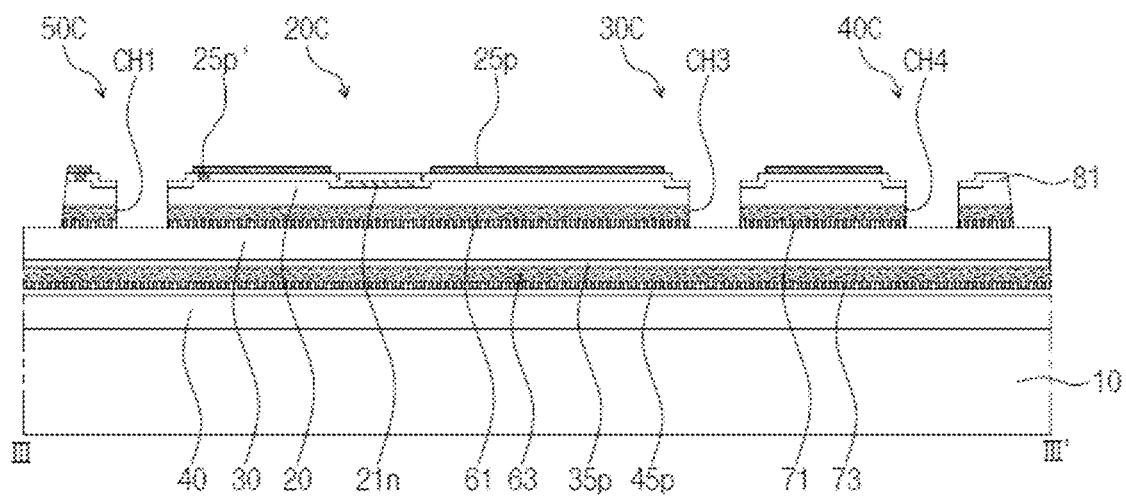

Referring to FIGS. 29, 30A and 30B, the first p-type contact electrode 25p is formed on the first epitaxial stack 20 that is formed with the first optically non-transmissive film 83, or the like. The first p-type contact electrode 25p may include a reflective material and is formed to cover the light emitting region. The first p-type contact electrode 25p may be formed by forming a reflective conductive material on the front side and then patterning the same using photolithography, or the like.

After the first p-type contact electrode 25p is formed, portions of the first epitaxial stack 20, the first adhesive layer 61, and the first wavelength pass filter 71 are removed in the regions corresponding to the non-light emitting region other than the light emitting region, the common contact 50C, the second contact 30C, and the third contact 40C, resulting in formation of the first to fourth contact holes CH1, CH2, CH3, and CH4. As such, the upper surface of the n-type semiconductor layer of the second epitaxial stack 30 is exposed at the second contact 30C.

In this case, the first epitaxial stack 20, the first adhesive layer 61, and the first wavelength pass filter 71 may be patterned by dry etching or wet etching using photolithography. The sides of the first epitaxial stack 20, the first adhesive layer 61, and the first wavelength pass filter 71 are obliquely patterned with respect to one surface of the substrate 10. Specifically, the angle formed between the first epitaxial stack 20 and one side of the substrate may be between about 45 degrees and about 85 degrees.

Figure 31:
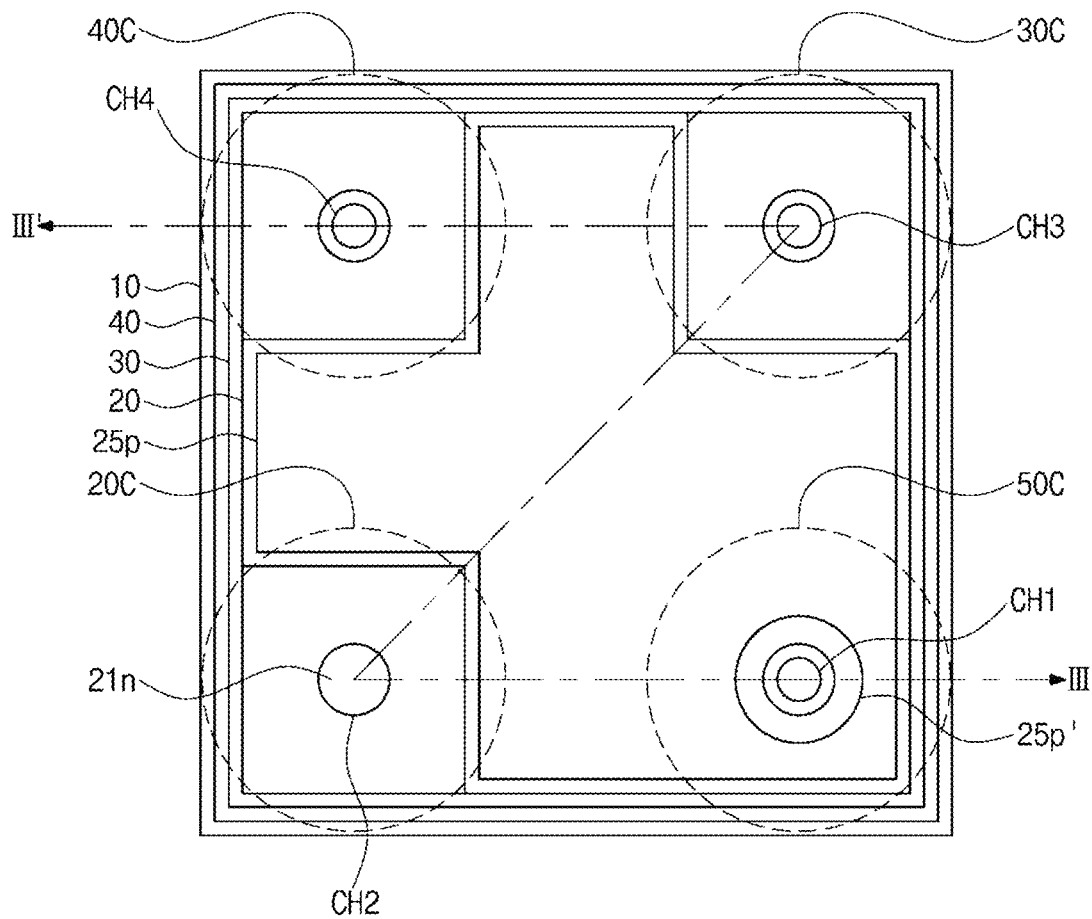
Figure 32A:
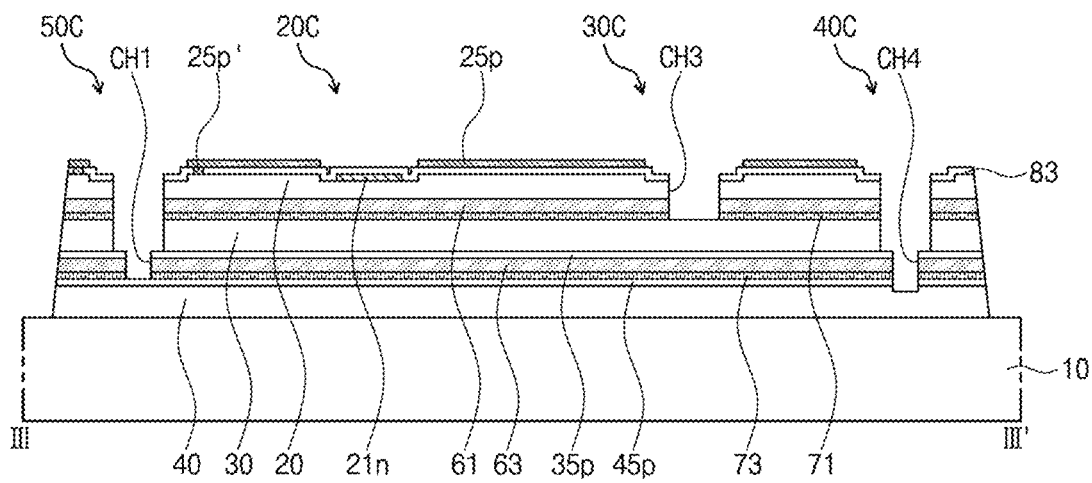
FIG. 32A and FIG. 32B are cross-sectional views taken along line of FIG. 31, respectively, according to exemplary embodiments.
Figure 32B:
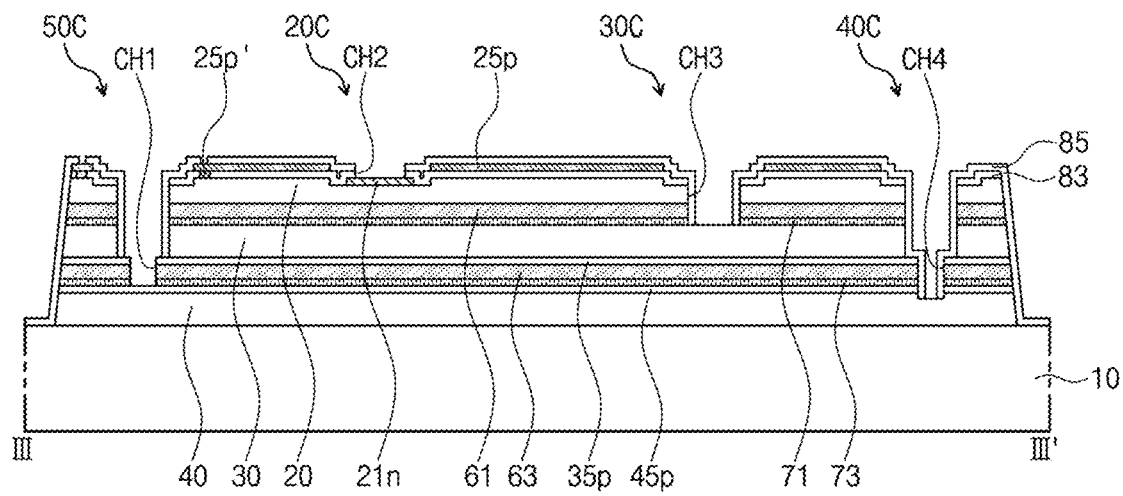

Referring to FIGS. 31, 32A and 32B, in the first contact hole CH1 of the common contact 50C, which is one of the regions corresponding to the non-light emitting region other than the light emitting region, the common contact 50C, the second contact 30C, the third contact 40C, and a portion of the upper surface of the second epitaxial stack 30 is removed, thus exposing a portion of the upper surface of the second p-type contact electrode 35p. In this case, the side of the second epitaxial stack 30 is obliquely patterned with respect to the upper surface of the substrate 10, and the angle formed between the second epitaxial stack 30 and upper surface of the substrate 10 may be between about 45 degrees and about 85 degrees.

Then, portions of the second p-type contact electrode 35p, the second adhesive layer 63, and the second wavelength pass filter 73 are additionally removed, exposing the upper surface of the third p-type contact electrode 45p. Further, in the fourth contact hole CH4 of the third contact 40C, portions of the second p-type contact electrode 35p, the second adhesive layer 63, the second wavelength pass filter 73, and the third epitaxial stack 40 are removed, exposing the upper surface of the n-type semiconductor layer of the third epitaxial stack 40. The third epitaxial stack 40 is additionally removed from the region except for the light emitting region.

The sides of the third epitaxial stack 40, the second adhesive layer 63, the second wavelength pass filter 73, and the third p-type contact electrode 45p are obliquely patterned with respect to the upper surface of the substrate 10. Specifically, the angle formed between the third epitaxial stack 40 and upper side of the substrate 10 may be between about 45 degrees and about 85 degrees.

Next, the second optically non-transmissive film 85 is formed on the substrate 10 that is formed with the contact holes, or the like. Since the other components including the first to third epitaxial stacks 20, 30, and 40 are inclined, the second optically non-transmissive film 85 may be formed with a sufficient thickness along the inclined sides. In general, it may be difficult to form the second optically non-transmissive film 85 with a sufficient thickness if the other components including the first to third epitaxial stacks 20, 30, and 40 have vertical or nearly vertical sides. The second optically non-transmissive film 85 may also be a DBR or an organic polymer film having a black color. In an exemplary embodiment, a floating metal reflective film may further be provided on the first optically non-transmissive film 83. In an exemplary embodiment, the optically non-transmissive film may be formed by depositing two or more insulating films having refractive indices different from each other.

The second optically non-transmissive film 85 is formed on the front side of the substrate 10 and then patterned to expose underlying components in some regions. Accordingly, the second optically non-transmissive film 85 has the first 'contact hole CH1' partially exposing the upper surface of the first p-type contact electrode 25p at the common contact 50C, the first contact hole CH1 exposing the upper surfaces of the second and third n-type contact electrodes, the second contact hole CH2 exposing the upper surface of the first n-type contact electrode 21n at the first contact 20C, the third contact hole CH3 exposing the upper surface of the n-type semiconductor layer of the second epitaxial stack 30 at the second contact 30C, and fourth contact hole CH4 exposing the upper surface of the n-type semiconductor layer of the third epitaxial stack 40 at the third contact 40C.

Figure 33:
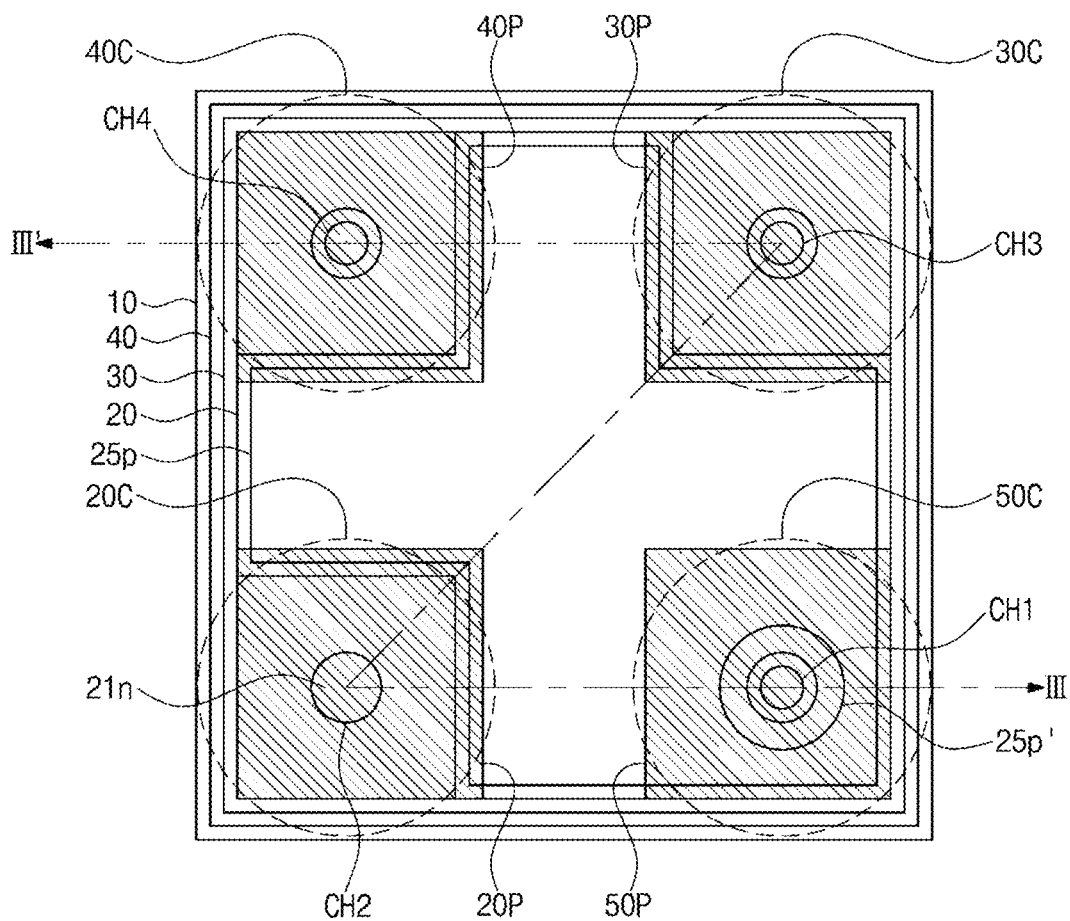
Figure 34:
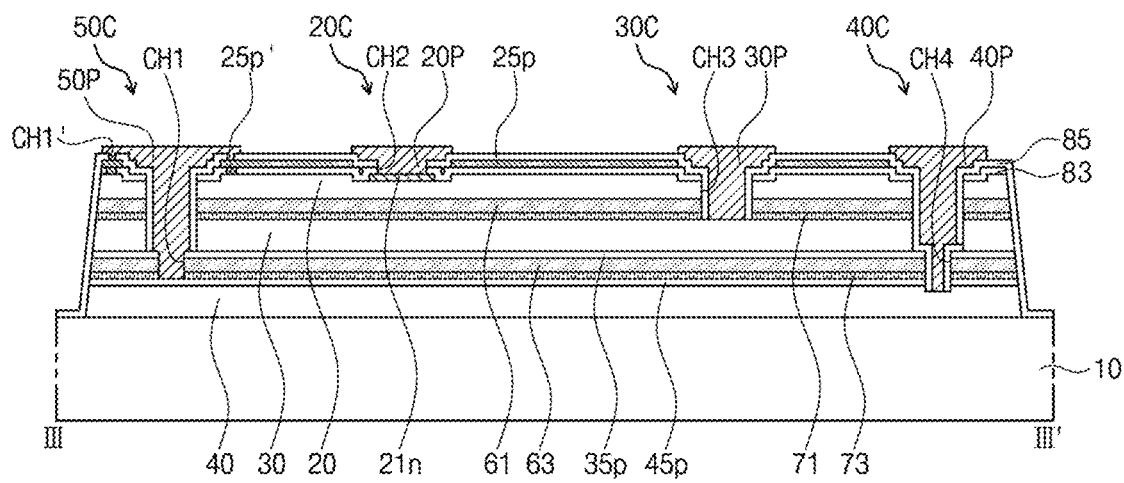
FIG. 34 is a cross-sectional view taken along line of FIG. 33.

Referring to FIGS. 33 and 34, the common pad 50P and the first to third pads 20P, 30,P and 40P are then formed in the common contact 50C formed with the first to fourth contact holes CH1, CH2, CH3, and CH4, and in the first to third contacts 20C, 30C, and 40C.

According to an exemplary embodiment, irregularities may be selectively provided on the lower surfaces of the first to third epitaxial stacks 20, 30, and 40. Each of the irregularities may be provided only at a portion corresponding to the light emitting region.

Further, according to an exemplary embodiment, an additional optically non-transmissive film may be further provided on the side of the light emitting stacked structure.

By providing the optically non-transmissive film on the sides of the light emitting stacked structure, it is possible to prevent the phenomenon in which light emitted from a certain light emitting stacked structure affects adjacent light emitting stacked structures, or the phenomenon in which color is mixed with the light emitted from the adjacent light emitting stacked structures.

As described above, since the common voltage and the light emitting signal are applied to the common contact 50C and the first to third contacts 20C, 30C, and 40C, respectively, whether or not to emit the light at the first to third epitaxial stacks 20, 30, and 40 can be independently controlled, and as a result, various colors can be implemented using emission of light from each of the epitaxial stacks.

Figure 35:
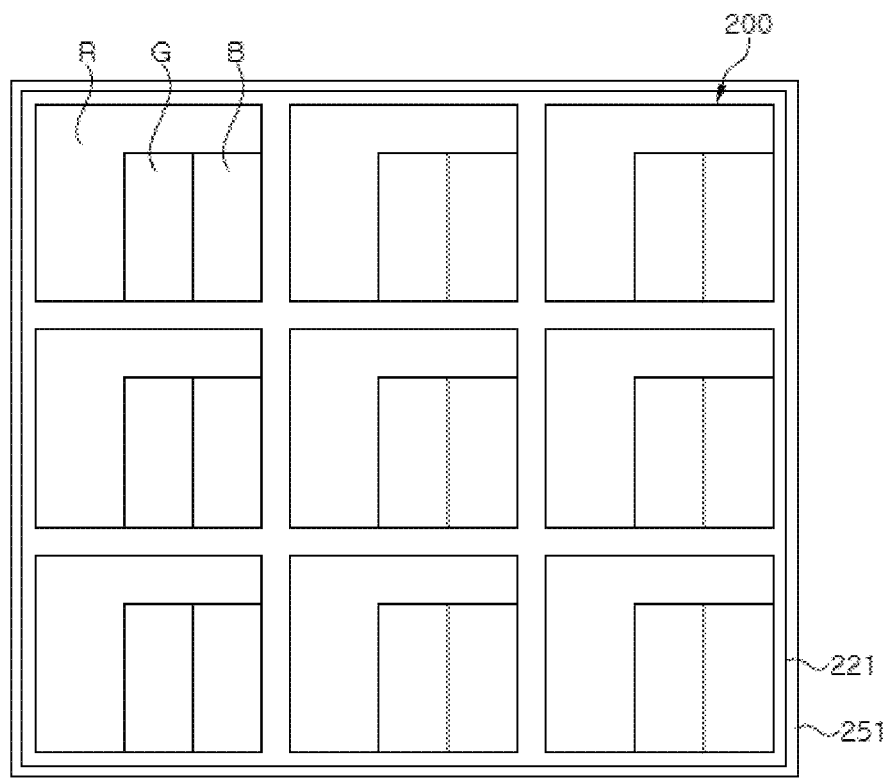
FIG. 35 is a plan view schematically illustrating a display apparatus according to an exemplary embodiment.
Figure 36:
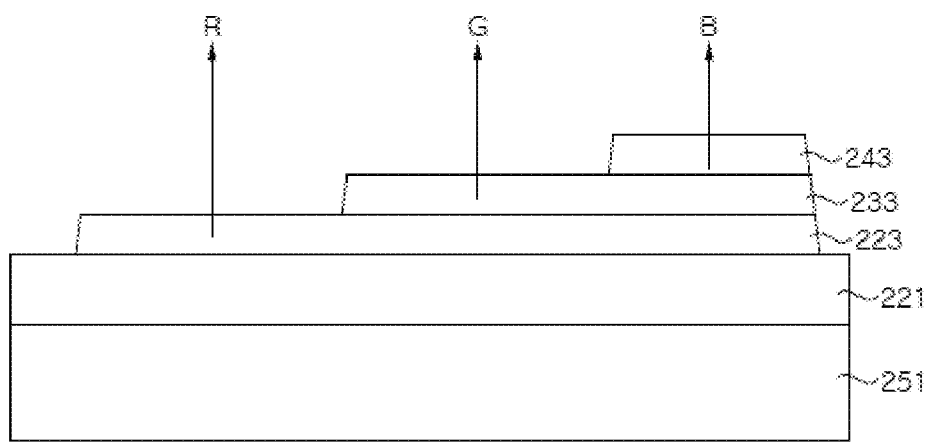
FIG. 36 is a schematic cross-sectional of a light-emitting diode (LED) pixel for a display according to an exemplary embodiment.

FIG. 35 is a schematic plan view of a display apparatus according to an exemplary embodiment. FIG. 36 is a schematic cross-sectional view of an LED pixel for a display according to an exemplary embodiment.

Referring to FIGS. 35 and 36, a display apparatus 201 includes a circuit board 251 and a plurality of pixels 200. Each of the pixels 200 may include a substrate 221, and a first sub-pixel R, a second sub-pixel G, and a third sub-pixel B disposed on the substrate 221. In another exemplary embodiment, the substrate 221 may be omitted.

The circuit board 251 may have a passive circuit or an active circuit. For example, the passive circuit may include data lines and scan lines. For example, the active circuit may include a transistor and/or a capacitor. The circuit board 251 may have a circuit located on a surface thereof or located therein. The circuit board 251 may include, for example, a glass substrate, a sapphire substrate, a Si substrate, or a Ge substrate.

The substrate 221 may support the first through third sub-pixels R, G, and B. When the substrate 221 is omitted, the first through third sub-pixels R, G, and B may be supported by the circuit board 251. The substrate 221 may be formed continuously over the plurality of pixels 200 and electrically connect the first through third sub-pixels R, G, and B to the circuit board 251. The substrate 221 may be, for example, a GaAs substrate, but is not limited thereto.

The first sub-pixel R includes a first LED stack 223, the second sub-pixel G includes a second LED stack 233, and the third sub-pixel B includes a third LED stack 243. The first sub-pixel R is configured so that light is emitted from the first LED stack 223, the second sub-pixel G is configured so that light is emitted from the second LED stack 233, and the third sub-pixel B is configured so that light is emitted from the third LED stack 243. The first through third LED stacks 223, 233, and 243 may be driven independently of each other.

The first LED stack 223, the second LED stack 233, and the third LED stack 243 are stacked in a vertical direction to overlap each other. The second LED stack 233 may be disposed on a partial region of the first LED stack 223. The second LED stack 233 may disposed toward one side on the first LED stack 223. The third LED stack 243 may be disposed on a partial region of the second LED stack 233. The third LED stack 243 may be disposed toward one side on the second LED stack 233. However, the inventive concepts are not limited thereto, and the third LED stack 243 may be disposed toward left side of the second LED stack 233.

Light R generated in the first LED stack 223 may be emitted from a region that is not covered by the second LED stack 233, and light G generated in the second LED stack 233 may be emitted from a region that is not covered by the third LED stack 243. In particular, light generated in the first LED stack 223 may be emitted to the outside without passing through the second LED stack 233 and the third LED stack 243, and light generated in the second LED stack 233 may be emitted to the outside without passing through the third LED stack 243.

In addition, an area of a region from which the light R is emitted from the first LED stack 223, an area of a region from which the light G is emitted from the second LED stack 233, and an area of a region of the third LED stack 243 may be different from each other, and an intensity of light emitted from each of the first through third LED stacks 223, 233, and 243 may be adjusted by adjusting these areas.

However, the inventive concepts are not limited thereto. Light generated in the first LED stack 223 may pass through the second LED stack 233 or pass through the second LED stack 233 and the third LED stack 243, and emitted to the outside. Light generated in the second LED stack 233 may pass through the third LED stack 243 and emitted to the outside.

Each of the first LED stack 223, the second LED stack 233, and the third LED stack 243 includes a first conductivity type semiconductor layer (for example, an n-type semiconductor layer), a second conductivity type semiconductor layer (for example, a p-type semiconductor layer), and an active layer interposed therebetween. The active layer may have, in particular, a multiple quantum well structure. The first through third LED stacks 223, 233, and 243 may include different active layers, and thus may emit light of different wavelengths. For example, the first LED stack 223 may be an inorganic LED emitting red light, the second LED stack 233 may be an inorganic LED emitting green light, and the third LED stack 243 may be an inorganic LED emitting blue light. To this end, the first LED stack 223 may include an AlGaInP-based well layer, the second LED stack 233 may include an AlGaInP-based or AlGaInN-based well layer, and the third LED stack 243 may include an AlGaInN-based well layer. However, the inventive concepts are not limited thereto, and an order of light emitted from the first LED stack 223, the second LED stack 233, and the third LED stack 243 may be changed. For example, the first LED stack 223 may emit any one of red, green, and blue light, and the second LED stack 233 and the third LED stack 243 may respectively emit a different one of the red, green, and blue light from each other.

In addition, a distribution Bragg reflector may be disposed between the substrate 221 and the first LED stack 223 to prevent light generated in the first LED stack 223 from being absorbed by the substrate 221 and lost. For example, a distribution Bragg reflector formed by alternately stacking an AlAs-based semiconductor layer and an AlGaAs-based semiconductor layer.

The third LED stack 243 and the second LED stack 233 may have inclined side surfaces. The inclined side surfaces may enhance reliability of a display apparatus by increasing a step coverage of an insulating layer or an interconnection line, such as a connector, formed on a side surface of the LED stacks 233 and 243. The first LED stack 223 may also have an inclined side surface. As used herein, a connector may be any type of structure, including through holes, vias, wires, lines, conductive material, and the like, that serves to electrically and/or mechanically connect two elements, such as layers.

Figure 37A:
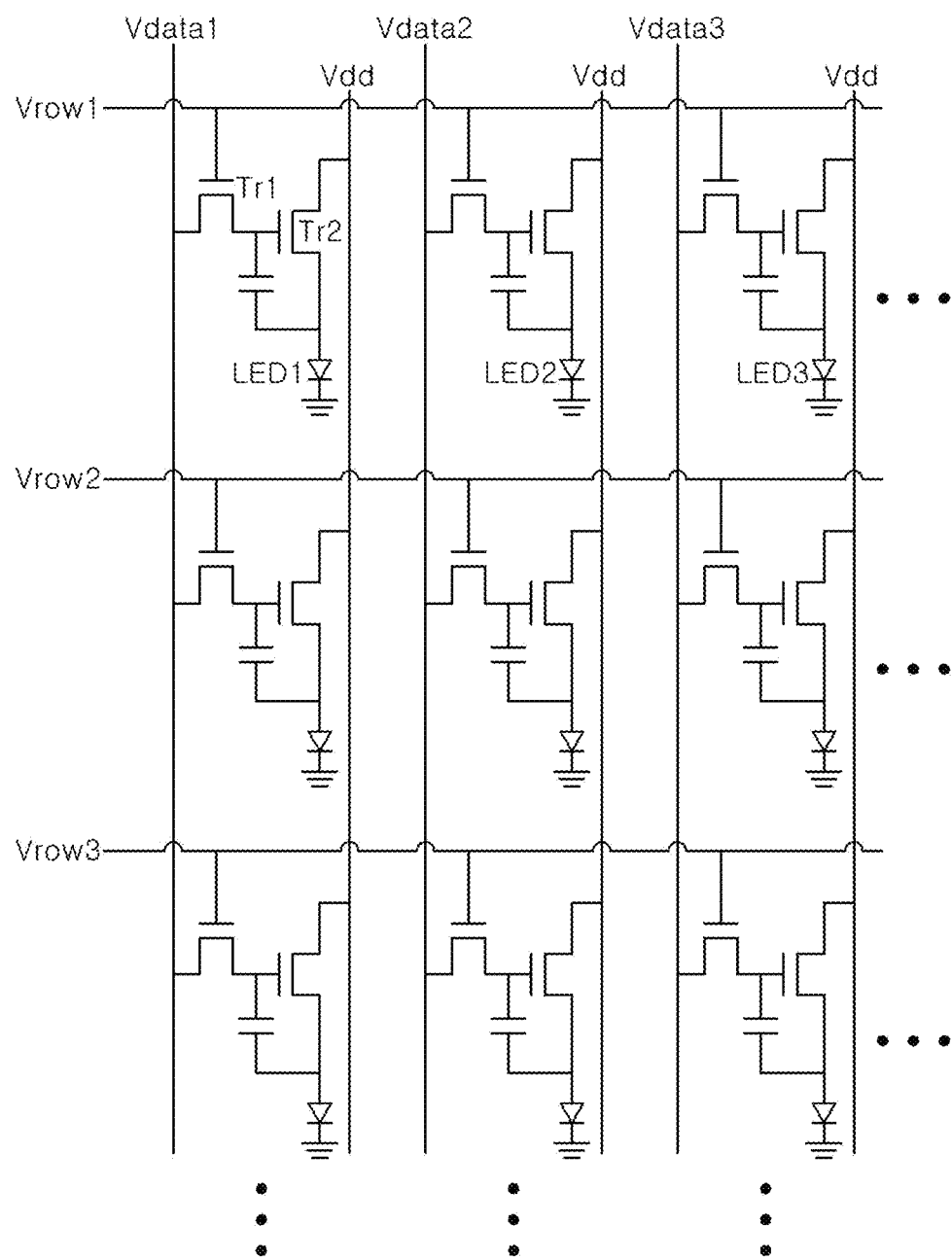
FIG. 37A and FIG. 37B are circuit diagrams of a display apparatus according to exemplary embodiments.
Figure 37B:
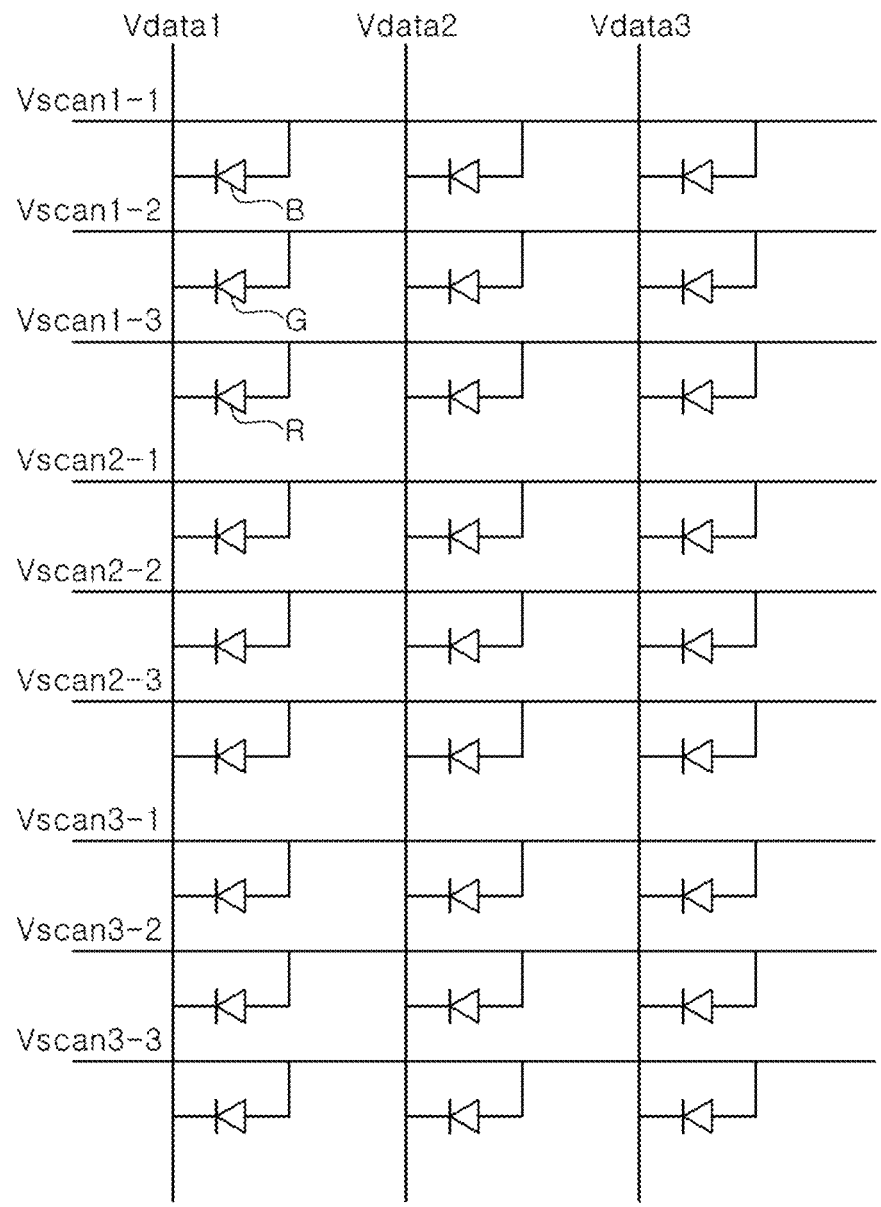

FIGS. 37A and 37B are schematic circuit diagrams of a display apparatus according to exemplary embodiments.

Referring to FIG. 37A, a display apparatus according to an exemplary embodiment may be driven in an active matrix manner. To this end, a circuit board may include an active circuit.

For example, a driving circuit according to an exemplary embodiment may include two or more transistors, for example, transistors Tr1 and Tr2, and a capacitor. When a power source is connected to selection lines Vrow1 through Vrow3, and when data voltage is applied to data lines Vdata1 through Vdata3, voltage may be applied to a corresponding LED. In addition, a corresponding capacitor may be charged with electric charges based on values of the data lines Vdata1 through Vdata3. A state in which the transistor Tr2 is turned on may be maintained by the charged voltage of the capacitor, and accordingly, the voltage of the capacitor may be maintained and be applied to LEDs LED1 through LED3 even though a power supply to the line Vrow1 is cut off. In addition, current flowing in the LEDs LED1 through LED3 may be changed based on the values of the data lines Vdata1 through Vdata3. Current may be supplied through Vdd at all times, and thus it is possible to continue to emit light.

The transistors Tr1 and Tr2 and the capacitor may be formed in the circuit board 251. Here, the LEDs LED1 through LED3 may correspond to the first through third LED stacks 223, 233, and 243 stacked in a single pixel, respectively. Anodes of the first through third LED stacks 223, 233, and 243 are connected to the transistors Tr2, and cathodes thereof may be grounded. As shown in FIG. 37A, the cathodes of the first through third LED stacks 223, 233, and 243 may be connected in common and grounded.

FIG. 37A shows a circuit diagram for active matrix driving, however, the inventive concepts are not limited thereto, and another circuit may be used. In addition, although anodes of the LEDs LED1 through LED3 are described as being connected to different transistors (for example, the transistors Tr2) and cathodes thereof are described as being grounded, according to some exemplary embodiments, the anodes of the first through third LED stacks 223, 233, and 243 may be connected in common, and the cathodes may be connected to different transistors.

FIG. 37B is a schematic circuit diagram for a passive matrix driving.

The circuit board 251 may include data lines, for example, Vdata1, Vdata2, Vdata3, and the like, and scan lines, for example, Vscan1-1, Vscan1-2, Vscan1-3, Vscan2-1, and the like. Each of first through third sub-pixels R, G, and B may be connected to a data line and a scan line. Anodes of the first through third sub-pixels R, G, and B may be connected to different scan lines (for example, Vscan1-1, Vscan1-2 and Vscan1-3), and cathodes thereof may be connected in common to the data line Vdata1. However, the inventive concepts are not limited thereto, and anodes of the first through third sub-pixels R, G, and B may be connected in common to a data line, and cathodes thereof may be connected to different scan lines.

According to an exemplary embodiment, each of the first through third LED stacks 223, 233, and 243 may be driven by using a pulse-width modulation method or by changing a current intensity, so that a brightness of each sub-pixel may be adjusted. Furthermore, the brightness may be adjusted by changing an area of each of the first through third LED stacks 223, 233, and 243, and an area of a region from which light R, G, and B is emitted in each of the first through third LED stacks 223, 233, and 243. For example, an area of an LED stack, for example, the first LED stack 223, that emits light with low visibility may be greater than an area of the second LED stack 233 or an area of the third LED stack 243, so as to emit light with a higher intensity under the same current density. Also, since the area of the second LED stack 233 is greater than the area of the third LED stack 243, the second LED stack 233 may emit light with a higher intensity than that of the third LED stack 243 under the same current density. As such, an output of light may be controlled in consideration of visibility of light emitted from the first LED stack 223, the second LED stack 233, and the third LED stack 243 by adjusting an area of each of the first through third LED stacks 223, 233, and 243.

Figure 38A:
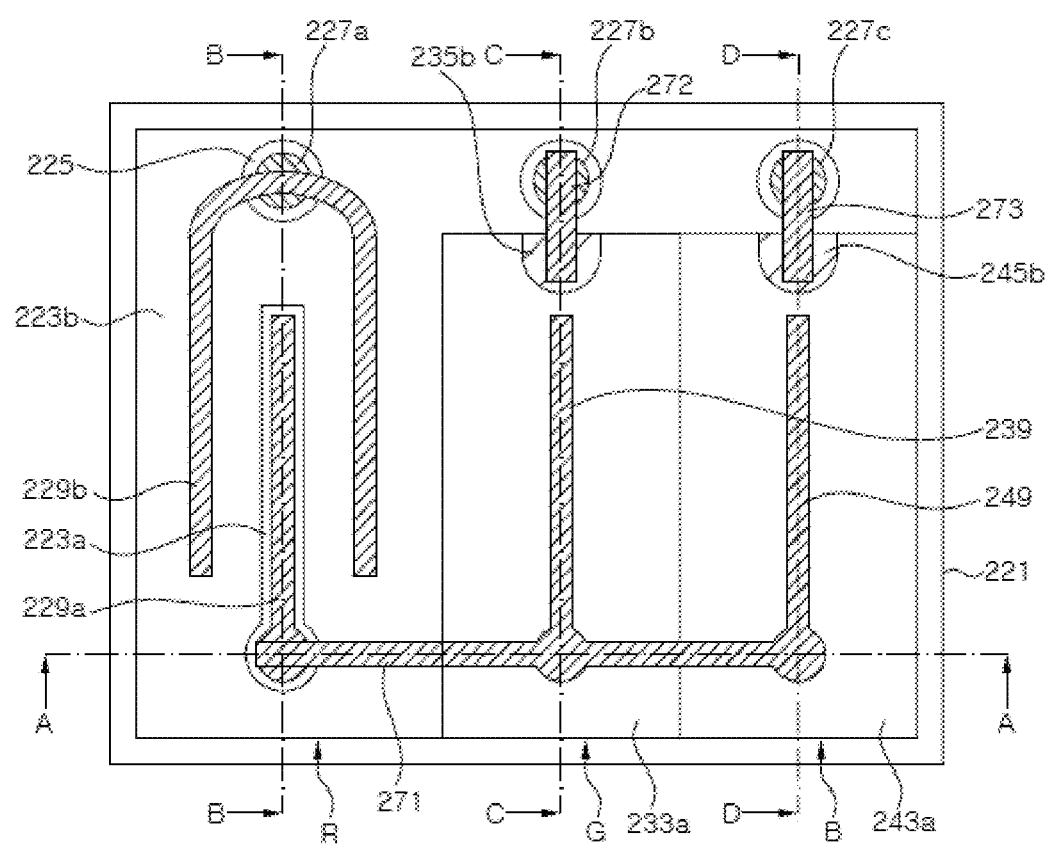
FIG. 38A and FIG. 38B are an enlarged plan view and an enlarged bottom view of one pixel of a display apparatus according to an exemplary embodiment, respectively.
Figure 38B:
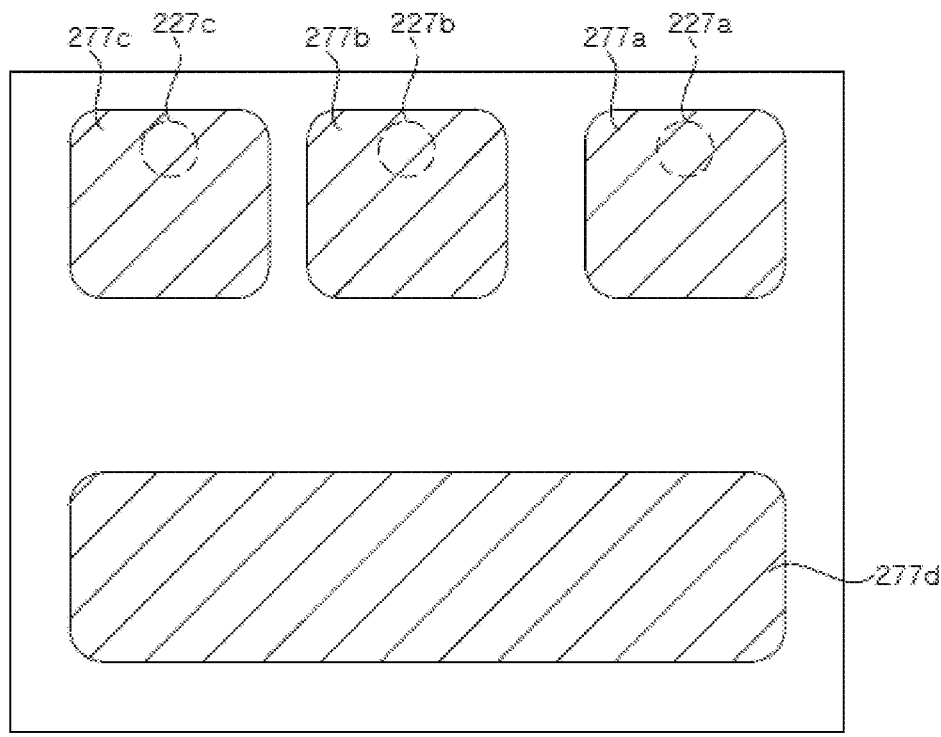

FIGS. 38A and 38B are an enlarged plan view and an enlarged bottom view of one pixel region of a display apparatus according to an exemplary embodiment, respectively. FIGS. 39A, 39B, 39C, and 39D are schematic cross-sectional views taken along dotted lines A-m A, B-B, C-C, and D-D of FIG. 38A, respectively.

A pixel of a display apparatus is disposed on a circuit board (for example, the circuit board 251 of FIG. 35), and includes a substrate 221, and first through third sub-pixels R, G and B. The substrate 221 may be continuous over a plurality of pixels. Hereinafter, a single pixel will be described in more detail.

Referring to FIGS. 38A, 38B, 39A, 39B, 39C, and 39D, a pixel may include a substrate 221, a distribution Bragg reflector 222, an insulating layer 225, through-vias 227a, 227b, and 227c, a first LED stack 223, a second LED stack 233, a third LED stack 243, a first-1 ohmic electrode 229a, a first-2 ohmic electrode 229b, a second-1 ohmic electrode 239, a second-2 ohmic electrode 235, a third-1 ohmic electrode 249, a third-2 ohmic electrode 245, a first bonding layer 253, a second bonding layer 255, an upper insulating layer 261, connectors 271, 272, and 273, a lower insulating layer 275, and electrode pads 277a, 277b, 277c, and 277d.

The first through third sub-pixels R, G, and B may include LED stacks 223, 233, and 243, and ohmic electrodes, respectively. In addition, anodes of the first through third sub-pixels R, G, and B may be electrically connected to the electrode pads 277a, 277b, and 277c, respectively, and cathodes thereof may be electrically connected to the electrode pad 277d. Thus, the first through third sub-pixels R, G, and B may be driven independently of each other.

The substrate 221 supports the first through third LED stacks 223, 233, and 243. The substrate 221 may be a growth substrate capable of growing AlGaInP-based semiconductor layers, and may include, for example, a GaAs substrate. In particular, the substrate 221 may be a semiconductor substrate, and may exhibit n-type conductivity.

The first LED stack 223 includes a first conductivity type semiconductor layer 223a and a second conductivity type semiconductor layer 223b, and the second LED stack 233 includes a first conductivity type semiconductor layer 233a and a second conductivity type semiconductor layer 233b. The third LED stack 243 includes a first conductivity type semiconductor layer 243a and a second conductivity type semiconductor layer 243b. An active layer may be interposed between each of the first conductivity type semiconductor layers 223a, 233a, and 243a and each of the second conductivity type semiconductor layers 223b, 233b, and 243b.

According to an exemplary embodiment, each of the first conductivity type semiconductor layers 223a, 233a, and 243a may be an n-type semiconductor layer, and each of the second conductivity type semiconductor layers 223b, 233b, and 243b may be a p-type semiconductor layer. A surface roughened by surface texturing (or irregularities) may be formed on an upper surface of each of the first conductivity type semiconductor layers 223a, 233a, and 243a. However, the inventive concepts are not limited thereto, and semiconductor types of the first conductivity semiconductor layer and the second conductivity semiconductor layer may be reversed.

The first LED stack 223 is disposed close to the circuit board 251, the second LED stack 233 is located on the first LED stack 223, and the third LED stack 243 is located on the second LED stack 233. The second LED stack 233 is disposed on a partial region of the first LED stack 223 so that the first LED stack 223 partially overlaps the second LED stack 233. The third LED stack 243 is disposed on a partial region of the second LED stack 233 so that the second LED stack 233 partially overlaps the third LED stack 243. Thus, light generated in the first LED stack 223 may be emitted to the outside without passing through the second and third LED stacks 233 and 243. Also, light generated in the second LED stack 233 may be emitted to the outside without passing through the third LED stack 243.

Materials of the first LED stack 223, the second LED stack 233, and the third LED stack 243 are substantially the same as those described with reference to FIG. 36, and accordingly, duplicated descriptions thereof will be omitted to avoid redundancy.

The first LED stack 223 has an inclined side surface. As used herein, the "inclined side surface" may refer to a surface that is not perpendicular to an upper surface or a lower surface of the first LED stack 223, and in particular, which forms an inclination angle between a side surface and the lower surface of the first LED stack 223 less than about 90 degrees. The second LED stack 233 and the third LED stack 243 may also include inclined side surfaces. In particular, a side surface of the second LED stack 233 may have an angle of inclination less than 90 degrees with respect to a lower surface of the second LED stack 233, and a side surface of the third LED stack 243 may also have an angle of inclination less than 90 degrees with respect to a lower surface of the third LED stack 243.

Figure 39A:
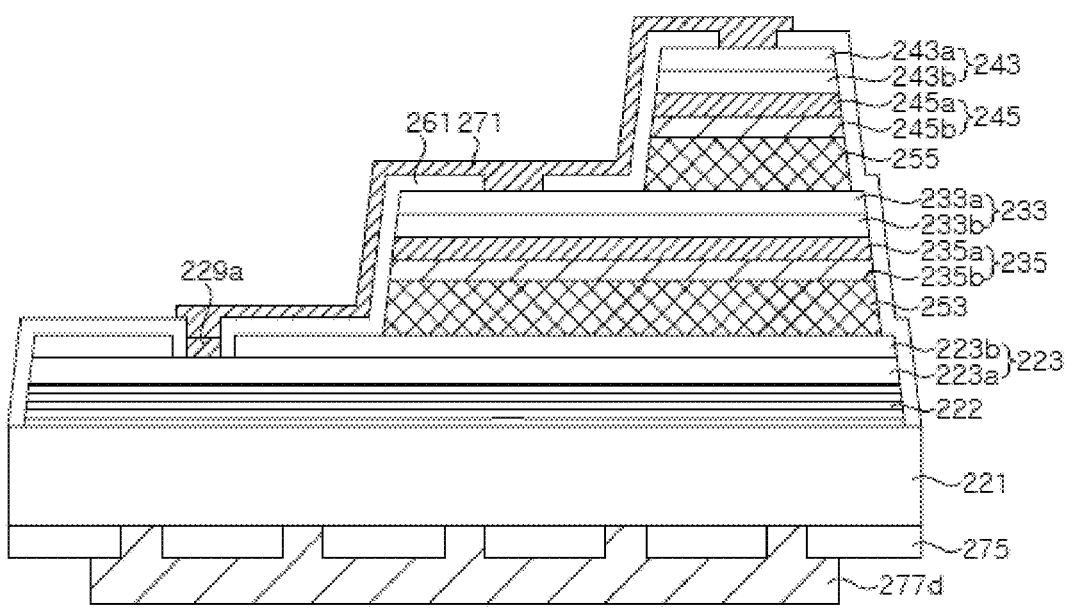
FIG. 39A is a schematic cross-sectional view taken along line A-A of FIG. 38A.
Figure 39B:
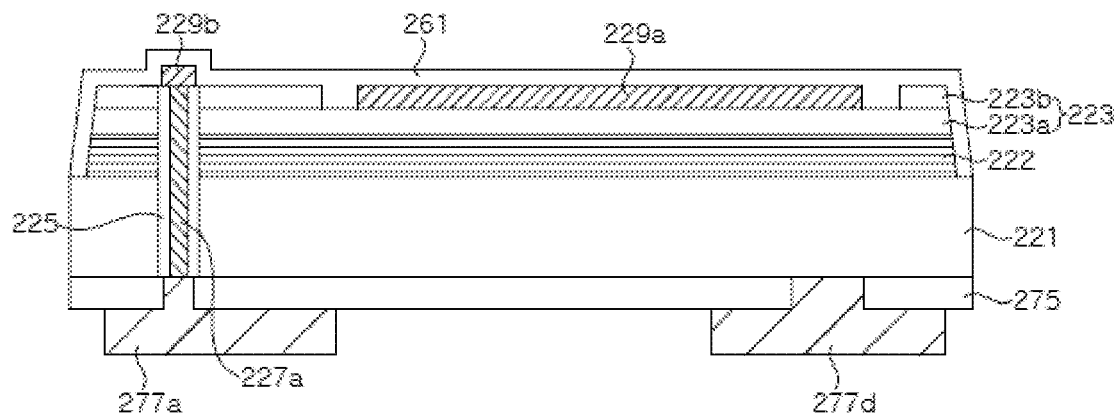
FIG. 39B is a schematic cross-sectional view taken along line B-B of FIG. 38A.

While FIG. 39A shows that all the first through third LED stacks 223, 233, and 243 have inclined side surfaces, however, the inventive concepts are not limited thereto. For example, at least one of the first through third LED stacks 223, 233, and 243 may not have an inclined side surface. Furthermore, according to some exemplary embodiments, only a portion of the side surface of the first LED stack 223, the second LED stack 233, or the third LED 243 may be inclined.

The distribution Bragg reflector 222 is interposed between the substrate 221 and the first LED stack 223. The distribution Bragg reflector 222 may be formed with semiconductor layers grown on the substrate 221. For example, the distribution Bragg reflector 222 may be formed by alternately stacking an AlAs layer and an AlGaAs layer. The distribution Bragg reflector 222 may be semiconductor layers, which electrically connects the substrate 221 and the first conductivity type semiconductor layer 223a of the first LED stack 223. The distribution Bragg reflector 222 may also have an inclined side surface, but is not limited thereto.

The through-vias 227a, 227b, and 227c that pass through the substrate 221 may be formed. The through-vias 227a, 227b, and 227c may also pass through the first LED stack 223. The through-vias 227a, 227b, and 227c may be formed of a conductive paste or by plating. Although the through-vias 227a, 227b, and 227c are shown as having a constant width, the inventive concepts are not limited thereto. Widths of the through-vias 227a, 227b, and 227c may be varied along horizontal or vertical direction. For example, the widths of the through-vias 227a, 227b, and 227c may decrease from top to bottom of the substrate 221.

The insulating layer 225 is disposed between the through-vias 227a, 227b, and 227c and an inner wall of a through-hole passing through the substrate 221 and the first LED stack 223, to prevent the through-vias 227a, 227b, and 227c from being short-circuited to the substrate 221 and the first LED stack 223.

The first-1 ohmic electrode 229a is in ohmic contact with the first conductivity type semiconductor layer 223a of the first LED stack 223. The first-1 ohmic electrode 229a may be formed of, for example, an Au—Te alloy or an Au—Ge alloy.

To form the first-1 ohmic electrode 229a, the second conductivity type semiconductor layer 223b and the active layer may be partially removed, and the first conductivity type semiconductor layer 223a may be exposed. The first-1 ohmic electrode 229a may be disposed away from a region in which the second LED stack 233 is disposed. In addition, the first-1 ohmic electrode 229a may include a pad region and an extension, and the connector 271 may be connected to the pad region as shown in FIG. 38A.

The first-2 ohmic electrode 229b is in ohmic contact with the second conductivity type semiconductor layer 223b of the first LED stack 223. For current dispersion, the first-2 ohmic electrode 229b may be formed to partially surround the first-1 ohmic electrode 229a, as shown in FIG. 38A. However, the first-2 ohmic electrode 229b is not necessarily formed to have an extension. The first-2 ohmic electrode 229b may be formed of, for example, an Au—Zn alloy, an Au—Be alloy, or others. In addition, the first-2 ohmic electrode 229b may be formed as a single layer, but is not limited thereto, and may be formed of multiple layers.

The first-2 ohmic electrode 229b may be connected to the through-via 227a, and accordingly, the through-via 227a may be electrically connected to the second conductivity type semiconductor layer 223b.

The second-1 ohmic electrode 239 is in ohmic contact with the first conductivity type semiconductor layer 233a of the second LED stack 233. The second-1 ohmic electrode 239 may also include a pad region and an extension. The connector 271 may electrically connect the second-1 ohmic electrode 239 to the first-1 ohmic electrode 229a, as shown in FIG. 38A. The second-1 ohmic electrode 239 may be disposed away from a region in which the third LED stack 243 is disposed.

The second-2 ohmic electrode 235 is in ohmic contact with the second conductivity type semiconductor layer 233b of the second LED stack 233. The second-2 ohmic electrode 235 may include a reflective layer 235a and a barrier layer 235b. The reflective layer 235a may reflect light generated in the second LED stack 233 to enhance a light efficiency of the second LED stack 233. The barrier layer 235b may protect the reflective layer 235a, and may function as a connection pad to which the connector 272 is connected. The second-2 ohmic electrode 235 may be formed of, for example, a metal layer, but is not limited thereto. For example, the second-2 ohmic electrode 235 may be formed of a transparent conductive layer such as a conductive oxide semiconductor layer.

The third-1 ohmic electrode 249 is in ohmic contact with the first conductivity type semiconductor layer 243a of the third LED stack 243. The third-1 ohmic electrode 249 may also include a pad region and an extension. The connector 271 may connect the third-1 ohmic electrode 249 to the first-1 ohmic electrode 229a, as shown in FIG. 38A.

The third-2 ohmic electrode 245 is in ohmic contact with the second conductivity type semiconductor layer 243b of the third LED stack 243. The third-2 ohmic electrode 245 may include a reflective layer 245a and a barrier layer 245b. The reflective layer 245a may reflect light generated in the third LED stack 243 to enhance a light efficiency of the third LED stack 243. The barrier layer 245b may protect the reflective layer 245a, and may function as a connection pad to which the connector 273 is connected. The third-2 ohmic electrode 245 may be formed of, for example, a metal layer, but is not limited thereto. For example, the third-2 ohmic electrode 245 may be formed of a transparent conductive layer such as a conductive oxide semiconductor layer.

The first-2 ohmic electrode 229b, the second-2 ohmic electrode 235, and the third-2 ohmic electrode 245 may be in ohmic contact with p-type semiconductor layers of the LED stacks, respectively, to help current spreading. The first-1 ohmic electrode 229a, the second-1 ohmic electrode 239, and the third-1 ohmic electrode 249 may be in ohmic contact with n-type semiconductor layers of the LED stacks, respectively, to help current dispersion.

The first bonding layer 253 couples the second LED stack 233 to the first LED stack 223. The second-2 ohmic electrode 235 may be in contact with the first bonding layer 253. The first bonding layer 253 may be light transmissive or light non-transmissive. The first bonding layer 253 may be formed of an organic material layer, or an inorganic material layer. The organic material layer may include, for example, SUB, poly(methyl methacrylate) (PMMA), polyimide, parylene, benzocyclobutene (BCB), or others, and the inorganic material layer may include, for example, $Al_2O_3$, $SiO_2$, $SiN_x$, or others. The organic material layer may be bonded at a high vacuum and high pressure. The inorganic material layers may be surface-planarized by, for example, a chemical mechanical polishing process, then surface energy may be controlled by using plasma, or others, and may be bonded at high vacuum using the surface energy. The first bonding layer 253 may also be formed by a spin-on-glass method, and may be formed as a metal bonding layer, such as AuSn. When a metal bonding layer is adopted, an insulating layer for electrical insulation of the first LED stack and the metal bonding layer may be disposed on the first LED stack 223. Furthermore, to prevent light generated in the first LED stack 223 from being incident to the second LED stack 233, a reflective layer may be added between the first bonding layer 253 and the first LED stack 223.

The first bonding layer 253 may also have an inclined side surface. In particular, the first bonding layer 253 may have an angle of inclination less than about 90 degrees with respect to the upper surface of the first LED stack 223. Although the angle of inclination of the first bonding layer 253 may be substantially the same as an angle of inclination of the second LED stack 233, the inventive concepts are not limited thereto. For example, the angle of inclination of the first bonding layer 253 may be different from the angle of inclination of the second LED stack 233. In an exemplary embodiment, the angle of inclination of the second LED stack 233 may be greater than the angle of inclination of the first bonding layer 253, and accordingly, it is possible to enhance a step coverage of the connectors 271, 272, and 273 or the insulating layer 261 formed on a side surface of the second LED stack 233 and/or a side surface of the first bonding layer 253. In another exemplary embodiment, the angle of inclination of the second LED stack 233 may be less than the angle of inclination of the first bonding layer 253, and accordingly, it is possible to increase a light emitting area of the second LED stack 233.

The second bonding layer 255 couples the second LED stack 233 and the third LED stack 243. The second bonding layer 255 may be disposed between the second LED stack 233 and the third-2 ohmic electrode 245, and may bond the second LED stack 233 and the third-2 ohmic electrode 245. The second bonding layer 255 may also be formed of a bonding material. In addition, an insulating layer and/or a reflective layer may be added between the second LED stack 233 and the second bonding layer 255.

The second bonding layer 255 may also have an inclined side surface. In particular, the second bonding layer 255 may have an angle of inclination less than about 90 degrees with respect to the upper surface of the second LED stack 233. Although the angle of inclination of the second bonding layer 255 may be substantially the same as an angle of inclination of the third LED stack 243, the inventive concepts are not limited thereto. For example, the angle of inclination of the second bonding layer 255 may be different from the angle of inclination of the third LED stack 243. In an exemplary embodiment, the angle of inclination of the third LED stack 243 may be greater than the angle of inclination of the second bonding layer 255, and accordingly, it is possible to enhance a step coverage of the connectors 271 and 273 or the insulating layer 261 formed on a side surface of the third LED stack 243 and/or a side surface of the second bonding layer 255. In another exemplary embodiment, the angle of inclination of the third LED stack 243 may be less than the angle of inclination of the second bonding layer 255, and accordingly, it is possible to increase a light emitting area of the third LED stack 243.

When the first bonding layer 253 and the second bonding layer 255 are formed of light transmissive materials, and when the second-2 ohmic electrode 235 and the third-2 ohmic electrode 245 are formed with transparent oxide layers, a portion of light generated in the first LED stack 223 may pass through the first bonding layer 253 and the second-2 ohmic electrode 235, may be incident to the second LED stack 233, and then may be emitted to the outside through the second LED stack 233. Also, a portion of light generated in the first LED stack 223 may pass through the second bonding layer 255 and the third-2 ohmic electrode 245, may be incident to the third LED stack 243, and then may be emitted to the outside. In addition, a portion of light generated in the second LED stack 233 may pass through the second bonding layer 255 and the third-2 ohmic electrode 245, may be incident to the third LED stack 243, and then may be emitted to the outside.

In this case, there is a need to prevent the light generated in the first LED stack 223 from being absorbed by the second LED stack 233 while the light passing through the second LED stack 233. To this end, light generated in the first LED stack 223 may need to have a smaller energy than a band gap energy of the second LED stack 233, and thus, a wavelength of light generated in the first LED stack 223 may be longer than that of light generated in the second LED stack 233.

In addition, to prevent light generated in the second LED stack 233 from being absorbed by the third LED stack 243 while the light passing through the third LED stack 243, light generated in the second LED stack 233 may have a wavelength longer than that of light generated in the third LED stack 243.

Meanwhile, when the first bonding layer 253 and the second bonding layer 255 are non-transmissive to light, reflective layers may be interposed between the first LED stack 223 and the first bonding layer 253, and between the second LED stack 233 and the second bonding layer 255, respectively, to reflect light generated in the first LED stack 223 and incident to the first bonding layer 253, and light generated in the second LED stack 233 and incident to the second bonding layer 255. The reflected light may be emitted to the outside through the first LED stack 223 and the second LED stack 233, respectively.

The upper insulating layer 261 may substantially cover the first through third LED stacks 223, 233, and 243. The upper insulating layer 261 may cover, in particular, an inclined side surface of each of the second LED stack 233 and the third LED stack 243, and may also cover a side surface of the first LED stack 223.

The upper insulating layer 261 may have openings that expose the first through third through-vias 227a, 227b, and 227c, and also have openings that expose the first conductivity type semiconductor layer 233a of the second LED stack 223, the first conductivity type semiconductor layer 243a of the third LED stack 243, the second-2 ohmic electrode 235, and the third-2 ohmic electrode 245.

The upper insulating layer 261 may be, but is not particularly limited to, an insulating material layer, and may be formed of, for example, silicon oxide or silicon nitride. The upper insulating layer 261 may be formed using a chemical vapor deposition technique, but is not limited thereto, and may be formed using a sputtering technique. In particular, when an angle of inclination of the first bonding layer 253 (or the second bonding layer 255) is greater than an angle of inclination of the second LED stack 233 (or the third LED stack 243), a step coverage may be improved by using the sputtering technique.

The connector 271 electrically connects the first-1 ohmic electrode 229a, the second-1 ohmic electrode 239, and the third-1 ohmic electrode 249 to each other. The connector 271 is formed on the upper insulating layer 261, and is insulated from the second conductivity type semiconductor layer 243b of the third LED stack 243, the second conductivity type semiconductor layer 233b of the second LED stack 233, and the second conductivity type semiconductor layer 223b of the first LED stack 223.

The connector 271 may be formed of substantially the same material as those of the second-1 ohmic electrode 239 and the third-1 ohmic electrode 249, and thus may be formed together with the second-1 ohmic electrode 239 and the third-1 ohmic electrode 249. However, the inventive concepts are not limited thereto, and the connector 271 may be formed of a conductive layer different from the second-1 ohmic electrode 239 or the third-1 ohmic electrode 249, and thus, may be formed in a process separate from a process for forming the second-1 ohmic electrode 239 and/or the third-1 ohmic electrode 249.

As shown in FIG. 39A, the connector 271 may be formed on inclined side surfaces of the second and third LED stacks 233 and 243 and the first and second bonding layers 253 and 255. Since the second and third LED stacks 233 and 243 and the first and second bonding layers 253 and 255 have the inclined side surfaces, the likelihood of disconnection of the connector 271 may be reduced or prevented as compared to when the second and third LED stacks 233 and 243 and the first and second bonding layers 253 and 255 have vertical side surfaces, and thus, reliability of a pixel may be enhanced.

The connector 272 may electrically connect the second-2 ohmic electrode 235, for example, the barrier layer 235b, and the second through-via 227b. The connector 273 electrically connects the third-2 ohmic electrode 245, for example, the barrier layer 245b, and the third through-via 227c. The connector 272 may be insulated from the first LED stack 223 by the upper insulating layer 261. The connector 273 may also be insulated from the second LED stack 233 and the first LED stack 223 by the upper insulating layer 261.

Figure 39C:
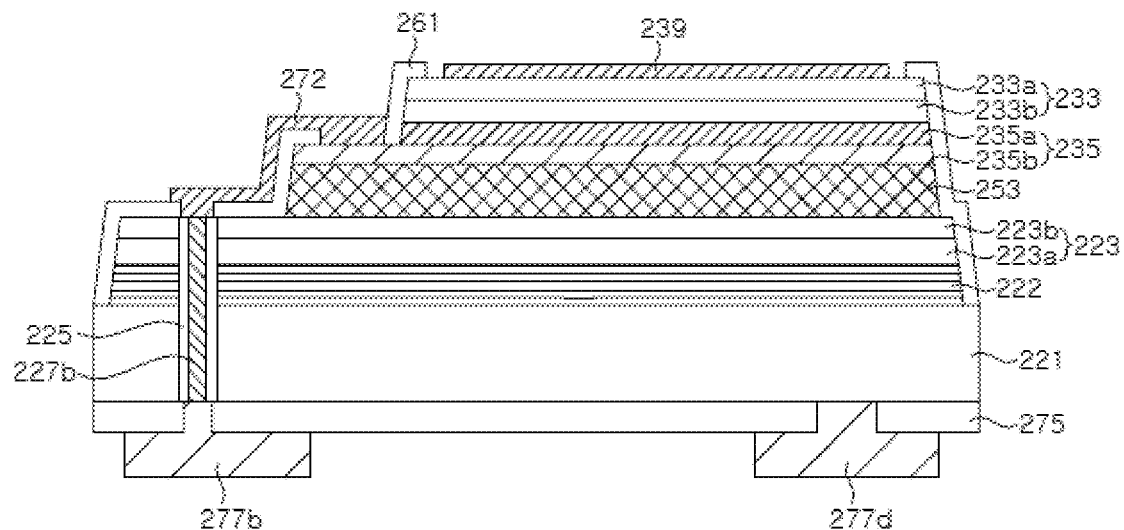
FIG. 39C is a schematic cross-sectional view taken along line C-C of FIG. 38A.
Figure 39D:
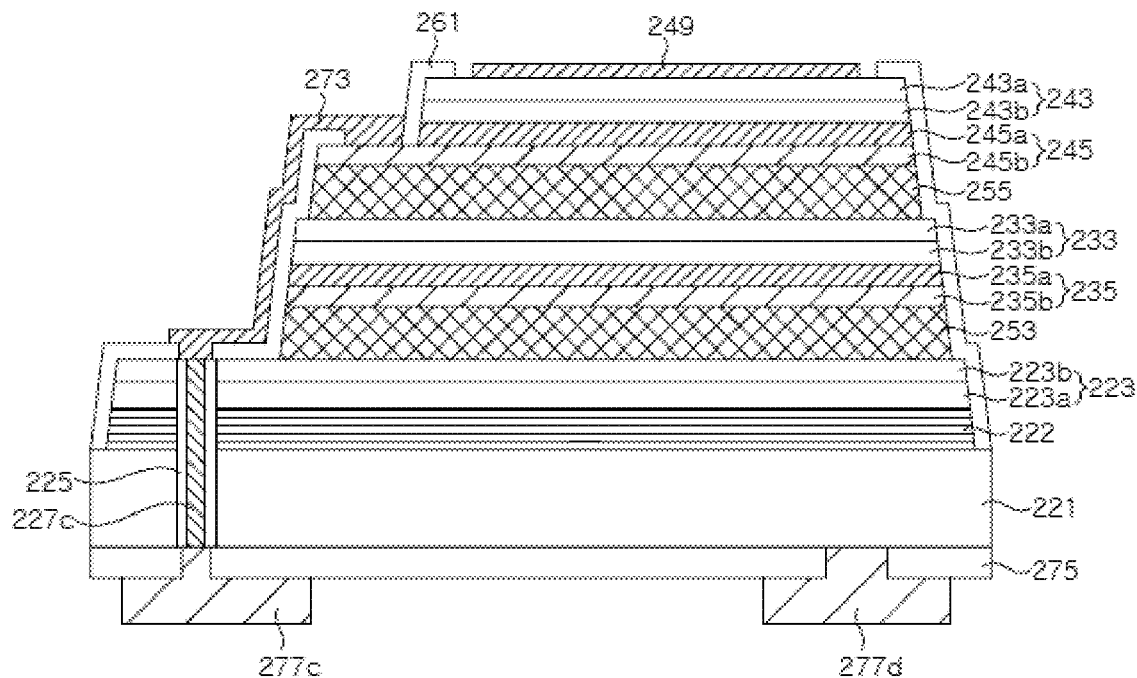
FIG. 39D is a schematic cross-sectional view taken along line D-D of FIG. 38A.

As shown in FIG. 39C, the connector 272 may be formed on the inclined side surface of the first bonding layer 253, and accordingly, an occurrence of disconnection of the connector 272 may be prevented as compared to when the first bonding layer 253 has a vertical side surface. In addition, as shown in FIG. 39D, the connector 273 may be formed on side surfaces of the second bonding layer 255, the second LED stack 233 and the first bonding layer 253, and the second bonding layer 255, the second LED stack 233, and the first bonding layer 253 have the inclined side surfaces, and accordingly, an occurrence of disconnection of the connector 273 may be prevented.

The connectors 272 and 273 may be formed together in the same process. The connectors 272 and 273 may also be formed together with the connector 271. Furthermore, the connectors 272 and 273 may be formed of substantially the same material as those of the second-1 ohmic electrode 239 and the third-1 ohmic electrode 249 together with the second-1 ohmic electrode 239 and the third-1 ohmic electrode 249. However, the inventive concepts are not limited thereto, and the connectors 272 and 273 may be formed of conductive layers different from the second-1 ohmic electrode 239 or the third-1 ohmic electrode 249, and thus, may be formed in a process separate from a process for forming the second-1 ohmic electrode 239 and/or the third-1 ohmic electrode 249.

The lower insulating layer 275 covers a bottom surface of the substrate 221. The lower insulating layer 275 may have openings that expose the first through third through-vias 227a, 227b, and 227c under the substrate 221, and also have an opening that exposes the bottom surface of the substrate 221.

The electrode pads 277a, 277b, 277c, and 277d are disposed under the substrate 221. The electrode pads 277a, 277b, and 277c are connected to the through-vias 227a, 227b, and 227c through the openings of the lower insulating layer 275, respectively, and the electrode pad 277d is connected to the substrate 221.

The electrode pads 277a, 277b, and 277c are disposed for each pixel and are electrically connected to first through third LED stacks 223, 233, and 243 of each pixel. The electrode pad 277d may be disposed for each pixel. However, since the substrate 221 is disposed continuously over a plurality of pixels, the electrode pad 277d may not need to be disposed for each pixel.

By bonding the electrode pads 277a, 277b, 277c, and 277d to the circuit board 251, a display apparatus according to an exemplary embodiment may be provided.

Hereinafter, a method of manufacturing a display apparatus according an exemplary embodiment will be described.

FIGS. 40A through 47B are plan views and cross-sectional views schematically illustrating a method of manufacturing a display apparatus according to an exemplary embodiment. Each of the cross-sectional views is taken along line E-E of a corresponding plan view.

Figure 40A:
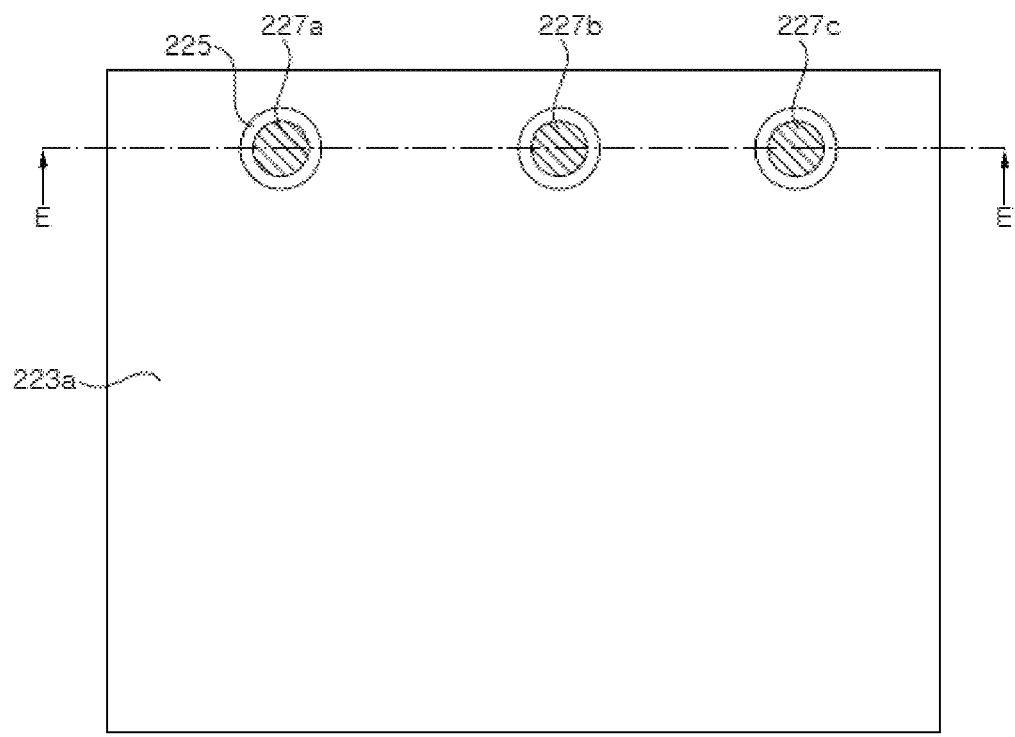
FIG. 40A, FIG. 41A, FIG. 42A, FIG. 43A, FIG. 44A, FIG. 45A, FIG. 46A, and FIG. 47A are plan views schematically illustrating a method of manufacturing a display apparatus according to an exemplary embodiment.
Figure 40B:
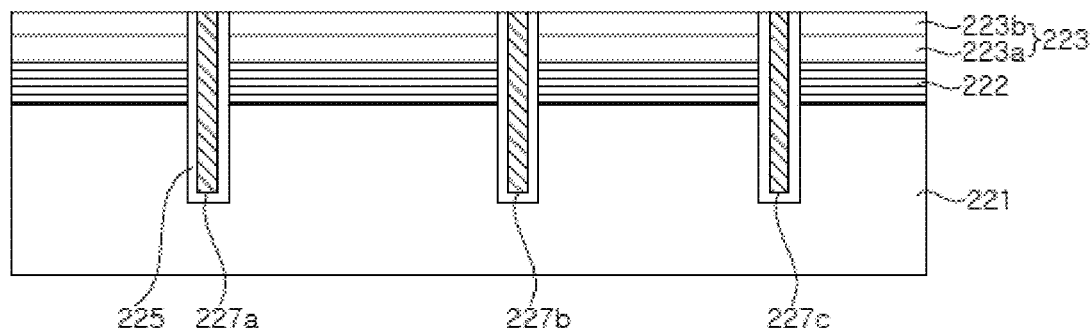
FIG. 40B, FIG. 41B, FIG. 42B, FIG. 43B, FIG. 44B, FIG. 45B, FIG. 46B, and FIG. 47B are cross-sectional view taken along line E-E of FIG. 40A, FIG. 41A, FIG. 42A, FIG. 43A, FIG. 44A, FIG. 45A, FIG. 46A, and FIG. 47A, respectively.

Referring to FIGS. 40A and 40B, a first LED stack 223 is grown on a substrate 221. The substrate 221 may be, for example, a GaAs substrate. The first LED stack 223 is formed with AlGaInP-based semiconductor layers, and includes a first conductivity type semiconductor layer 223a, an active layer, and a second conductivity type semiconductor layer 223b. Before the first LED stack 223 is grown, a distribution Bragg reflector 222 may be formed first on the substrate 221. The distribution Bragg reflector 222 may have, for example, a stack structure of alternating AlAs and AlGaAs layers.

Next, grooves are formed on the substrate 221 and the first LED stack 223 using a photolithography and etching process. The grooves may pass through the substrate 221, or may be formed to have a height less than a thickness of the substrate 221, as shown in the drawings.

Next, an insulating layer 225 covering a side wall of each of the grooves is formed, and through-vias 227a, 227b and 227c filling the grooves are formed. For example, after an insulating layer 225 covering a side wall of each of the grooves is formed, the through-vias 227a, 227b, and 227c may be formed by filling the grooves with a conductive layer using a plating technique, or filling the grooves with a conductive paste, and by removing a conductive material layer and an insulating layer remaining on an upper surface of the first LED stack 223 using a chemical mechanical polishing technique, or the like.

Figure 41A:
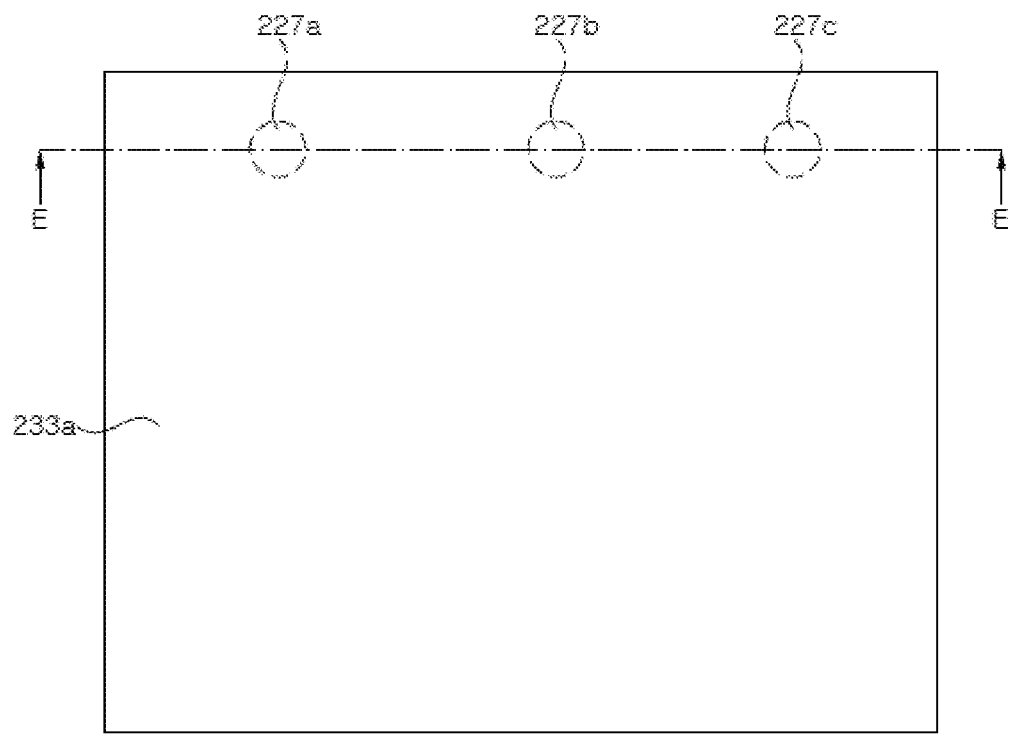
Figure 41B:
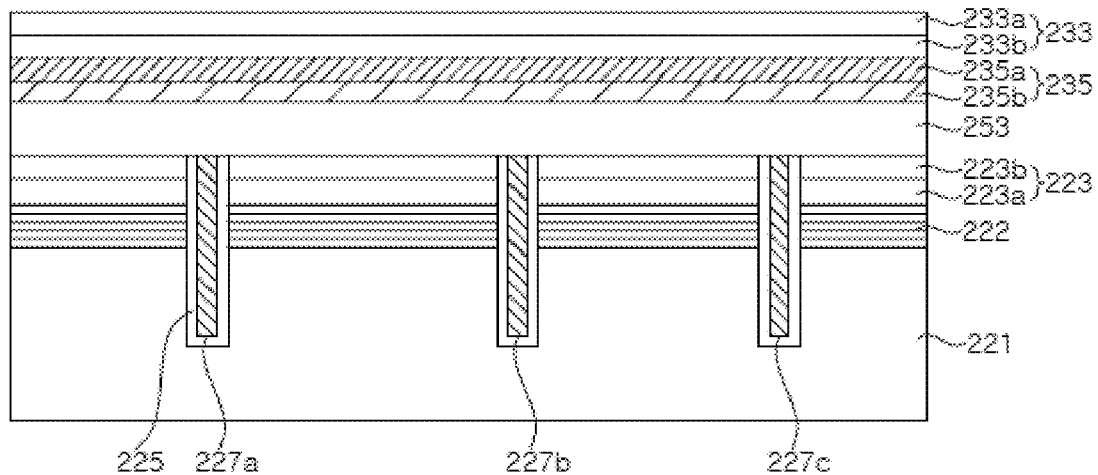

Referring to FIGS. 41A and 41B, a second LED stack 233 and a second-2 ohmic electrode 235 may be bonded to the first LED stack 223 through a first bonding layer 253.

The second LED stack 233 is grown on a second substrate, and the second-2 ohmic electrode 235 is formed on the second LED stack 233. The second LED stack 233 may be formed with AlGaInP-based semiconductor layers or AlGaInN-based semiconductor layers, and may include a first conductivity type semiconductor layer 233a, an active layer, and a second conductivity type semiconductor layer 233b. The second substrate may be a substrate, for example, a GaAs substrate, capable of growing AlGaInP-based semiconductor layers, or a sapphire substrate, capable of growing AlGaInN-based semiconductor layers. A composition ratio of Al, Ga, and In may be set so that the second LED stack 233 may emit green light. The second-2 ohmic electrode 235 is in ohmic contact with the second conductivity type semiconductor layer 233b, for example, a p-type semiconductor layer. The second-2 ohmic electrode 235 may include a reflective layer 235a for reflecting light generated in the second LED stack 233, and a barrier layer 235b.

The second-2 ohmic electrode 235 is disposed to face the first LED stack 223 and is bonded to the first LED stack 223 by the first bonding layer 253. Next, the second substrate is removed from the second LED stack 233 using a chemical etching technique or a laser lift-off technique, and the first conductivity type semiconductor layer 233a is exposed. A surface roughened by surface texturing may be formed on the exposed first conductivity type semiconductor layer 233a.

According to an exemplary embodiment, before the first bonding layer 253 is formed, an insulating layer and a reflective layer may be added onto the first LED stack 223.

Figure 42A:
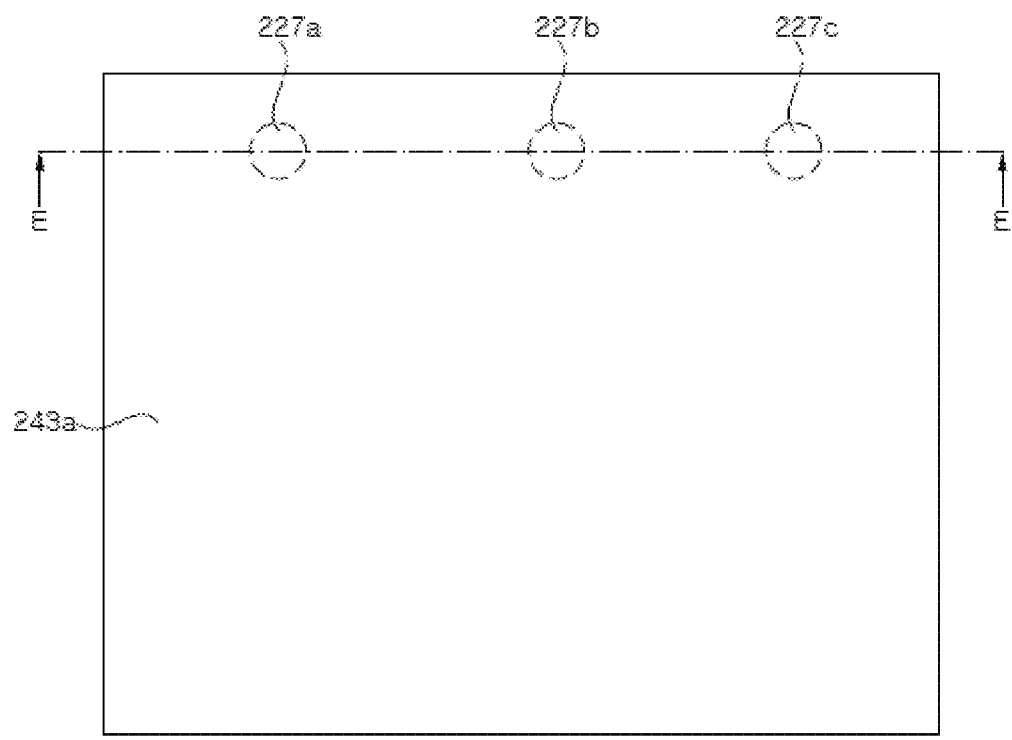
Figure 42B:
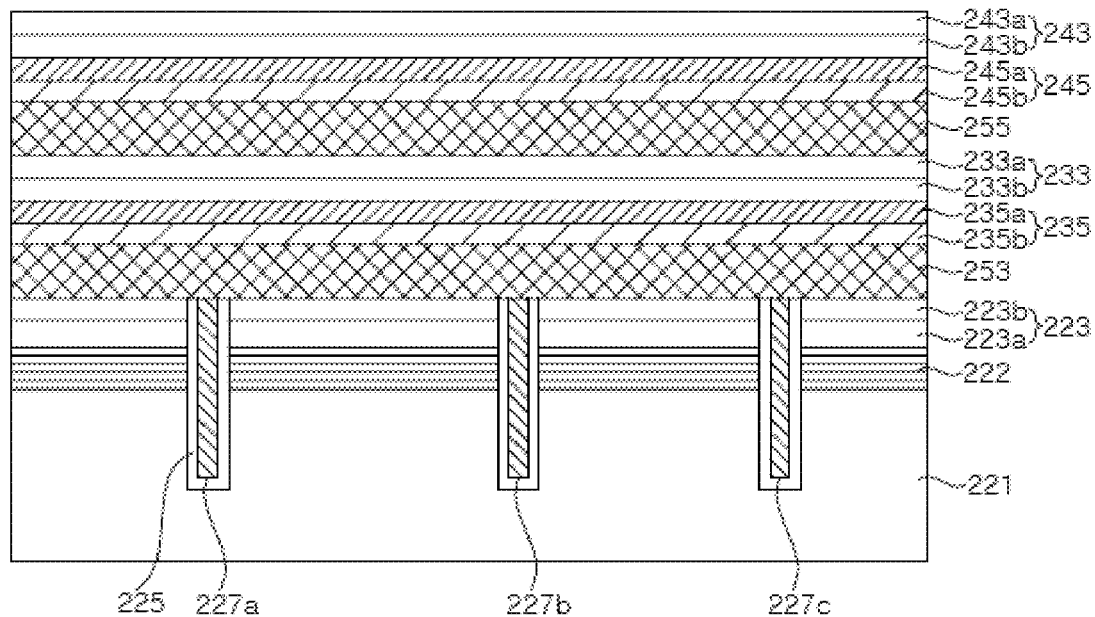

Referring to FIGS. 42A and 42B, a third LED stack 243 and a third-2 ohmic electrode 245 may be bonded to the second LED stack 233 through a second bonding layer 255.

First, the third LED stack 243 is grown on a third substrate, and the third-2 ohmic electrode 245 is formed on the third LED stack 243. The third LED stack 243 may be formed with AlGaInN-based semiconductor layers, and may include a first conductivity type semiconductor layer 243a, an active layer, and a second conductivity type semiconductor layer 243b. The third substrate is a substrate capable of growing a gallium nitride-based semiconductor layer, and is different from the first substrate 221. A composition ratio of AlGaInN may be set so that the third LED stack 243 may emit blue light. The third-2 ohmic electrode 245 is in ohmic contact with the second conductivity type semiconductor layer 243b, for example, a p-type semiconductor layer. The third-2 ohmic electrode 245 may include a reflective layer 245a for reflecting light generated in the third LED stack 243, and a barrier layer 245b.

The third-2 ohmic electrode 245 is disposed to face the second LED stack 233 and is bonded to the second LED stack 233 by the second bonding layer 255. Next, the third substrate is removed from the third LED stack 243 using a chemical lift-off technique or a laser lift-off technique, and the first conductivity type semiconductor layer 243a is exposed. A surface roughened by surface texturing may be formed on the exposed first conductivity type semiconductor layer 243a.

According to an exemplary embodiment, before the second bonding layer 255 is formed, an insulating layer and a reflective layer may be added onto the second LED stack 233.

Figure 43A:
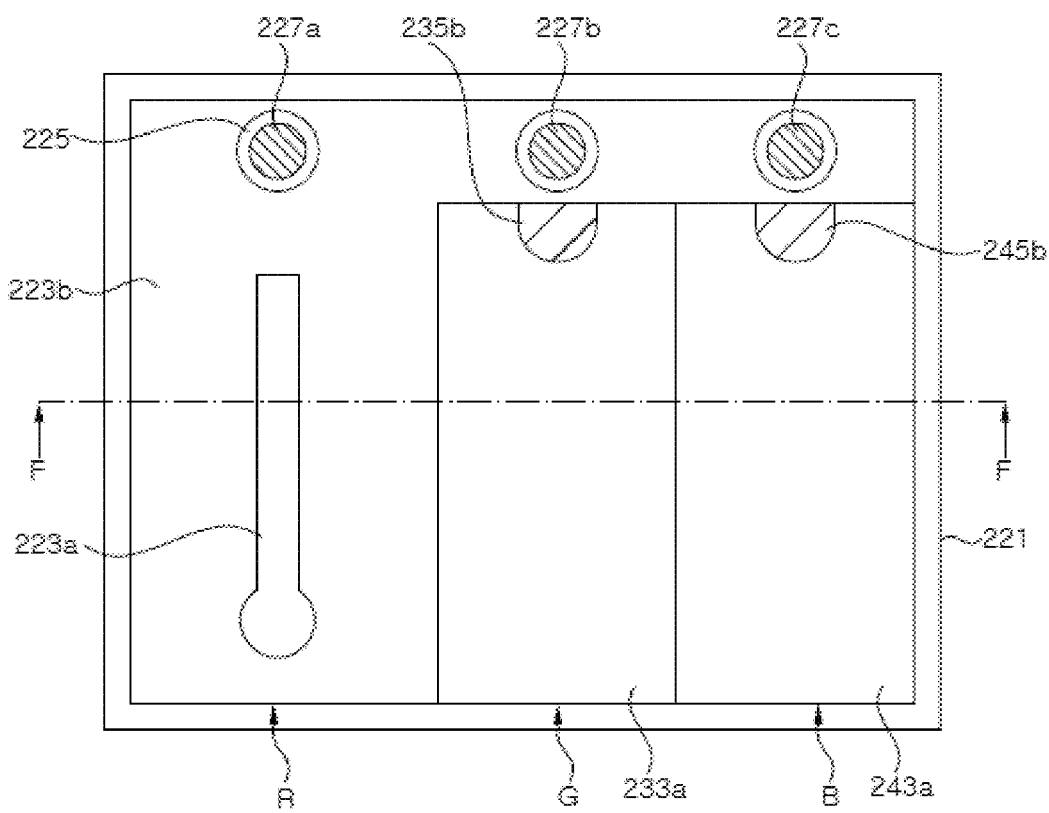
Figure 43B:
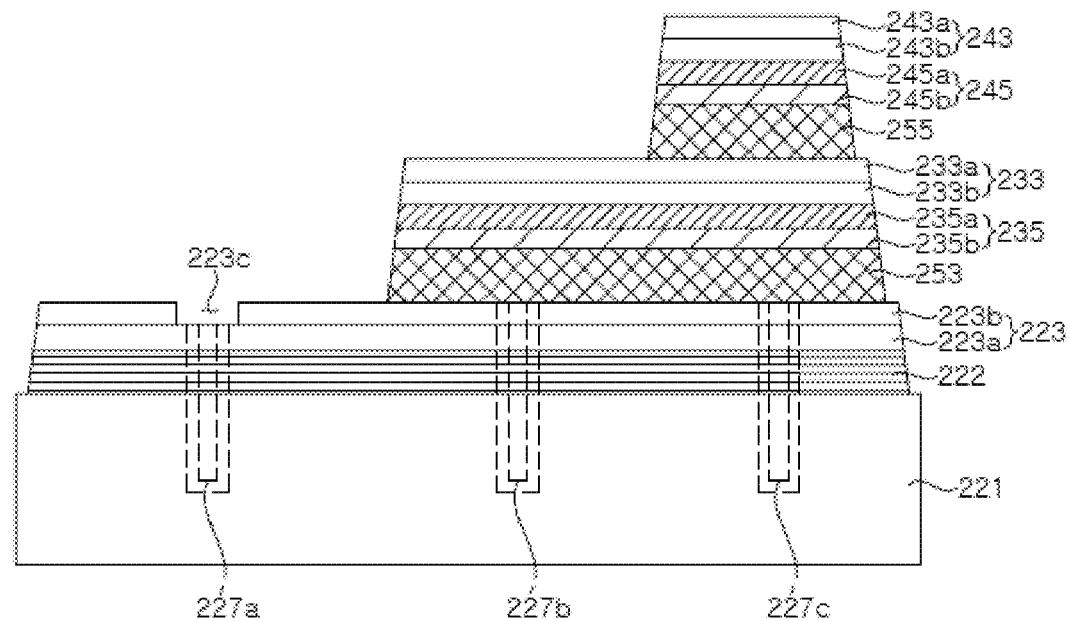

Referring to FIGS. 43A and 43B, in each pixel region, the third LED stack 243 is removed except a region of a third sub-pixel B by patterning the third LED stack 243. In addition, in the region of the third sub-pixel B, an indented part may be formed in the third LED stack 243, and the barrier layer 245b may be exposed in the indented part. The third LED stack 243 is formed to have an inclined side surface, as shown in FIG. 43B. For example, a photoresist pattern with an inclined side surface may be formed using a reflow process of a photoresist, and the third LED stack 243 may be etched using the photoresist pattern with the inclined side surface, so that the third LED stack 243 having the inclined side surface may be formed.

Next, in regions other than the region of the third sub-pixel B, the third-2 ohmic electrode 245 and the second bonding layer 255 are removed, and the second LED stack 233 is exposed. The third-2 ohmic electrode 245 and the second bonding layer 255 may also be formed to have inclined side surfaces. In particular, an angle of inclination of a side surface of the second bonding layer 255 may be substantially the same as an angle of inclination of a side surface of the third LED stack 243, but is not limited thereto. The third-2 ohmic electrode 245 is restricted near the region of the third sub-pixel B.

Meanwhile, in each pixel region, the second LED stack 233 is removed from regions except a region of a second sub-pixel G of each pixel by patterning the second LED stack 233. A second LED stack 233 of the region of the second sub-pixel G partially overlaps the third LED stack 243. As shown in FIG. 43B, the second LED stack 233 is also patterned to have an inclined side surface.

By patterning the second LED stack 233, the second-2 ohmic electrode 235 is exposed. The second LED stack 233 may include an indented part, and the second-2 ohmic electrode 235, for example, the barrier layer 235*b*, may be exposed in the indented part.

Next, the second-2 ohmic electrode 235 and the first bonding layer 253 are removed, and the first LED stack 223 is exposed. The second-2 ohmic electrode 235 and the first bonding layer 253 may also be patterned to have inclined side surfaces. In particular, an angle of inclination of a side surface of the first bonding layer 253 may be substantially the same as an angle of inclination of a side surface of the second LED stack 233, but is not limited thereto. The second-2 ohmic electrode 235 is restricted near the region of the second sub-pixel G. In addition, the first through third through-vias 227*a*, 227*b*, and 227*c* may be exposed together when the first LED stack 223 is exposed.

Meanwhile, in each pixel region, the first conductivity type semiconductor layer 223*a* is exposed by patterning the second conductivity type semiconductor layer 223*b* of the first LED stack 223. The first conductivity type semiconductor layer 223*a* may be exposed to have substantially an elongated shape, as shown in FIG. 43A, but is not limited thereto.

Furthermore, pixel regions may be separated by patterning the first LED stack 223. Accordingly, a region of a first sub-pixel R is defined. Here, the distribution Bragg reflector 222 may also be divided. As shown in FIG. 43B, the first LED stack 223 may be patterned to have an inclined side surface, and the distribution Bragg reflector 222 may also have an inclined side surface. However, the inventive concepts are not limited thereto. For example, the distribution Bragg reflector 222 may be continuous over a plurality of pixels instead of being divided. Furthermore, the first LED stack 223 may have substantially a vertical side surface. Moreover, the first conductivity type semiconductor layer 223*a* may be continuous over a plurality of pixels instead of being divided into pixel regions.

Figure 44A:
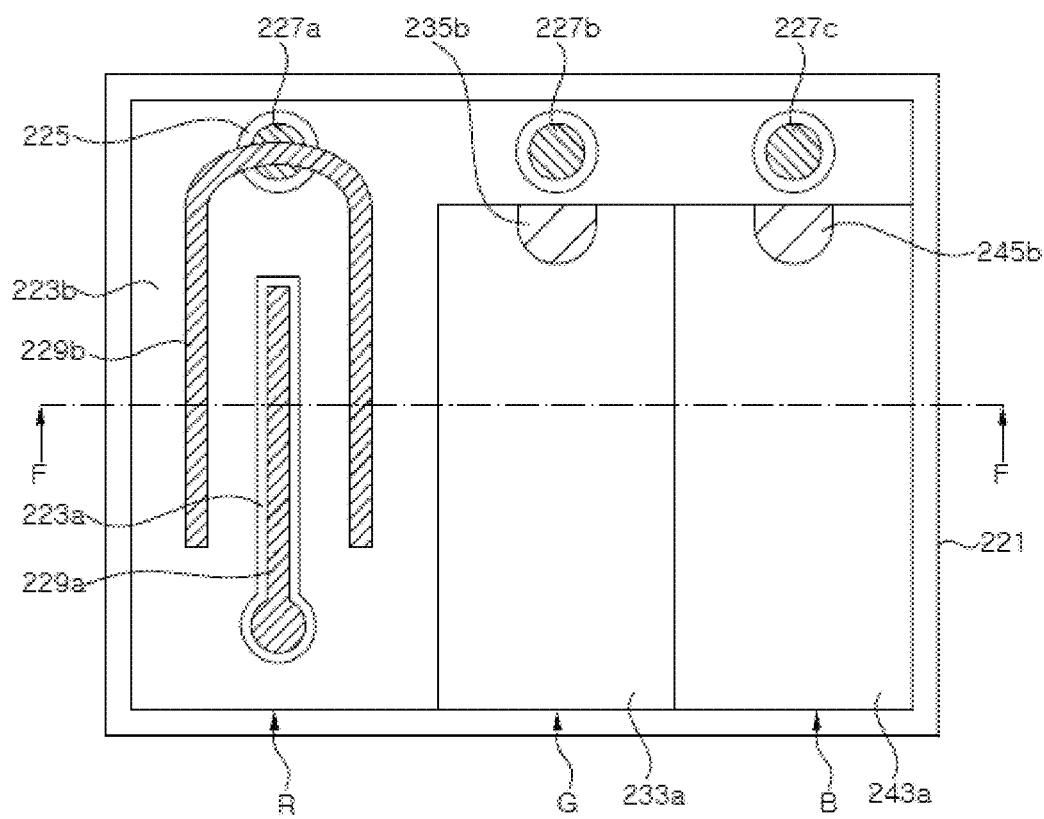
Figure 44B:
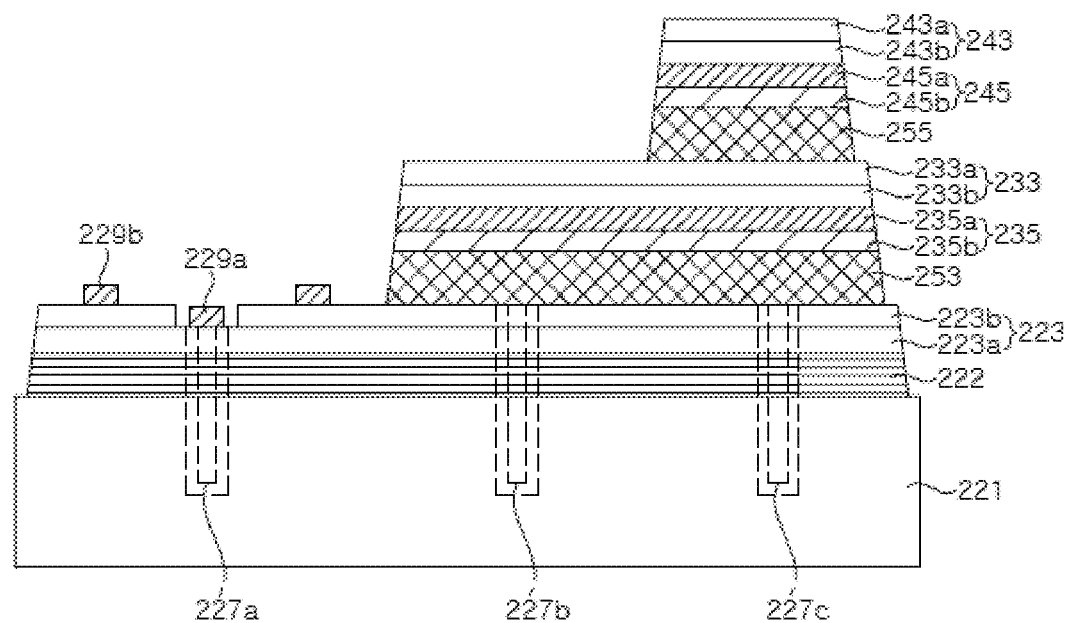

Referring to FIGS. 44A and 44B, a first-1 ohmic electrode 229*a* and a first-2 ohmic electrode 229*b* are formed on the first LED stack 223. The first-1 ohmic electrode 229*a* may be formed of, for example, an Au—Te alloy, an Au—Ge alloy, or others, on the exposed first conductivity type semiconductor layer 223*a*. The first-2 ohmic electrode 229*b* may be formed of, for example, an Au—Be alloy, an Au—Zn alloy, or others, on the second conductivity type semiconductor layer 223*b*. The first-2 ohmic electrode 229*b* may be formed first, and the first-1 ohmic electrode 229*a* may be formed, or the first-1 ohmic electrode 229*a* may be formed before the first-2 ohmic electrode 229*b* is formed. The first-2 ohmic electrode 229*b* may be connected to the first through-via 227*a*. The first-1 ohmic electrode 229*a* may include a pad region and an extension, and the extension may extend from the pad region toward the first through-via 227*a*.

In addition, for current spreading, the first-2 ohmic electrode 229*b* may be disposed to at least partially surround the first-1 ohmic electrode 229*a*. The first-1 ohmic electrode 229*a* and the first-2 ohmic electrode 229*b* are formed to have an extended length as shown in the drawings, however, the inventive concepts are not limited thereto. For example, the first-1 ohmic electrode 229*a* and the first-2 ohmic electrode 229*b* may be formed to have substantially a circular shape.

Figure 45A:
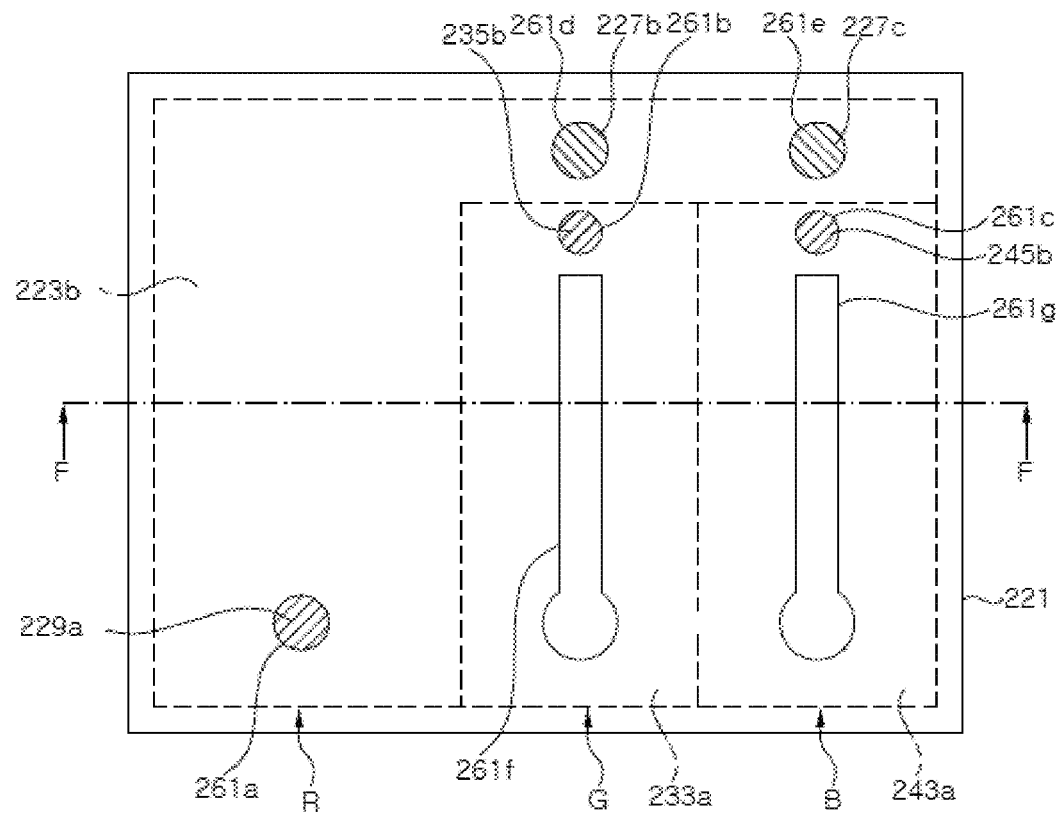
Figure 45B:
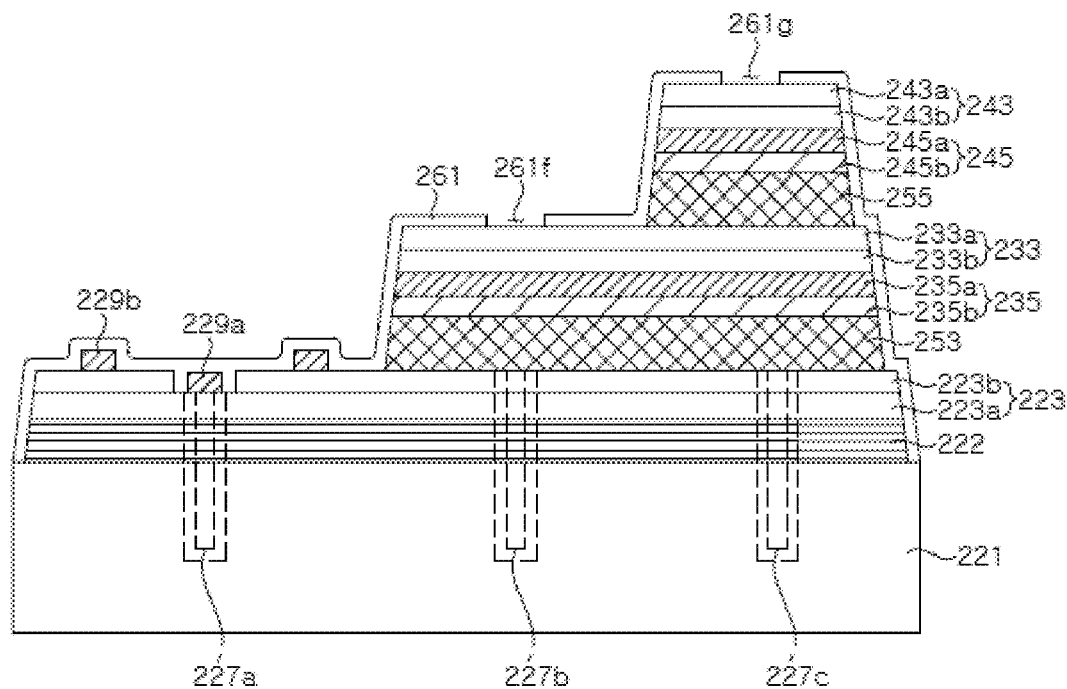

Referring to FIGS. 45A and 45B, an upper insulating layer 261 covering the first through third LED stacks 223, 233, and 243 is formed. The upper insulating layer 261 may cover the first-1 ohmic electrode 229*a* and the first-2 ohmic electrode 229*b*. The upper insulating layer 261 may also cover side surfaces of the first through third LED stacks 223, 233, and 243, and may cover a side surface of the distribution Bragg reflector 222. The upper insulating layer 261 may be formed using a chemical vapor deposition technique. According to some exemplary embodiments, the upper insulating layer 261 may be formed using a sputtering technique.

The upper insulating layer 261 may have an opening 261*a* that exposes the first-1 ohmic electrode 229*a*, openings 261*b* and 261*c* that expose the barrier layers 235*b* and 245*b*, openings 261*d* and 261*e* that expose the second and third through-vias 227*b* and 227*c*, and openings 261*f* and 261*g* that expose the first conductivity type semiconductor layer 233*a* of the second LED stack 233 and the first conductivity type semiconductor layer 243*a* of the third LED stack 243. The openings 261*a* through 261*g* may be formed using a photolithography and etching technique.

Figure 46A:
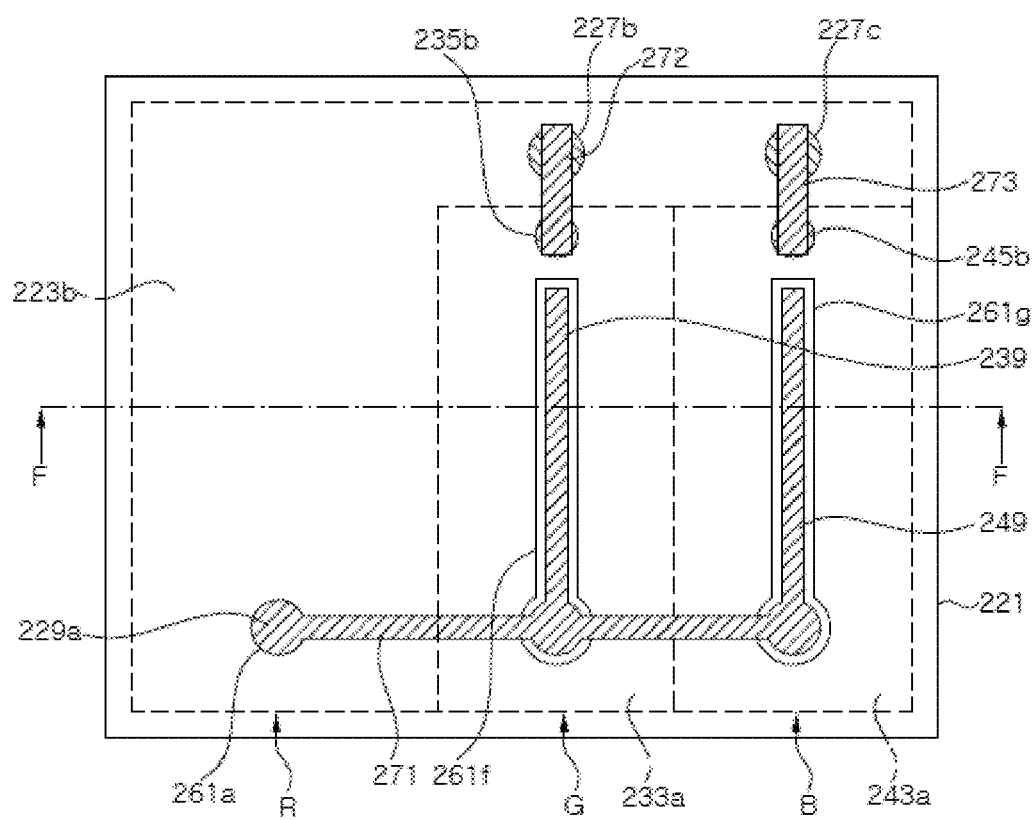
Figure 46B:
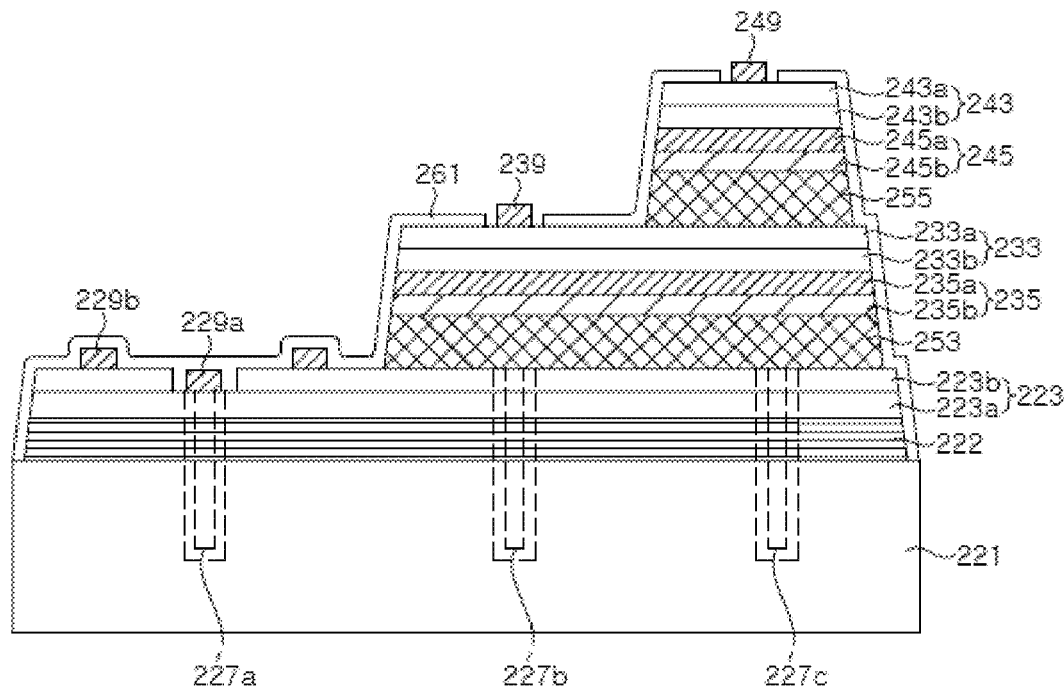

Referring to FIGS. 46A and 46B, a second-1 ohmic electrode 239, a third-1 ohmic electrode 249, and connectors 271, 272, and 273 are formed. The second-1 ohmic electrode 239 is formed in the opening 261*f* and is in ohmic contact with the first conductivity type semiconductor layer 233*a*. The third-1 ohmic electrode 249 is formed in the opening 261*g* and is in ohmic contact with the first conductivity type semiconductor layer 243*a*.

The connector 271 electrically connects the second-1 ohmic electrode 239 and the third-1 ohmic electrode 249 to the first-1 ohmic electrode 229*a*. For example, the connector 271 may be connected to the first-1 ohmic electrode 229*a* exposed by the opening 261*a*. The connector 271 is formed on the upper insulating layer 261 and is insulated from the second conductivity type semiconductor layers 223*b*, 233*b* and 243*b*.

The connector 272 electrically connects the second-2 ohmic electrode 235 to the second through-via 227*b*, and the connector 273 electrically connects the third-2 ohmic electrode 245 to the third through-via 227*c*. The connectors 272 and 273 are also disposed on the upper insulating layer 261, to prevent a short-circuit to the first through third LED stacks 223, 233 and 243.

The connectors 271, 272, and 273 are formed on the inclined side surfaces of the first and second bonding layers 253 and 255, the second LED stack 233 and the third LED stack 243, and thus, it is possible to prevent disconnection due to poor step coverage.

The second-1 ohmic electrode 239, the third-1 ohmic electrode 249, and the connectors 271, 272, and 273 may be formed of substantially the same material together in the same process. However, the inventive concepts are not limited thereto, and the connectors 271, 272, and 273 may be formed of different materials in different processes.

Figure 47A:
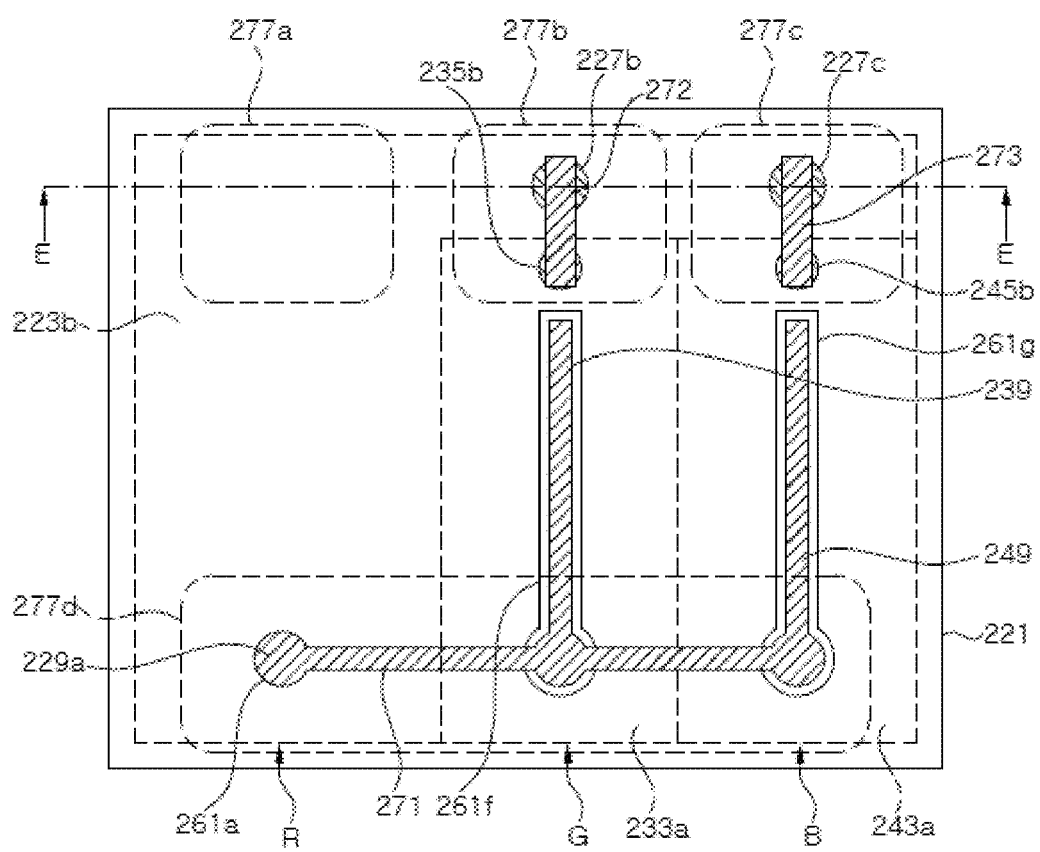
Figure 47B:
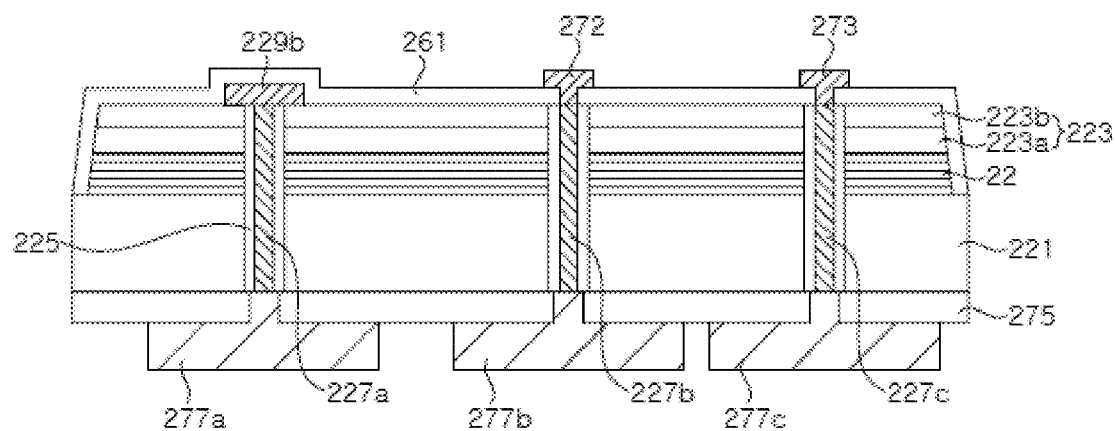

Next, referring to FIGS. 47A and 47B, a lower insulating layer 275 is formed under the substrate 221. The lower insulating layer 275 may have openings that expose the first through third through-vias 227*a*, 227*b*, and 227*c*, and an opening(s) exposing the bottom surface of the substrate 221.

Electrode pads 277*a*, 277*b*, 277*c*, and 277*d* are formed on the lower insulating layer 275. The electrode pads 277*a*, 277*b* and 277*c* are connected to the first through third through-vias 227*a*, 227*b*, and 227*c*, respectively, and the electrode pad 277*d* is connected to the substrate 221.

Accordingly, the electrode pad 277*a* is electrically connected to the second conductivity type semiconductor layer 223*b* of the first LED stack 223 through the first through-via 227*a*, the electrode pad 277*b* is electrically connected to the second conductivity type semiconductor layer 233*b* of the second LED stack 233 through the second through-via 227*b*, and the electrode pad 277*c* is electrically connected to the second conductivity type semiconductor layer 243*b* of the third LED stack 243 through the third through-via 227*c*. The first conductivity type semiconductor layers 223*a*, 233*a*, and 243*a* of the first through third LED stacks 223, 233, and 243 are electrically connected in common to the electrode pad 277*d*.

The electrode pads 277*a*, 277*b*, 277*c*, and 277*d* of the substrate 221 are bonded to the circuit board 251 of FIG. 35, so that a display apparatus according to an exemplary embodiment may be provided. The circuit board 251 may include an active circuit or a passive circuit, and accordingly, the display apparatus may be driven in an active matrix driving manner or a passive matrix driving manner.

Figure 48:
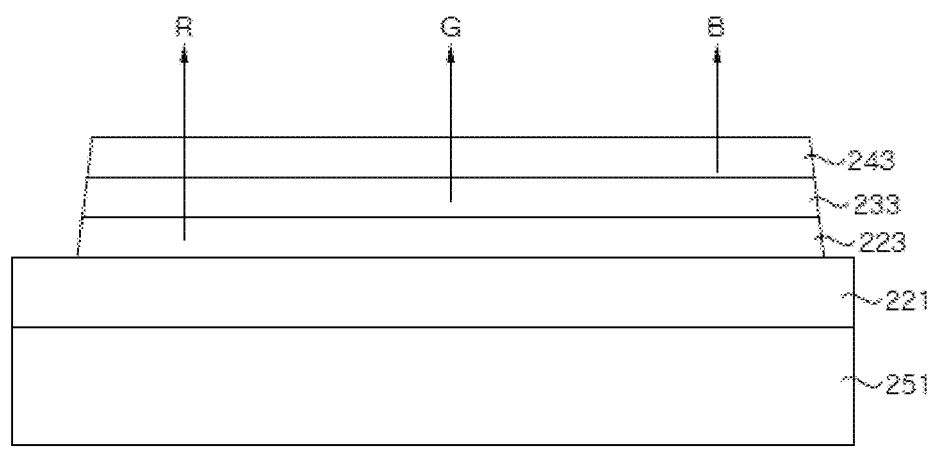
FIG. 48 is a schematic cross-sectional view of an LED pixel for a display according to another exemplary embodiment.

FIG. 48 is a schematic cross-sectional view of an LED pixel for a display according to another exemplary embodiment.

Referring to FIG. 48, the LED pixel 202 of the display apparatus according to an exemplary embodiment is substantially similar to the LED pixel 200 of the display apparatus of FIG. 36, except that a second LED stack 233 covers most regions of a first LED stack 223, and a third LED stack 243 covers most regions of the second LED stack 233. Thus, light generated in a first sub-pixel R substantially passes through the second LED stack 233 and the third LED stack 243, and is emitted to the outside. In addition, light generated in the second LED stack 233 substantially passes through the third LED stack 243 and is emitted to the outside.

The first LED stack 223 may include an active layer with a narrow band gap as compared to the second LED stack 233 and the third LED stack 243, and may emit light having a relatively long wavelength than that emitted from the second LED stack 233 and the third LED stack 243. The second LED stack 233 may include an active layer with a narrow band gap as compared to the third LED stack 243, and may emit light having a relatively long wavelength than that emitted in the third LED stack 243.

Figure 49:
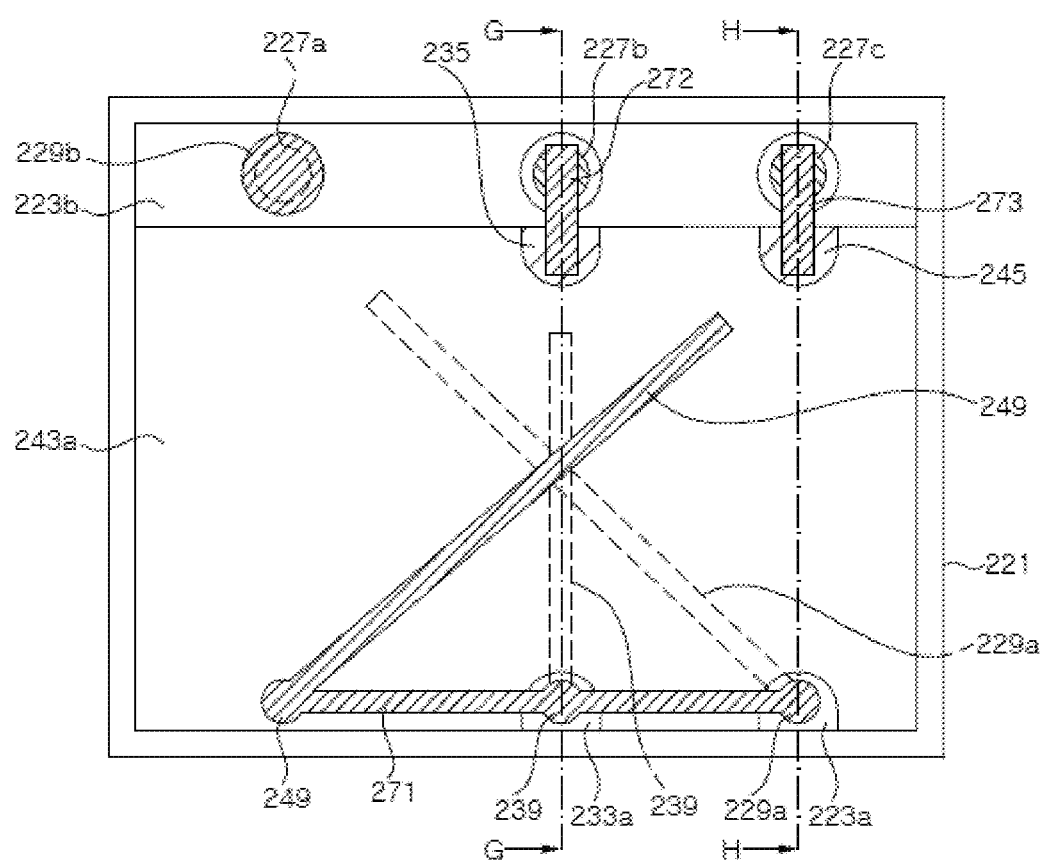
FIG. 49 is an enlarged plan view of one pixel of a display apparatus according to an exemplary embodiment.
Figure 50A:
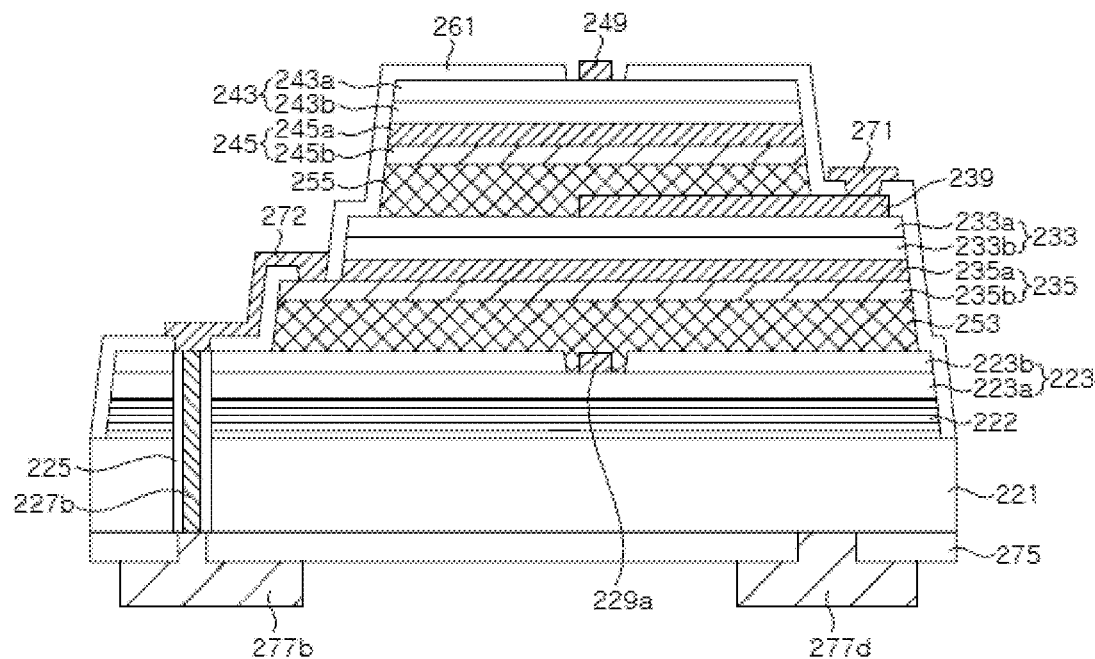
FIG. 50A and FIG. 50B are cross-sectional views taken along lines G-G and H-H of FIG. 49, respectively.
Figure 50B:
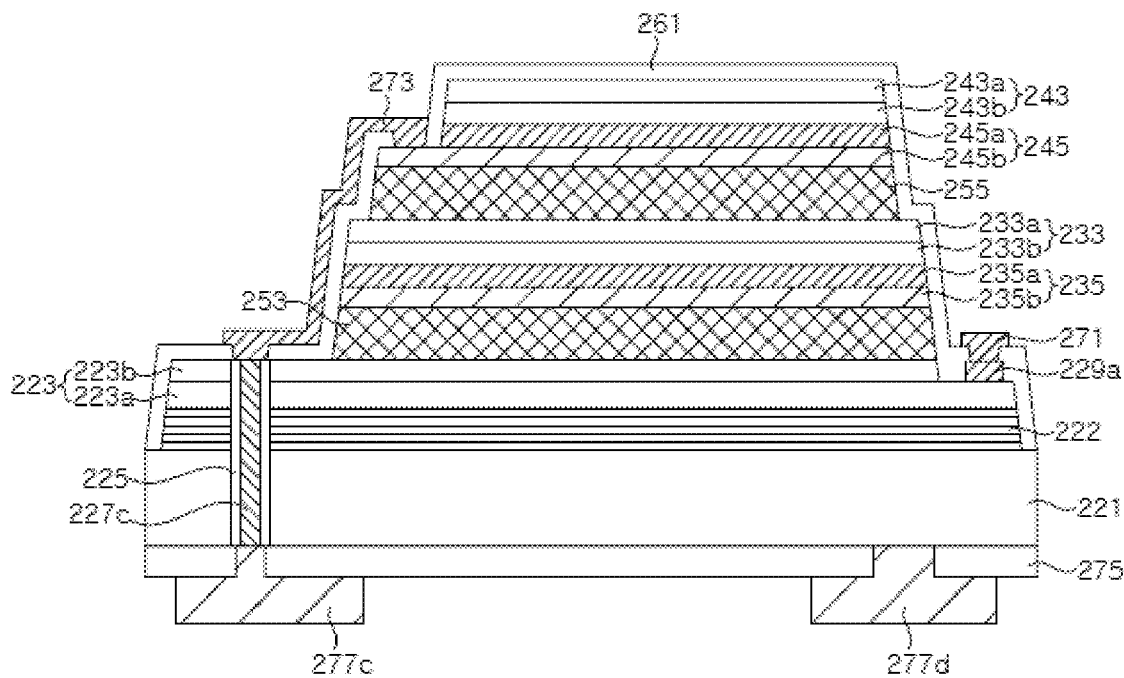

FIG. 49 is an enlarged plan view of one pixel of a display apparatus according to an exemplary embodiment, and FIGS. 50A and 50B are cross-sectional views taken along lines G-G and H-H of FIG. 49, respectively.

Referring to FIGS. 49, 50A and 50B, the pixel according to an exemplary embodiment is substantially similar to the pixel described with reference to FIGS. 38, 39A, 39B and 39C, except that a second LED stack 233 covers most regions of a first LED stack 223 and a third LED stack 243 covers most regions of the second LED stack 233. First through third through-vias 227*a*, 227*b*, and 227*c* may be disposed outside the second LED stack 233 and the third LED stack 243.

An upper surface of the first LED stack 223 exposes the through-vias 227*a*, 227*b*, and 227*c* as shown in the drawings, however, according to some exemplary embodiments, the through-vias 227*a*, 227*b* and 227*c* may be omitted.

A portion of a first-1 ohmic electrode 229*a* and a portion of a second-1 ohmic electrode 239 may be disposed under the third LED stack 243. To this end, the first-1 ohmic electrode 229*a* may be formed before the second LED stack 233 is bonded to the first LED stack 223, and the second-1 ohmic electrode 239 may also be formed before the third LED stack 243 is bonded to the second LED stack 233.

Light generated in the first LED stack 223 substantially passes through the second LED stack 233 and the third LED stack 243, and is emitted to the outside. Light generated in the second LED stack 233 substantially passes through the third LED stack 243 and is emitted to the outside. Thus, a first bonding layer 253 and a second bonding layer 255 may be formed of light-transmissive materials, and a second-2 ohmic electrode 235 and a third-2 ohmic electrode 245 may be formed of transparent conductive layers.

An indented part is formed in the third LED stack 243 to expose the third-2 ohmic electrode 245, and an indented part is continuously formed in the third LED stack 243 and the second LED stack 233 to expose the second-2 ohmic electrode 235. The second-2 ohmic electrode 235 and the third-2 ohmic electrode 245 are electrically connected to the second through-via 227*b* and the third through-via 227*c* through connectors 272 and 273, respectively.

In addition, since the indented part is formed in the third LED stack 243, the second-1 ohmic electrode 239 formed on the first conductivity type semiconductor layer 233*a* of the second LED stack 233 may be exposed. Also, since the indented part is continuously formed in the third LED stack 243 and the second LED stack 233, the first-1 ohmic electrode 229*a* formed on the first conductivity type semiconductor layer 223*a* of the first LED stack 223 may be exposed. The connector 271 may connect the first-1 ohmic electrode 229*a* and the second-1 ohmic electrode 239 to the third-1 ohmic electrode 249. The third-1 ohmic electrode 249 may be formed together with the connector 271, and may be connected to a pad region of each of the first-1 ohmic electrode 229*a* and the second-1 ohmic electrode 239.

A portion of the first-1 ohmic electrode 229*a* and a portion of the second-1 ohmic electrode 239 are disposed under the third LED stack 243, but the inventive concepts are not limited thereto. The portion of the first-1 ohmic electrode 229*a* and the portion of the second-1 ohmic electrode 239 disposed under the third LED stack 243 may be omitted. In addition, the second-1 ohmic electrode 239 may be omitted, and the connector 271 may be in ohmic contact with the first conductivity type semiconductor layer 233*a*.

As in the above-described exemplary embodiment, the third LED stack 243, the second bonding layer 255, the second LED stack 233, and the first bonding layer 253 include inclined side surfaces, connectors 271 and 273 are formed on the inclined side surfaces, and connector 272 is formed on the included side surface of the first bonding layer 253.

According to the exemplary embodiments, a plurality of pixels may be formed at a wafer level using wafer bonding, and thus, the step of individually mountings LEDs may be obviated.

In addition, since the through-vias 227*a*, 227*b*, and 227*c* are formed in the substrate 221 and are used as current paths, it is not necessary to remove the substrate 221. Thus, a growth substrate used to grow the first LED stack 223 may be used as the substrate 221 without removing the growth substrate from the first LED stack 223. However, the inventive concepts are not limited thereto, and the substrate 221 may be removed from the first LED stack 223, and the first LED stack 223 may be bonded to the circuit board 251 using a bonding layer. Here, the connectors 271, 272, and 273 may be connected directly to the circuit board 251. To this end, the first LED stack 223 and the bonding layer may be formed to have inclined side surfaces.

Furthermore, the first LED stack 223, the second LED stack 233, and the third LED stack 243 are stacked in a vertical direction, and accordingly, when the first through third LED stacks 223, 233, and 243 and the first and second bonding layers 253 and 255 have vertical side surfaces, it may be difficult to securely form the connectors 271, 272 and 273 on the vertical side surfaces. According to exemplary embodiments, a side surface on which wiring, such as the connectors 271, 272 and 273, is to be formed among side surfaces of the first through third LED stacks 223, 233, and 243, and the first and second bonding layers 253 and 255 may be inclined, so that the wiring may be securely formed. Thus, it is possible to enhance reliability of the display apparatus.

Figure 51:
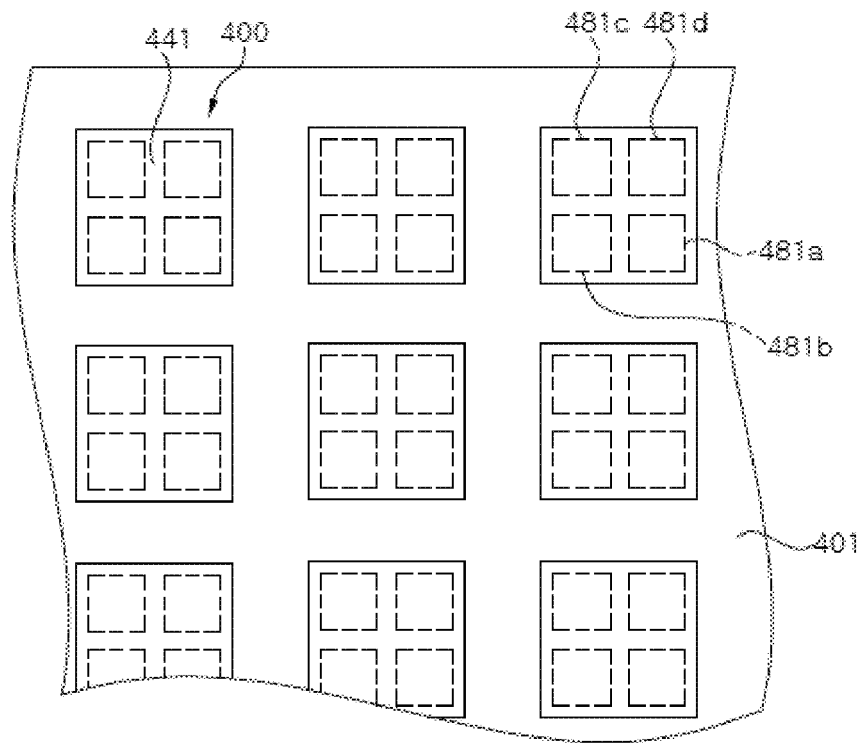
FIG. 51 is a schematic plan view of a display apparatus according to an exemplary embodiment.

FIG. 51 is a schematic plan view of a display apparatus according to an exemplary embodiment.

Referring to FIG. 51, the display apparatus includes a circuit board 401 and a plurality of light emitting devices 400.

The circuit board 401 may include a circuit for passive matrix driving or active matrix driving. In one exemplary embodiment, the circuit board 401 may include interconnection lines and resistors therein. In another exemplary embodiment, the circuit board 401 may include interconnection lines, transistors, and capacitors. The circuit board 401 may also have pads on the upper surface such that the circuit disposed therein can be electrically connected to external components.

A plurality of light emitting devices 400 are arranged on the circuit board 401. Each light emitting device 400 may constitute one pixel. The light emitting device 400 has electrode pads 481a, 481b, 481c, and 481d electrically connected to the circuit board 401. The light emitting device 400 may also include a substrate 441 on the upper surface thereof. Since the light emitting devices 400 are spaced apart from each other, the substrates 441 disposed on the upper surfaces of the light emitting devices 400 are also spaced apart from each other.

Figure 52A:
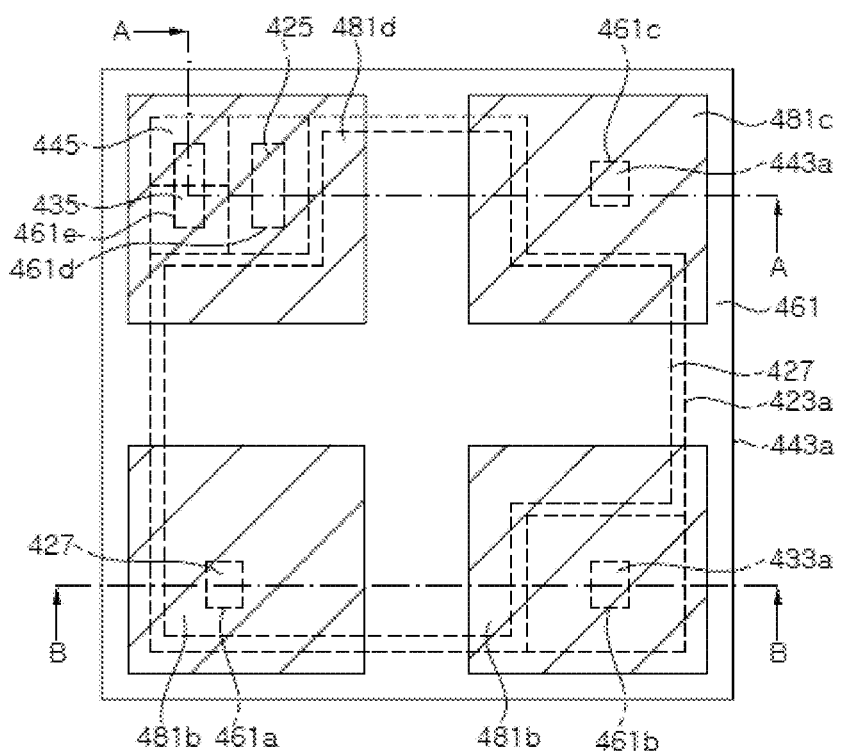
FIG. 52A is a schematic plan view of a light emitting device according to an exemplary embodiment.
Figure 52B:
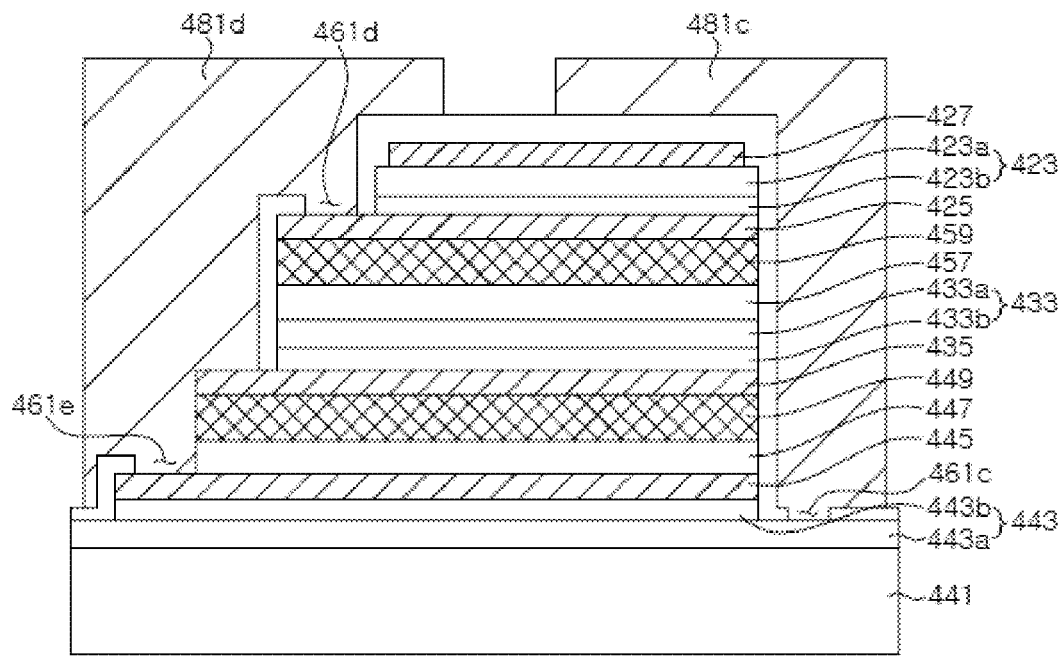
FIG. 52B and FIG. 52C are schematic cross-sectional views taken along line A-A and line B-B of FIG. 52A, respectively.
Figure 52C:
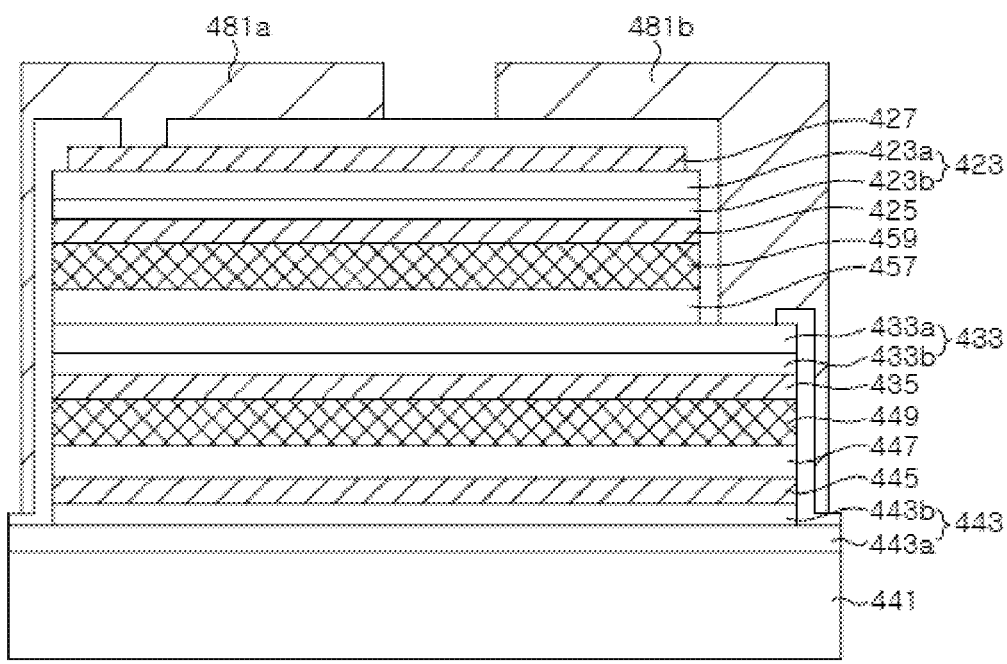

The configuration of the light emitting device 400 will be described in detail with reference to FIGS. 52A, 52B, and 52C. FIG. 52A is a schematic plan view of the light emitting device 400 according to an exemplary embodiment, FIG. 52B is a cross-sectional view taken along line A-A of FIG. 52A, and FIG. 52C is a cross-sectional view taken along line B-B of FIG. 52A. Although it is shown and described herein that the electrode pads 481a, 481b, 481c, and 481d are arranged on the upper side, however, the inventive concepts are not limited thereto, and the light emitting device 400 according to some exemplary embodiments may be flip-bonded on the circuit board 401 of FIG. 51, and in this case, the electrode pads 481a, 481b, 481c, and 481d may be arranged on the lower side of the light emitting device 400.

Referring to FIGS. 52A, 52B and 52C, the light emitting device 400 includes the substrate 441, the electrode pads 481a, 481b, 481c, and 481d, a first LED stack 423, a second LED stack 433, a third LED stack 443, a first transparent electrode 425, a second transparent electrode 435, a third transparent electrode 445, an ohmic electrode 427, a first color filter 447, a second color filter 457, a first bonding layer 449, a second bonding layer 459, and an insulating layer 461.

The substrate 441 may support the LED stacks 423, 433, and 443. In addition, the substrate 441 may be a growth substrate for growing the third LED stack 443. For example, the substrate 441 may be a sapphire substrate or a gallium nitride substrate, in particular, a patterned sapphire substrate. The LED stacks are disposed on the substrate 441 in the order of the third LED stack 443, the second LED stack 433, and the first LED stack 423.

In an exemplary embodiment, a single third LED stack may be disposed on one substrate 441, and thus, the light emitting device 400 may have a single-chip structure of a single pixel. According to another exemplary embodiment, the substrate 441 may be omitted and the lower surface of the third LED stack 443 may be exposed. In this case, a roughened surface may be formed on the lower surface of the third LED stack 443 by surface texturing.

According to still another exemplary embodiment, a plurality of third LED stacks 443 may be disposed on one substrate 441, and the second LED stack 433 and the first LED stack 423 may be disposed on each third LED stack 443. Accordingly, the light emitting device 400 may include a plurality of pixels.

The first LED stack 423, the second LED stack 433, and the third LED stack 443 each include a first conductivity type semiconductor layer 423a, 433b or 443a, a second conductivity type semiconductor layer 423b, 433b or 443b, and an active layer interposed therebetween. The active layer may have a multiple quantum well structure.

For the LED stacks 423, 433, and 443, the closer to the substrate 441 the LED stack is, the shorter wavelength light may be emitted from the LED stack. For example, the first LED stack 423 may be an inorganic light emitting diode emitting red light, the second LED stack 433 may be an inorganic light emitting diode emitting green light, and the third LED stack 443 may be an inorganic light emitting diode emitting blue light. The first LED stack 423 may include AlGaInP based semiconductor layers, the second LED stack 433 may include AlGaInP based or AlGaInN based semiconductor layers, and the third LED stack 443 may include AlGaInN based semiconductor layers. However, the inventive concepts are not limited thereto, and when LED stacks include micro LEDs, the LED stack disposed closest to the substrate 440 may emit light having the longest wavelength, or light having an intermediate wavelength than the LED stack disposed thereabove, without adversely affecting the operation and without requiring color filters due to small form factor of a micro LED.

The first conductivity type semiconductor layers 423a, 433a, and 443a of the respective LED stacks 423, 433, and 443 may be n-type semiconductor layers and the second conductivity type semiconductor layers 423b, 433b, and 443b of the respective LED stacks 423, 433, and 443 may be p-type semiconductor layers. In particular, the upper surface of the first LED stack 423 may be an n-type semiconductor layer 423a, the upper surface of the second LED stack 433 may be an n-type semiconductor layer 433a, and the upper surface of the third LED stack 443 may be a p-type semiconductor layer 443b. That is, the order of the semiconductor layers is reversed only in the third LED stack 443. Accordingly, the p-type semiconductor layers of the second LED stack 433 and the third LED stack 443 are arranged to face each other. However, the inventive concepts are not limited thereto, and the p-type semiconductor layer 423b of the first LED stack 423 and the p-type semiconductor layer 433b of the second LED stack 433 may be arranged to face each other. Further, the n-type semiconductor layer 433a of the second LED stack 433 and the n-type semiconductor layer 443a of the third LED stack 443 may be arranged to face each other, or the n-type semiconductor layer 423a of the first LED stack 423 and the n-type semiconductor layer 433a of the second LED stack 433 may be arranged to face each other.

In the first LED stack 423, the first conductivity type semiconductor layer 423a may have substantially the same area as the second conductivity type semiconductor layer 423b, and thus, the first conductivity type semiconductor layer 423a and the second conductivity type semiconductor layer 423b may overlap with each other. Also in the second LED stack 433, the first conductivity type semiconductor layer 433a may have substantially the same area as the second conductivity type semiconductor layer 433b, and thus, the first conductivity type semiconductor layer 433a and the second conductivity type semiconductor layer 433b may overlap with each other. In the third LED stack 443, the second conductivity type semiconductor layer 443b may be disposed on a partial region of the first conductivity type semiconductor layer 443a, and thus, the first conductivity type semiconductor layer 443a is partially exposed.

The first LED stack 423 and the second LED stack 433 may be disposed on a partial region of the third LED stack 443. Furthermore, the first and second LED stacks 423 and 433 may be disposed in the upper region of the second conductivity type semiconductor layer 443b. More specifically, the second LED stack 433 may be disposed on a partial region of the second conductivity type semiconductor layer 443b, and the first LED stack 423 may be disposed on a partial region of the second LED stack 433. The second LED stack 433 may include a region disposed outside the first LED stack 423, and the third LED stack 443 may include a region disposed outside the second LED stack 433.

The first LED stack 423 is disposed farther away from the substrate 441, the second LED stack 433 is disposed below the first LED stack 423, and the third LED stack 443 is disposed below the second LED stack 433. The first LED stack 423 emits light having a longer wavelength than the second and third LED stacks 433 and 443, so that light generated in the first LED stack 423 may be emitted to the outside through the second and third LED stacks 433 and 443 and the substrate 441. In addition, the second LED stack 433 emits light having a longer wavelength than the third LED stack 443, so that light generated in the second LED stack 433 may be emitted to the outside through the third LED stack 443 and the substrate 441. However, the inventive concepts are not limited thereto, and when LED stacks include micro LEDs, the LED stack disposed closest to the substrate 440 may emit light having the longest wavelength, or light having an intermediate wavelength than the LED stack disposed thereabove, without adversely affecting the operation or requiring color filters due to small form factor of a micro LED.

The first transparent electrode 425 is in ohmic contact with the second conductivity type semiconductor layer 423b of the first LED stack 423 and transmits light generated in the first LED stack 423. The first transparent electrode 425 may be formed of a metal layer or a conductive oxide layer which is transparent to red light.

As shown in FIG. 52B, the first transparent electrode 425 may include a portion protruding outside the first LED stack 423. That is, the first transparent electrode 425 may include a region exposed outside the first LED stack 423.

The ohmic electrode 427 is in ohmic contact with the first conductivity type semiconductor layer 423a of the first LED stack 423. In one exemplary embodiment, the ohmic electrode 427 may include a reflective metal layer, and thus may reflect light generated in the first LED stack 423 toward the substrate 441. The ohmic electrode 427 may be formed of, for example, AuTe, AuGe, or others. In another exemplary embodiment, the ohmic electrode 427 may be formed of a material layer transparent to red light, such as a conductive oxide layer.

The ohmic electrode 427 may cover most of the region of the first LED stack 423, but is not limited thereto, and may be partially in contact with the first conductivity type semiconductor layer 423a.

The second transparent electrode 435 in ohmic contact with the second conductivity type semiconductor layer 433b of the second LED stack 433. As shown in the drawing, the second transparent electrode 435 is in contact with the lower surface of the second LED stack 433 between the second LED stack 433 and the third LED stack 443. In addition, as shown in FIG. 52B, the second transparent electrode 435 may include a region protruding outside the second LED stack 433. That is, the second transparent electrode 435 may include a region exposed outside the second LED stack 433. The second transparent electrode 435 may be formed of a metal layer or a conductive oxide layer which is transparent to red light and green light.

The third transparent electrode 445 is in ohmic contact with the second conductivity type semiconductor layer 443b of the third LED stack 433. The third transparent electrode 445 may be disposed between the second LED stack 433 and the third LED stack 443 and is in contact with the upper surface of the third LED stack 443. The third transparent electrode 445 may be formed of a metal layer or a conductive oxide layer which is transparent to red light and green light. The third transparent electrode 445 may also be transparent to blue light. The third transparent electrode 445 is disposed in the upper region of the second conductivity type semiconductor layer 443b and therefore has a narrower area than the first conductivity type semiconductor layer 443a.

The first transparent electrode 425, the second transparent electrode 435, and the third transparent electrode 445 may assist current spreading by being in ohmic contact with the p-type semiconductor layer of each LED stack. Examples of the conductive oxide layer used for the first, second, and third transparent electrodes 425, 435, and 445 include $SnO_2$, $InO_2$, ITO, ZnO, IZO, or others. In addition, the first, second, and third transparent electrodes 425, 435, and 445 may be used as an etch stop layer, and the exposed portion and unexposed portion may have different thicknesses.

The first color filter 447 may be disposed between the third transparent electrode 445 and the second LED stack 433, and the second color filter 457 may be disposed between the second LED stack 433 and the first LED stack 423. The first color filter 447 transmits light generated in the first and second LED stacks 423 and 433 and reflects light generated in the third LED stack 443. The second color filter 457 transmits light generated in the first LED stack 423 and reflects light generated in the second LED stack 433. Accordingly, light generated in the first LED stack 423 can be emitted to the outside through the second LED stack 433 and the third LED stack 443, and light generated in the second LED stack 433 can be emitted to the outside through the third LED stack 443. Furthermore, light generated in the second LED stack 433 may be prevented from being lost by being incident on the first LED stack 423, or light generated in the third LED stack 443 may be prevented from being lost by being incident on the second LED stack 433.

In some exemplary embodiments, the second color filter 457 may reflect light generated in the third LED stack 443.

The first and second color filters 447 and 457 are, for example, a low pass filter that passes a low frequency range, that is, only a long wavelength band, a band pass filter that passes only a predetermined wavelength band, or a band stop filter that blocks only a predetermined wavelength band. In particular, the first and second color filters 447 and 457 may be formed by alternately stacking insulating layers having refractive indices different from each other, for example, may be formed by alternately stacking the $TiO_2$ insulating layer and the $SiO_2$ insulating layer. In particular, the first and second color filters 447 and 457 may include a distributed Bragg reflector (DBR). The stop band of the distributed Bragg reflector can be controlled by adjusting the thickness of $TiO_2$ and $SiO_2$. The low pass filter and the band pass filter may also be formed by alternately stacking insulating layers having refractive indices different from each other.

The first bonding layer 449 adjoins the second LED stack 433 to the third LED stack 443. The first bonding layer 449 substantially covers the first color filter 447 and may be bonded to the second transparent electrode 435. For example, the first bonding layer 449 may be a transparent organic layer or a transparent inorganic layer. Examples of the organic layer include SUB, poly(methylmethacrylate) (PMMA), polyimide, parylene, and benzocyclobutene (BCB), examples of the inorganic layer include $Al_2O_3$, $SiO_2$, $SiN_x$, or others. The first bonding layer 449 may also be formed of spin-on-glass (SOG). The organic layers may be bonded at a high vacuum and a high pressure, and the inorganic layers may be bonded under a high vacuum in a state in which the surface energy is changed by using plasma or others, after planarizing the surface by a chemical mechanical polishing process, for example.

The second bonding layer 459 couples the second LED stack 433 to the first LED stack 423. As shown in the drawing, the second bonding layer 459 may cover the second color filter 457 and be in contact with the first transparent electrode 425. The second bonding layer 459 may be formed of substantially the same material as the first bonding layer 449 described above.

The insulating layer 461 covers the side surfaces and upper region of the first, second, and third LED stacks 423, 433, and 443. In one exemplary embodiment, the insulating layer 461 may be formed of a light transmitting material $SiO_2$, $Si_3N_4$, or SOG. In another exemplary embodiment, the insulating layer 461 may contain a light reflecting layer or a light blocking layer, such as a light absorbing layer, to prevent optical interference with the adjacent light emitting device. For example, the insulating layer 461 may include a distributed Bragg reflector that reflects red light, green light, and blue light, or an $SiO_2$ layer with a reflective metallic layer or a highly reflective organic layer deposited thereon. Alternatively, the insulating layer 461 may contain an absorbing layer, such as a black epoxy, for light blocking. The light blocking layer may increase the contrast ratio of an image by preventing optical interference between the light emitting devices.

The insulating layer 461 may have openings 461a, 461b, 461c, 461d, and 461e for electrical paths. For example, the insulating layer 461 includes the openings 461a, 461b, 461c, 461d, and 461e for exposing the ohmic electrode 427, the first transparent electrode 425, the second and third transparent electrodes 435 and 445, and the second and third LED stacks 433 and 443. The opening 461a exposes the ohmic electrode 427, the opening 461b exposes the first conductivity type semiconductor layer 433a of the second LED stack 433, and the opening 461c exposes the first conductivity type semiconductor layer 443a of the third LED stack 443. The opening 461d exposes the first transparent electrode 425 and the opening 461e exposes the second transparent electrode 435 and the third transparent electrode 445 together. In another exemplary embodiment, the second transparent electrode 435 and the third transparent electrode 445 may be exposed by different openings. However, when the second and third transparent electrodes 435 and 445 are exposed by one opening 461e, the second and third transparent electrodes 435 and 445 may be exposed to a relatively great extent.

The electrode pads 481a, 481b, 481c, and 481d are disposed over the first LED stack 423, and are electrically connected to the first, second, and third LED stacks 423, 433, and 443. The electrode pads 481a, 481b, 481c, and 481d may include the first, second, and third electrode pads 481a, 481b, and 481c and the common electrode pad. The electrode pads 481a, 481b, 481c, and 481d may be disposed on the insulating layer 461, and be connected to the ohmic electrode 427 exposed by the openings 461a, 461b, 461c, 461d, and 461e of the insulating layer 461, the first, second, and third transparent electrodes 425, 435 and 445, and the first conductivity type semiconductor layers 433a and 443a of the second and third LED stacks. For example, the first electrode pad 481a may be connected to the ohmic electrode 427 through the opening 461a. The first electrode pad 481a is electrically connected to the first conductivity type semiconductor layer 423a of the first LED stack 423 through the ohmic electrode 427.

In addition, the second electrode pad 481b may be connected to the first conductivity type semiconductor layer 433a of the second LED stack 433 through the opening 461b of the insulating layer 461, and the third electrode pad 481c may be electrically connected to the first conductivity type semiconductor layer 443a of the third LED stack 443 through the opening 461c of the insulating layer 461.

The common electrode pad 481d may be connected in common to the first transparent electrode 425, the second transparent electrode 435, and the third transparent electrode 445 through the openings 461d and 461e. Accordingly, the common electrode pad 481d is electrically connected in common to the second conductivity type semiconductor layer 423b of the first LED stack 423, the second conductivity type semiconductor layer 433b of the second LED stack 433, and the second conductivity type semiconductor layer 443b of the third LED stack 443.

According to an exemplary embodiment, the first LED stack 423 is electrically connected to the electrode pads 481d and 481a, and the second LED stack 433 is electrically connected to the electrode pads 481d and 481b, and the third LED stack 443 is electrically connected to the electrode pads 481d and 481c. Accordingly, anodes of the first LED stack 423, the second LED stack 433, and the third LED stack 443 are electrically connected in common to the electrode pad 481d, and cathodes thereof are electrically connected to the first, second, and third electrode pads 481a, 481b, and 481c, respectively. Thus, the first, second, and third LED stacks 423, 433, and 443 can be independently driven.

While the first, second, and third electrode pads 481a, 481b, and 481c are described as being electrically connected to the first conductivity type semiconductor layers 423a, 433a, and 443a and the common electrode pad 481d is described as being electrically connected to the second conductivity type semiconductor layers 423b, 433b, and 443b, the inventive concepts are not limited thereto. For example, the first, second, and third electrode pads 481a, 481b, and 481c may be electrically connected to the second conductivity type semiconductor layers 423b, 433b, 443b, and the common electrode pad 481d may be electrically connected to the first conductivity type semiconductor layers 423a, 433a, and 443a.

FIGS. 53, 54, 55, 56, 57A, 57B, 58A, 58B, 59A, 59B, 60A, 60B, 61A, 61B, 62A, 62B, 63A, 63B, 64A, and 64B are schematic plan views and cross-sectional views illustrating a method of manufacturing the light emitting device 400 according to an exemplary embodiment. In the drawings, each plan view corresponds to a plan view of FIG. 52A, and each cross-sectional view corresponds to a cross-sectional view taken along line A-A of FIG. 52A.

Figure 53:
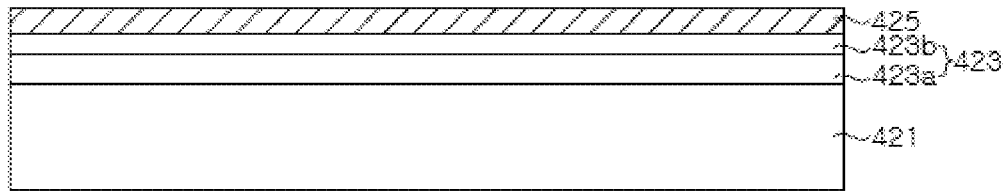
FIG. 53, FIG. 54, FIG. 55, FIG. 56, FIG. 57A, FIG. 57B, FIG. 58A, FIG. 58B, FIG. 59A, FIG. 59B, FIG. 60A, FIG. 60B, FIG. 61A, FIG. 61B, FIG. 62A, FIG. 62B, FIG. 63A, FIG. 63B, FIG. 64A, and FIG. 64B are schematic plan views and cross-sectional views illustrating a method of manufacturing a light emitting device according to an exemplary embodiment.

Referring to FIG. 53, the first LED stack 423 is grown on a first substrate 421. The first substrate 421 may be a GaAs substrate, for example. The first LED stack 423 is formed of AlGaInP based semiconductor layers, and includes the first conductivity type semiconductor layer 423a, the active layer, and the second conductivity type semiconductor layer 423b. Here, the first conductivity type may be n-type and the second conductivity type may be p-type.

The first transparent electrode 425 may be formed on the first LED stack 423. The first transparent electrode 425 may be formed of a conductive oxide layer such as $SnO_2$, $InO_2$, ITO, ZnO, IZO, or others.

Figure 54:
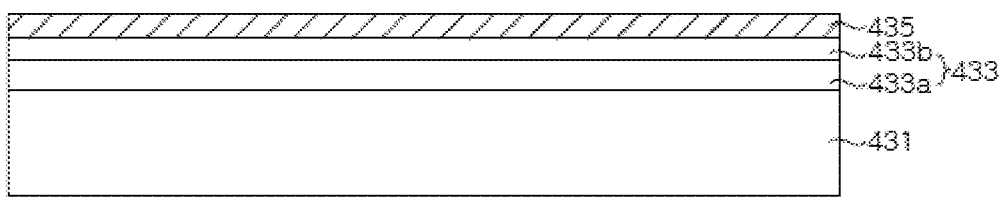

Referring to FIG. 54, the second LED stack 433 is grown on a second substrate 431, and the second transparent electrode 435 is formed on the second LED stack 433. The second LED stack 433 is AlGaInP based or AlGaInN based semiconductor layers, and may include the first conductivity type semiconductor layer 433a, the active layer, and the second conductivity type semiconductor layer 433b. The active layer may include an AlGaInP based or AlGaInN well layer. Here, the first conductivity type may be n-type and the second conductivity type may be p-type.

The second substrate 431 may be a substrate on which an AlGaInP based semiconductor layer can be grown, for example, a GaAs substrate, or a substrate on which an AlGaInN based semiconductor layer can be grown, for example, a GaN substrate or a sapphire substrate. The composition ratio of the well layer can be determined so that the second LED stack 433 emits green light. The second transparent electrode 435 is in ohmic contact with the second conductivity type semiconductor layer 433b. The second transparent electrode 435 may be formed of a conductive oxide layer such as SnO2, InO2, ITO, ZnO, IZO, or others.

Figure 55:
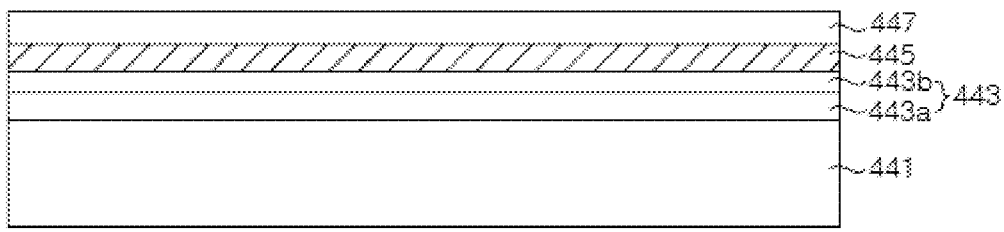

Referring to FIG. 55, the third LED stack 443 is grown on a third substrate 441, and the third transparent electrode 445 and the first color filter 447 are formed on the third LED stack 443. The third LED stack 443 is formed of AlGaInN based semiconductor layers, and may include the first conductivity type semiconductor layer 443a, the active layer, and the second conductivity type semiconductor layer 443b. The active layer may also include an AlGaInN based well layer. Here, the first conductivity type may be n-type and the second conductivity type may be p-type.

The third substrate 441 is a substrate on which a gallium nitride based semiconductor layer can be grown, and may be a sapphire substrate or a GaN substrate. The composition ratio of the AlGaInN can be determined so that the third LED stack 443 emits blue light. The third transparent electrode 445 is in ohmic contact with the second conductivity type semiconductor layer 443b. The third transparent electrode 445 may be formed of a conductive oxide layer such as $SnO_2$, $InO_2$, ITO, ZnO, IZO, or others.

Since the first color filter 447 substantially the same as that described with reference to FIGS. 52A, 52B, and 52C, detailed descriptions thereof will be omitted in order to avoid redundancy.

Figure 56:
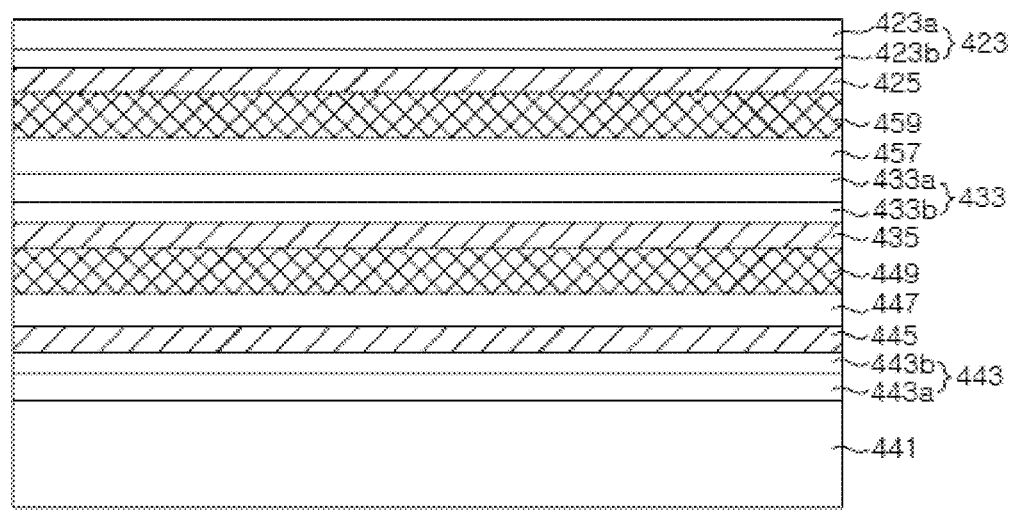

Referring to FIG. 56, the second LED stack 433 described with reference to FIG. 54 is bonded onto the third LED stack 443 of FIG. 55.

The first color filter 447 and the second transparent electrode 435 are bonded so as to face each other. For example, bonding material layers are formed on the first color filter 447 and the second transparent electrode 435, respectively, and by bonding the first color filter 447 and the second transparent electrode 435, the first bonding layer 449 may be formed. The bonding material layers may be, for example, a transparent organic layer or a transparent inorganic layer. Examples of the organic layer include SU8, poly(methylmethacrylate) (PMMA), polyimide, parylene, benzocyclobutene (BCB), or others, and examples of the inorganic layer include $Al_2O_3$, $SiO_2$, $SiN_x$, or others. In addition, the first bonding layer 449 may be formed using spin-on-glass (SOG).

Then, the second substrate 431 is removed from the second LED stack 433 using techniques such as laser lift-off, chemical lift-off, or others. Accordingly, the first conductivity type semiconductor layer 433a of the second LED stack 433 is exposed from above. A surface roughened by surface texturing may be formed on the surface of the exposed first conductivity type semiconductor layer 433a.

Then, the second color filter 457 is formed on the exposed first conductivity type semiconductor layer 433a of the second LED stack 433. Since the second color filter 457 is substantially the same as that described with reference to FIGS. 52A, 52B, and 52C, detailed descriptions thereof will be omitted to avoid redundancy.

The first LED stack 423 of FIG. 53 is bonded on the second LED stack 433. The second color filter 457 and the first transparent electrode 425 may be bonded to face each other. For example, bonding material layers are formed on the second color filter 457 and the first transparent electrode 425, respectively, and by bonding the second color filter 457 and the first transparent electrode 425, the second bonding layer 459 may be formed. The bonding material layers may be, for example, a transparent organic layer or a transparent inorganic layer as described above.

Then, the first substrate 421 is removed from the first LED stack 423. The first substrate 421 may be removed using, for example, a wet etching technique. Accordingly, the first conductivity type semiconductor layer 423a is exposed. The surface of the exposed first conductivity type semiconductor layer 423a may be textured to improve light extraction efficiency, which makes it possible to form a roughened surface or a light extracting structure on the surface of the first conductivity type semiconductor layer 423a.

Figure 57A:
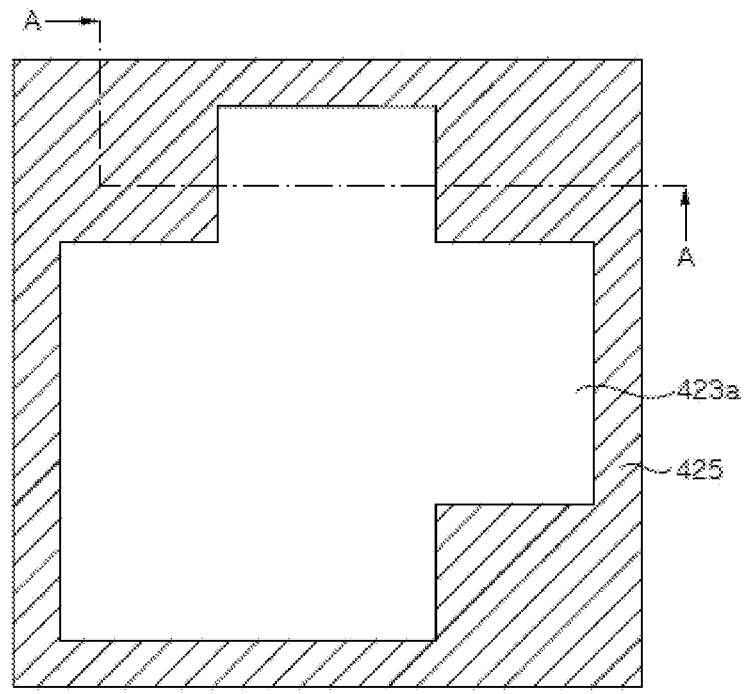
Figure 57B:
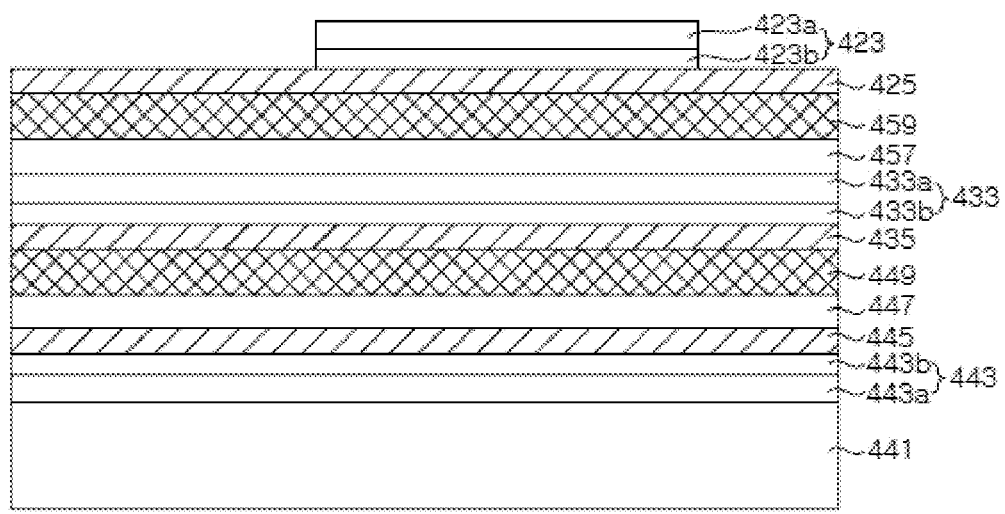

Referring to FIGS. 57A and 57B, the first LED stack 423 is patterned to expose the first transparent electrode 425. Although the drawings show one light emitting device region, the first LED stack 423 is patterned in a plurality of light emitting device regions on the substrate 441, and the first transparent electrode 425 is exposed. The first transparent electrode 425 may be used as an etch stop layer when the first LED stack 423 is patterned, which makes it possible to etch a part of the first transparent electrode 425 exposed to the outside of the first LED stack 423 to form a step on the first transparent electrode 425. That is, the first transparent electrode 425 below the first LED stack 423 may be thicker than the first transparent electrode 425 outside the first LED stack 423.

Figure 58A:
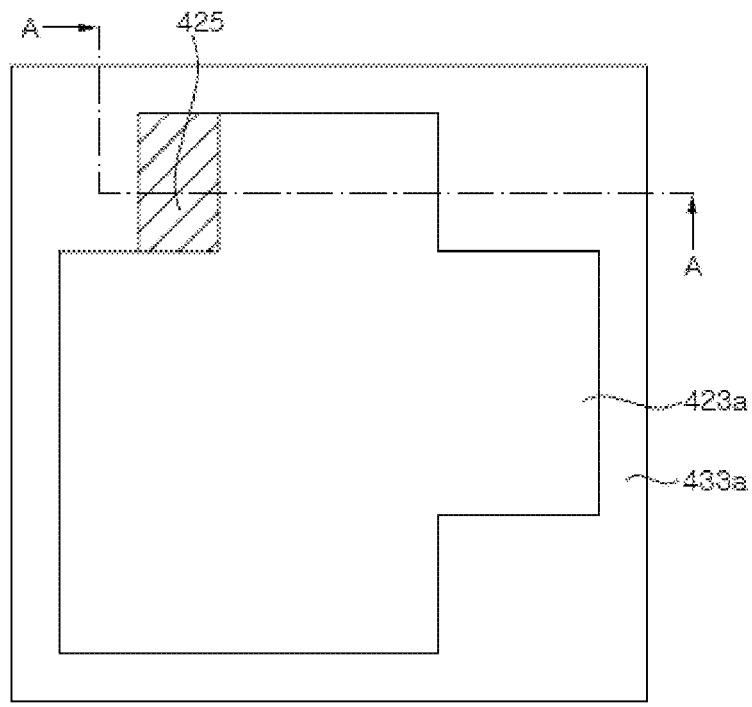
Figure 58B:
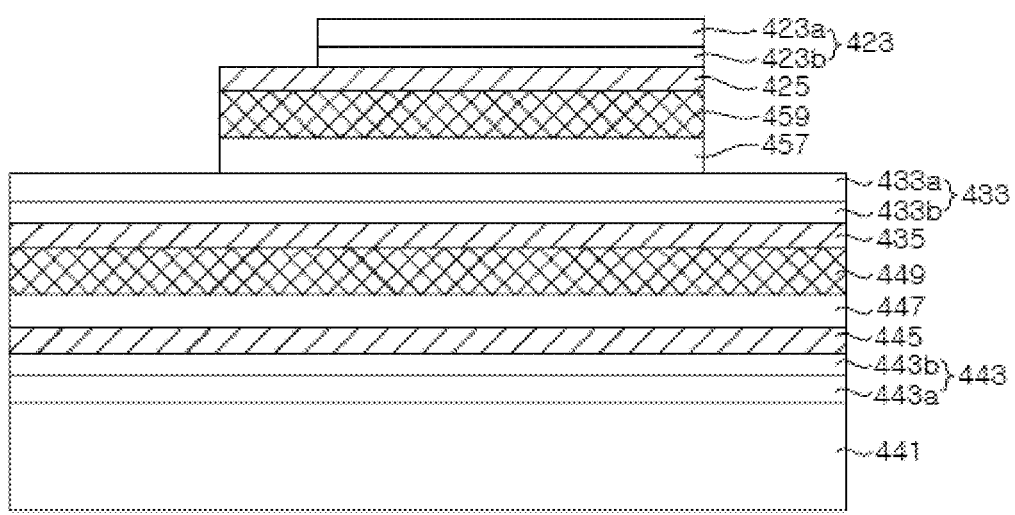

Referring to FIGS. 58A and 58B, subsequently, the first transparent electrode 425, the second bonding layer 459, and the second color filter 457 are patterned such that the first conductivity type semiconductor layer 433a of the second LED stack 433 is exposed. As shown in FIG. 58A, the first transparent electrode 425 is patterned such that a part of the first transparent electrode 425 remains outside the first LED stack 423 in a plan view.

Figure 59A:
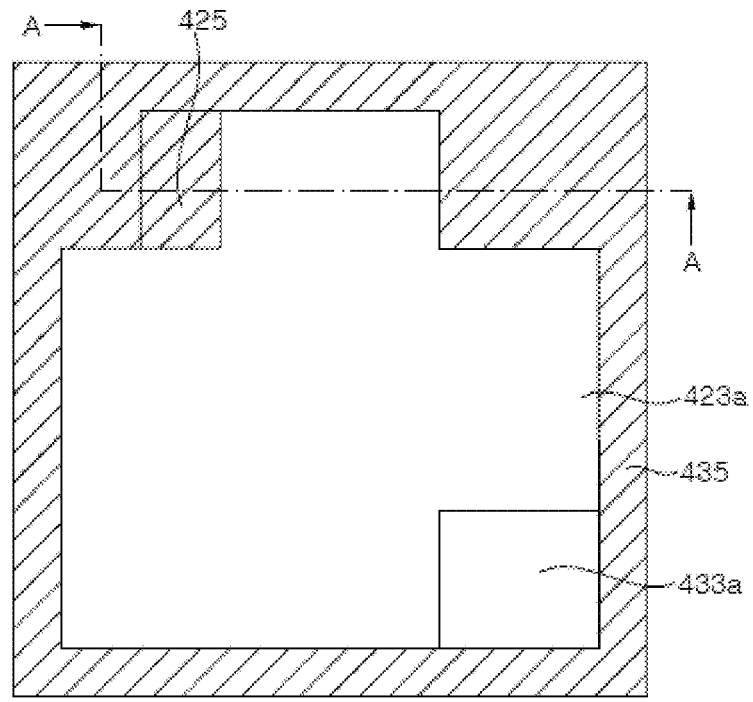
Figure 59B:
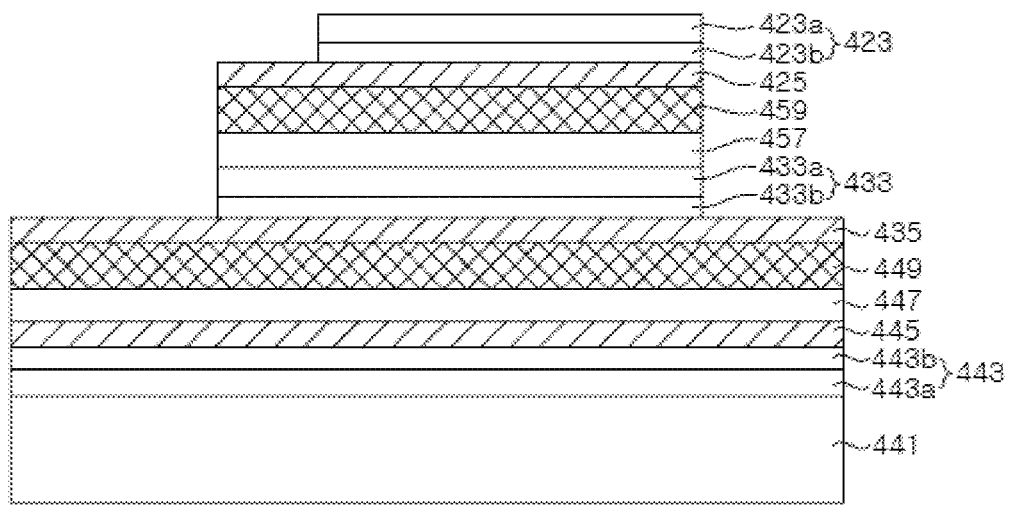

Referring to FIGS. 59A and 59B, the first and second conductivity type semiconductor layers 433a and 433b are patterned to expose the second transparent electrode 435. As shown in FIG. 59A, the first conductivity type semiconductor layer 433a is patterned such that a part of the first conductivity type semiconductor layer 433a remains outside the first LED stack 423 in a plan view. The second transparent electrode 435 may be used as an etch stop layer during the patterning of the first and second conductivity type semiconductor layers 433a and 433b. Accordingly, in the second transparent electrode 435, a part disposed outside the second LED stack 433 may be thinner than a part disposed below the second LED stack 433 so that a step is formed.

Figure 60A:
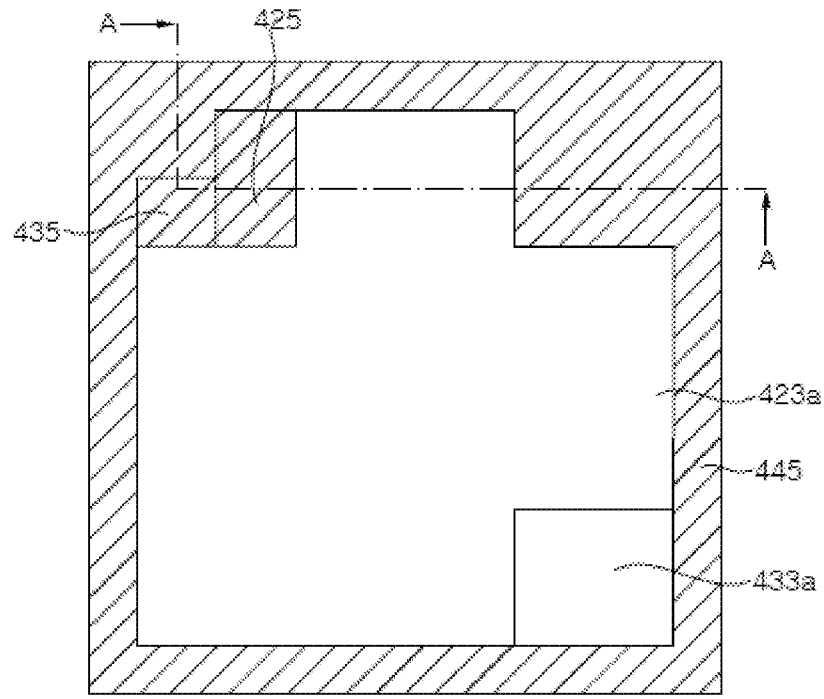
Figure 60B:
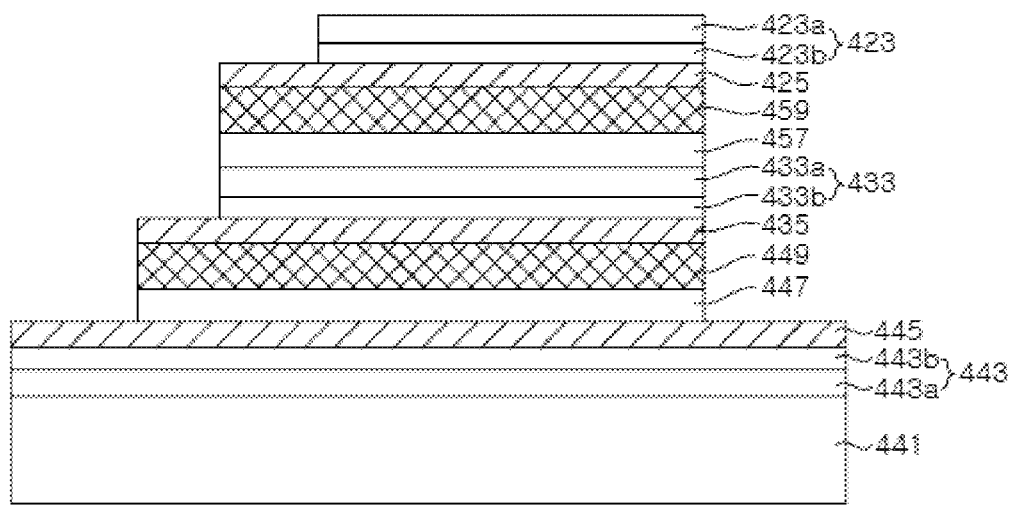

Referring to FIGS. 60A and 60B, the second transparent electrode 435, the first bonding layer 449, and the first color filter 447 are sequentially patterned to expose the third transparent electrode 445. The third transparent electrode 445 may be used as an etch stop layer, so that a step may also be formed on the third transparent electrode 445. That is, in the third transparent electrode 445, a part exposed outside the first color filter 447 may be relatively thin, compared with a part disposed below the first color filter 447.

As shown in FIG. 58A, the second transparent electrode 435 is patterned such that a part of the second transparent electrode 435 remains outside the second LED stack 433 in a plan view. The exposed second transparent electrode 435 is disposed adjacent to the exposed first transparent electrode 425.

Figure 61A:
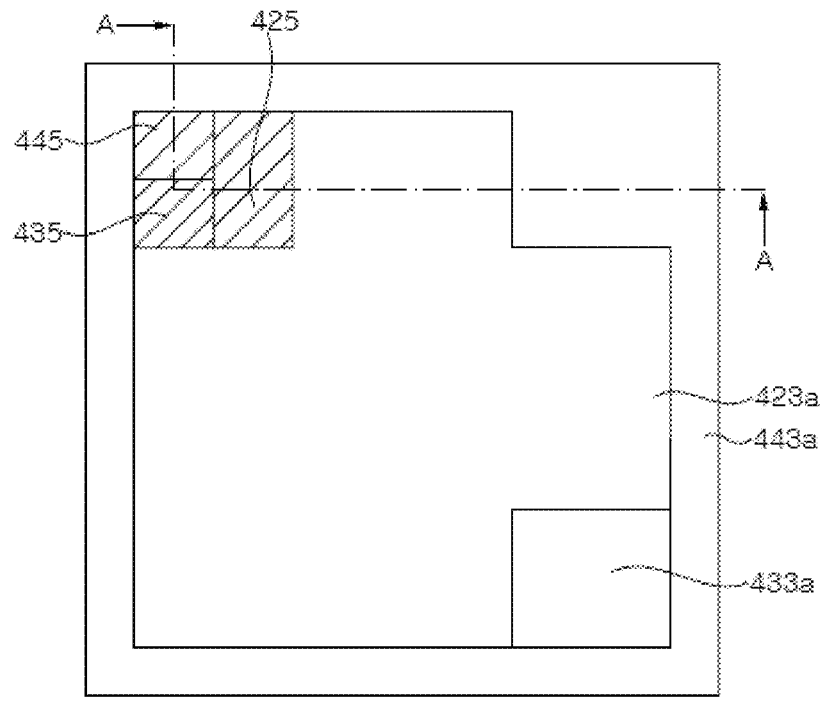
Figure 61B:
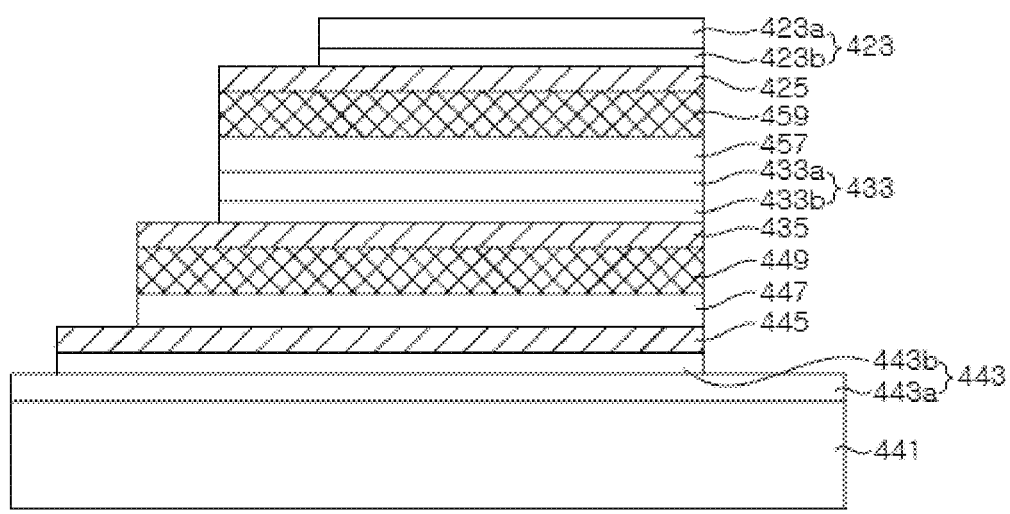

Referring to FIGS. 61A and 61B, the third transparent electrode 445 and the second conductivity type semiconductor layer 443a are patterned to expose the first conductivity type semiconductor layer 443a.

A part of the third transparent electrode 445 is exposed to the outside of the second LED stack 433 to be viewed in a plan view. The exposed third transparent electrode 445 is disposed adjacent to the exposed second transparent electrode 435.

Figure 62A:
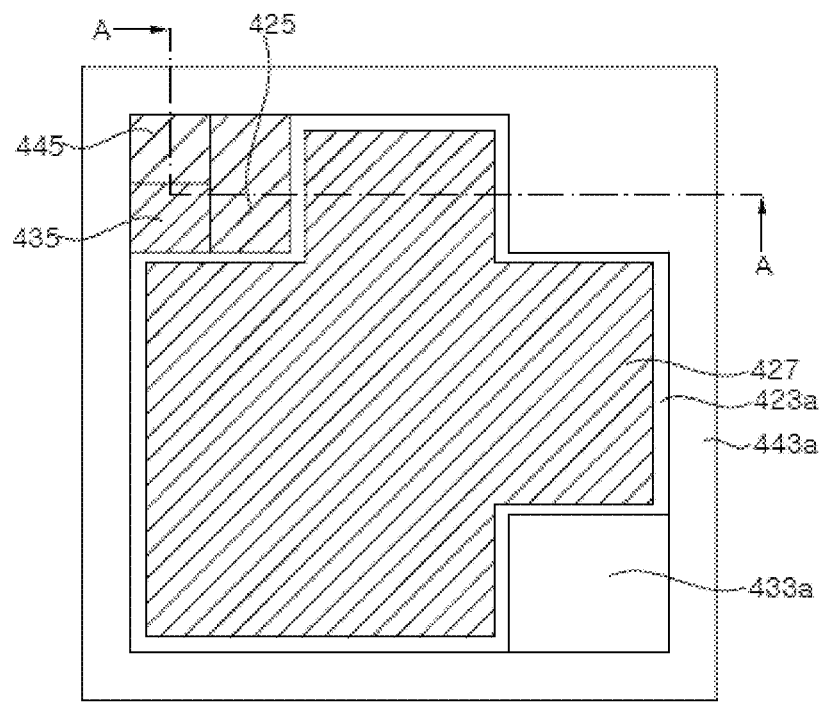
Figure 62B:
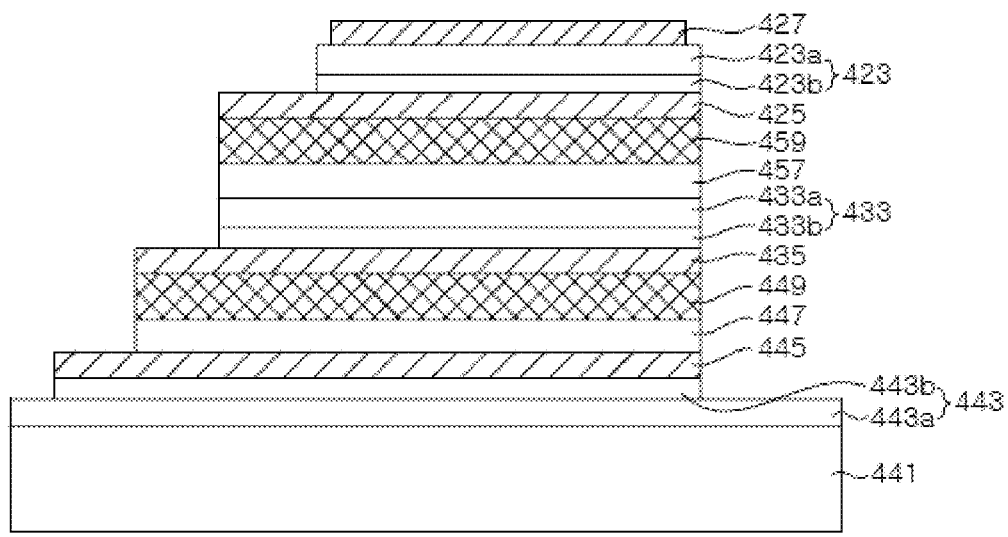

Referring to FIGS. 62A and 62B, the ohmic electrode 427 is formed on the first conductivity type semiconductor layer 423a of the first LED stack 423. The ohmic electrode 427 is in ohmic contact with the first conductivity type semiconductor layer 423a and may be formed of a metal layer, such as AuTe or AuGe.

Figure 63A:
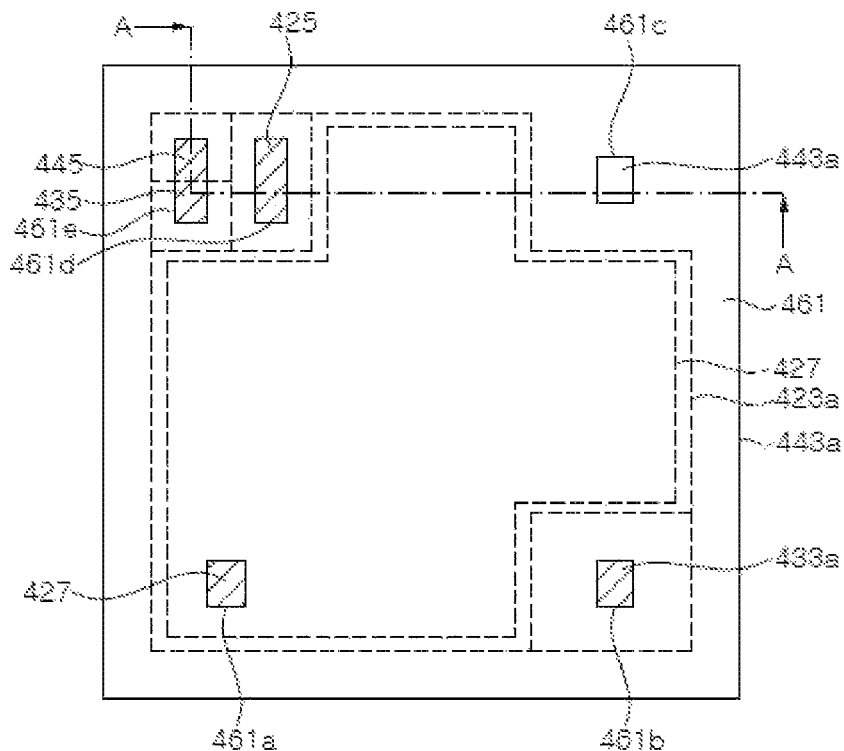
Figure 63B:
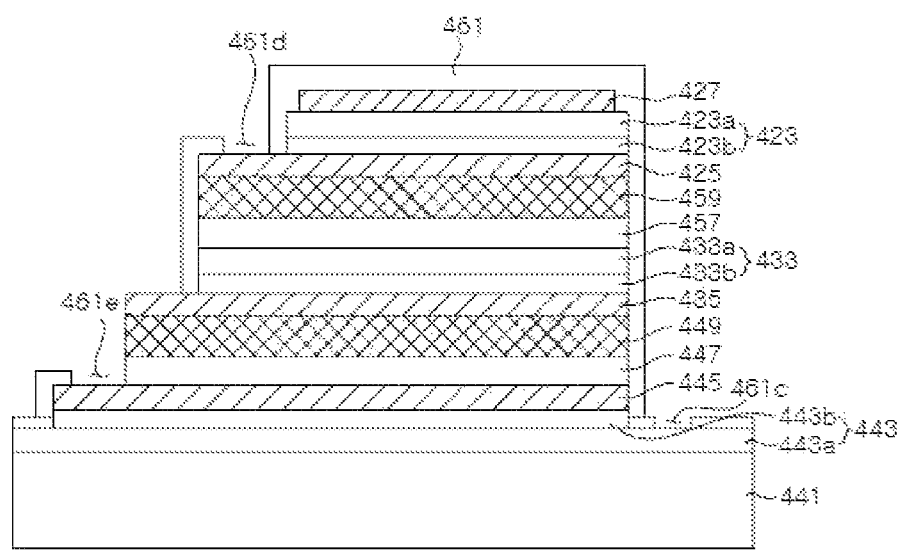

Referring to FIGS. 63A and 63B, the insulating layer 461 covering the first, second, and third LED stacks 423, 433, and 443 is formed. The insulating layer 461 may be formed as a single layer or multiple layers of $SiO_2$, $Si_3N_4$, SOG, or others. Alternatively, the insulating layer 461 may include a light reflecting layer or a light absorbing layer to avoid optical interference with the adjacent light emitting device. For example, the insulating layer 461 may include a distributed Bragg reflector that reflects red light, green light, and blue light, or a layer of $SiO_2$ with a reflective metallic layer or a highly reflective organic layer deposited thereon. Alternatively, the insulating layer 461 may include, for example, black epoxy as a light absorbing material. The light reflecting layer or the light absorbing layer prevents optical interference between the light emitting devices, which results in increase in the contrast ratio of the image.

The insulating layer 461 may cover the upper surface and side surfaces of the first, second, and third LED stacks 423, 433, and 443. The insulating layer 461 also covers the exposed first, second, and third transparent electrodes 425, 435, and 445. The insulating layer 461 may also cover the ohmic electrode 427.

The insulating layer 461 is patterned to include the openings 461a, 461b, 461b, 461c, 461d, and 461e for exposing the ohmic electrode 427, the first conductivity type semiconductor layers 433a and 443a, and the first, second, and third transparent electrodes 425, 435, and 445. In particular, the opening 461e may expose the second transparent electrode 435 and the third transparent electrode 445 together.

Although the ohmic electrode 427, the first conductivity type semiconductor layer 433a, and the first conductivity type semiconductor layer 443a are each shown and described as being exposed by one opening, each of them may be exposed by a plurality of openings. In addition, the second and third transparent electrodes 435 and 445 may be exposed by different openings, respectively, and the first, second, and third transparent electrodes 425, 435, and 445 each may be exposed by a plurality of openings.

Figure 64A:
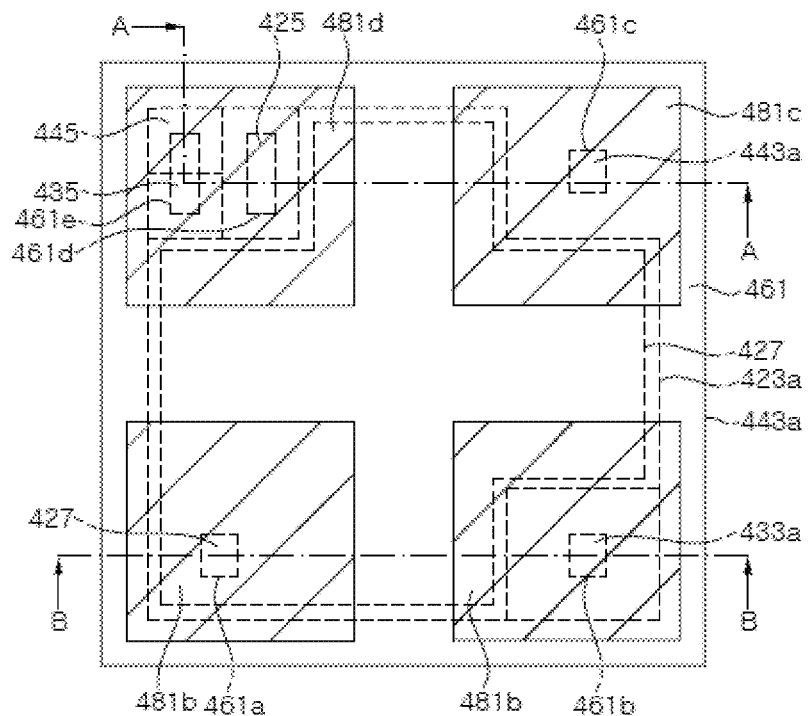
Figure 64B:
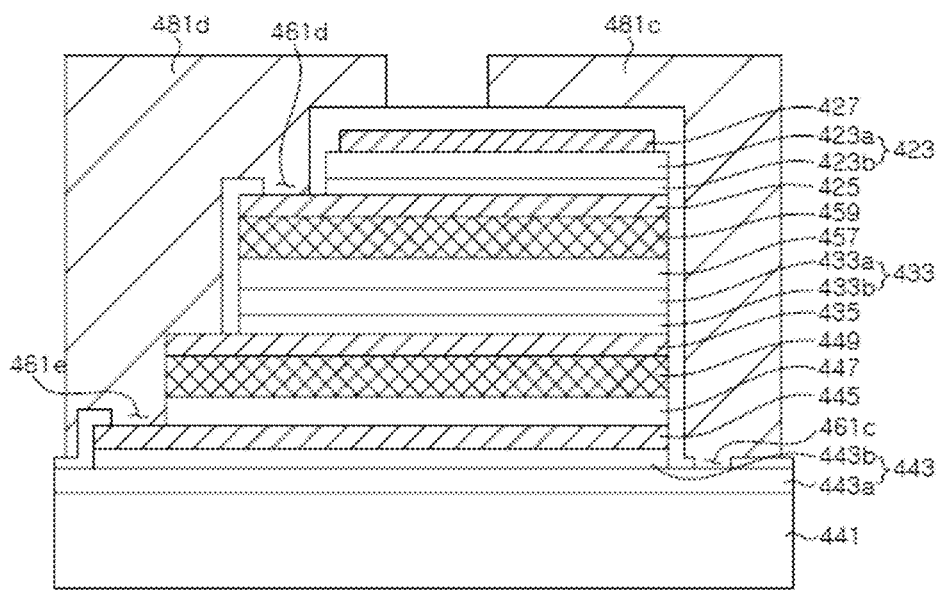

Referring to FIGS. 64A and 64B, the electrode pads 481a, 481b, 481c, and 481d are formed on the insulating layer 461. The electrode pads 481a, 481b, 481c, and 481d include the first electrode pad 481a, the second electrode pad 481b, the third electrode pad 481c, and the common electrode pad 481d.

The common electrode pad 481d is connected to the first transparent electrode 425, the second transparent electrode 435, and the third transparent electrode 445 through the openings 461d and 461e. Thus, the common electrode pad 481d is electrically connected in common to the anodes of the first, second, and third LED stacks 423, 433, and 443. In particular, the common electrode pad 481d may be simultaneously connected to the second transparent electrode 435 and the third transparent electrode 445 through one opening 461e.

The first electrode pad 481a is connected to the ohmic electrode 427 and electrically connected to the cathode of the first LED stack 423, that is, the first conductivity type semiconductor layer 423a through the opening 461a. The second electrode pad 481b is electrically connected to the cathode of the second LED stack 433, that is, the first conductivity type semiconductor layer 433a through the opening 461b, and the third electrode pad 481c is electrically connected to the cathode of the third LED stack 443, that is, the first conductivity type semiconductor layer 443a through the opening 461c.

The electrode pads 481a, 481b, 481c, and 481d are electrically separated from each other, so that each of the first, second, and third LED stacks 423, 433, and 443 is electrically connected to two electrode pads, and is adapted to be independently driven.

Subsequently, the light emitting device 400 of FIG. 52A according to an exemplary embodiment is provided by dividing the substrate 441 into light emitting device regions.

As shown in FIG. 64A, the electrode pads 481a, 481b, 481c, and 481d may be disposed at four corners of each light emitting device 400. In addition, the electrode pads 481a, 481*b*, 481*c*, and 481*d* may have substantially a rectangular shape, but the inventive concepts are not limited thereto.

Further, although the substrate 441 is described as being divided, the substrate 441 may be removed so that the surface of the exposed first conductivity type semiconductor layer 443 may be textured.

A light emitting device according to an exemplary embodiment has a structure, in which anodes of the first, second, and third LED stacks 423, 433, and 443 are electrically connected in common, and cathodes thereof are independently connected. However, the inventive concepts are not limited thereto, and the anodes of the first, second, and third LED stacks 423, 433, and 443 may be independently connected to the electrode pads, and the cathodes may be electrically connected to the common electrode pad in common.

The light emitting device 400 may include the first, second, and third LED stacks 423, 433, and 443 to emit red, green, and blue light, and thus may be used as a single pixel in a display apparatus. As described with reference to FIG. 51, a display apparatus may be provided by arranging a plurality of light emitting devices 400 on the circuit board 401. Since the light emitting device 400 includes the first, second, and third LED stacks 423, 433, and 443, the area of the subpixel in one pixel may be increased. Further, the first, second, and third LED stacks 423, 433, and 443 may be mounted by mounting one light emitting device 400, thereby reducing the number of mounting processes.

According to the illustrated embodiment, the second transparent electrode 435 and the third transparent electrode 445 may be exposed together through one opening 461*e*, and the common electrode pad 481*d* may be connected to the second transparent electrode 435 and the third transparent electrode 445 in common through the opening 461*e*. Since the semiconductor layers of the same conductivity type of the second LED stack 433 and the third LED stack 443 are disposed to face each other, short circuit may not occur by the common electrode pad 481*d*. The semiconductor layers of the second conductivity type semiconductor layers 433*b* and 443*b* of the second LED stack 433 and the third LED stack 443 are described as being disposed to face each other, but the inventive concepts are not limited thereto.

As described with reference to FIG. 51, the light emitting devices 400 mounted on the circuit board 401 may be driven by a passive matrix method or an active matrix method.

Figure 65:
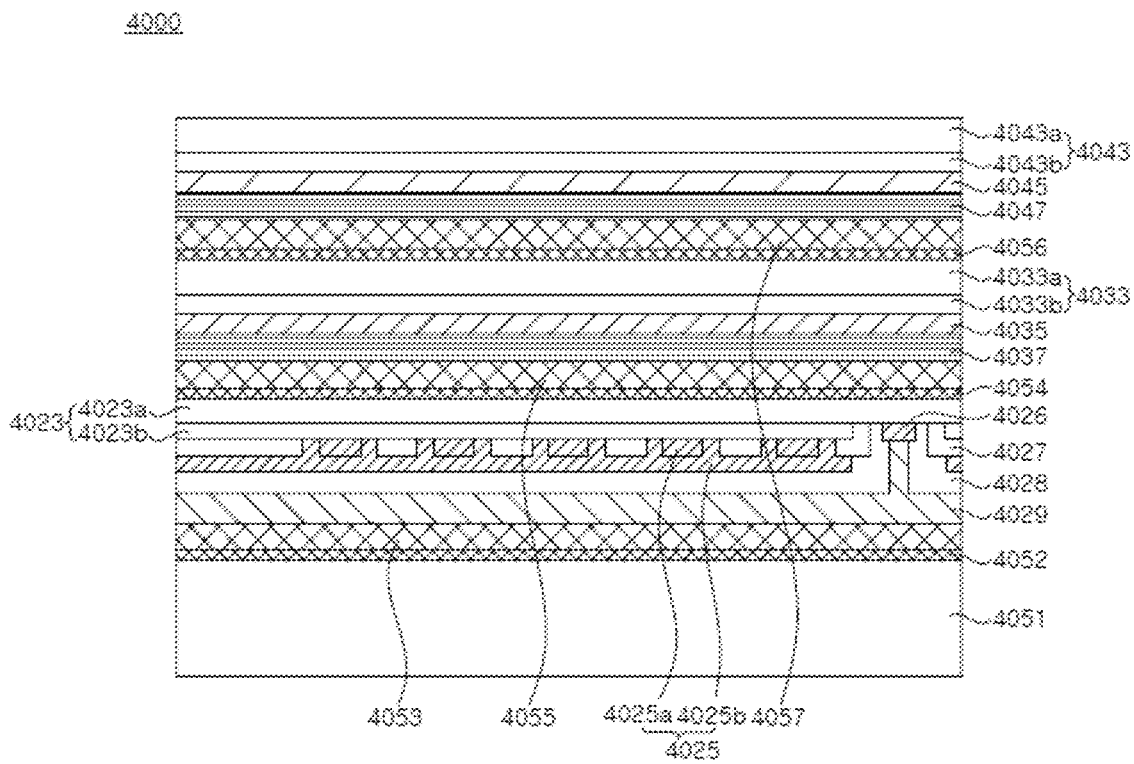
FIG. 65 is a schematic cross-sectional view of a light emitting diode (LED) stack for a display according to an exemplary embodiment.

FIG. 65 is a schematic cross-sectional view of a light emitting diode (LED) stack for a display according to an exemplary embodiment.

Referring to FIG. 65, the light emitting diode stack 4000 for a display may include a support substrate 4051, a first LED stack 4023, a second LED stack 4033, a third LED stack 4043, a reflective electrode 4025, an ohmic electrode 4026, a first insulating layer 4027, a second insulating layer 4028, a interconnection line 4029, a second-p transparent electrode 4035, a third-p transparent electrode 4045, a first color filter 4037, a second color filter 4047, hydrophilic material layers 4052, 4054, and 4056, a first bonding layer 4053 (a lower bonding layer), a second bonding layer 4055 (an intermediate bonding layer), and a third bonding layer 4057 (an upper bonding layer).

The support substrate 4051 supports LED stacks 4023, 4033, and 4043. The support substrate 4051 may have a circuit on a surface thereof or an inside thereof, but is not limited thereto. The support substrate 4051 may include, for example, a glass, a sapphire substrate, a Si substrate, or a Ge substrate.

The first LED stack 4023, the second LED stack 4033, and the third LED stack 4043 each include first conductivity type semiconductor layers 4023*a*, 4033*a*, and 4043*a*, second conductivity type semiconductor layers 4023*b*, 4033*b*, and 4043*b*, and active layers interposed between the first conductivity type semiconductor layers and the second conductivity type semiconductor layers. The active layer may have a multiple quantum well structure.

The first LED stack 4023 may be an inorganic LED that emits red light, the second LED stack 4033 may be an inorganic LED that emits green light, and the third LED stack 4043 may be an inorganic LED that emits blue light. The first LED stack 4023 may include a GaInP-based well layer, and the second LED stack 4033 and the third LED stack 4043 may include a GaInN-based well layer. However, the inventive concepts are not limited thereto, and when the LED stacks include micro LEDs, the first LED stack 4023 may emit any one of red, green, and blue light, and the second and third LED stacks 4033 and 4043 may emit a different one of the red, green, and blue light without adversely affecting operation or requiring color filters due to its small form factor.

Opposite surfaces of each LED stack 4023, 4033, or 4043 are an n-type semiconductor layer and a p-type semiconductor layer, respectively. The illustrated exemplary embodiment describes a case in which the first conductivity type semiconductor layers 4023*a*, 4033*a*, and 4043*a* of each of the first to third LED stacks 4023, 4033, and 4043 are n-type, and the second conductivity type semiconductor layers 4023*b*, 4033*b*, and 4043*b* thereof are p-type. A roughened surface may be formed on upper surfaces of the first to third LED stacks 4023, 4033, and 4043. However, the inventive concepts are not limited thereto, and the type of the semiconductor types of the upper surface and the lower surface of each of the LED stacks may be reversed.

The first LED stack 4023 is disposed to be adjacent to the support substrate 4051, the second LED stack 4033 is disposed on the first LED stack 4023, and the third LED stack 4043 is disposed on the second LED stack 4033. Since the first LED stack 4023 emits light of the wavelength longer than the wavelengths of the second and third LED stacks 4033 and 4043, light generated in the first LED stack 4023 may be transmitted through the second and third LED stacks 4033 and 4043 and may be emitted to the outside. In addition, since the second LED stack 4033 emits light of the wavelength longer than the wavelength of the third LED stack 4043, light generated in the second LED stack 4033 may be transmitted through the third LED stack 4043 and may be emitted to the outside.

The reflective electrode 4025 is in ohmic contact with the second conductivity type semiconductor layer of the first LED stack 4023 and reflects light generated in the first LED stack 4023. For example, the reflective electrode 4025 may include an ohmic contact layer 4025*a* and a reflective layer 4025*b*.

The ohmic contact layer 4025*a* is partially in contact with the second conductivity type semiconductor layer, that is, a p-type semiconductor layer. In order to prevent light absorption by the ohmic contact layer 4025*a*, an area in which the ohmic contact layer 4025*a* is in contact with the p-type semiconductor layer may not exceed about 50% of a total area of the p-type semiconductor layer. The reflective layer 4025*b* covers the ohmic contact layer 4025*a* and also covers the first insulating layer 4027. As illustrated, the reflective layer 4025*b* may substantially cover the entirety of the ohmic contact layer 4025*a*, or a portion of the ohmic contact layer 4025*a*.

The reflective layer 4025b covers the first insulating layer 4027, such that an omnidirectional reflector may be formed by a stack of the first LED stack 4023 having a relatively high refractive index and the first insulating layer 4027 and the reflective layer 4025b having a relatively low refractive index. The reflective layer 4025b covers about 50% or more of the area of the first LED stack 4023, preferably, most of the region of the first LED stack 4023, thereby improving light efficiency.

The ohmic contact layer 4025a and the reflective layer 4025b may be formed of a metal layer containing gold (Au). The ohmic contact layer 4025a may be formed of, for example, an Au—Zn alloy or an Au—Be alloy. The reflective layer 4025b may be formed of a metal layer having high reflectivity with respect to light generated in the first LED stack 4023, for example, red light, such as aluminum (Al), silver (Ag), or gold (Au). In particular, Au may have relatively low reflectivity with respect to light generated in the second LED stack 4033 and the third LED stack 4043, for example, green light or blue light, and thus, may reduce light interference by absorbing light generated in the second and third LED stacks 4033 and 4043 and traveling toward the support substrate 4051.

The first insulating layer 4027 is disposed between the support substrate 4051 and the first LED stack 4023, and has an opening exposing the first LED stack 4023. The ohmic contact layer 4025a is connected to the first LED stack 4023 within the opening of the first insulating layer 4027.

The ohmic electrode 4026 is in ohmic contact with the first conductivity type semiconductor layer 4023a of the first LED stack 4023. The ohmic electrode 4026 may be disposed on the first conductivity type semiconductor layer 4023a exposed by partially removing the second conductivity type semiconductor layer 4023b. Although FIG. 65 illustrates one ohmic electrode 4026, a plurality of ohmic electrodes 4026 are aligned on a plurality of regions on the support substrate 4051. The ohmic electrode 4026 may be formed of, for example, an Au—Te alloy or an Au—Ge alloy.

The second insulating layer 4028 is disposed between the support substrate 4051 and the reflective electrode 4025 to cover the reflective electrode 4025. The second insulating layer 4028 has an opening exposing the ohmic electrode 4026. The second insulating layer 4028 may be formed of $SiO_2$ or SOG.

The interconnection line 4029 is disposed between the second insulating layer 4028 and the support substrate 4051, and is connected to the ohmic electrode 4026 through the opening of the second insulating layer 4028. The interconnection line 4029 may connect a plurality of ohmic electrodes 4026 to one another on the support substrate 4051.

The second-p transparent electrode 4035 is in ohmic contact with the second conductivity type semiconductor layer 4033b of the second LED stack 4033, that is, the p-type semiconductor layer. The second-p transparent electrode 4035 may be formed of a metal layer or a conductive oxide layer which is transparent to red light and green light.

The third-p transparent electrode 4045 is in ohmic contact with the second conductivity type semiconductor layer 4043b of the third LED stack 4043, that is, the p-type semiconductor layer. The third-p transparent electrode 4045 may be formed of a metal layer or a conductive oxide layer which is transparent to red light, green light, and blue light.

The reflective electrode 4025, the second-p transparent electrode 4035, and the third-p transparent electrode 4045 may be in ohmic contact with the p-type semiconductor layer of each LED stack to assist in current dispersion.

The first color filter 4037 may be disposed between the first LED stack 4023 and the second LED stack 4033. In addition, the second color filter 4047 may be disposed between the second LED stack 4033 and the third LED stack 4043. The first color filter 4037 transmits light generated in the first LED stack 4023 and reflects light generated in the second LED stack 4033. The second color filter 4047 transmits light generated in the first and second LED stacks 4023 and 4033 and reflects light generated in the third LED stack 4043. Accordingly, light generated in the first LED stack 4023 may be emitted to the outside through the second LED stack 4033 and the third LED stack 4043, and light generated in the second LED stack 4033 may be emitted to the outside through the third LED stack 4043. Further, it is possible to prevent light generated in the second LED stack 4033 from being incident on the first LED stack 4023 and lost, or light generated in the third LED stack 4043 from being incident on the second LED stack 4033 and lost.

According to some exemplary embodiments, the first color filter 4037 may also reflect light generated in the third LED stack 4043. According to some exemplary embodiments, when the LED stacks include micro LEDs, the color filters may be omitted due to the small form factor of the micro LEDs.

The first and second color filters 4037 and 4047 may be, for example, a low pass filter that passes only a low frequency region, that is, a long wavelength region, a band pass filter that passes only a predetermined wavelength band, or a band stop filter that blocks only the predetermined wavelength band. In particular, the first and second color filters 4037 and 4047 may be formed by alternately stacking insulating layers having different refractive indices, and may be formed by alternately stacking, for example, $TiO_2$ and $SiO_2$, $Ta_2O_5$ and $SiO_2$, $Nb_2O_5$ and $SiO_2$, $HfO_2$ and $SiO_2$, or $ZrO_2$ and $SiO_2$. Further, the first and/or second color filter 4037 and/or 4047 may include a distributed Bragg reflector (DBR). The distributed Bragg reflector may be formed by alternately stacking insulating layers having different refractive indices. Further, a stop band of the distributed Bragg reflector may be controlled by adjusting a thickness of $TiO_2$ and $SiO_2$.

The first bonding layer 4053 couples the first LED stack 4023 to the support substrate 4051. As illustrated, the interconnection line 4029 may be in contact with the first bonding layer 4053. In addition, the interconnection line 4029 is disposed below some regions of the second insulating layer 4028, and a region of the second insulating layer 4028 that does not have the interconnection line 4029 may be in contact with the first bonding layer 4053. The first bonding layer 4053 may be light transmissive or light non-transmissive. In particular, a contrast of the display apparatus may be improved by using an adhesive layer that absorbs light, such as black epoxy, as the first bonding layer 4053.

The first bonding layer 4053 may be in direct contact with the support substrate 4051, but as illustrated, the hydrophilic material layer 4052 may be disposed on an interface between the support substrate 4051 and the first bonding layer 4053. The hydrophilic material layer 4052 may change a surface of the support substrate 4051 to be hydrophilic to improve adhesion of the first bonding layer 4053. As used herein, the bonding layer and the hydrophilic material layer may collectively be referred to as a buffer layer.

The first bonding layer 4053 has a strong adhesion to the hydrophilic material layer, while it has a weak adhesion to a hydrophobic material layer. Therefore, peeling may occur at a portion in which the adhesion is weak. The hydrophilic material layer 4052 according to an exemplary embodiment may change a hydrophobic surface to be hydrophilic to enhance the adhesion of the first bonding layer 4053, thereby preventing the occurrence of the peeling.

The hydrophilic material layer 4052 may also be formed by depositing, for example, $SiO_2$, or others on the surface of the support substrate 4051, and may also be formed by treating the surface of the support substrate 4051 with plasma to modify the surface. The surface modified layer increases surface energy to change hydrophobic property into hydrophilic property. In a case in which the second insulating layer 4028 has hydrophobic property, the hydrophilic material layer may also be disposed on the second insulating layer 4028, and the first bonding layer 4052 may be in contact with the hydrophilic material layer on the second insulating layer 4028.

The second bonding layer 4055 couples the second LED stack 4033 to the first LED stack 4023. The second bonding layer 4055 may be disposed between the first LED stack 4023 and the first color filter 4037 and may be in contact with the first color filter 4037. The second bonding layer 4055 may transmit light generated in the first LED stack 4023. A hydrophilic material layer 4054 may be disposed in an interface between the first LED stack 4023 and the second bonding layer 4055. The first conductivity type semiconductor layer 4023a of the first LED stack 4023 generally exhibits hydrophobic property. Therefore, in a case in which the second bonding layer 4055 is in direct contact with the first conductivity type semiconductor layer 4023a, the peeling is likely to occur at an interface between the second bonding layer 4055 and the first conductivity type semiconductor layer 4023a.

The hydrophilic material layer 4054 according to an exemplary embodiment changes the surface of the first LED stack 4023 from having hydrophobic properties to having hydrophilic properties, and thus, improves the adhesion of the second bonding layer 4055, thereby reducing or preventing the occurrence of the peeling. The hydrophilic material layer 4054 may be formed by depositing $SiO_2$ or modifying the surface of the first LED stack 4023 with plasma as described above.

A surface layer of the first color filter 4037 which is in contact with the second bonding layer 4055 may be a hydrophilic material layer, for example, $SiO_2$. In a case in which the surface layer of the first color filter 4037 is not hydrophilic, the hydrophilic material layer may be formed on the first color filter 4037, and the second bonding layer 4055 may be in contact with the hydrophilic material layer.

The third bonding layer 4057 couples the third LED stack 4043 to the second LED stack 4033. The third bonding layer 4057 may be disposed between the second LED stack 4033 and the second color filter 4047 and may be in contact with the second color filter 4047. The third bonding layer 4057 transmits light generated in the first LED stack 4023 and the second Led stack 4033. A hydrophilic material layer 4056 may be disposed in an interface between the second LED stack 4033 and the third bonding layer 4057. The second LED stack 4033 may exhibit hydrophobic property, and as a result, in a case in which the third bonding layer 4057 is in direct contact with the second LED stack 4033, the peeling is likely to occur at an interface between the third bonding layer 4057 and the second LED stack 4033.

The hydrophilic material layer 4056 according to an exemplary embodiment changes the surface of the second LED stack 4033 from hydrophobic property into hydrophilic property, and thus, improves the adhesion of the third bonding layer 4057, thereby preventing the occurrence of the peeling. The hydrophilic material layer 4056 may be formed by depositing $SiO_2$ or modifying the surface of the second LED stack 4033 with plasma as described above.

A surface layer of the second color filter 4047 which is in contact with the third bonding layer 4057 may be a hydrophilic material layer, for example, $SiO_2$. In a case in which the surface layer of the second color filter 4047 is not hydrophilic, the hydrophilic material layer may be formed on the second color filter 4047 and the third bonding layer 4057 may be in contact with the hydrophilic material layer.

The first to third bonding layers 4053, 4055, and 4057 may be formed of light transmissive SOC, but is not limited thereto, and other transparent organic material layers or transparent inorganic material layers may be used. Examples of the organic material layer may include SUB, poly(methylmethacrylate) (PMMA), polyimide, parylene, benzocyclobutene (BCB), or others, and examples of the inorganic material layer may include $Al_2O_3$, $SiO_2$, $SiN_x$, or others. The organic material layers may be bonded at high vacuum and high pressure, and the inorganic material layers may be bonded by planarizing a surface with, for example, a chemical mechanical polishing process, changing surface energy using plasma or others, and then using the changed surface energy.

FIGS. 66A to 66F are schematic cross-sectional views illustrating a method of manufacturing the light emitting diode stack 4000 for a display according to the exemplary embodiment.

Figure 66A:
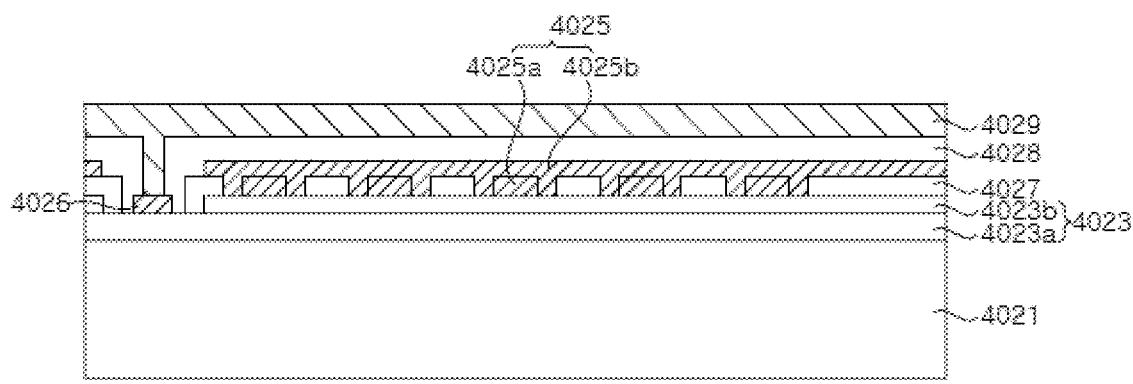
FIG. 66A, FIG. 66B, FIG. 66C, FIG. 66D, FIG. 66E, and FIG. 66F are schematic cross-sectional views illustrating a method for manufacturing a light emitting diode stack for a display according to an exemplary embodiment.

Referring to FIG. 66A, a first LED stack 4023 is first grown on a first substrate 4021. The first substrate 4021 may be, for example, a GaAs substrate. The first LED stack 4023 is formed of an AlGaInP based semiconductor layers, and includes a first conductivity type semiconductor layer 4023a, an active layer, and a second conductivity type semiconductor layer 4023b.

Next, the second conductivity type semiconductor layer 4023b is partially removed to expose the first conductivity type semiconductor layer 4023a. Although FIG. 66A shows only one pixel region, the first conductivity type semiconductor layer 4023a is partially exposed for each of the pixel regions.

A first insulating layer 4027 is formed on the first LED stack 4023 and is patterned to form openings. For example, $SiO_2$ is formed on the first LED stack 4023, a photoresist is applied thereto, and a photoresist pattern is formed through photolithograph and development. Next, the first insulating layer 4027 in which the openings are formed may be formed by patterning $SiO_2$ using the photoresist pattern as an etching mask. One of the openings of the first insulating layer 4027 may be disposed on the first conductivity type semiconductor layer 4023a, and other openings may be disposed on the second conductivity type semiconductor layer 4023b.

Thereafter, an ohmic contact layer 4025a and an ohmic electrode 4026 are formed in the openings of the first insulating layer 4027. The ohmic contact layer 4025a and the ohmic electrode 4026 may be formed using a lift-off technique. The ohmic contact layer 4025a may be first formed and the ohmic electrode 4026 may be then formed, or vice versa. In addition, according to an exemplary embodiment, the ohmic electrode 4026 and the ohmic contact layer 4025a may be simultaneously formed of the same material layer.

After the ohmic contact layer 4025a is formed, a reflective layer 4025b covering the ohmic contact layer 4025a and the first insulating layer 4027 is formed. The reflective layer 4025b may be formed using a lift-off technique. The reflective layer 4025b may also cover a portion of the ohmic contact layer 4025a, and may also cover substantially the entirety of the ohmic contact layer 4025a as illustrated. A reflective electrode 4025 is formed by the ohmic contact layer 4025a and the reflective layer 4025b.

The reflective electrode 4025 may be in ohmic contact with a p-type semiconductor layer of the first LED stack 4023, and may be thus referred to as a first p-type reflective electrode 4025. The reflective electrode 4025 is spaced apart from the ohmic electrode 4026, and is thus electrically insulated from the first conductivity type semiconductor layer 4023a.

A second insulating layer 4028 covering the reflective electrode 4025 and having an opening exposing the ohmic electrode 4026 is formed. The second insulating layer 4028 may be formed of, for example, $SiO_2$ or SOG.

Then, a interconnection line 4029 is formed on the second insulating layer 4028. The interconnection line 4029 is connected to the ohmic electrode 4026 through the opening of the second insulating layer 4028, and is thus electrically connected to the first conductivity type semiconductor layer 4023a.

Although the interconnection line 4029 is illustrated in FIG. 66A as covering the entire surface of the second insulating layer 4028, the interconnection line 4029 may be partially disposed on the second insulating layer 4028, and an upper surface of the second insulating layer 4028 may be exposed around the interconnection line 4029.

Although the illustrated exemplary embodiment shows one pixel region, the first LED stack 4023 disposed on the substrate 4021 may cover a plurality of pixel regions, and the interconnection line 4029 may be commonly connected to the ohmic electrodes 4026 formed on a plurality of regions. In addition, a plurality of interconnection lines 4029 may be formed on the substrate 4021.

Figure 66B:
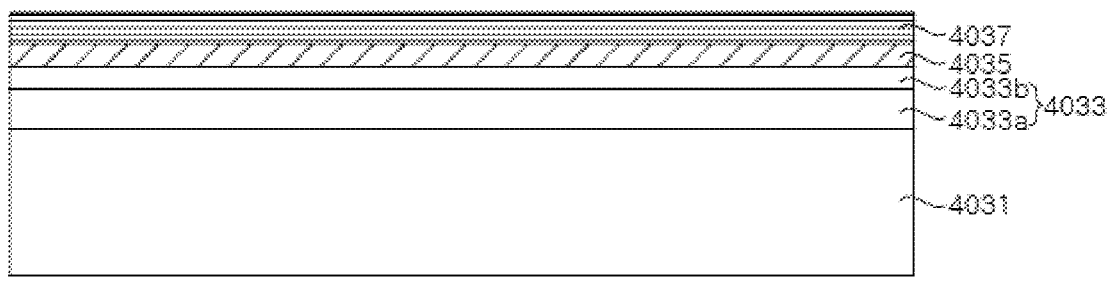

Referring to FIG. 66B, a second LED stack 4033 is grown on a second substrate 4031 and a second-p transparent electrode 4035 and a first color filter 4037 are formed on the second LED stack 4033. The second LED stack 4033 may include a gallium nitride-based first conductivity type semiconductor layer 4033a, a second conductivity type semiconductor layer 4033b, and an active layer disposed therebetween, and the active layer may include a GaInN well layer. The second substrate 4031 is a substrate on which a gallium nitride-based semiconductor layer may be grown, and is different from the first substrate 4021. A combination ratio of GaInN may be determined so that the second LED stack 4033 may emit green light. The second-p transparent electrode 4035 is in ohmic contact with the second conductivity type semiconductor layer 4033b.

The first color filter 4037 may be formed on the second-p transparent electrode 4035, and since details thereof are substantially the same as those described with reference to FIG. 65, detailed descriptions thereof will be omitted in order to avoid redundancy.

Figure 66C:
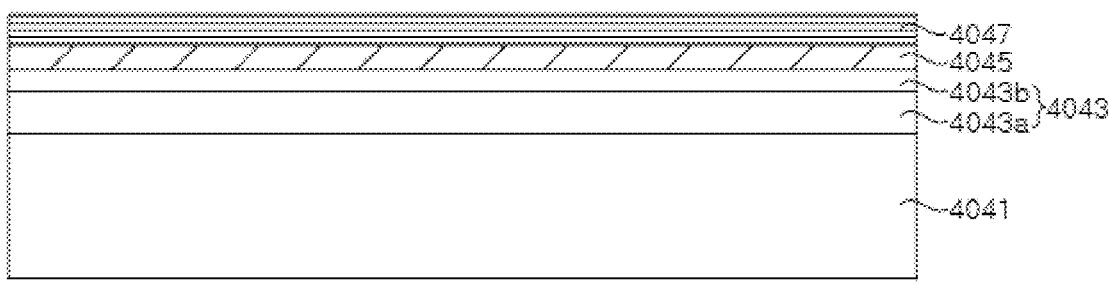

Referring to FIG. 66C, a third LED stack 4043 is grown on a third substrate 4041 and a third-p transparent electrode 4045 and a second color filter 4047 are formed on the third LED stack 4043. The third LED stack 4043 may include a gallium nitride-based first conductivity type semiconductor layer 4043a, a second conductivity type semiconductor layer 4043b, and an active layer disposed therebetween, and the active layer may include a GaInN well layer. The third substrate 4041 is a substrate on which a gallium nitride-based semiconductor layer may be grown, and is different from the first substrate 4021. A combination ratio of GaInN may be determined so that the third LED stack 4043 emits blue light. The third-p transparent electrode 4045 is in ohmic contact with the second conductivity type semiconductor layer 4043b.

Since the second color filter 4047 is substantially the same as that described with reference to FIG. 65, detailed descriptions thereof will be omitted in order to avoid redundancy.

Meanwhile, since the first LED stack 4023, the second LED stack 4033, and the third LED stack 4043 are grown on different substrates, the order of formation thereof is not particularly limited.

Figure 66D:
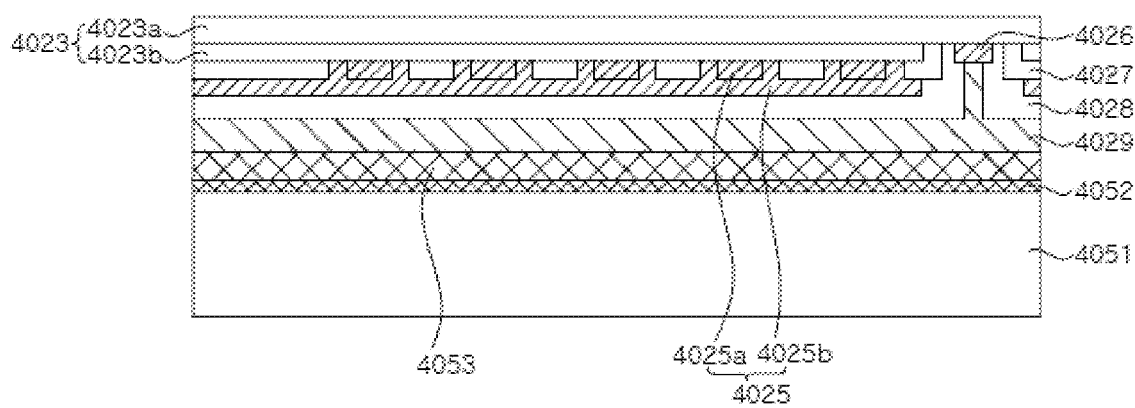

Referring to FIG. 66D, next, the first LED stack 4023 is coupled onto a support substrate 4051 through the first bonding layer 4053. Bonding material layers may be disposed on the support substrate 4051 and the second insulating layer 4028 and may be bonded to each other to form the first bonding layer 4053. The interconnection line 4029 is disposed to face the support substrate 4051.

Meanwhile, in a case in which a surface of the support substrate 4051 has hydrophobic property, a hydrophilic material layer 4052 may be first formed on the support substrate 4051. The hydrophilic material layer 4052 may also be formed by depositing a material layer such as $SiO_2$ on the surface of the support substrate 4051, or treating the surface of the support substrate 4051 with plasma or the like to increase surface energy. The surface of the support substrate 4051 is modified by the plasma treatment, and a surface modified layer having high surface energy may be formed on the surface of the support substrate 4051. The first bonding layer 4053 may be bonded to the hydrophilic material layer 4052, and adhesion of the first bonding layer 4053 is thus improved.

The first substrate 4021 is removed from the first LED stack 4023 using a chemical etching technique. Accordingly, the first conductivity type semiconductor layer of the first LED stack 4023 is exposed on the top surface. The exposed surface of the first conductivity type semiconductor layer 4023a may be textured to increase light extraction efficiency, and a light extraction structure, such as a roughened surface or others, may be thus formed on the surface of the first conductivity type semiconductor layer 4023a.

Figure 66E:
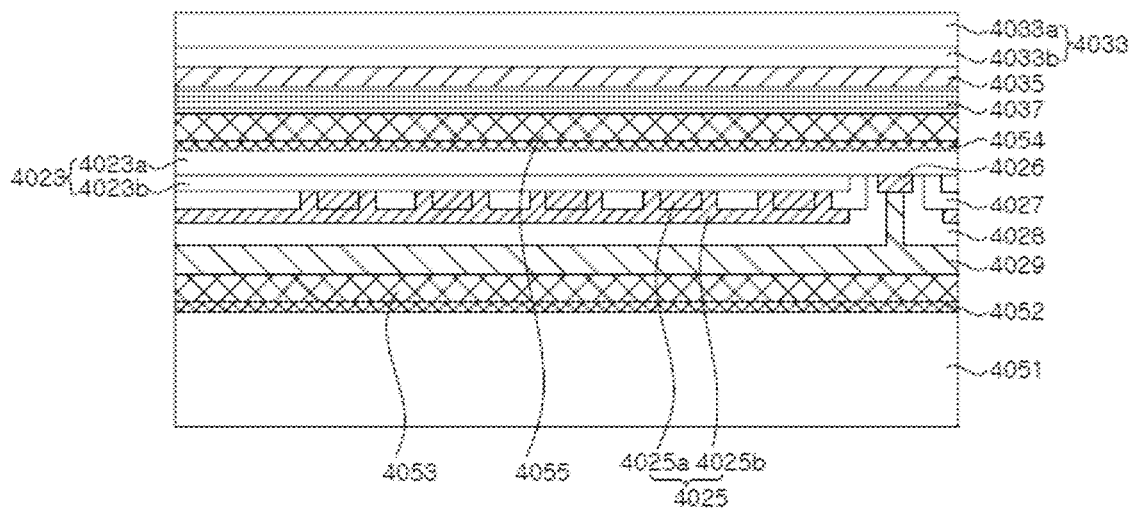

Referring to FIG. 66E, the second LED stack 4033 is coupled to the first LED stack 4023 through the second bonding layer 4055. The first color filter 4037 is disposed to face the first LED stack 4023 and is bonded to the second bonding layer 4055. The bonding material layers are disposed on the first LED stack 4023 and the first color filter 4037 and are bonded to each other to form the second bonding layer 4055.

Meanwhile, before the second bonding layer 4055 is formed, a hydrophilic material layer 4054 may be first formed on the first LED stack 4023. The hydrophilic material layer 4054 changes the surface of the first LED stack 4023 from hydrophobic property to hydrophilic property and thus improves the adhesion of the second bonding layer 4055. The hydrophilic material layer 4054 may also be formed by depositing a material layer such as $SiO_2$, or treating the surface of the first LED stack 4023 with plasma or others to increase surface energy. The surface of the first LED stack 4023 is modified by the plasma treatment, and a surface modified layer having high surface energy may be formed on the surface of the first LED stack 4023. The second bonding layer 4055 may be bonded to the hydrophilic material layer 4054, and adhesion of the second bonding layer 4055 is thus improved.

The second substrate 4031 may be separated from the second LED stack 4033 using a technique such as a laser lift-off or a chemical lift-off. In addition, in order to improve light extraction, a roughened surface may be formed on the exposed surface of the first conductivity type semiconductor layer 4033a using a surface texturing.

Figure 66F:
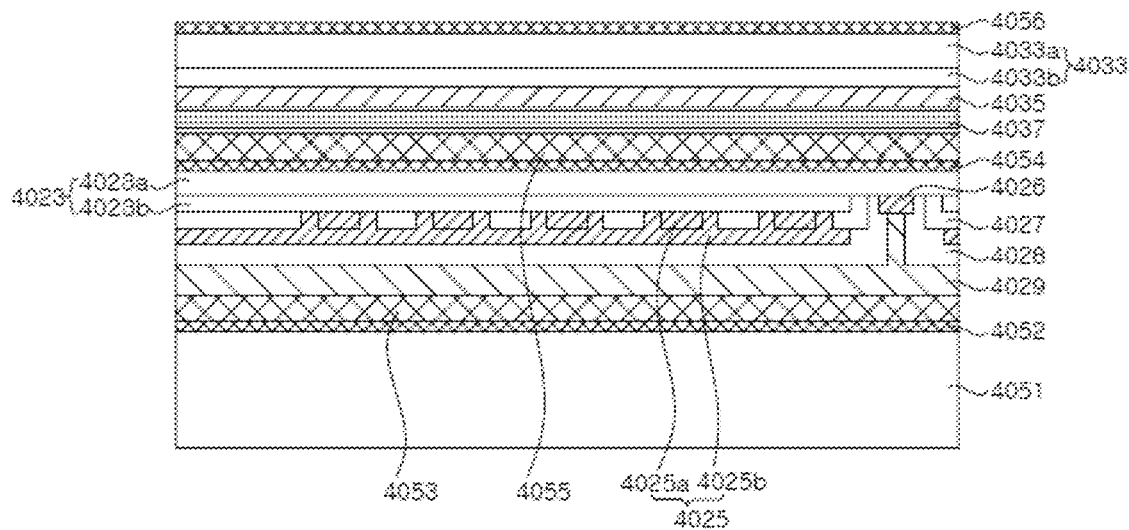

Referring to FIG. 66F, a hydrophilic material layer 4056 may be then formed on the second LED stack 4033. The hydrophilic material layer 4056 changes the surface of the second LED stack 4033 to hydrophilic property and thus improves adhesion of the third bonding layer 4057. The hydrophilic material layer 4056 may also be formed by depositing a material layer such as $SiO_2$, or treating the surface of the second LED stack 4033 with plasma or the like to increase surface energy. However, in a case in which the surface of the second LED stack 4033 has hydrophilic property, the hydrophilic material layer 4056 may be omitted.

Next, referring to FIGS. 65 and 66C, the third LED stack 4043 is coupled onto the second LED stack 4033 through the third bonding layer 4057. The second color filter 4047 is disposed to face the second LED stack 4033 and is bonded to the third bonding layer 4057. The bonding material layers are disposed on the second LED stack 4033 (or the hydrophilic material layer 4056) and the third color filter 4047, and are bonded to each other to form the third bonding layer 4057.

The third substrate 4041 may be separated from the third LED stack 4043 using a technique such as a laser lift-off or a chemical lift-off. Accordingly, as illustrated in FIG. 65, the LED stack for a display in which the first conductive layer 4043a of the third LED stack 4043 is exposed is provided. In addition, a roughened surface may be formed on the exposed surface of the first conductivity type semiconductor layer 4043a by a surface texturing.

A stack of the first to third LED stacks 4023, 4033, and 4043 disposed on the support substrate 4051 is patterned in a unit of pixel, and the patterned stacks are connected to each other using the interconnection lines, thereby making it possible to provide a display apparatus. Hereinafter, a display apparatus according to exemplary embodiments will be described.

Figure 67:
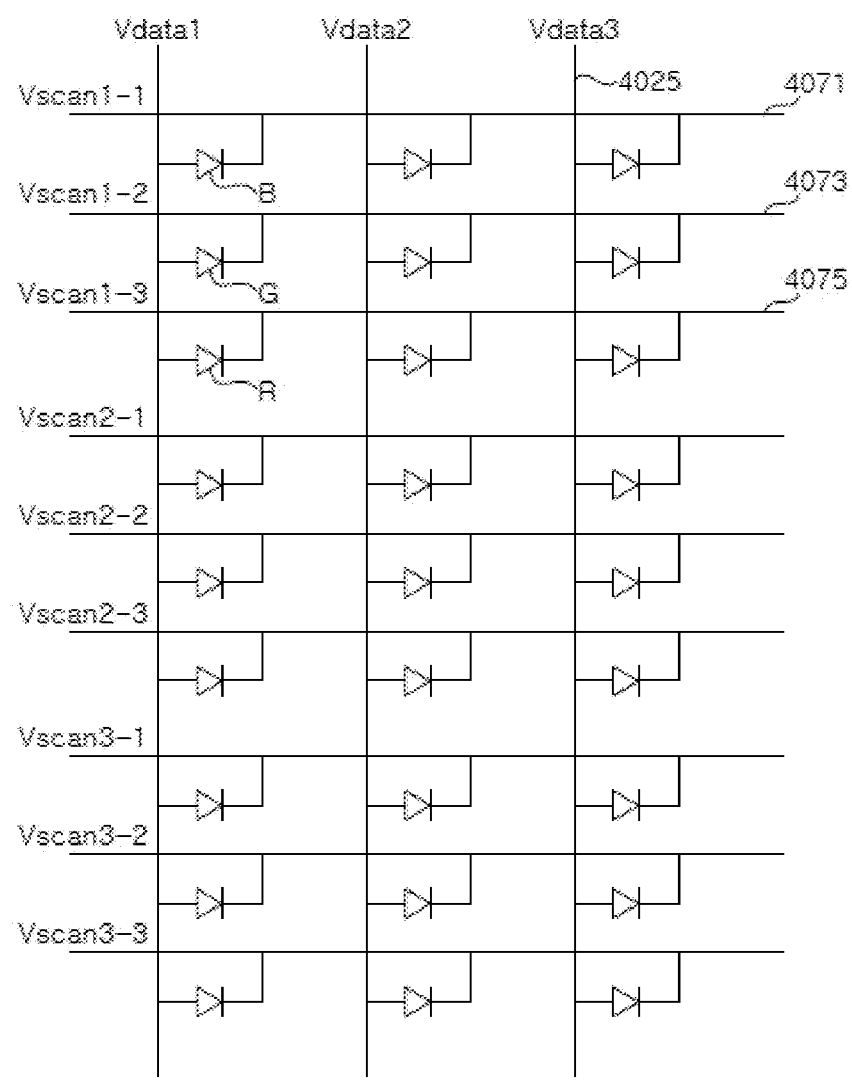
FIG. 67 is a schematic circuit diagram of a display apparatus according to an exemplary embodiment.
Figure 68:
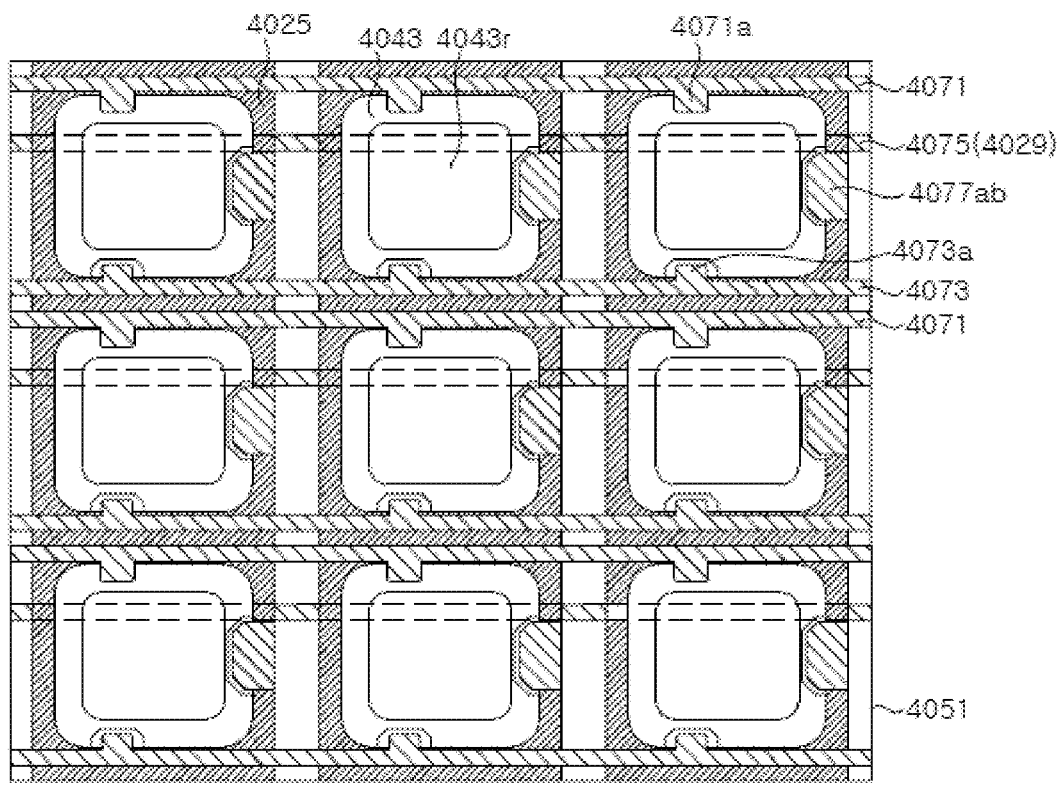
FIG. 68 is a schematic plan view of a display apparatus according to an exemplary embodiment.

FIG. 67 is a schematic circuit diagram of a display apparatus according to an exemplary embodiment, and FIG. 68 is a schematic plan view of a display apparatus according to an exemplary embodiment.

Referring to FIGS. 67 and 68, the display apparatus according to an exemplary embodiment may be implemented to be driven in a passive matrix manner.

For example, since the LED stack for a display described with reference to FIG. 65 has a structure in which the first to third LED stacks 4023, 4033, and 4044 are stacked in a vertical direction, one pixel includes three light emitting diodes R, G, and B. Here, a first light emitting diode R may correspond to the first LED stack 4023, a second light emitting diode G may correspond to the second LED stack 4033, and a third light emitting diode B may correspond to the third LED stack 4043.

In FIGS. 67 and 68, one pixel includes the first to third light emitting diodes R, G, and B, and each light emitting diode corresponds to a sub-pixel. Anodes of the first to third light emitting diodes R, G, and B are connected to a common line, for example, a data line, and cathodes thereof are connected to different lines, for example, scan lines. For a first pixel, as an example, the anodes of the first to third light emitting diodes R, G, and B are commonly connected to a data line Vdata1, and cathodes thereof are connected to scan lines Vscan1-1, Vscan1-2, and Vscan1-3, respectively. Accordingly, the light emitting diodes R, G, and B in the same pixel may be separately driven.

In addition, each of the light emitting diodes R, G, and B may be driven by using pulse width modulation or change current intensity, thereby making it possible to adjust brightness of each sub-pixel.

Referring to again FIG. 68, a plurality of patterns are formed by patterning the stack described with reference to FIG. 65, and the respective pixels are connected to reflective electrodes 4025 and interconnection lines 4071, 4073, and 4075. As illustrated in FIG. 67, the reflective electrode 4025 may be used as a data line Vdata, and the interconnection lines 4071, 4073, and 4075 may be formed as the scan lines. Here, the interconnection line 4075 may be formed by the interconnection line 4029. The reflective electrode 4025 may electrically connect the first conductivity type semiconductor layers 4023a, 4033a, and 4043a of the first to third LED stacks 4023, 4033, and 4043 of the plurality of pixels to one another, and the interconnection line 4029 may be disposed to be substantially perpendicular to the reflective electrode 4025 to electrically connect the first conductivity type semiconductor layers 4023a of the plurality of pixels to each other.

The pixels may be arranged in a matrix form, and the anodes of the light emitting diodes R, G, and B of each pixel are commonly connected to the reflective electrode 4025 and the cathodes thereof are each connected to the interconnection lines 4071, 4073, and 4075 which are spaced apart from each other. Here, the interconnection lines 4071, 4073, and 4075 may be used as scan lines Vscan.

Figure 69:
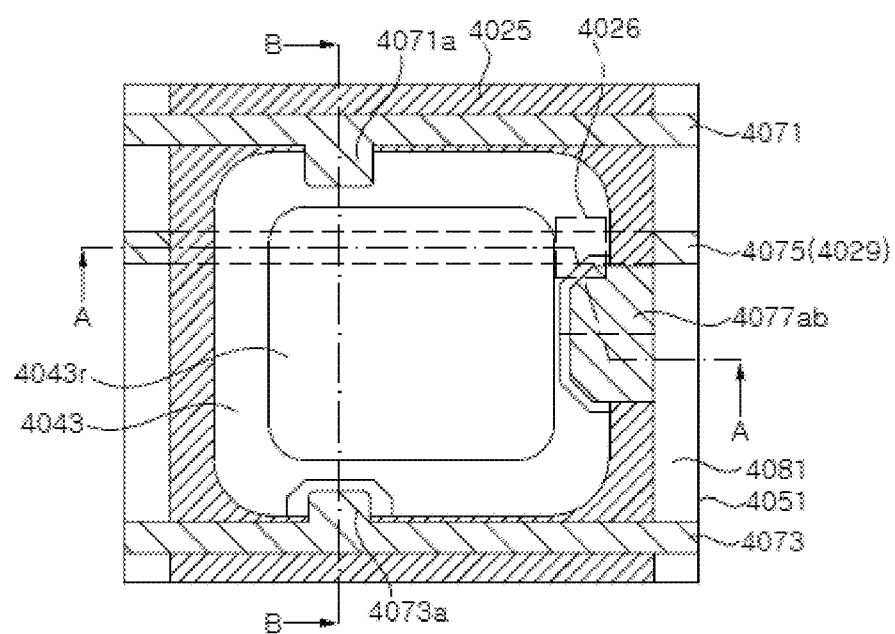
FIG. 69 is an enlarged plan view of one pixel of the display apparatus of FIG. 68.
Figure 70:
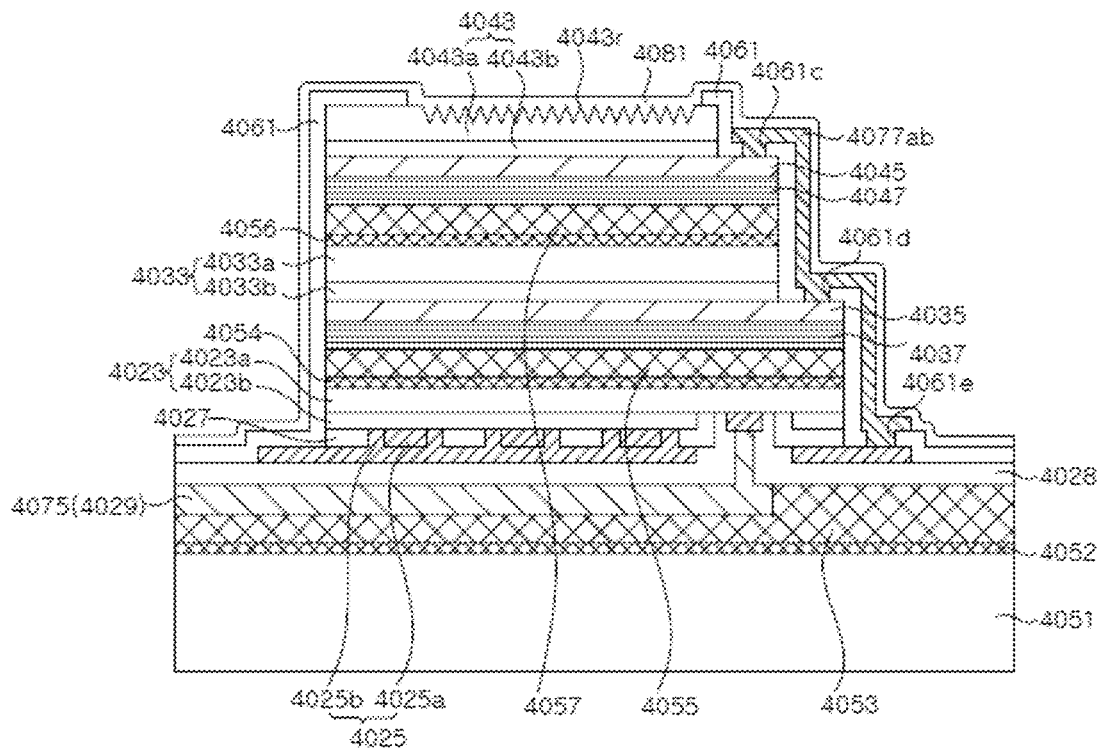
FIG. 70 and FIG. 71 are schematic cross-sectional views taken along line A-A and line B-B of FIG. 69, respectively.
Figure 71:
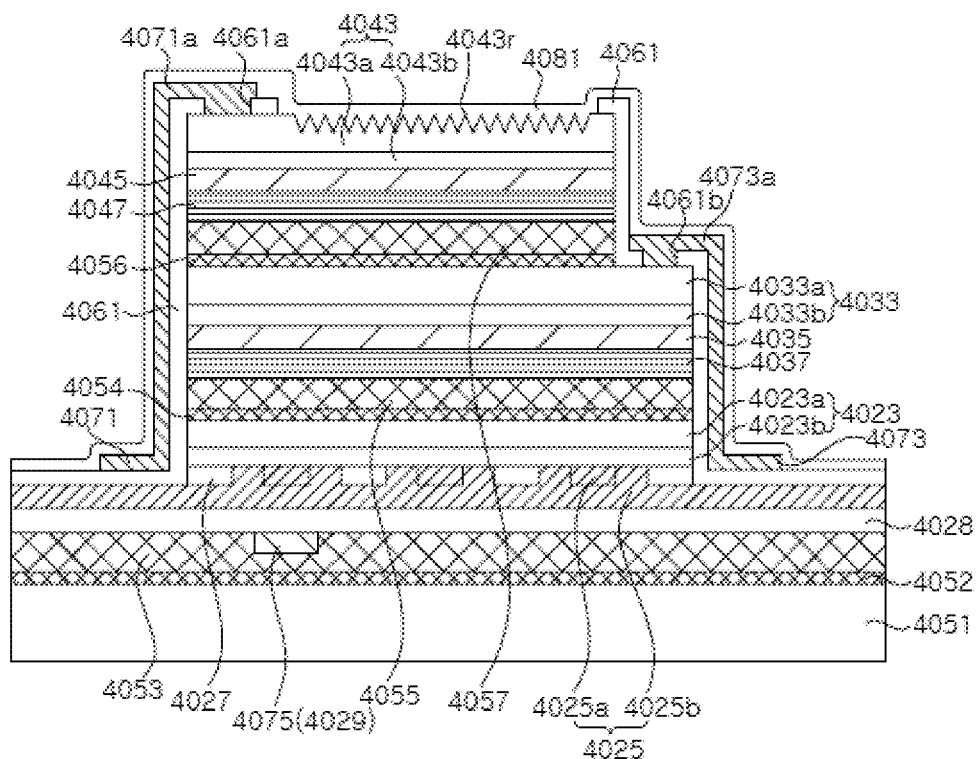

FIG. 69 is an enlarged plan view of one pixel of the display apparatus of FIG. 68, FIG. 70 is a schematic cross-sectional view taken along line A-A of FIG. 69, and FIG. 71 is a schematic cross-sectional view taken along line B-B of FIG. 69.

Referring back to FIGS. 68 to 71, in each pixel, a portion of the reflective electrode 4025, a portion of the second-p transparent electrode 4035, a portion of an upper surface of the second LED stack 4033, a portion of the third-p transparent electrode 4045, and an upper surface of the third LED stack 4043 are exposed to the outside.

The third LED stack 4043 may have a roughened surface 4043r formed on the upper surface thereof. The roughened surface 4043r may also be formed on the entirety of the upper surface of the third LED stack 4043, or on a portion of the upper surface of the third LED stack 4043.

A lower insulating layer 4061 may cover a side surface of each pixel. The lower insulating layer 4061 may be formed of a light transmissive material such as $SiO_2$, and in this case, the lower insulating layer 4061 may also cover substantially the entirety of the upper surface of the third LED stack 4043. Alternatively, the lower insulating layer 4061 according to an exemplary embodiment may include a light reflective layer or a light absorption layer to prevent light traveling from the first to third LED stacks 4023, 4033, and 4043 to the side surface, and in this case, the lower insulating layer 4061 at least partially exposes the upper surface of the third LED stack 4043. The lower insulating layer 4061 may include, for example, a distribution Bragg reflector or a metallic reflective layer, or an organic reflective layer on a transparent insulating layer, and may also include a light absorption layer such as black epoxy. The light absorption layer, such as black epoxy, may prevent light from being emitted to the outside of the pixels, thereby improving a contrast ratio between the pixels in the display apparatus.

The lower insulating layer 4061 may have an opening 4061a exposing the upper surface of the third LED stack 4043, an opening 4061b exposing the upper surface of the second LED stack 4033, an opening 4061c exposing the third-p transparent electrode 4045, an opening 4061d exposing the second-p transparent electrode 4035, and an opening 4061e exposing the first p-type reflective electrode 4025. The upper surface of the first LED stack 4023 may not be exposed to the outside.

The interconnection line 4071 and the interconnection line 4073 may be formed on the support substrate 4051 in the vicinity of the first to third LED stacks 4023, 4033, and 4043, and may be disposed on the lower insulating layer 4061 to be insulated from the first p-type reflective electrode 4025. A connector 4077ab connects the second-p transparent electrode 4035 and the third-p transparent electrode 4045 to the reflective electrode 4025. Accordingly, the anodes of the first LED stack 4023, the second LED stack 4033, and the third LED stack 4043 are commonly connected to the reflective electrode 4025.

The interconnection line 4075 or 4029 may be disposed to be substantially perpendicular to the reflective electrode 4025 below the reflective electrode 4025, and is connected to the ohmic electrode 4026, thereby being electrically connected to the first conductivity type semiconductor layer 4023a. The ohmic electrode 4026 is connected to the first conductivity type semiconductor layer 4023a below the first LED stack 4023. The ohmic electrode 4026 may be disposed outside a lower region of the roughened surface 4043r of the third LED stack 4043 as illustrated in FIG. 69, and light loss may be thus reduced.

The connector 4071a connects the upper surface of the third LED stack 4043 to the interconnection line 4071, and the connector 4073a connects the upper surface of the second LED stack 4033 to the interconnection line 4073.

An upper insulating layer 4081 may be disposed on the interconnection lines 4071 and 4073 and the lower insulating layer 4061 to protect the interconnection lines 4071, 4073, and 4075. The upper insulating layer 4081 may have openings that expose the interconnection lines 4071, 4073, and 4075, and a bonding wire and the like may be connected thereto through the openings.

According to an exemplary embodiment, the anodes of the first to third LED stacks 4023, 4033, and 4043 are commonly and electrically connected to the reflective electrode 4025, and the cathodes thereof are electrically connected to the interconnection lines 4071, 4073, and 4075, respectively. Accordingly, the first to third LED stacks 4023, 4033, and 4043 may be independently driven. However, the inventive concepts are not limited thereto, and connections of the electrodes and wirings can be variously modified.

FIGS. 72A to 72H are schematic plan views for describing a method for manufacturing a display apparatus according to an exemplary embodiment. Hereinafter, a method for manufacturing the pixel of FIG. 69 will be described.

First, the light emitting diode stack 4000 as described with reference to FIG. 65 is prepared.

Figure 72A:
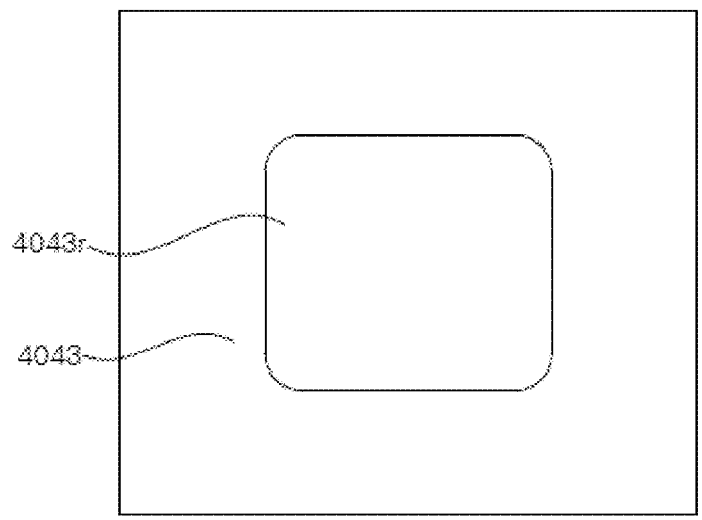
FIG. 72A, FIG. 72B, FIG. 72C, FIG. 72D, FIG. 72E, FIG. 72F, FIG. 72G, and FIG. 72H are schematic plan views illustrating a method for manufacturing a display apparatus according to an exemplary embodiment.

Next, referring to FIG. 72A, the roughened surface 4043r may be formed on the upper surface of the third LED stack 4043. The roughened surface 4043r may be formed to correspond to each pixel region on the upper surface of the third LED stack 4043. The roughened surface 4043r may be formed using a chemical etching technique, for example, using a photo-enhanced chemical etch (PEC) technique.

The roughened surface 4043r may be partially formed within each pixel region in consideration of a region in which the third LED stack 4043 is to be etched in the future. In particular, the roughened surface 4043r may be formed so that the ohmic electrode 4026 is disposed outside the roughened surface 4043r. However, the inventive concepts are not limited thereto, and the roughened surface 4043r may also be formed over substantially the entirety of the upper surface of the third LED stack 4043.

Figure 72B:
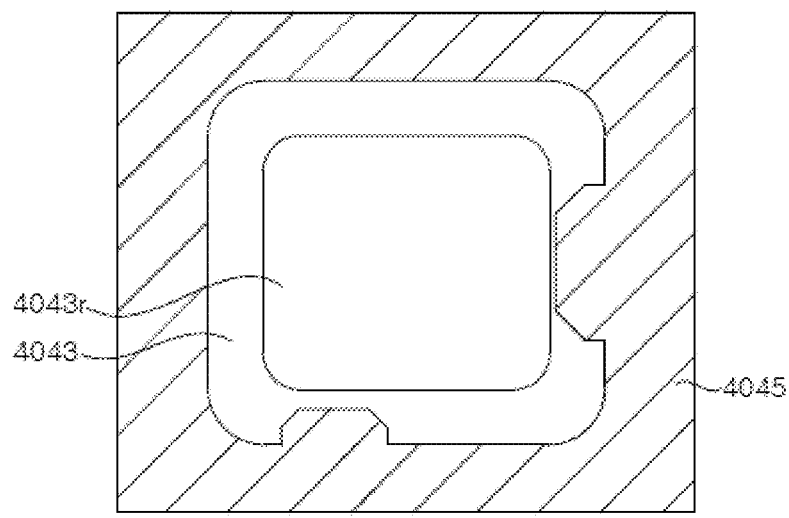

Referring to FIG. 72B, a peripheral region of the third LED stack 4043 is then etched in each pixel region to expose the third-p transparent electrode 4045. The third LED stack 4043 may be left to have substantially a rectangular or square shape as illustrated, but at least two depression parts may be formed along the edges. In addition, as illustrated, one depression part may be formed to be greater than another depression part.

Figure 72C:
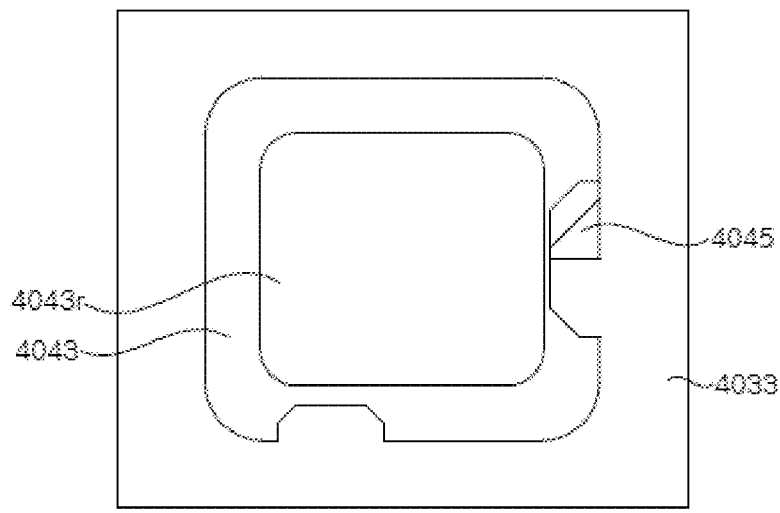

Referring to FIG. 72C, the exposed third-p transparent electrode 4045 is then removed except for a portion of the third-p transparent electrode 4045 exposed in a relatively large depression part, to thereby expose the upper surface of the second LED stack 4033. The upper surface of the second LED stack 4033 is exposed around the third LED stack 4043 and is also exposed in another depression part. A region in which the third-p transparent electrode 4045 is exposed and a region in which the second LED stack 4033 is exposed are formed in the relatively large depression part.

Figure 72D:
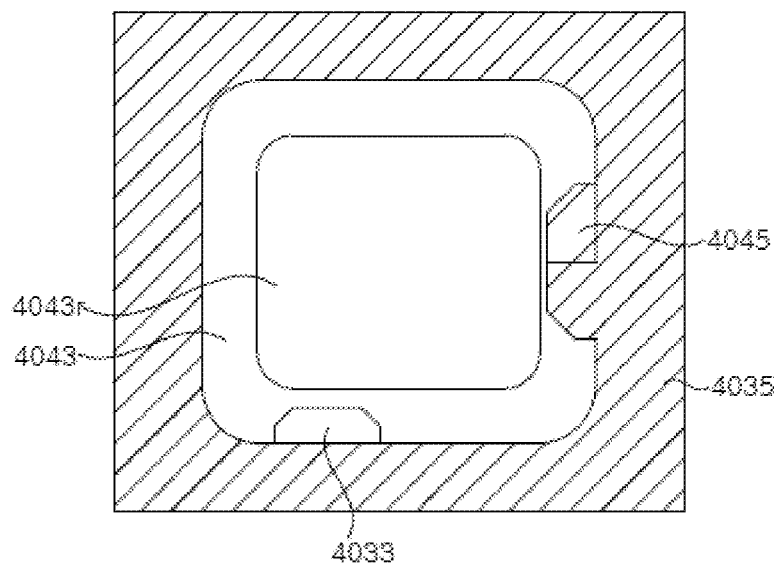

Referring to FIG. 72D, the second LED stack 4033 exposed in the remaining region is removed except for the second LED stack 4033 formed in a relatively small depression part to thereby expose the second-p transparent electrode 4035. The second-p transparent electrode is exposed around the third LED stack 4043 and the second-p transparent electrode 4035 is also exposed in the relatively large depression part.

Figure 72E:
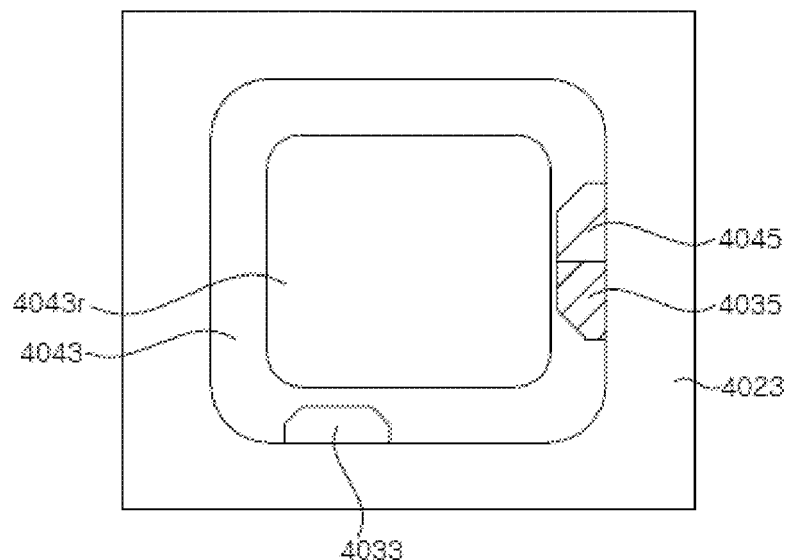

Referring to FIG. 72E, the second-p transparent electrode 4035 exposed around the second LED stack 4043 is then removed except for the second-p transparent electrode 4035 exposed in the relatively large depression part, to thereby expose the upper surface of the first LED stack 4023.

Figure 72F:
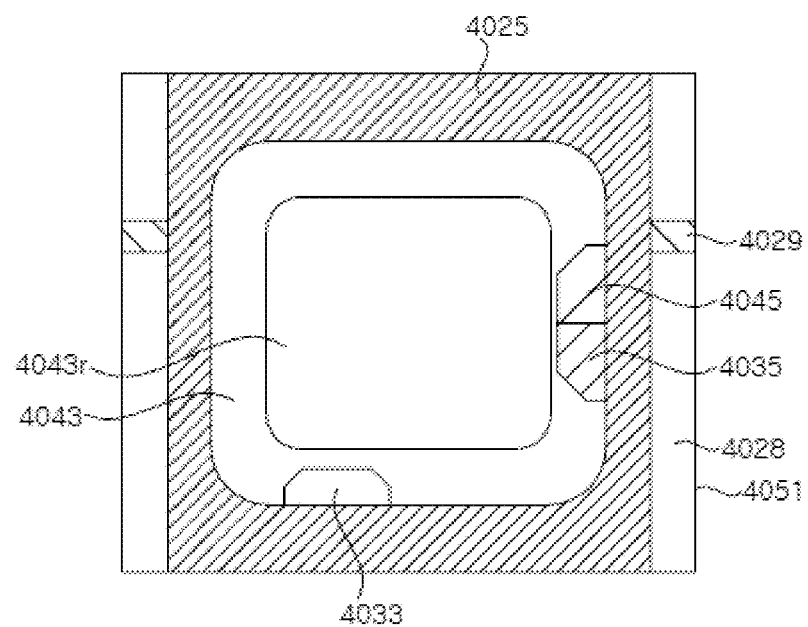

Referring to FIG. 72F, the first LED stack 4023 exposed around the third LED stack 4043 continues to be removed and the first insulating layer 4027 is removed to thereby expose the reflective electrode 4025. Accordingly, the reflective electrode 4025 is exposed around the third LED stack 4043. The exposed reflective electrode 4025 is patterned so as to have substantially an elongated shape in a vertical direction to thereby form a linear interconnection line. The patterned reflective electrode 4025 is disposed over the plurality of pixel regions in the vertical direction and is spaced apart from a neighboring pixel in a horizontal direction.

In the illustrated exemplary embodiment, it is described the reflective electrode 4025 is patterned after removing the first LED stack 4023, but the reflective electrode 4025 may also be formed in advance to have the patterned shape when the reflective electrode 4025 is formed on the substrate 4021. In this case, it is not necessary to pattern the reflective electrode 4025 after removing the first LED stack 4023.

By patterning the reflective electrode 4025, the second insulating layer 4028 may be exposed. The interconnection line 4029 is disposed to be perpendicular to the reflective electrode 4025, and is insulated from the reflective electrode 4025 by the second insulating layer 4028.

Figure 72G:
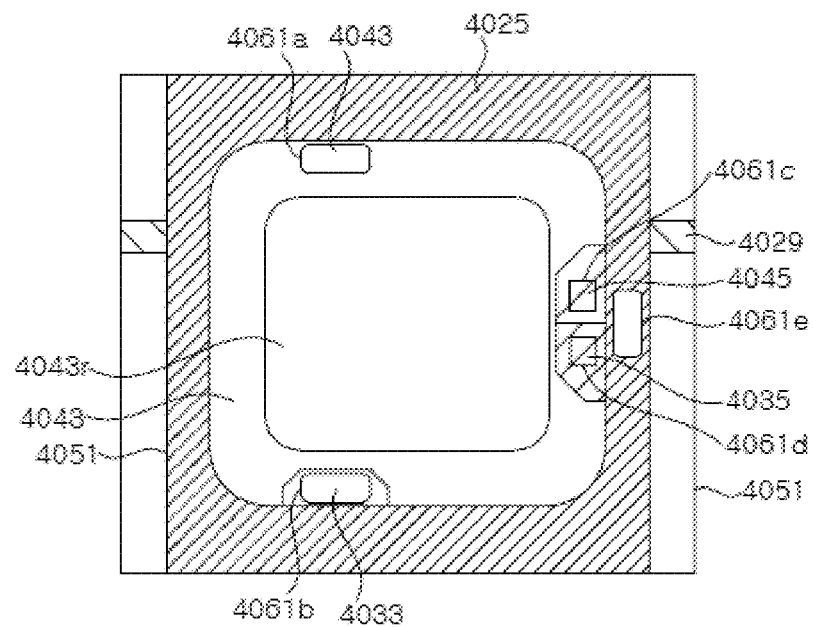

Referring to FIG. 72G, the lower insulating layer 4061 (FIGS. 70 and 71) covering the pixels is then formed. The lower insulating layer 4061 covers the reflective electrode 4025 and covers the side surfaces of the first to third LED stacks 4023, 4033, and 4043. In addition, the lower insulating layer 4061 may at least partially cover the upper surface of the third LED stack 4043. In a case in which the lower insulating layer 4061 is a transparent layer such as $SiO_2$, the lower insulating layer 4061 may also cover substantially the entirety of the upper surface of the third LED stack 4043. Alternatively, the lower insulating layer 4061 may also include a reflective layer or a light absorption layer, and in this case, the lower insulating layer 4061 at least partially exposes the upper surface of the third LED stack 4043 so that light is emitted to the outside.

The lower insulating layer 4061 may have an opening 4061a exposing the third LED stack 4043, an opening 4061b exposing the second LED stack 4033, an opening 4061c exposing the third-p transparent electrode 4045, an opening 4061d exposing the second-p transparent electrode 4035, and an opening 4061e exposing the reflective electrode 4025. One or a plurality of openings 4061e exposing the reflective electrode 4025 may be formed.

Figure 72H:
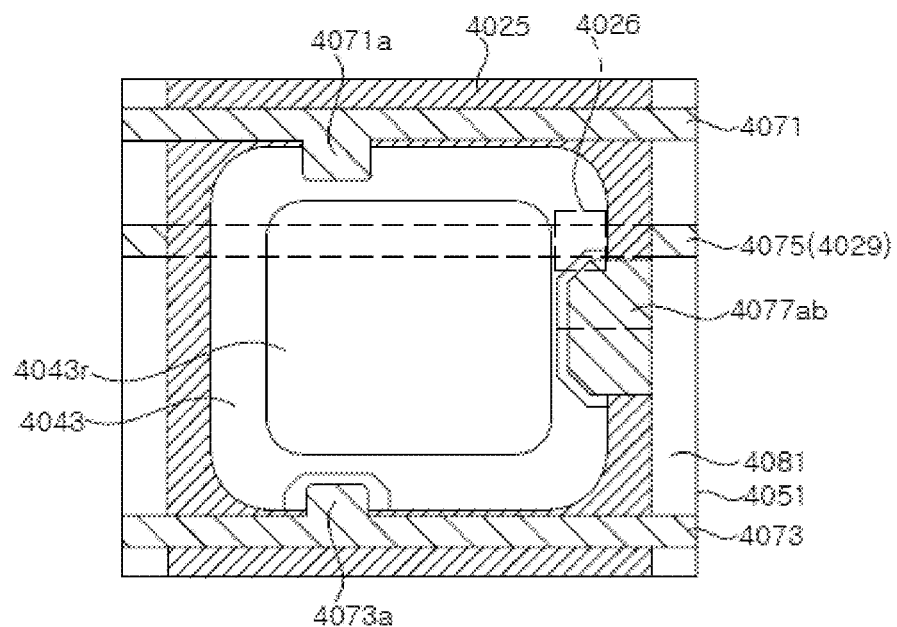

Referring to FIG. 72H, the interconnection lines 4071 and 4073 and the connectors 4071a, 4073a, and 77ab are then formed by a lift-off technique. The interconnection lines 4071 and 4073 are insulated from the reflective electrode 4025 by the lower insulating layer 4061. The connector 4071a electrically connects the third LED stack 4043 to the interconnection line 4071 and the connector 4073a connects the second LED stack 4033 to the interconnection line 4073. The connector 77ab electrically connects the third-p transparent electrode 4045 and the second-p transparent electrode 4035 to the first p-type reflective electrode 4025.

The interconnection lines 4071 and 4073 may be disposed to be substantially perpendicular to the reflective electrode 4025 and may connect the plurality of pixels to each other.

Next, the upper insulating layer 4081 (FIGS. 70 and 71) covers the interconnection lines 4071 and 4073 and the connectors 4071a, 4073a, and 4077ab. The upper insulating layer 4081 may also cover substantially the entirety of the upper surface of the third LED stack 4043. The upper insulating layer 4081 may be formed of, for example, silicon oxide film or silicon nitride film, and may also include a distribution Bragg reflector. In addition, the upper insulating layer 4081 may include a transparent insulating film and a reflective metal layer, or an organic reflective layer of a multilayer structure thereon to reflect light, or may include a light absorption layer such as black based epoxy to thereby shield light.

In a case in which the upper insulating layer 4081 reflects or shields light, in order to emit light to the outside, it is necessary to at least partially expose the upper surface of the third LED stack 4043. Meanwhile, in order to allow an electrical connection from the outside, the upper insulating layer 4081 is partially removed to thereby partially expose the interconnection lines 4071, 4073, and 4075. Further, the upper insulating layer 4081 may also be omitted.

As the upper insulating layer 4081 is formed, the pixel region illustrated in FIG. 69 is completed. In addition, as illustrated in FIG. 68, the plurality of pixels may be formed on the support substrate 4051, and those pixels may be connected to each other by the first p-type reflective electrode 4025 and the interconnection lines 4071, 4073, and 4075, and may be driven in a passive matrix manner.

In the illustrated exemplary embodiment, the method for manufacturing the display apparatus that may be driven in the passive matrix manner is described, but the inventive concepts are not limited thereto, and a display apparatus including the light emitting diode stack illustrated in FIG. 65 may be configured to be driven in various manners.

For example, it is described that the interconnection lines 4071 and 4073 are formed together on the lower insulating layer 4061, but the interconnection line 4071 may be formed on the lower insulating layer 4061 and the interconnection line 4073 may also be formed on the upper insulating layer 4081.

Meanwhile, in FIG. 65, it is described that the reflective electrode 4025, the second-p transparent electrode 4035, and the third-p transparent electrode 4045 are in ohmic contact with the second conductivity type semiconductor layers 4023b, 4033b, and 4043b of the first LED stack 4023, the second LED stack 4033, and the third LED stack 4043, respectively, and it is described that the ohmic electrode 4026 is in ohmic contact with the first conductivity type semiconductor layer 4023a of the first LED stack 4023, but the ohmic contact layer is not separately provided to the first conductivity type semiconductor layers 4033a and 4033b of the second LED stack 4033 and the third LED stack 4043. When a size of a pixel is as small as 200 micrometers or less, according to some exemplary embodiments, there is no difficulty in current dispersion even in a case in which a separate ohmic contact layer is not formed in the first conductivity type semiconductor layers 4033a and 4043a, which are n-type. However, for current dispersion, transparent electrode layers may be disposed on the n-type semiconductor layers of the second and third LED stacks 4033 and 4043.

According to exemplary embodiments, the plurality of pixels may be formed at a wafer level by using the light emitting diode stack 4000 for a display, and thus the steps of individually mounting the light emitting diodes may be obviated. Furthermore, since the light emitting diode stack has a structure that the first to third LED stacks 4023, 4033, and 4043 are vertically stacked, an area of the sub-pixel may be secured within a limited pixel area. In addition, since light generated in the first LED stack 4023, the second LED stack 4033, and the third LED stack 4043 is transmitted through these LED stacks and emitted to the outside, it is possible to reduce light loss.

However, the inventive concepts are not limited thereto, and light emitting devices in which the respective pixels are separated from each other may also be provided, and those light emitting devices are individually mounted on a circuit board, thereby making it possible to provide the display apparatus.

In addition, it is described that the ohmic electrode 4026 is formed on the first conductivity type semiconductor layer 4023a adjacent to the second conductivity type semiconductor layer 4023b, but the ohmic electrode 4026 may also be formed on the surface of the first conductivity type semiconductor layer 4023a opposite to the second conductivity type semiconductor layer 4023b. In this case, the third LED stack 4043 and the second LED stack 4033 are patterned to expose the ohmic electrode 4026, and instead of the interconnection line 4029, a separate interconnection line connecting the ohmic electrode 4026 to the circuit board is provided.

Figure 73:
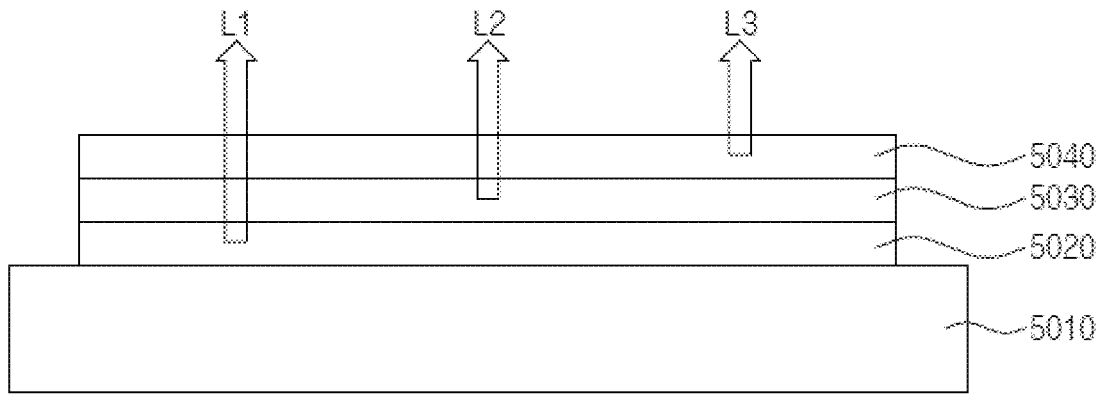
FIG. 73 is a cross-sectional view of a light emitting stacked structure according to an exemplary embodiment.

FIG. 73 is a cross-sectional view of a light emitting stacked structure according to an exemplary embodiment.

Referring to FIG. 73, a light emitting stacked structure according to an exemplary embodiment includes a plurality of sequentially stacked epitaxial stacks. A plurality of epitaxial stacks are provided on the substrate 5010.

The substrate 5010 has a substantially a plate shape having an upper surface and a lower surface.

A plurality of epitaxial stacks can be mounted on the upper surface of the substrate 5010, and the substrate 5010 may be provided in various forms. The substrate 5010 may be formed of an insulating material. Examples of the material of the substrate 5010 include glass, quartz, silicon, organic polymer, organic/inorganic composite, or others. However, the material of the substrate 5010 is not limited thereto, and is not particularly limited as long as it has an insulation property. In an exemplary embodiment, the substrate 5010 may further include a wiring part that may provide a light emitting signal and a common voltage to the respective epitaxial stacks. In an exemplary embodiment, in addition to the wiring part, the substrate 5010 may further include a drive element including a thin film transistor, in which case the respective epitaxial stacks may be driven in the active matrix type. To this end, the substrate 5010 may be provided as a printed circuit board 5010 or as a composite substrate having a wiring part and/or a drive element formed on glass, silicon, quartz, organic polymer, or organic/inorganic composite.

A plurality of epitaxial stacks are sequentially stacked on an upper surface of the substrate 5010, and respectively emit light.

In an exemplary embodiment, two or more epitaxial stacks may be provided, each emitting light of different wavelength bands from each other. That is, a plurality of epitaxial stacks may be provided, respectively having different energy bands from each other. In an exemplary embodiment, the epitaxial stack on the substrate 5010 is illustrated as being provided with three sequentially stacked layers, including first to third epitaxial stacks 5020, 5030, and 5040.

Each of the epitaxial stacks may emit a color light of a visible light band of various wavelength bands. Light emitted from the lowermost epitaxial stack is a color light of the longest wavelength having the lowest energy band, and the wavelength of the emitted color light becomes shorter in the order from lower to upper sides. The light emitted from the epitaxial stack disposed at the top is a color light of the shortest wavelength having the highest energy band. For example, the first epitaxial stack 5020 may emit the first color light L1, the second epitaxial stack 5030 may emit the second color light L2, and the third epitaxial stack 5040 may emit the third color light L3. The first to third color light L1, L2, and L3 correspond to different color light from each other, and the first to third color light L1, L2, and L3 may be color light of different wavelength bands from each other which have sequentially decreasing wavelengths. That is, the first to third color light L1, L2, and L3 may have different wavelength bands from each other, and the color light may be a shorter wavelength band of a higher energy in an order of the first color light L1 to the third color light L3. However, the inventive concepts are not limited thereto, and when the light emitting stacked structure include micro LEDs, the lowermost epitaxial stack may emit a color of light having any energy band, and the epitaxial stacks disposed thereon may emit a color of light having different energy band than that of the lowermost epitaxial stack due to the small form factor of micro LEDs.

In the exemplary embodiment, the first color light L1 may be red light, the second color light L2 may be green light, and the third color light L3 may be blue light, for example.

Each of the epitaxial stacks emits light to a front direction of the substrate 5010. In particular, light emitted from one epitaxial stack is passed through another epitaxial stack located in the light path, and travels to the front direction. The front direction may corresponds to a direction along which the first to third epitaxial stacks 5020, 5030 and 5040 are stacked.

Hereinafter, in addition to the front direction and the back direction mentioned above, the "front" direction of the substrate 5010 will be referred to as the "upper" direction, and "back" direction of the substrate 5010 will be referred to as the "lower" direction. Of course, the terms "upper" or "lower" refer to relative directions, which may vary according to the placement and the direction of the light emitting stacked structure.

Each of the epitaxial stacks emits light in an upper direction, and each of the epitaxial stacks transmits most of light emitted from the underlying epitaxial stacks. In particular, light emitted from the first epitaxial stack 5020 passes through the second epitaxial stack 5030 and the third epitaxial stack 5040 and travels to the front direction, and the light emitted from the second epitaxial stack 5030 passes through the third epitaxial stack 5040 and travels to the front direction. To this end, at least some, or desirably, all of the epitaxial stacks other than the lowermost epitaxial stack may include an optically transmissive material. As used herein, the material being "optically transmissive" not only includes a transparent material that transmits the entire light, but also a material that transmits light of a predetermined wavelength or transmitting a portion of light of a predetermined wavelength. In an exemplary embodiment, each of the epitaxial stacks may transmit about 60% or more of light emitted from the epitaxial stack disposed thereunder, or about 80% or more in another exemplary embodiment, or about 90% or more in yet another exemplary embodiment.

In the light emitting stacked structure according to an exemplary embodiment, the signal lines for applying emitting signals to the respective epitaxial stacks are independently connected, and accordingly, the respective epitaxial stacks can be independently driven and the light emitting stacked structure can implement various colors according to whether light is emitted from each of the epitaxial stacks. In addition, the epitaxial stacks for emitting light of different wavelengths from each other are overlapped vertically on one another, and thus can be formed in a narrow area.

Figure 74A:
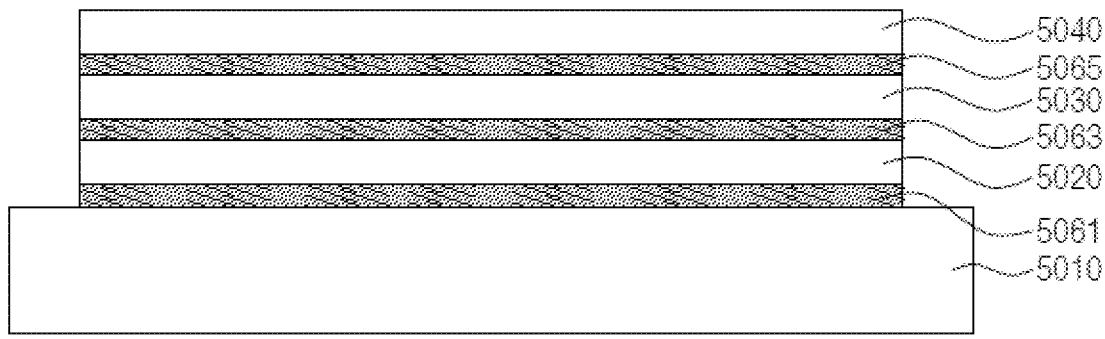
FIG. 74A and FIG. 74B are cross-sectional views of a light emitting stacked structure according to exemplary embodiments.
Figure 74B:
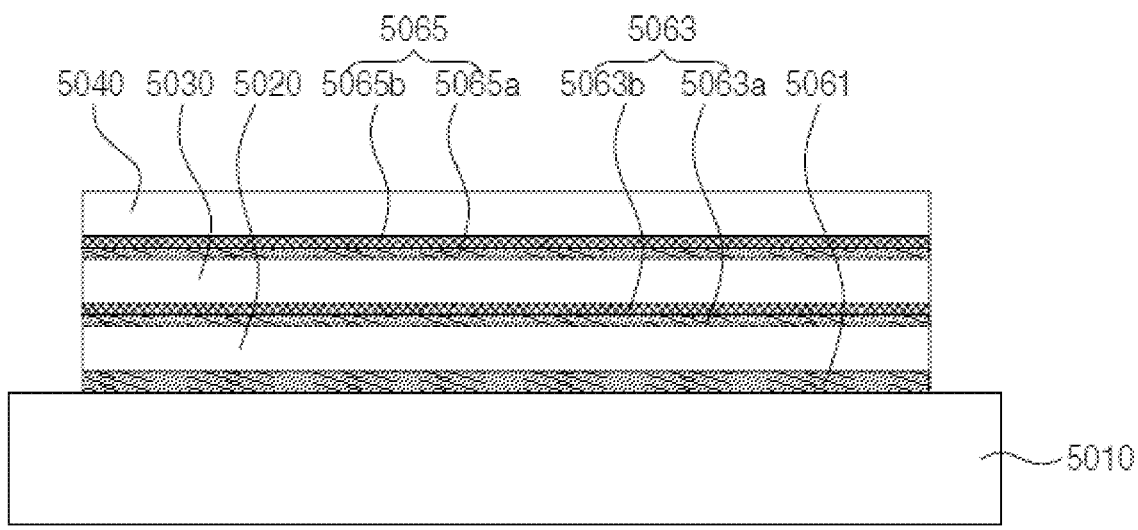

FIGS. 74A and 74B are cross-sectional views illustrating a light emitting stacked structure according to an exemplary embodiment.

Referring to FIG. 74A, in a light emitting stacked structure according to an exemplary embodiment, each of first to third epitaxial stacks 5020, 5030, and 5040 may be provided on a substrate 5010 via an adhesive layer or a buffer layer interposed therebetween.

The adhesive layer 5061 adheres the substrate 5010 and the first epitaxial stack 5020 onto the substrate 5010. The adhesive layer 5061 may include a conductive or non-conductive material. The adhesive layer 5061 may have conductivity in some areas, when it needs to be electrically connected to the substrate 5010 provided thereunder. The adhesive layer 5061 may include a transparent or opaque material. In an exemplary embodiment, when the substrate 5010 is provided with an opaque material and has a wiring part or the like formed thereon, the adhesive layer 5061 may include an opaque material, for example, a light absorbing material. For the light absorbing material that forms the adhesive layer 5061, various polymer adhesives may be used, including, for example, an epoxy-based polymer adhesive.

The buffer layer acts as a component to adhere two adjacent layers to each other, while also serving to relieve the stress or impact between two adjacent layers. The buffer layer is provided between two adjacent epitaxial stacks to adhere the two adjacent epitaxial stacks together, while also serving to relieve the stress or impact that may affect the two adjacent epitaxial stacks.

The buffer layer includes first and second buffer layers 5063 and 5065. The first buffer layer 5063 may be provided between the first and second epitaxial stacks 5020 and 5030, and a second buffer layer 5065 may be provided between the second and third epitaxial stacks 5030 and 5040.

The buffer layer includes a material capable of relieving stress or impact, e.g., a material that is capable of absorbing stress or impact when there is stress or impact from the outside. The buffer layer may have a certain elasticity for this purpose. The buffer layer may also include a material having an adhesive force. In addition, the first and second buffer layers 5063 and 5065 may include a non-conductive material and an optically transmissive material. For example, an optically clear adhesive may be used for the first and second buffer layers 5063 and 5065.

The material for forming the first and second buffer layers 5063 and 5065 is not particularly limited as long as it is optically transparent and is capable of buffering stress or impact while attaching each of the epitaxial stacks stably. For example, the first and second buffer layers 5063 and 5065 may be formed of an organic material including an epoxy-based polymer such as SU-8, various resists, parylene, poly(methyl methacrylate) (PMMA), benzocyclobutene (BCB), spin on glass (SOG), or others, and inorganic material such as silicon oxide, aluminum oxide, or the like. If necessary, a conductive oxide may also be used as a buffer layer, in which case the conductive oxide should be insulated from other components. When an organic material is used as the buffer layer, the organic material may be applied to the adhesive surface and then bonded at a high temperature and a high pressure in a vacuum state. When an inorganic material is used as the buffer layer, the inorganic material may be deposited on the adhesive surface and then planarized by chemical-mechanical planarization (CMP) or the like, after which the surface is subjected to the plasma treatment and then bonded by bonding under a high vacuum.

Referring to FIG. 74B, each of the first and second buffer layers 5063 and 5065 may include an adhesion enhancing layer 5063a or 5065a for adhering two epitaxial stacks adjacent to each other, and an shock absorbing layer 5063b or 5065b for relieving stress or impact between the two adjacent epitaxial stacks.

The shock absorbing layer 5063b and 5065b between two adjacent epitaxial stacks plays a role of absorbing stress or impact when at least one of the two adjacent epitaxial stacks is exposed to stress or impact.

The material that forms the shock absorbing layer 5063b and 5065b may include, but is not limited to, silicon oxide, silicon nitride, aluminum oxide, or others. In an exemplary embodiment, the shock absorbing layer 5063b and 5065b may include silicon oxide.

In an exemplary embodiment, in addition to stress or impact absorption, the shock absorbing layer 5063b and 5065b may have a predetermined adhesion force to adhere two adjacent epitaxial stacks. In particular, the shock absorbing layer 5063b and 5065b may include a material with surface energy similar or equivalent to the surface energy of the epitaxial stack to facilitate adhesion to the epitaxial stack. For example, when the surface of the epitaxial stack is imparted with hydrophilicity through a plasma treatment or others, a hydrophilic material such as silicon oxide may be used as the shock absorbing layer in order to improve adhesion to the hydrophilic epitaxial stack.

The adhesion enhancing layer 5063a or 5065a serves to firmly adhere two adjacent epitaxial stacks. Examples of the material for forming the adhesion enhancing layer 5063a or 5065a include, but are not limited to, epoxy-based polymers such as SOG, SU-8, various resists, parylene, poly(methyl methacrylate) (PMMA), benzocyclobutene (BCB), or others. In an exemplary embodiment, the adhesion enhancing layer 5063a or 5065a may include SOG.

In an exemplary embodiment, the first buffer layer 5063 may include a first adhesion enhancing layer 5063a and a first shock absorbing layer 5063b, and the second buffer layer 5065 may include a second adhesion enhancing layer 5065a and a second shock absorbing layer 5065b. In an exemplary embodiment, each of the adhesion enhancing layer and the shock absorbing layer may be provided as one layer, but are not limited thereto, and in another exemplary embodiment, each of the adhesion enhancing layer and the shock absorbing layer may be provided as a plurality of layers.

In an exemplary embodiment, the order of stacking the adhesion enhancing layer and the shock absorbing layer may be variously changed. For example, the shock absorbing layer may be stacked on the adhesion enhancing layer, or conversely, the adhesion enhancing layer may be stacked on the shock absorbing layer. In addition, the order of stacking the adhesion enhancing layer and the shock absorbing layer in the first buffer layer 5063 and the second buffer layer 5065 may be different. For example, in the first buffer layer 5063, the first shock absorbing 5063b layer and the first adhesion enhancing layer 5063a may be sequentially stacked, while in the second buffer layer 5065, the first adhesion enhancing layer 5065a and the second shock absorbing layer 5065b may be stacked sequentially. FIG. 74B shows an exemplary embodiment where the first shock absorbing layer 5063b is stacked on the first adhesion enhancing layer 5063a in the first buffer layer 5063, and the second shock absorbing layer 5065b is stacked on the second adhesion enhancing layer 5065a in the second buffer layer 5065.

In an exemplary embodiment, the thicknesses of the first buffer layer 5063 and the second buffer layer 5065 may be substantially the same as each other or different from each other. The thicknesses of the first buffer layer 5063 and the second buffer layer 5065 may be determined in consideration of the amount of impact to the epitaxial stacks in the stacking process of the epitaxial stacks. In an exemplary embodiment, the thickness of the first buffer layer 5063 may be greater than the thickness of the second buffer layer 5065. In particular, the thickness of the first shock absorbing layer 5063b in the first buffer layer 5063 may be greater than the thickness of the second shock absorbing layer 5065b in the second buffer layer 5065.

The light emitting stacked structure according to an exemplary embodiment may be manufactured through a process in which the first to third epitaxial stacks 5020, 5030, and 5040 are stacked sequentially, and accordingly, the second epitaxial stack 5030 is stacked after the first epitaxial stack 5020 is stacked, and the third epitaxial stack 5040 is stacked after both the first and second epitaxial stacks 5020 and 5030 are stacked. Accordingly, the amount of stress or impact that may be applied to the first epitaxial stack 5020 during a process is greater than the amount of stress or impact that may be applied to the second epitaxial stack 5030, and with an increased frequency. In particular, since the second epitaxial stack 5030 is stacked in a state that the stack thereunder has a shallow thickness, the second epitaxial stack 5030 is subjected to a greater amount of stress or impact than the stress or impact exerted to the third epitaxial stack 5040 that is stacked on the underlying stack of a relatively greater thickness. In an exemplary embodiment, the thickness of the first buffer layer 5063 is greater than the thickness of the second buffer layer 5065 to compensate for the difference in stress or impact mentioned above.

Figure 75:
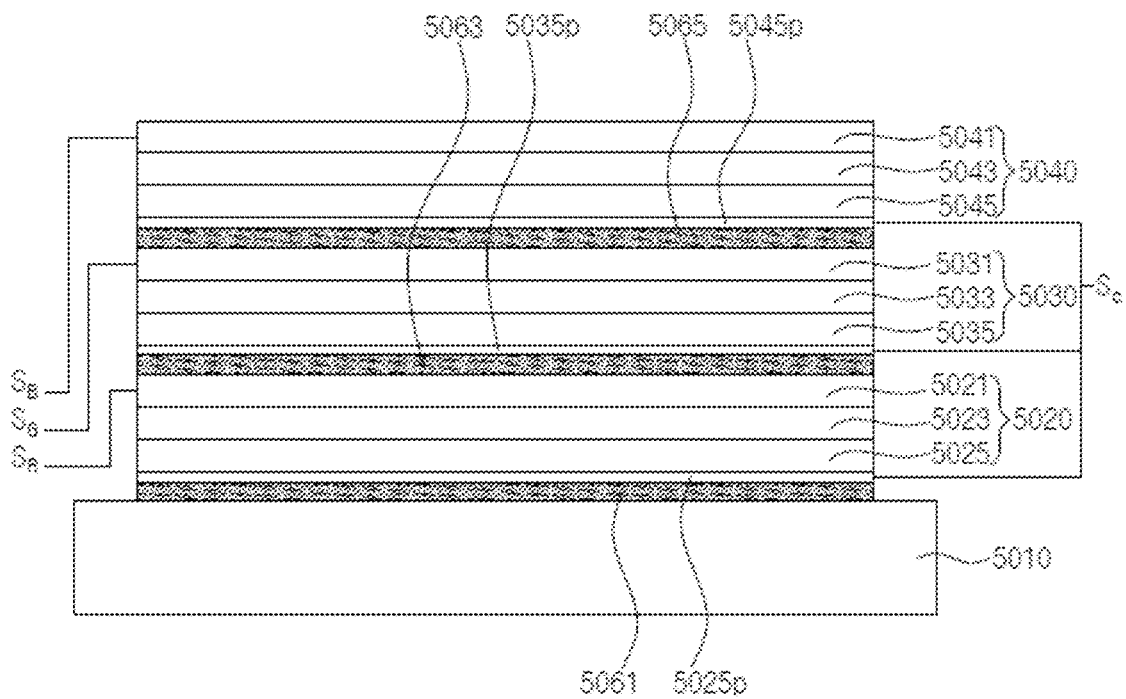
FIG. 75 is a cross-sectional view of a light emitting stacked structure including a wiring part according to an exemplary embodiment.

FIG. 75 is a cross-sectional view of a light emitting stacked structure according to an exemplary embodiment.

Referring to FIG. 75, each of the first to third epitaxial stacks 5020, 5030, and 5040 may be provided on the substrate 5010 via the adhesive layer 5061 and the first and second buffer layers 5063 and 5065 interposed therebetween.

Each of the first to third epitaxial stacks 5020, 5030, and 5040 includes p-type semiconductor layers 5025, 5035, and 5045, active layers 5023, 5033, and 5043, and n-type semiconductor layers 5021, 5031, and 5041, which are sequentially disposed.

The p-type semiconductor layer 5025, the active layer 5023, and the n-type semiconductor layer 5021 of the first epitaxial stack 5020 may include a semiconductor material that emits red light.

Examples of a semiconductor material that emits red light may include aluminum gallium arsenide (AlGaAs), gallium arsenide phosphide (GaAsP), aluminum gallium indium phosphide (AlGaInP), gallium phosphide (GaP), or others. However, the semiconductor material that emits red light is not limited thereto, and various other materials may be used.

A first p-type contact electrode 5025p may be provided under the p-type semiconductor layer 5025 of the first epitaxial stack 5020. The first p-type contact electrode 5025p of the first epitaxial stack 5020 may be a single layer or a multi-layer metal. For example, the first p-type contact electrode 5025p may include various materials including metals such as Al, Ti, Cr, Ni, Au, Ag, Ti, Sn, Ni, Cr, W, Cu, or others, or alloys thereof. The first p-type contact electrode 5025p may include metal having a high reflectivity, and accordingly, since the first p-type contact electrode 5025p is formed of metal having a high reflectivity, it is possible to increase the emission efficiency of light emitted from the first epitaxial stack 5020 in the upper direction.

A first n-type contact electrode 5021n may be provided on an upper portion of the n-type semiconductor layer of the first epitaxial stack 5020. The first n-type contact electrode 5021n of the first epitaxial stack 5020 may be a single layer or a multi-layer metal. For example, the first n-type contact electrode 5021n may be formed of various materials including metals such as Al, Ti, Cr, Ni, Au, Ag, Ti, Sn, Ni, Cr, W, Cu, or others, or alloys thereof. However, the material of the first n-type contact electrode 5021n is not limited to those mentioned above, and accordingly, other conductive materials may be used.

The second epitaxial stack 5030 includes an n-type semiconductor layer 5031, an active layer 5033, and a p-type semiconductor layer 5035, which are sequentially disposed. The n-type semiconductor layer 5031, the active layer 5033, and the p-type semiconductor layer 5035 may include a semiconductor material that emits green light. Examples of materials for emitting green light include indium gallium nitride (InGaN), gallium nitride (GaN), gallium phosphide (GaP), aluminum gallium indium phosphide (AlGaInP), and aluminum gallium phosphide (AlGaP). However, the semiconductor material that emits green light is not limited thereto, and various other materials may be used.

A second p-type contact electrode 5035p is provided under the p-type semiconductor layer 5035 of the second epitaxial stack 5030. The second p-type contact electrode 5035p is provided between the first epitaxial stack 5020 and the second epitaxial stack 5030, or specifically, between the first buffer layer 5063 and the second epitaxial stack 5030.

Each of the second p-type contact electrodes 5035p may include a transparent conductive oxide (TCO). The transparent conductive oxide may include tin oxide (SnO), indium oxide (InO2), zinc oxide (ZnO), indium tin oxide (ITO), indium tin zinc oxide (ITZO) or others. The transparent conductive compound may be deposited by the chemical vapor deposition (CVD), the physical vapor deposition (PVD), such as an evaporator, a sputter, or others. The second p-type contact electrode 5035p may be provided with a sufficient thickness to serve as an etch stopper in the fabrication process to be described below, for example, with a thickness of about 5001 angstroms to about 2 micrometers to the extent that the transparency is satisfied.

The third epitaxial stack 5040 includes a p-type semiconductor layer 5045, an active layer 5043, and an n-type semiconductor layer 5041, which are sequentially disposed. The p-type semiconductor layer 5045, the active layer 5043, and the n-type semiconductor layer 5041 may include a semiconductor material that emits blue light. The examples of the materials that emit blue light may include gallium nitride (GaN), indium gallium nitride (InGaN), zinc selenide (ZnSe), or others. However, the semiconductor material that emits blue light is not limited thereto, and various other materials may be used.

A third p-type contact electrode 5045p is provided under the p-type semiconductor layer 5045 of the third epitaxial stack 5040. The third p-type contact electrode 5045p is provided between the second epitaxial stack 5030 and the third epitaxial stack 5040, or specifically, between the second buffer layer 5065 and the third epitaxial stack 5040.

The second p-type contact electrode 5035p and the third p-type contact electrode 5045p between the p-type semiconductor layer 5035 of the second epitaxial stack 5030, and the p-type semiconductor layer 5045 of the third epitaxial stack 5040 are shared electrodes shared by the second epitaxial stack 5030 and the third epitaxial stack 5040.

Since the second p-type contact electrode 5035p and the third p-type contact electrode 5045p are at least partially in contact with each other, and physically and electrically connected to each other, when a signal is applied to at least a portion of the second p-type contact electrode 5035p or the third p-type contact electrode 5045p, the same signal can be applied to the p-type semiconductor layer 5035 of the second epitaxial stack 5030 and the p-type semiconductor layer 5045 of the third epitaxial stack 5040 at the same time. For example, when a common voltage is applied to one of the second p-type contact electrode 5035p and the third p-type contact electrode 5045p, the common voltage is applied to the p-type semiconductor layers of each of the second and third epitaxial stacks 5030 and 5040 through both the second p-type contact electrode 5035p and the third p-type contact electrode 5045p.

In the illustrated exemplary embodiment, although the n-type semiconductor layers 5021, 5031, and 5041 and the p-type semiconductor layers 5025, 5035, and 5045 of the first to third epitaxial stacks 5020, 5030, and 5040 are each shown as a single layer, these layers may be multilayers and may also include superlattice layers. In addition, the active layers 5023, 5033, and 5043 of the first to third epitaxial stacks 5020, 5030, and 5040 may include a single quantum well structure or a multi-quantum well structure.

In an exemplary embodiment, the second and third p-type contact electrodes 5035p and 5045p, which are shared electrodes, substantially cover the second and third epitaxial stacks 5030 and 5040. The second and third p-type contact electrodes 5035p and 5045p may include a transparent conductive material to transmit light from the epitaxial stack below. For example, each of the second and third p-type contact electrodes 5035p and 5045p may include a transparent conductive oxide (TCO). The transparent conductive oxide may include tin oxide (SnO), indium oxide (InO2), zinc oxide (ZnO), indium tin oxide (ITO), indium tin zinc oxide (ITZO) or others. The transparent conductive compound may be deposited by the chemical vapor deposition (CVD), the physical vapor deposition (PVD), such as an evaporator, a sputter, or others. The second and third p-type contact electrodes 5035p and 5045p may be provided with a sufficient thickness to serve as an etch stopper in the fabrication process to be described below, for example, with a thickness of about 5001 angstroms to about 2 micrometers to the extent that the transparency is satisfied.

In an exemplary embodiment, common lines may be connected to the first to third p-type contact electrodes 5025p, 5035p, and 5045p. In this case, the common line is a line to which the common voltage is applied. In addition, the light emitting signal lines may be connected to the n-type semiconductor layers 5021, 5031, and 5041 of the first to third epitaxial stacks 5020, 5030, and 5040, respectively. A common voltage SC is applied to the first p-type contact electrode 5025p, the second p-type contact electrode 5035p, and the third p-type contact electrode 5045p through the common line, and the light emitting signal is applied to the n-type semiconductor layer 5021 of the first epitaxial stack 5020, the n-type semiconductor layer 5031 of the second epitaxial stack 5030, and the n-type semiconductor layer 5041 of the third epitaxial stack 5040 through the light emitting signal line, thereby controlling the light emission of the first to third epitaxial stacks 5020, 5030, and 5040. The light emitting signal includes first to third light emitting signals SR, SG, and SB corresponding to the first to third epitaxial stacks 5020, 5030, and 5040, respectively. In an exemplary embodiment, the first light emitting signal SR may be a signal corresponding to red light, the second light emitting signal SG may be a signal corresponding to green light, and the third light emitting signal SB may be a signal corresponding to an emission of blue light.

In the illustrated exemplary embodiment described above, it is described that a common voltage is applied to the p-type semiconductor layers 5025, 5035, and 5045 of the first to third epitaxial stacks 5020, 5030, and 5040, and the light emitting signal is applied to the n-type semiconductor layers 5021, 5031, and 5041 of the first to third epitaxial stacks 5020, 5030, and 5040, but the inventive concepts are not limited thereto. In another exemplary embodiment, a common voltage may be applied to the n-type semiconductor layers 5021, 5031, and 5041 of the first to third epitaxial stacks 5020, 5030, and 5040, and light emitting signals may be applied to the p-type semiconductor layers 5025, 5035, and 5045 of the first to third epitaxial stacks 5020, 5030, and 5040.

In this manner, the first to third epitaxial stacks 5020, 5030, and 5040 are driven according to a light emitting signal applied to each of the epitaxial stacks. In particular, the first epitaxial stack 5020 is driven according to a first light emitting signal SR, the second epitaxial stack 5030 is driven according to a second light emitting signal SG, and the third epitaxial stack 5040 is driven according to the third light emitting signal SB. In this case, the first, second, and third driving signals SR, SG, and SB are independently applied to the first to third epitaxial stacks 5020, 5030, and 5040, and as a result, each of the first to third epitaxial stacks 5020, 5030 and 5040 is independently driven. The light emitting stacked structure may finally provide light of various colors by combining the first to third color light emitted upward from the first to third epitaxial stacks 5020, 5030, and 5040.

The light emitting stacked structure according to an exemplary embodiment may implement a color in a manner such that portions of different color light are provided on the overlapped region, rather than implementing different color light on different planes spaced apart from each other, thereby advantageously providing compactness and integration of the light emitting element. In a conventional light emitting element, in order to realize full color, light emitting elements that emit different colors, such as red, green, and blue light are generally placed apart from each other on a plane, which would occupy a relatively large area as each of the light emitting elements is arranged on a plane. However, in the light emitting stacked structure according to an exemplary embodiment, it is possible to realize a full color in a remarkably smaller area compared to the conventional light emitting element, by providing a stacked structure having the portions of the light emitting elements that emit different color light overlapped in one region. Accordingly, it is possible to manufacture a high-resolution device even in a small area.

In addition, the light emitting stacked structure according to an exemplary embodiment significantly reduces defects that may occur during manufacture. In particular, the light emitting stacked structure can be manufactured by stacking in the order of the first to third epitaxial stacks, in which case the second epitaxial stack is stacked in a state that the first epitaxial stack is stacked, and the third epitaxial stack is stacked in a state that both the first and second epitaxial stacks are stacked. However, since the first to third epitaxial stacks are first manufactured on a separate temporary substrate, and then stacked by being transferred onto the substrate, defects may occur during the step of transferring onto the substrate and removing the temporary substrate, the first to third epitaxial stacks and other components on the first to third epitaxial stacks may be exposed to stress or impact. However, since the light emitting stacked structure according to an exemplary embodiment includes a buffer layer, or a stress or shock absorbing layer, between adjacent epitaxial stacks, defects that may occur during processing may be reduced.

In addition, the conventional light emitting device has a complex structure and thus requires a complicated manufacturing process, as it would require separately preparing respective light emitting elements and then forming separate contacts such as connecting by interconnection lines, or others, for each of the light emitting elements. However, according to an exemplary embodiment, the light emitting stacked structure is formed by stacking multi-layers of epitaxial stacks sequentially on a single substrate 5010, and then forming contacts on the multi-layered epitaxial stacks and connecting by lines through a minimum process. In addition, since light emitting elements of individual colors are separately manufactured and mounted separately, only a single light emitting stacked structure is mounted according to an exemplary embodiment, instead of a plurality of light emitting elements. Accordingly, the manufacturing method is simplified significantly.

The light emitting stacked structure according to an exemplary embodiment may additionally employ various components to provide high purity and color light of high efficiency. For example, a light emitting stacked structure according to an exemplary embodiment may include a wavelength pass filter to block short wavelength light from proceeding toward the epitaxial stack that emits relatively long wavelength light.

In the following exemplary embodiments, in order to avoid redundant descriptions, differences from the exemplary embodiments described above will be mainly described.

Figure 76:
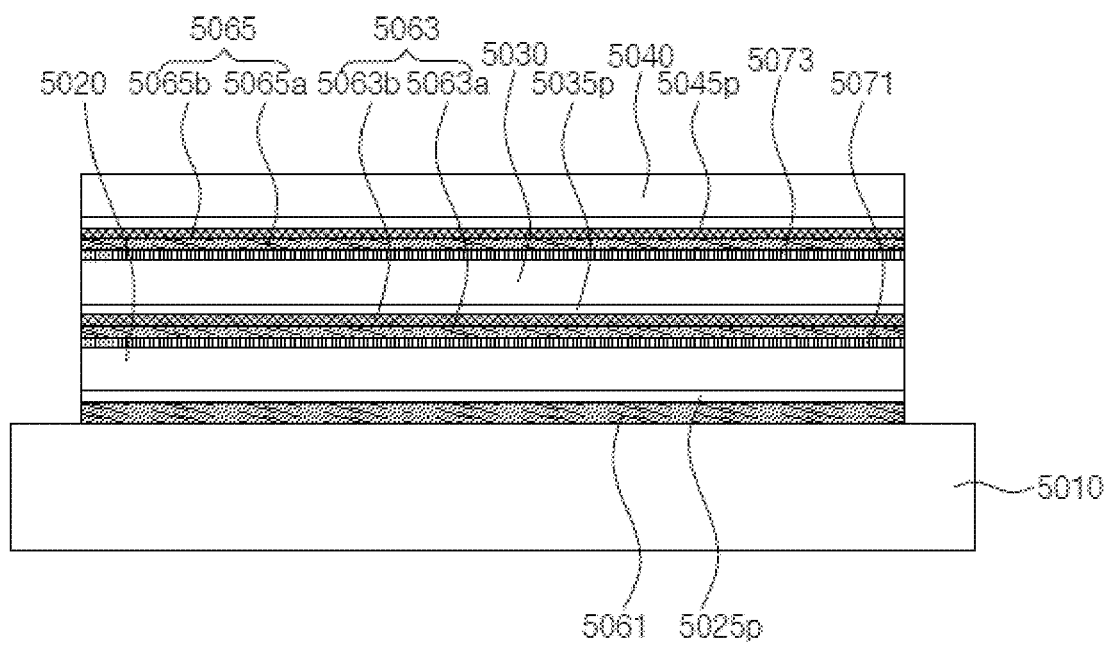
FIG. 76 is a cross-view of a light emitting stacked structure according to an exemplary embodiment.

FIG. 76 is a cross-sectional view of a light emitting stacked structure including a predetermined wavelength pass filter according to an exemplary embodiment.

Referring to FIG. 76, a first wavelength pass filter 5071 may be provided between the first epitaxial stack 5020 and the second epitaxial stack 5030 in a light emitting stacked structure according to an exemplary embodiment.

The first wavelength pass filter 5071 selectively transmits a certain wavelength light, and may transmit a first color light emitted from the first epitaxial stack 5020 while blocks or reflects light other than the first color light. Accordingly, the first color light emitted from the first epitaxial stack 5020 may travel in an upper direction, while the second and third color light emitted from the second and third epitaxial stacks 5030 and 5040 are blocked from traveling toward the first epitaxial stack 5020, and may be reflected or blocked by the first wavelength pass filter 5071.

The second and third color light are high-energy light that may have a relatively shorter wavelength than the first color light, which may additional light emission in the first epitaxial stack 5020 when entering the first epitaxial stack 5020. In an exemplary embodiment, the second and the third color light may be blocked from entering the first epitaxial stack 5020 by the first wavelength pass filter 5071.

In an exemplary embodiment, a second wavelength pass filter 5073 may be provided between the second epitaxial stack 5030 and the third epitaxial stack 5040. The second wavelength pass filter 5073 transmits the first color light and the second color light emitted from the first and second epitaxial stacks 5020 and 5030, while blocking or reflecting light other than the first and second color light. Accordingly, the first and second color light emitted from the first and second epitaxial stacks 5020 and 5030 may travel in the upper direction, while the third color light emitted from the third epitaxial stack 5040 is not allowed to travel in a direction toward the first and second epitaxial stacks 5020 and 5030, but reflected or blocked by the second wavelength pass filter 5073.

As described above, the third color light is a relatively high-energy light having a shorter wavelength than the first and second color light, and when entering the first and second epitaxial stacks 5020 and 5030, the third color light may induce additional emission in the first and second epitaxial stacks 5020 and 5030. In an exemplary embodiment, the second wavelength pass filter 5073 prevents the third light from entering the first and second epitaxial stacks 5020 and 5030.

The first and second wavelength pass filters 5071 and 5073 may be formed in various shapes, and may be formed by alternately stacking insulating films having different refractive indices. For example, the wavelength of transmitted light may be determined by alternately stacking $SiO_2$ and $TiO_2$, and adjusting the thickness and number of stacking of $SiO_2$ and $TiO_2$. The insulating films having different refractive indices may include $SiO_2$, $TiO_2$, $HfO_2$, $Nb_2O_5$, $ZrO_2$, $Ta_2O_5$, or others.

When the first and second wavelength pass filters 5071 and 5073 are formed by stacking inorganic insulating films having different refractive indices from each other, defects due to stress or impact during the manufacturing process, for example, peel-off or cracks may occur. However, according to an exemplary embodiment, such defects may be significantly reduced by providing a buffer layer to relieve the impact.

The light emitting stacked structure according to an exemplary embodiment may additionally employ various components to provide uniform light of high efficiency. For example, a light emitting stacked structure according to an exemplary embodiment may have various irregularities (or roughened surface) on the light exit surface. For example, a light emitting stacked structure according to an exemplary embodiment may have irregularities formed on an upper surface of at least one n-type semiconductor layer of the first to third epitaxial stacks 5020, 5030, and 5040.

In an exemplary embodiment, the irregularities of each of the epitaxial stacks may be selectively formed. For example, irregularities may be provided on the first epitaxial stack 5020, irregularities may be provided on the first and third epitaxial stacks 5020 and 5040, or irregularities may be provided on the first to third epitaxial stacks 5020, 5030 and 5040. The irregularities of each of the epitaxial stacks may be provided on an n-type semiconductor layer corresponding to the emission surface of each of the epitaxial stacks.

The irregularities are provided to increase light emission efficiency, and may be provided in various forms such as a polygonal pyramid, a hemisphere, or planes with a surface roughness in a random arrangement. The irregularities may be textured through various etching processes or by using a patterned sapphire substrate.

In an exemplary embodiment, the first to third color light from the first to third epitaxial stacks 5020, 5030, and 5040 may have different light intensities, and this difference in intensity may lead to differences in visibility. The light emission efficiency may be improved by selectively forming irregularities on the light exit surface of the first to third epitaxial stacks 5020, 5030 and 5040, which results in reduction of the visibility differences between the first to third color light. The color light corresponding to red and/or blue color may have lower visibility than the green color, in which case the first epitaxial stack 5020 and/or the third epitaxial stack 5040 may be textured to decrease the difference of visibility. In particularly, when the lowermost of the light emitting stacks emits red color light, the light intensity may be small. As such, the light efficiency may be increased by forming irregularities on the upper surface thereof.

The light emitting stacked structure having the structure described above is a light emitting element capable of expressing various colors, and thus may be employed as a pixel in a display device. In the following exemplary embodiment, a display device will be described as including the light emitting stacked structure according to exemplary embodiments.

Figure 77:
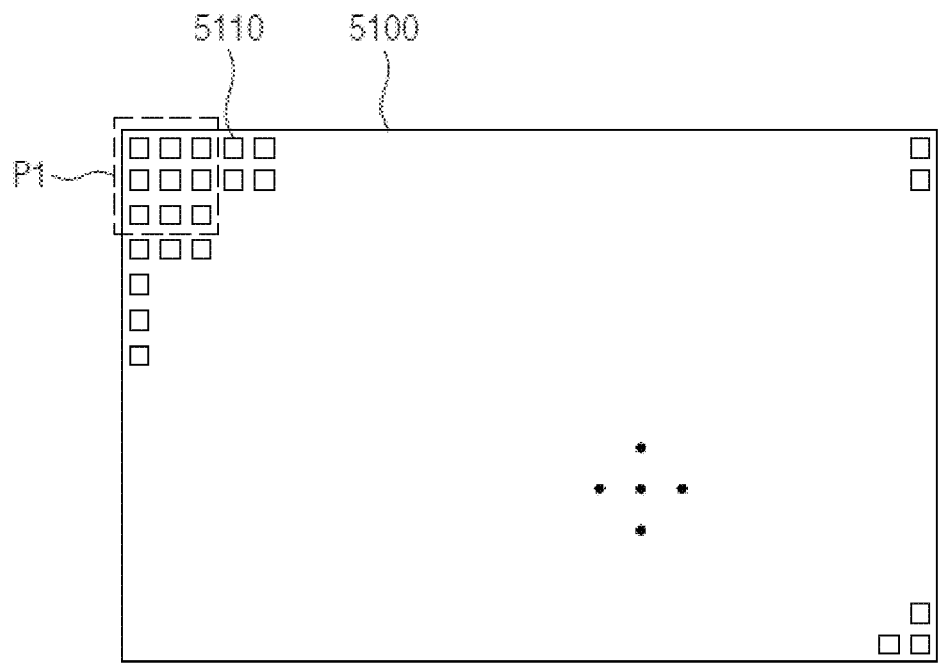
FIG. 77 is a plan view illustrating a display device according to an exemplary embodiment.
Figure 78:
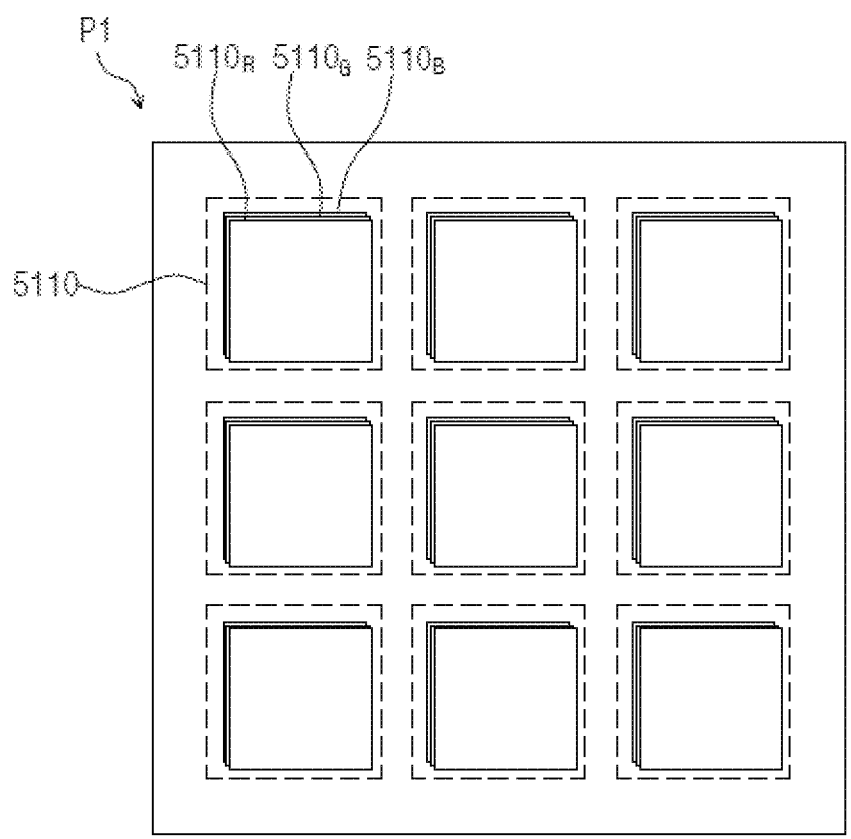
FIG. 78 is an enlarged plan view illustrating portion P1 of FIG. 77.

FIG. 77 is a plan view of a display device according to an exemplary embodiment, and FIG. 78 is an enlarged plan view illustrating portion P1 of FIG. 77.

Referring to FIGS. 77 and 78, the display device 5110 according to an exemplary embodiment may display any visual information such as text, video, photographs, two or three-dimensional images, or others.

The display device 5110 may be provided in various shapes including a closed polygon that includes a straight side, such as a rectangle, or a circle, an ellipse, or the like, that includes a curved side, a semi-circle, or semi-ellipse that includes a combination of straight and curved sides. In an exemplary embodiment, the display device will be described as having substantially a rectangular shape.

The display device 5110 has a plurality of pixels 5110 for displaying images. Each of the pixels 5110 may be a minimum unit for displaying an image. Each pixel 5110 includes the light emitting stacked structure having the structure described above, and may emit white light and/or color light.

In an exemplary embodiment, each pixel includes a first pixel 5110R that emits red light, a second pixel 5110G that emits green light, and a third pixel 5110B that emits blue light. The first to third pixels 5110R, 5110G, and 5110B may correspond to the first to third epitaxial stacks 5020, 5030, and 5040 of the light emitting stacked structure described above, respectively.

The pixels 5110 are arranged in a matrix. As used herein, pixels arranged in "a matrix" may not only refer to when the pixels 5110 are arranged in a line along the row or column, but also to when the pixels 5110 are arranged in any repeating pattern, such as generally along the rows and columns, with certain modifications in details, such as the pixels 5110 being arranged in a zigzag shape, for example.

Figure 79:
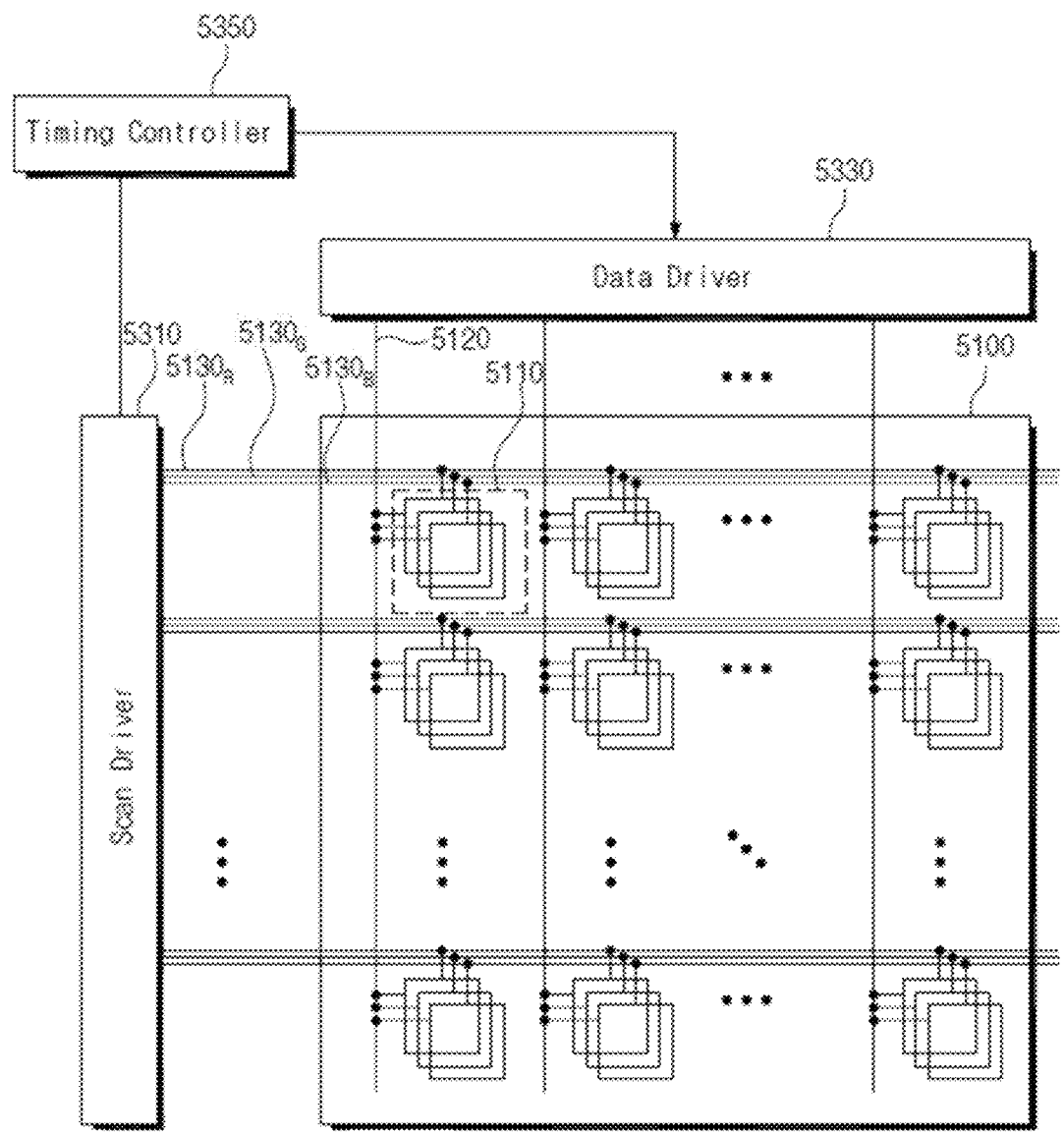
FIG. 79 is a structural diagram of a display device according to an exemplary embodiment.

FIG. 79 is a structural diagram of a display device according to an exemplary embodiment.

Referring to FIG. 79, a display device 5110 according to an exemplary embodiment includes a timing controller 5350, a scan driver 5310, a data driver 5330, a wiring part, and pixels. When the pixels include a plurality of pixels, each of the pixels is individually connected to the scan driver 5310, the data driver 5330, or the like through a wiring part.

The timing controller 5350 receives various control signals and image data necessary for driving a display device from outside (e.g., from a system for transmitting image data). The timing controller 5350 rearranges the received image data and transmits the image data to the data driver 5330. In addition, the timing controller 5350 generates scan control signals and data control signals necessary for driving the scan driver 5310 and the data driver 5330, and outputs the generated scan control signals and data control signals to the scan driver 5310 and the data driver 5330.

The scan driver 5310 receives scan control signals from the timing controller 5350 and generates corresponding scan signals. The data driver 5330 receives data control signals and image data from the timing controller 5350, and generates corresponding data signals.

The wiring part includes a plurality of signal lines. The wiring part includes scan lines 5130 connecting the scan driver 5310 and the pixels, and data lines 5120 connecting the data driver 5330 and the pixels. The scan lines 5130 may be connected to respective pixels, and accordingly, the scan lines 5130 that correspond to the respective pixels are marked as first to third scan lines 5130R, 5130G, and 5130B (hereinafter, collectively referred to by '5130').

In addition, the wiring part further includes lines connecting between the timing controller 5350 and the scan driver 5310, the timing controller 5350 and the data driver 5330, or other components, and transmitting the signals.

The scan lines 5130 provide the scan signals generated at the scan driver 5310 to the pixels. The data signals generated at the data driver 5330 is outputted to the data lines 5120.

The pixels are connected to the scan lines 5130 and data lines 5120. The pixels selectively emit light in response to the data signals inputted from the data lines 5120 when the scan signals are supplied from scan lines 5130. For example, during each frame period, each of the pixels emits light with the luminance corresponding to the input data signals. The pixels supplied with data signals corresponding to black luminance display black by emitting no light during the corresponding frame period.

In an exemplary embodiment, the pixels may be driven as either passive or active type. When the display device is driven as the active type, the display device may be supplied with the first and second pixel powers in addition to the scan signals and the data signals.

Figure 80:
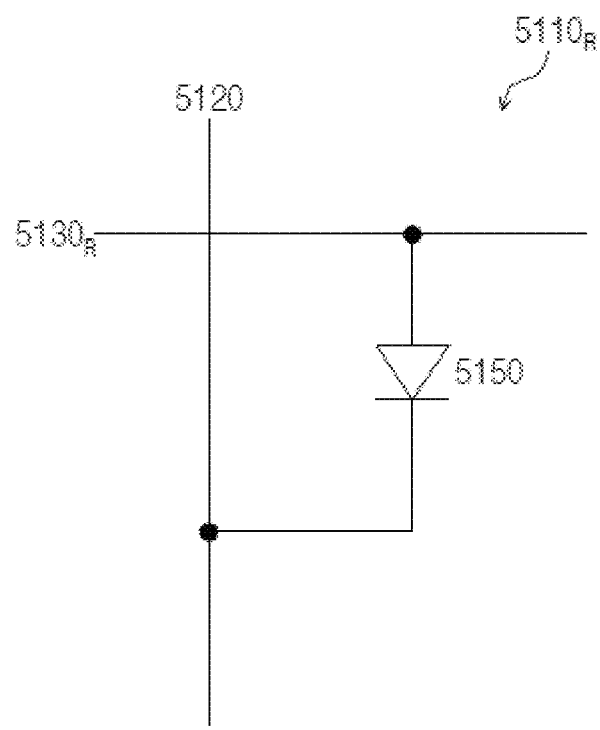
FIG. 80 is a circuit diagram of one pixel of a passive type display device according to an exemplary embodiment.

FIG. 80 is a circuit diagram of one pixel of a passive type display device. The pixel may be one of R, G, B pixels, and the first pixel 5110R is illustrated as an example. Since the second and third pixels may be driven in substantially the same manner as the first pixel, the circuit diagrams for the second and third pixels will be omitted.

Referring to FIG. 80, a first pixel 5110R includes a light emitting element 150 connected between a scan line 5130 and a data line 5120. The light emitting element 150 may correspond to the first epitaxial stack 5020. The first epitaxial stack 5020 emits light with a luminance corresponding to a magnitude of the applied voltage when a voltage equal to or greater than a threshold voltage is applied between the p-type semiconductor layer and the n-type semiconductor layer. In particular, the emission of the first pixel 5110R may be controlled by controlling the voltages of the scan signal applied to the first scan line 5130R and/or the data signal applied to the data line 5120.

Figure 81:
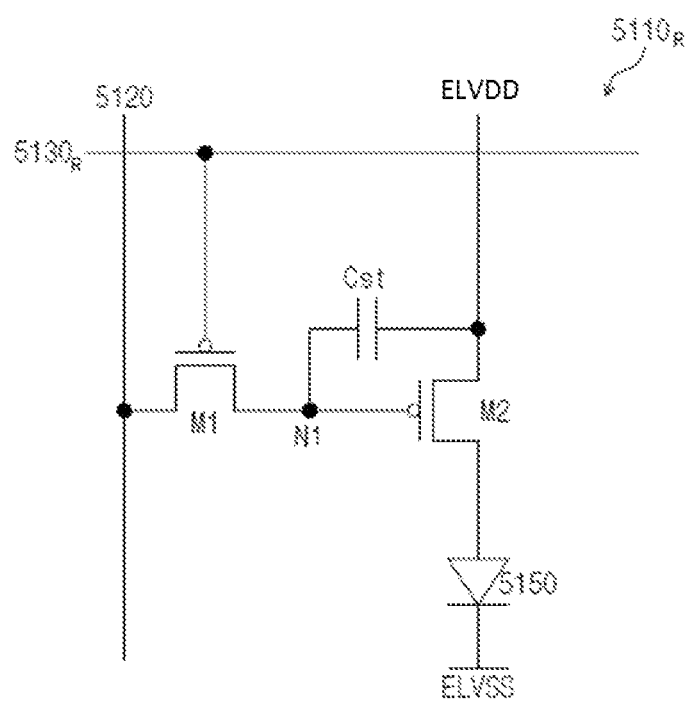
FIG. 81 is a schematic circuit diagram of one pixel of an active type display device according to an exemplary embodiment.

FIG. 81 is a circuit diagram of a first pixel of an active type display device.

When the display device is the active type, the first pixel 5110R may be further supplied with the first and second pixel powers (ELVDD and ELVSS) in addition to the scan signal and the data signal.

Referring to FIG. 81, the first pixel 5110R includes a light emitting element 150 and a transistor part connected thereto. The light emitting element 150 may correspond to the first epitaxial stack 5020, and the p-type semiconductor layer of the light emitting element 150 may be connected to the first pixel power ELVDD via the transistor part, and the n-type semiconductor layer may be connected to a second pixel power ELVSS. The first pixel power ELVDD and the second pixel power ELVSS may have different potentials from each other. For example, the second pixel power ELVSS may have potential lower than that of the first pixel power ELVDD, by at least the threshold voltage of the light emitting element. Each of these light emitting elements emits light with a luminance corresponding to the driving current controlled by the transistor part.

According to an exemplary embodiment, the transistor part includes first and a second transistors M1 and M2 and a storage capacitor Cst. However, the inventive concepts are not limited thereto, and the structure of the transistor part may be varied.

The source electrode of the first transistor M1 (e.g., switching transistor) is connected to the data line 5120, and the drain electrode is connected to the first node N1. Further, the gate electrode of the first transistor is connected to the first scan line 5130R. The first transistor is turned on when a scan signal of a voltage capable of turning on the first transistor M1 is supplied from the first scan line 5130R to the data line 5120, to electrically connect the first node N1. The data signal of the corresponding frame is supplied to the data line 5120, and accordingly, the data signal is transmitted to the first node N1. The data signal transmitted to the first node N1 is charged in the storage capacitor Cst.

The source electrode of the second transistor M2 is connected to the first pixel power ELVDD, and the drain electrode is connected to the n-type semiconductor layer of the light emitting element. The gate electrode of the second transistor M2 is connected to the first node N1. The second transistor M2 controls an amount of driving current supplied to the light emitting element corresponding to the voltage of the first node N1.

One electrode of the storage capacitor Cst is connected to the first pixel power ELVDD, and the other electrode is connected to the first node N1. The storage capacitor Cst charges the voltage corresponding to the data signal supplied to the first node N1 and maintains the charged voltage until the data signal of the next frame is supplied.

FIG. 81 shows a transistor part including two transistors. However, the inventive concepts are not limited thereto, and various modifications are applicable to the structure of the transistor part. For example, the transistor part may include more transistors, capacitors, or the like. In addition, although the specific structures of the first and second transistors, storage capacitors, and lines are not shown, the first and second transistors, storage capacitors, and lines are not particularly limited and can be variously provided.

The pixels may be implemented in various structures within the scope of the inventive concepts. Hereinafter, a pixel according to an exemplary embodiment will be described with reference to a passive matrix type pixel.

Figure 82:
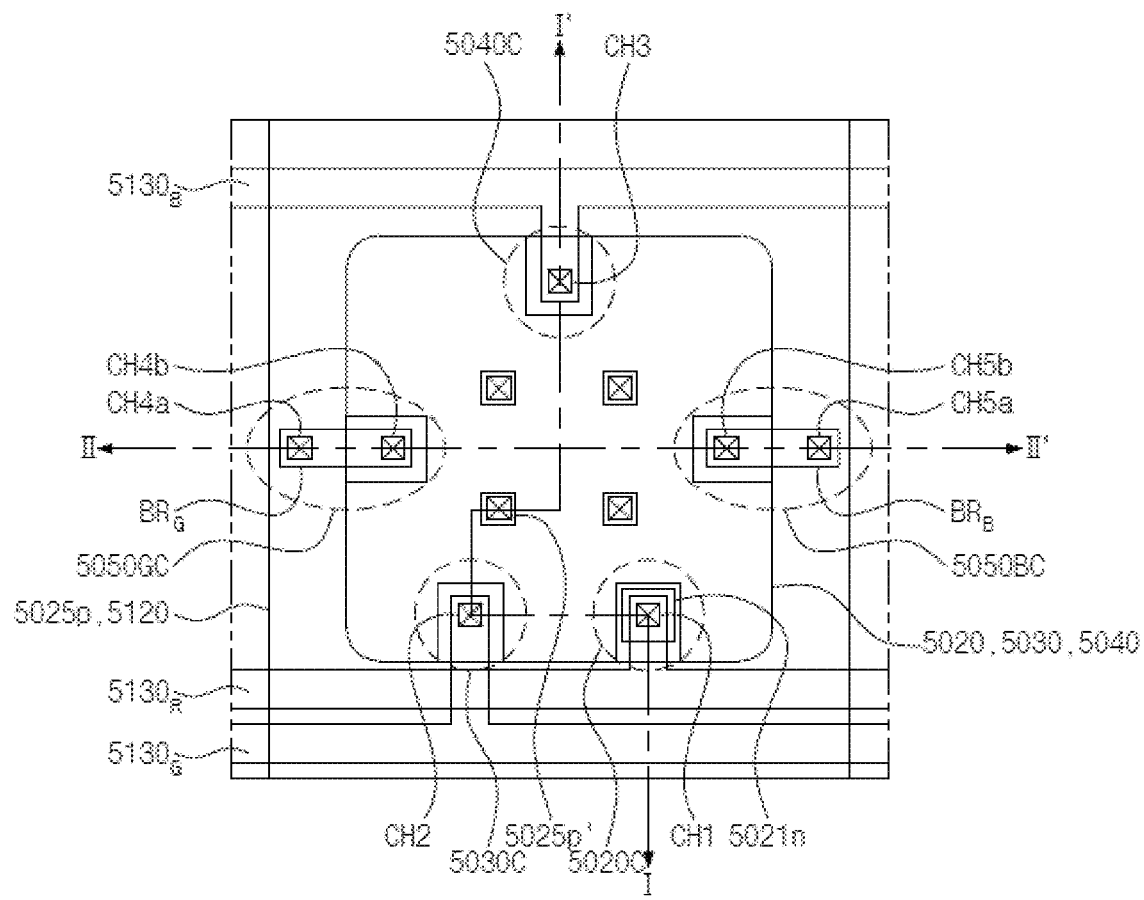
FIG. 82 is a plan view of a pixel according to an exemplary embodiment.
Figure 83A:
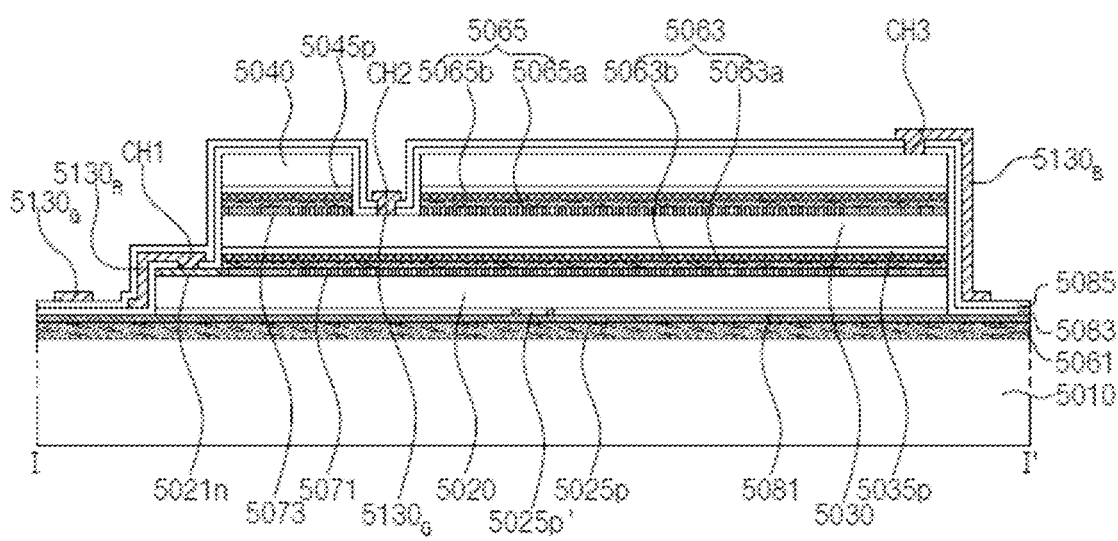
FIG. 83A and FIG. 83B are cross-sectional views taken along lines I-I' and II-II' of FIG. 82, respectively.
Figure 83B:
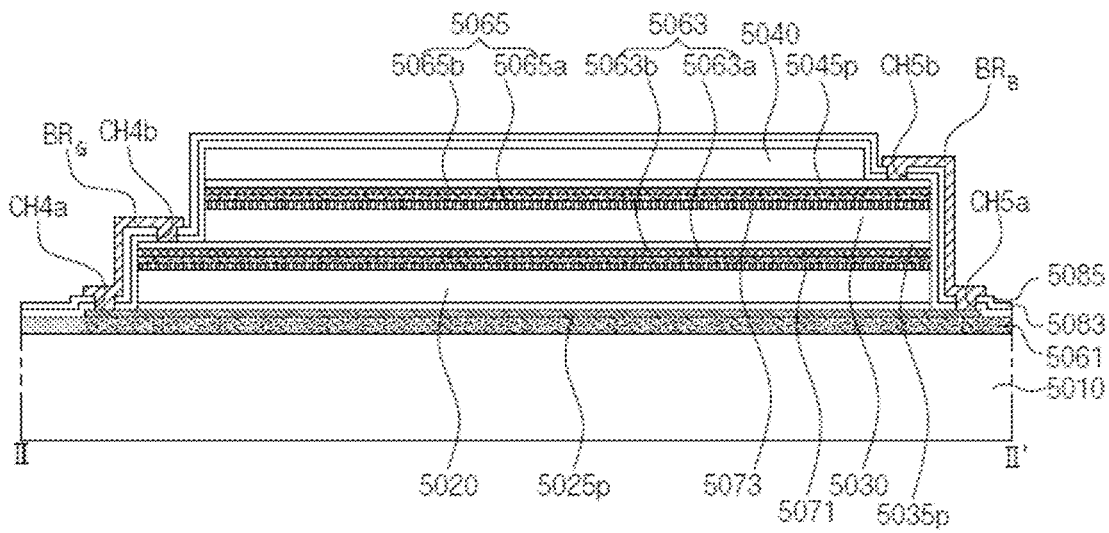

FIG. 82 is a plan view of a pixel according to an exemplary embodiment, and FIGS. 83A and 83B are cross-sectional views taken along lines I-I' and of FIG. 82, respectively.

Referring to FIGS. 82, 83A and 83B, viewing from a plan view, a pixel according to an exemplary embodiment includes a light emitting region in which a plurality of epitaxial stacks are stacked, and a peripheral region surrounding the light emitting region. The plurality of epitaxial stacks include first to third epitaxial stacks 5020, 5030, and 5040.

When viewed from a plan view, the pixel according to an exemplary embodiment has a light emitting region in which a plurality of epitaxial stacks are stacked. At least one side of the light emitting region is provided with a contact for connecting the wiring part to the first to third epitaxial stacks 5020, 5030, and 5040. The contact includes first and second common contacts 5050GC and 5050BC for applying a common voltage to the first to third epitaxial stacks 5020, 5030, and 5040, a first contact 5020C for providing a light emitting signal to the first epitaxial stack 5020, a second contact 5030C for providing a light emitting signal to the second epitaxial stack 5030, and a third contact 5040C for providing a light emitting signal to the third epitaxial stack 5040.

In an exemplary embodiment, the stacked structure may vary depending on the polarity of the semiconductor layers of the first to third epitaxial stacks 5020, 5030, and 5040 to which the common voltage is applied. That is, regarding the first and second common contacts 5050GC and 5050BC, when there are contact electrodes provided for applying a common voltage to each of the first to third epitaxial stacks 5020, 5030, and 5040, such contact electrodes may be referred to as the "first to third common contact electrodes", and the first to third contact electrodes may be the "first to third p-type contact electrodes", respectively, when the common voltage is applied to the p-type semiconductor layer. In an exemplary embodiment where a common voltage is applied to the n-type semiconductor layer, the first to third common contact electrodes may be first to third n-type contact electrodes, respectively. Hereinafter, a common voltage will be described as being applied to a p-type semiconductor layer, and thus, the first to third common contact electrodes will be described as corresponding to first to third p-type contact electrodes, respectively.

In an exemplary embodiment, when viewed from a plan view, the first and second common contacts 5050GC and 5050BC and the first to third contacts 5020C, 5030C, and 5040C may be provided at various positions. For example, when the light emitting stacked structure has substantially a square shape, the first and second common contacts 5050GC and 5050BC and the first to third contacts 5020C, 5030C, and 5040C may be disposed in regions corresponding to respective corners of the square. However, the positions of the first and second common contacts 550GC and 550BC and the first to third contacts 5020C, 5030C and 5040C are not limited thereto, and various modifications are applicable according to the shape of the light emitting stacked structure.

The plurality of epitaxial stacks include first to third epitaxial stacks 5020, 5030, and 5040. The first to third epitaxial stacks 5020, 5030, and 5040 are connected with first to third light emitting signal lines for providing light emitting signals to each of the first to third epitaxial stacks 5020, 5030, and 5040, and a common line for providing a common voltage to each of the first to third epitaxial stacks 5020, 5030, and 5040. In an exemplary embodiment, the first to third light emitting signal lines may correspond to the first to third scan lines 5130R, 5130G, and 5130B, and the common line may correspond to the data line 5120. Accordingly, the first to third scan lines 5130R, 5130G, and 5130B and the data line 5120 are connected to the first to third epitaxial stacks 5020, 5030, and 5040, respectively.

In an exemplary embodiment, the first to third scan lines 5130R, 5130G, and 5130B may extend substantially in a first direction (e.g., in a transverse direction as shown in the drawing). The data line 5120 may extend substantially in a second direction intersecting with the first to third scan lines 5130R, 5130G, and 5130B (e.g., in a longitudinal direction as shown in the drawing). However, the extending directions of the first to third scan lines 5130R, 5130G, and 5130B and the data line 5120 are not limited thereto, and various modifications are applicable according to the arrangement of the pixels.

The data line 5120 and the first p-type contact electrode 5025$p$ extend substantially in a second direction intersecting the first direction, while concurrently providing a common voltage to the p-type semiconductor layer of the first epitaxial stack 5020. Accordingly, the data line 5120 and the first p-type contact electrode 5025$p$ may be substantially the same component. Hereinafter, the first p-type contact electrode 5025$p$ may be referred to as the data line 5120 or vice versa.

An ohmic electrode 5025$p$' for ohmic contact between the first p-type contact electrode 5025$p$ and the first epitaxial stack 5020 is provided on the light emitting region provided with the first p-type contact electrode 5025$p$.

The first scan line 5130R is connected to the first epitaxial stack 5020 through the first contact hole CH1, and the data line 5120 is connected via the ohmic electrode 5025$p$'. The second scan line 5130G is connected to the second epitaxial stack 5030 through the second contact hole CH2 and the data line 5120 is connected through the 4$a^{th}$ and 4$b^{th}$ contact holes CH4$a$ and CH4$b$. The third scan line 5130B is connected to the third epitaxial stack 5040 through the third contact hole CH3 and the data line 5120 is connected through the 5$a^{th}$ and 5$b^t$ contact holes CH5$a$ and CH5$b$.

A buffer layer, a contact electrode, a wavelength pass filter, or the like are provided between the substrate 5010 and the first to third epitaxial stacks 5020, 5030, and 5040, respectively. Hereinafter, the pixel according to an exemplary embodiment will be described in the order of stacking.

According to an exemplary embodiment, a first epitaxial stack 5020 is provided on the substrate 5010 via an adhesive layer 5061 interposed therebetween. In the first epitaxial stack 5020, a p-type semiconductor layer, an active layer, and an n-type semiconductor layer are sequentially disposed from lower to upper sides.

A first insulating film 5081 is stacked on a lower surface of the first epitaxial stack 5020, that is, on the surface facing the substrate 5010. A plurality of contact holes are formed in the first insulating film 5081. The contact holes are provided with an ohmic electrode 5025p' in contact with the p-type semiconductor layer of the first epitaxial stack 5020. The ohmic electrode 5025p' may include a variety of materials. In an exemplary embodiment, the ohmic electrode 5025p' corresponding to the p-type ohmic electrode 5025p' may include an Au/Zn alloy or an Au/Be alloy. In this case, since the material of the ohmic electrode 5025p' is lower in reflectivity than Ag, Al, Au, or the like, additional reflective electrodes may be further disposed. As an additional reflective electrode, Ag, Au, or the like may be used, and Ti, Ni, Cr, Ta, or the like may be disposed as an adhesive layer for adhesion to adjacent components. In this case, the adhesive layer may be thinly deposited on the upper and lower surfaces of the reflective electrode including Ag, Au, or the like.

The first p-type contact electrode 5025p and the data line 5120 are in contact with the ohmic electrode 5025p'. The first p-type contact electrode 5025p (also serving as the data line 5120) is provided between the first insulating film 5081 and the adhesive layer 5061.

When viewed from a plan view, the first p-type contact electrode 5025p may be provided in a form such that the first p-type contact electrode 5025p overlaps the first epitaxial stack 5020, or more particularly, overlaps the light emitting region of the first epitaxial stack 5020, while covering most, or all of the light emitting region. The first p-type contact electrode 5025p may include a reflective material so that the first p-type contact electrode 5025p may reflect light from the first epitaxial stack 5020. The first insulating film 81 may also be formed to have a reflective property to facilitate the reflection of light from the first epitaxial stack 5020. For example, the first insulating film 81 may have an omni-directional reflector (ODR) structure.

In addition, the material of the first p-type contact electrode layer 5025p is selected from metals having high reflectivity to light emitted from the first epitaxial stack 5020, to maximize the reflectivity of light emitted from the first epitaxial stack 5020. For example, when the first epitaxial stack 5020 emits red light, metal having a high reflectivity to red light, for example, Au, Al, Ag, or the like may be used as the material of the first p-type contact electrode layer 5025p. Au does not have a high reflectivity to light emitted from the second and third epitaxial stacks 5030 and 5040 (e.g., green light and blue light), and thus can reduce a mixture of colors by light emitted from the second and third epitaxial stacks 5030 and 5040.

The first wavelength pass filter 5071 and the first n-type contact electrode 5021n are provided on an upper surface of the first epitaxial stack 5020. In an exemplary embodiment, the first n-type contact electrode 5021n may include various metals and metal alloys, including Au/Te alloy or Au/Ge alloy, for example.

The first wavelength pass filter 5071 is provided on the upper surface of the first epitaxial stack 5020 to cover substantially all the light emitting region of the first epitaxial stack 5020.

The first n-type contact electrode 5021n is provided in a region corresponding to the first contact 5020C and may include a conductive material. The first wavelength pass filter 5071 is provided with a contact hole through which the first n-type contact electrode 5021n is brought into contact with the n-type semiconductor layer on the upper surface of the first epitaxial stack 5020.

The first buffer layer 5063 is provided on the first epitaxial stack 5020, and the second p-type contact electrode 5035p and the second epitaxial stack 5030 are sequentially provided on the first buffer layer 5063. In the second epitaxial stack 5030, a p-type semiconductor layer, an active layer, and an n-type semiconductor layer are sequentially disposed from lower to upper sides.

In an exemplary embodiment, the region corresponding to the first contact 5020C of the second epitaxial stack 5030 is removed, thereby exposing a portion of the upper surface of the first n-type contact electrode 5021n. In addition, the second epitaxial stack 5030 may have a smaller area than the second p-type contact electrode 5035p. The region corresponding to the first common contact 550GC is removed from the second epitaxial stack 5030, thereby exposing a portion of the upper surface of the second p-type contact electrode 5035p.

The second wavelength pass filter 5073, the second buffer layer 5065, and the third p-type contact electrode 5045p are sequentially provided on the second epitaxial stack 5030. The third epitaxial stack 5040 is provided on the third p-type contact electrode 5045p. In the third epitaxial stack 5040, an n-type semiconductor layer, an active layer, and a p-type semiconductor layer are sequentially disposed from lower to upper sides.

The third epitaxial stack 5040 may have a smaller area than the second epitaxial stack 5030. The third epitaxial stack 5040 may have a smaller area than the third p-type contact electrode 5045p. The region corresponding to the second common contact 5050BC is removed from the third epitaxial stack 5040, thereby exposing a portion of the upper surface of the third p-type contact electrode 5045p.

The second insulating film 5083 covering the stacked structure of the first to third epitaxial stacks 5020, 5030, and 5040 is provided on the third epitaxial stack 5040. The second insulating film 5083 may include various organic/inorganic insulating materials, but is not limited thereto. For example, the second insulating film 5083 may include inorganic insulating material including silicon nitride and silicon oxide, or organic insulating material including polyimide.

The first contact hole CH1 is formed in the second insulating film 5083 to expose an upper surface of the first n-type contact electrode 5021n provided in the first contact 5020C. The first scan line is connected to the first n-type contact electrode 5021n through the first contact hole CH1.

A third insulating film 5085 is provided on the second insulating film 5083. The third insulating film 5085 may include a material substantially the same as or different from the second insulating film 5083. The third insulating film 5085 may include various organic/inorganic insulating materials, but is not limited thereto.

The second and third scan lines 5130G and 5130B and the first and second bridge electrodes $BR_G$ and $BR_B$ are provided on the third insulating film 5085.

The third insulating film 5085 is provided with a second contact hole CH2 for exposing an upper surface of the second epitaxial stack 5030 at the second contact 5030C, that is, exposing the n-type semiconductor layer of the second epitaxial stack 5030, a third contact hole CH3 for exposing an upper surface of the third epitaxial stack 5040 at the third contact 5040C, that is, exposing an n-type semiconductor layer of the third epitaxial stack 5040, $4a^{th}$ and $4b^{th}$ contact holes CH4a and CH4b for exposing an upper surface of the first p-type contact electrode 5025p and an upper surface of the second p-type contact electrode 5035p, at the first common contact 5050GC, and 5a$^{th}$ and 5b$^t$ contact holes CH5a and CH5b for exposing an upper surface of the first p-type contact electrode 5025p and an upper surface of the third p-type contact electrode 5045p, at the second common contact 5050BC.

The second scan line 5130G is connected to the n-type semiconductor layer of the second epitaxial stack 5030 through the second contact hole CH2. The third scan line 5130B is connected to the n-type semiconductor layer of the third epitaxial stack 5040 through the third contact hole CH3.

The data line 5120 is connected to the second p-type contact electrode 5035p through the 4a$^{th}$ and 4b$^{th}$ contact holes CH4a and CH4b and the first bridge electrode BR$_G$. The data line 5120 is also connected to the third p-type contact electrode 5045p through the 5a$^{th}$ and 5b$^{th}$ contact holes CH5a and CH5b and the second bridge electrode BR$_B$.

It is illustrated herein that the second and third scan lines 5130G and 5130B in an exemplary embodiment are electrically connected to the n-type semiconductor layer of the second and third epitaxial stacks 5030 and 5040 in direct contact with each other. However, in another exemplary embodiment, the second and third n-type contact electrodes may be further provided between the second and third scan lines 5130G and 5130B and the n-type semiconductor layers of the second and third epitaxial stacks 5030 and 5040.

According to an exemplary embodiment, irregularities may be selectively provided on the upper surfaces of the first to third epitaxial stacks 5020, 5030, and 5040, that is, on an upper surface of the n-type semiconductor of the first to third epitaxial stacks. Each of the irregularities may be provided only at a portion corresponding to the light emitting region, or may be provided over the entire upper surface of the respective semiconductor layers.

In addition, in an exemplary embodiment, a substantially, non-transmissive film may be further provided on sides of the second and/or third insulating films 5083 and 5085 that correspond to the sides of the pixel. The non-transmissive film is a light blocking film that includes a light absorbing or reflective material, which is provided to prevent light from the first to third epitaxial stacks 5020, 5030, and 5040 from emerging through the sides of the pixel.

In an exemplary embodiment, the optically non-transmissive film may be formed as a single or multi-layered metal. For example, the optically non-transmissive film may be formed of a variety of materials including metals such as Al, Ti, Cr, Ni, Au, Ag, Ti, Sn, Ni, Cr, W, Cu or others, or alloys thereof.

The optically non-transmissive film may be provided on the side of the second insulating film 5083 as a separate layer formed of a material such as metal or alloy thereof.

The optically non-transmissive film may be provided in such a form that is laterally extending from at least one of the first to third scan lines 5130R, 5130G, and 5130B and the first and second bridge electrodes BR$_G$ and BR$_B$. In this case, the optically non-transmissive film extending from one of the first to third scan lines 5130R, 5130G, and 5130B and the first and second bridge electrodes BR$_G$ and BR$_B$ is provided within a limit such that it is not electrically connected to other conductive components.

In addition, a substantially, non-transmissive film may be provided, which is formed separately from the first to third scan lines 5130R, 5130G, and 5130B and the first and second bridge electrodes BR$_G$ and BR$_B$, on the same layer and using substantially the same material during the same process of forming at least one of the first to third scan lines 5130R, 5130G, and 5130B and the first and second bridge electrodes BR$_G$ and BR$_B$. In this case, the non-transmissive film may be electrically insulated from the first to third scan lines 5130R, 5130G, and 5130B and the first and second bridge electrodes BR$_G$ and BR$_B$.

Alternatively, when no optically non-transmissive film is separately provided, the second and third insulating films 5083 and 5085 may serve as optically non-transmissive films. When the second and third insulating films 5083 and 5085 are used as an optically non-transmissive film, the second and third insulating films 5083 and 5085 may not be provided in a region corresponding to an upper portion (front direction) of the first to third epitaxial stacks 5020, 5030, and 5040 to allow light emitted from the first to third epitaxial stacks 5020, 5030, and 5040 to travel to the front direction.

The substantially, non-transmissive film is not particularly limited as long as it blocks transmission of light by absorbing or reflecting light. In an exemplary embodiment, the non-transmissive film may be a distributed Bragg reflector (DBR) dielectric mirror, a metal reflective film formed on an insulating film, or an organic polymer film in black color. When a metal reflective film is used as the non-transmissive film, the metal reflective film may be in a floating state that is electrically isolated from the components within other pixels.

By providing the non-transmissive film on the sides of the pixels, it is possible to prevent the phenomenon in which light emitted from a certain pixel affects adjacent pixels, or in which color is mixed with light emitted from the adjacent pixels.

The pixel having the structure described above may be manufactured by sequentially stacking the first to third epitaxial stacks 5020, 5030, and 5040 on the substrate 5010 sequentially and patterning the same, which will be described in detail below.

Figure 84A:
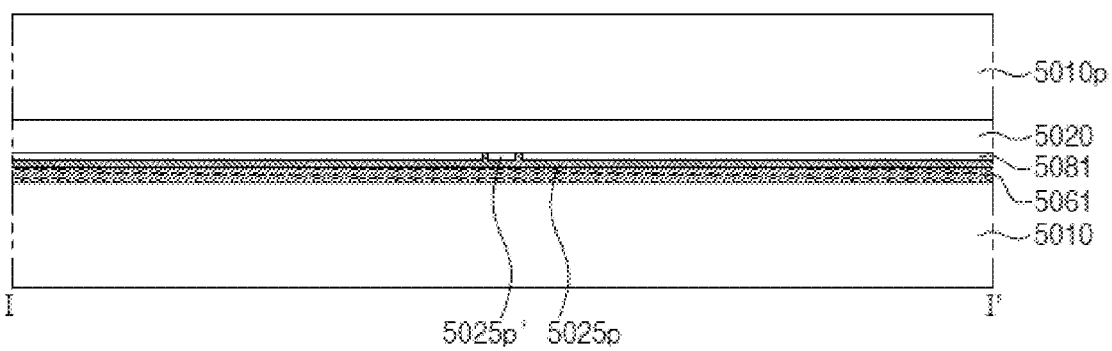
FIG. 84A, FIG. 84B, and FIG. 84C are cross-sectional views take along line I-I' of FIG. 82 according to an exemplary embodiment.
Figure 84B:
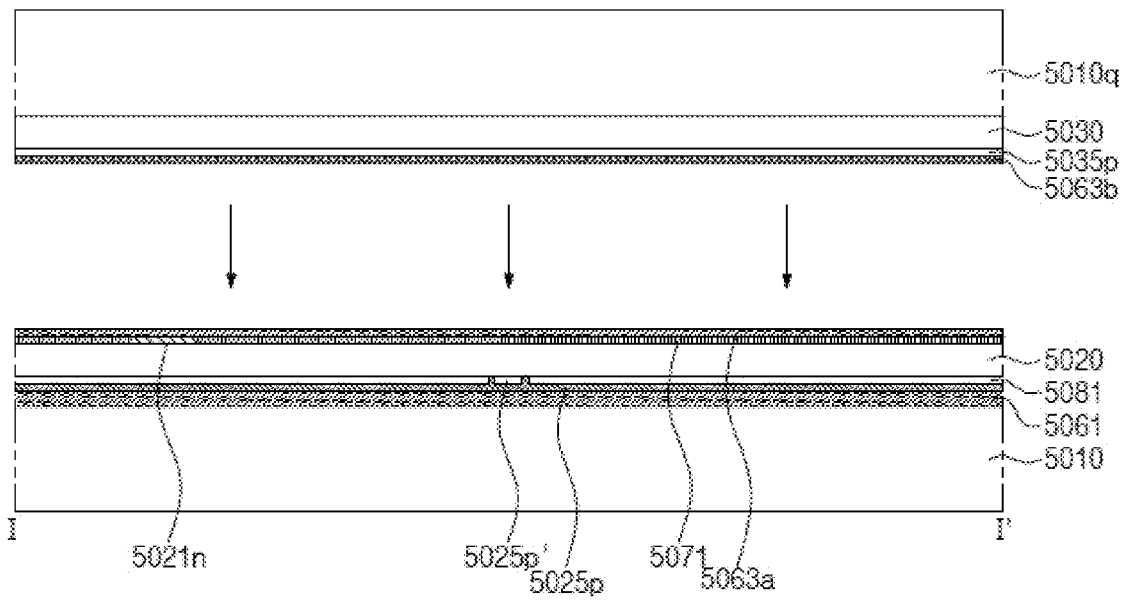
Figure 84C:
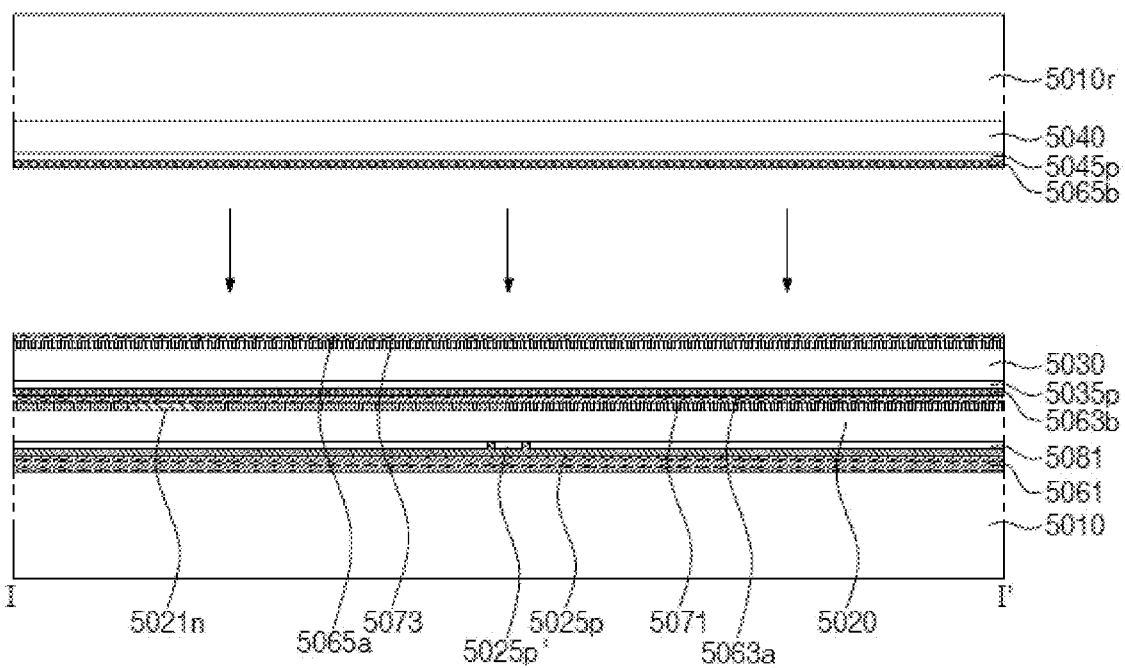

FIGS. 84A to 84C are cross-sectional views of line I-I' in FIG. 82, illustrating a process of stacking first to third epitaxial stacks on a substrate.

Referring to FIG. 84A, the first epitaxial stack 5020 is formed on the substrate 5010.

The first epitaxial stack 5020 and the ohmic electrode 5025p' are formed on a first temporary substrate 5010p. In an exemplary embodiment, the first temporary substrate 5010p may be a semiconductor substrate such as a GaAs substrate for forming the first epitaxial stack 5020. The first epitaxial stack 5020 is fabricated in a manner of stacking the n-type semiconductor layer, the active layer, and the p-type semiconductor layer on the first temporary substrate 5010p. The first insulating film 5081 having a contact hole formed thereon is formed on the first temporary substrate 5010p, and the ohmic electrode 5025p' is formed within the contact hole of the first insulating film 5081.

The ohmic electrode 5025p' is formed by forming the first insulating film 81 on the first temporary substrate 5010p, applying photoresist, patterning the photoresist, depositing an ohmic electrode 5025p' material on the patterned photoresist, and then lifting off the photoresist pattern. However, the method of forming the ohmic electrode 5025p' is not limited thereto. For example, the first insulating film 81 may be formed by forming the first insulating film 81, patterning the first insulating film 81 by photolithography, forming the ohmic electrode film 5025p' with the ohmic electrode film 5025p' material and then patterning the ohmic electrode film 5025p' by photolithography.

The first p-type contact electrode layer 5025p (also serving as the data line 5120) is formed on the first temporary substrate 5010p on which the ohmic electrode 5025p' is formed. The first p-type contact electrode layer 5025p may include a reflective material. The first p-type contact electrode layer 5025p may be formed by, for example, depositing a metallic material and then patterning the same using photolithography.

The first epitaxial stack 5020 formed on the first temporary substrate 5010p is inverted and attached to the substrate 5010 via the adhesive layer 5061 interposed therebetween.

After the first epitaxial stack 5020 is attached to the substrate 5010, the first temporary substrate 5010p is removed. The first temporary substrate 5010p may be removed by various methods such as wet etching, dry etching, physical removal, laser lift-off, or the like.

Referring to FIG. 84B, after the first temporary substrate 5010p is removed, the first n-type contact electrode 5021n, the first wavelength pass filter 5071, and the first adhesion enhancing layer 5063a are formed on the first epitaxial stack 5020. The first n-type contact electrode 5021n may be formed by depositing a conductive material and then patterning by the photolithography process. The first wavelength pass filter 5071 may be formed by alternately stacking insulating films having different refractive indices from each other.

After the removal of the first temporary substrate 5010p, irregularities may be formed on an upper surface (n-type semiconductor layer) of the first epitaxial stack 5020. The irregularities may be formed by texturing with various etching processes. For example, the irregularities may be formed by various methods such as dry etching using a micro photo process, wet etching using a crystal characteristic, texturing using a physical method such as sand blasting, ion beam etching, texturing based on difference in etching rates of block copolymers, or the like.

The second epitaxial stack 5030, the second p-type contact electrode layer 5035p, and the first shock absorbing layer 5063b are formed on a separate second temporary substrate 5010q.

The second temporary substrate 5010q may be a sapphire substrate. The second epitaxial stack 5030 may be fabricated by forming the n-type semiconductor layer, the active layer, and the p-type semiconductor layer on the second temporary substrate 5010q.

The second epitaxial stack 5030 formed on the second temporary substrate 5010q is inverted and attached onto the first epitaxial stack 5020. In this case, the first adhesion enhancing layer 5063a and the second shock absorbing layer 5063b may be disposed to face each other and then joined. In an exemplary embodiment, the first adhesion enhancing layer 5063a and the first shock absorbing layer 5063b may include various materials, such as SOG and silicon oxide, respectively.

After attachment, the second temporary substrate 5010q is removed. The second temporary substrate 5010q may be removed by various methods such as wet etching, dry etching, physical removal, laser lift-off, or the like.

According to an exemplary embodiment, in the process of attaching the second epitaxial stack 5030 formed on the second temporary substrate 5010q onto the substrate 5010, and in the process of removing the second temporary substrate 5010q from the second epitaxial stack 5030, the impact applied to the first epitaxial stack 5020, the second epitaxial stack 5030, the first wavelength pass filter 5071, and the second p-type contact electrode 5035p, is absorbed and/or relieved by the first buffer layer 5063, more particularly, by the first shock absorbing layer 5063b within the first layer 5063. This minimizes cracking and peel-off that may otherwise occur in the first epitaxial stack 5020, the second epitaxial stack 5030, the first wavelength pass filter 5071, and the second p-type contact electrode 5035p. More particularly, when the first wavelength pass filter 5071 is formed on the upper surface of the first epitaxial stack 5020, the possibility of having peel-off is remarkably reduced as compared to when the first wavelength pass filter 5071 is formed on the second epitaxial stack 5030 side. When the first wavelength pass filter 5071 is formed on the upper surface of the second epitaxial stack 5030 and then attached to the first epitaxial stack 5020 side, due to impact generated in the process of removing the second temporary substrate 5010q, there may be a peel-off defect of the first wavelength pass filter 5071. However, according to an exemplary embodiment, in addition to the first wavelength pass filter 5071 being formed on the first epitaxial stack 5020 side, the shock absorbing effect by the first shock absorbing layer 5063b may prevent the occurrence of defects, such as peel-off.

Referring to FIG. 84C, the second wavelength pass filter 5073 and the second adhesion enhancing layer 5065a are formed on the second epitaxial stack 5030 from which the second temporary substrate 5010q has been removed.

The second wavelength pass filter 5073 may be formed by alternately stacking insulating films having different refractive indices from each other.

Irregularities may be formed on an upper surface (n-type semiconductor layer) of the second epitaxial stack 5030 after the removal of the second temporary substrate. The irregularities may be textured through various etching processes, or may be formed by using a patterned sapphire substrate for the second temporary substrate.

The third epitaxial stack 5040, the third p-type contact electrode layer 5045p, and the second shock absorbing layer 5065b are formed on a separate third temporary substrate 5010r.

The third temporary substrate 5010r may be a sapphire substrate. The third epitaxial stack 5040 may be fabricated by forming the n-type semiconductor layer, the active layer, and the p-type semiconductor layer on the third temporary substrate 5010r.

The third epitaxial stack 5040 formed on the third temporary substrate 5010r is inverted and attached onto the second epitaxial stack 5030. In this case, the second adhesion enhancing layer 5065a and the second shock absorbing layer 5065b may be disposed to face each other and then joined. In an exemplary embodiment, the second adhesion enhancing layer 5065a and the second shock absorbing layer 5065b may include various materials, such as SOG and silicon oxide, respectively.

After attachment, the third temporary substrate 5010r is removed. The third temporary substrate 5010r may be removed by various methods such as wet etching, dry etching, physical removal, laser lift-off, or the like.

According to an exemplary embodiment, in the process of attaching the third epitaxial stack 5040 formed on the third temporary substrate 5010r onto the substrate 5010, and in the process of removing the third temporary substrate 5010r from the third epitaxial stack 5040, the impact applied to the second and third epitaxial stacks 5030 and 5040, the second wavelength pass filter 5073, and the third p-type contact electrode 5045p is absorbed and/or relieved by the second buffer layer 5065, in particular, by the second shock absorbing layer 5065b within the second buffer layer 5065.

Accordingly, all of the first to third epitaxial stacks 5020, 5030, and 5040 are stacked on the substrate 5010.

Irregularities may be formed on an upper surface (n-type semiconductor layer) of the third epitaxial stack 5040 after the removal of the second temporary substrate. The irregularities may be textured through various etching processes or may be formed by using a patterned sapphire substrate for the second temporary substrate 5010q.

Hereinafter, a method of manufacturing a pixel by patterning stacked epitaxial stacks according to an exemplary embodiment will be described.

FIGS. 85, 87, 89, 91, 93, 95, and 97 are plan views sequentially showing a method of manufacturing a pixel on a substrate according to an exemplary embodiment.

FIGS. 86A, 86B, 88A, 88B, 90A, 90B, 90C, 90D, 92A, 92B, 94A, 94B, 96A, 96B, 96C, 96D 98A, and 98B are views taken along line I-I' and line II-II' of corresponding figures, respectively.

Figure 85:
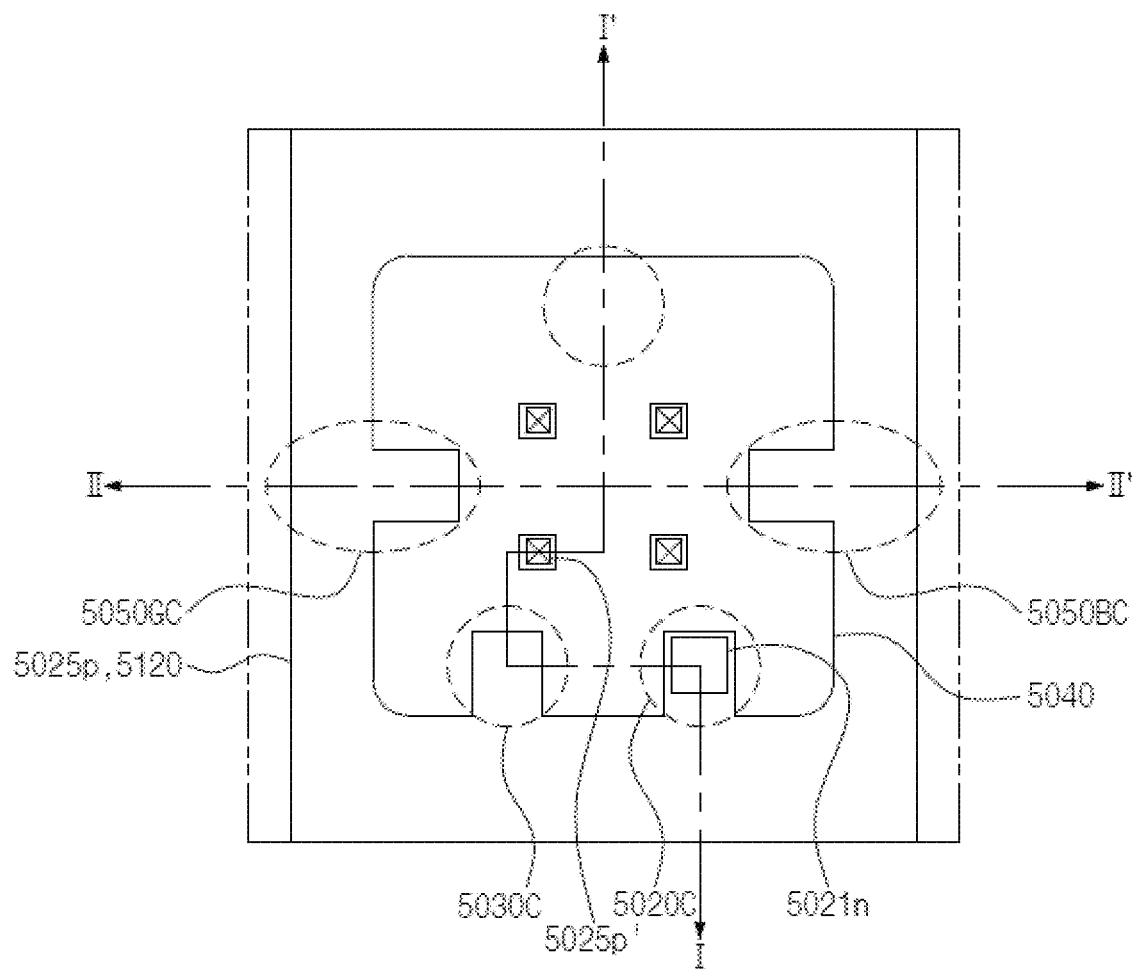
FIG. 85, FIG. 87, FIG. 89, FIG. 91, FIG. 93, FIG. 95, and FIG. 97 are plan views illustrating a method of manufacturing a pixel on a substrate according to an exemplary embodiment.
Figure 86A:
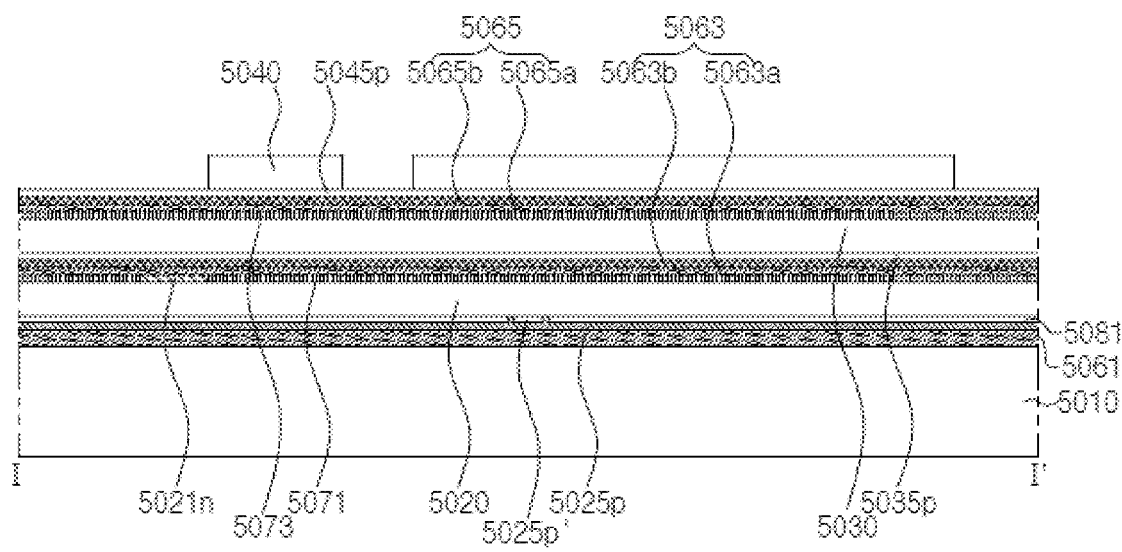
FIG. 86A and FIG. 86B are cross-sectional views taken along line I-I' and line II-II' of FIG. 85, respectively.
Figure 86B:
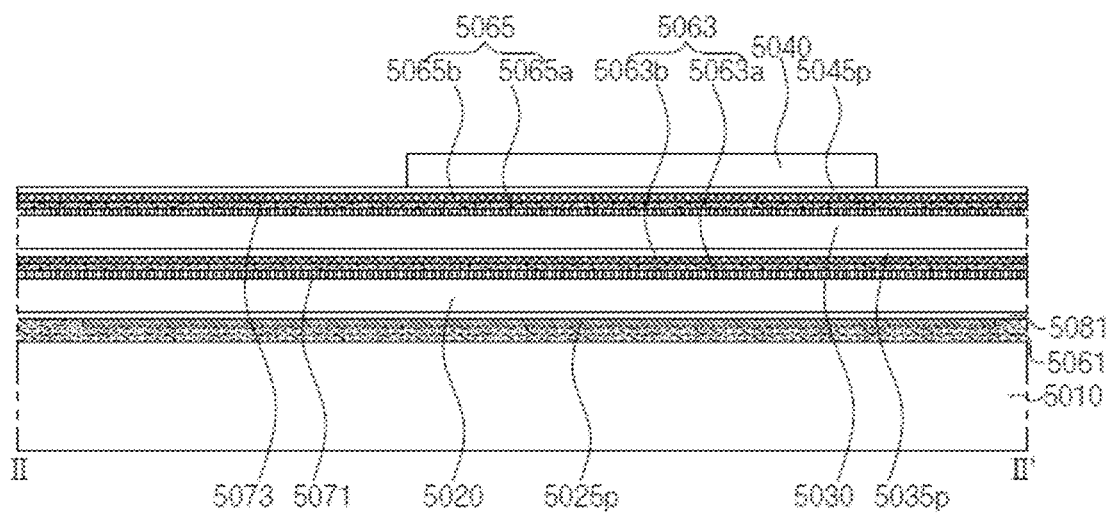

Referring to FIGS. 85, 86A and 86B, first, the third epitaxial stack 5040 is patterned. Most of the third epitaxial stack 5040 except for the light emitting region is removed and in particular, the portions corresponding to the first and second contacts 5030C and the first and second common contacts 5050GC and 5050BC are removed. The third epitaxial stack 5040 may be removed by various methods such as wet etching or dry etching using photolithography, and the third p-type contact electrode 5045p may function as an etch stopper.

Figure 87:
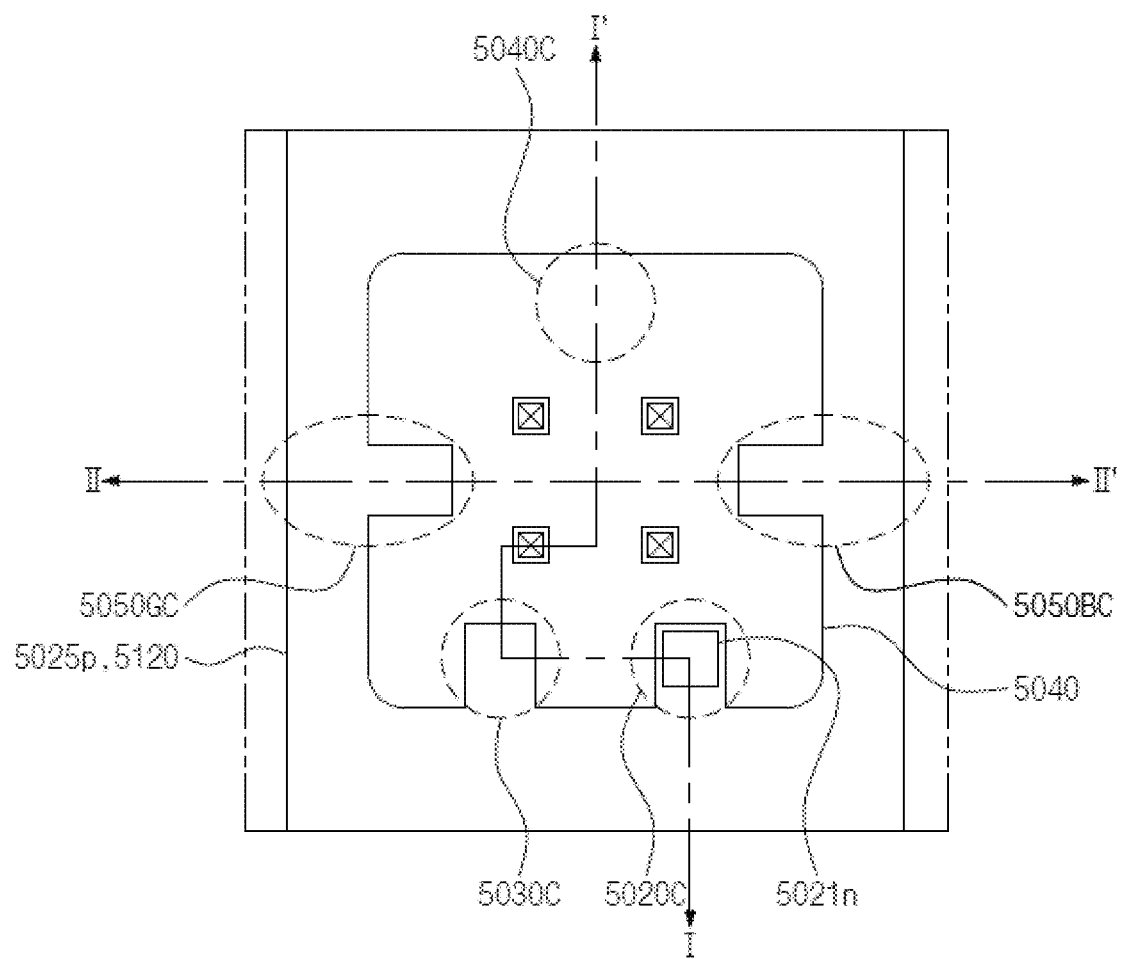
Figure 88A:
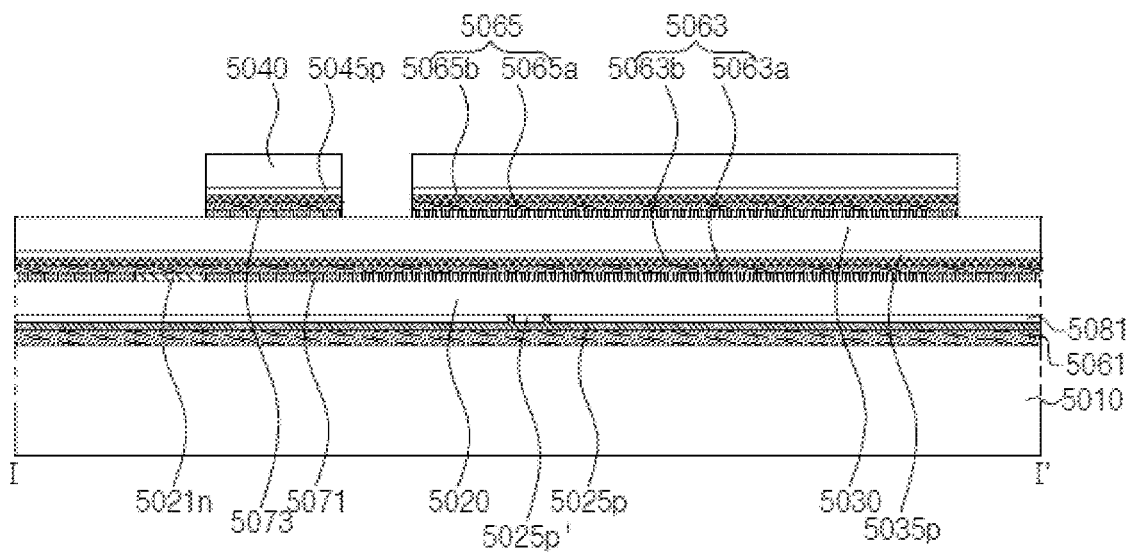
FIG. 88A and FIG. 88B are cross-sectional views taken along line I-I' and line II-II' of FIG. 87, respectively.
Figure 88B:
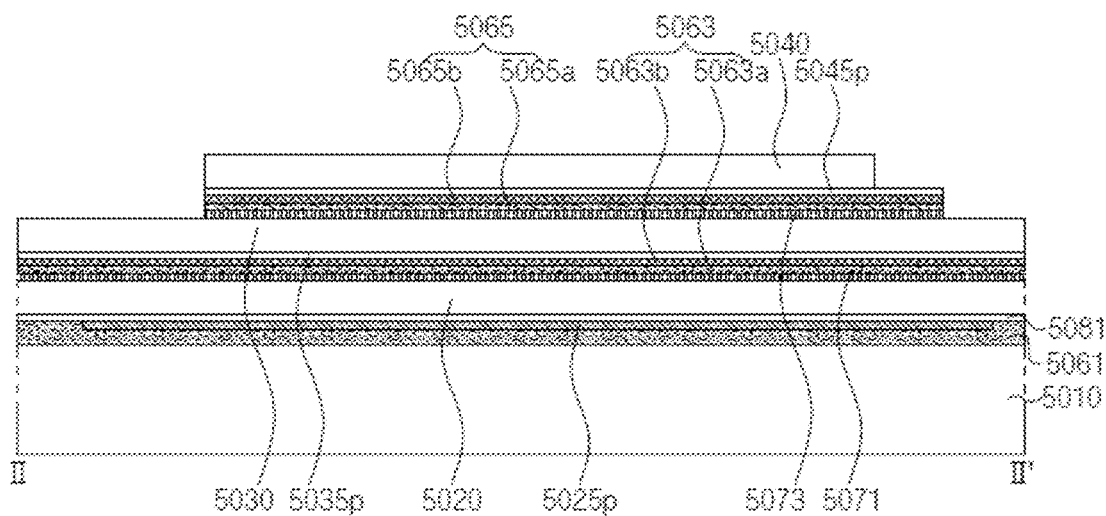
Figure 89:
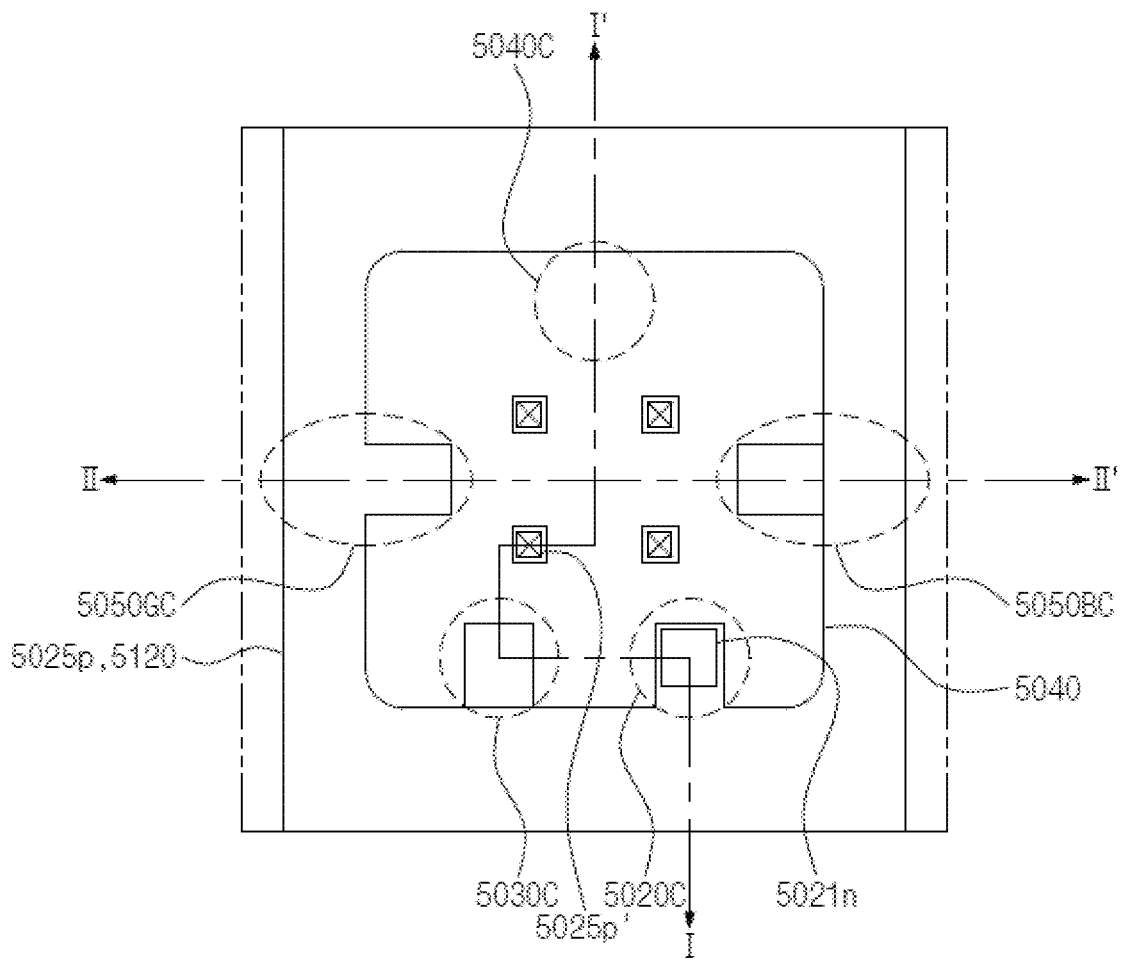
Figure 90A:
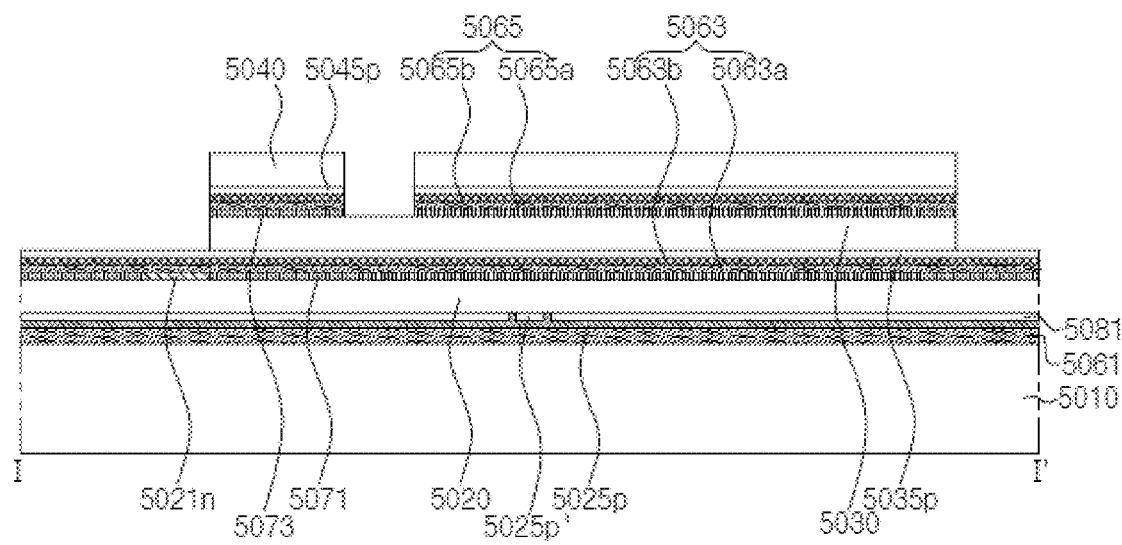
FIG. 90A, FIG. 90B, FIG. 90C, and FIG. 90D are cross-sectional views taken along line I-I' and line II-IF of FIG. 89, respectively.
Figure 90B:
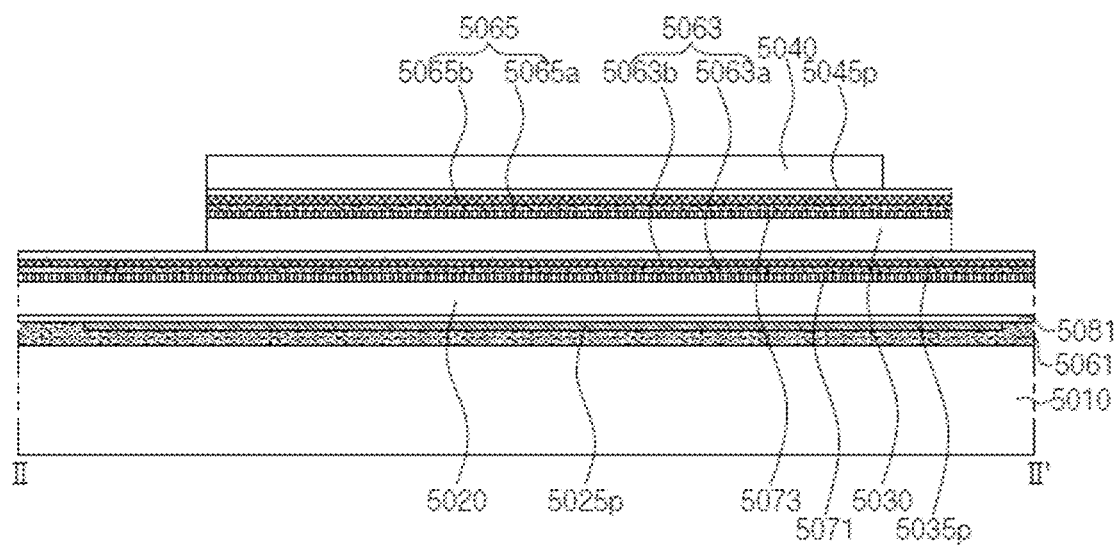
Figure 90C:
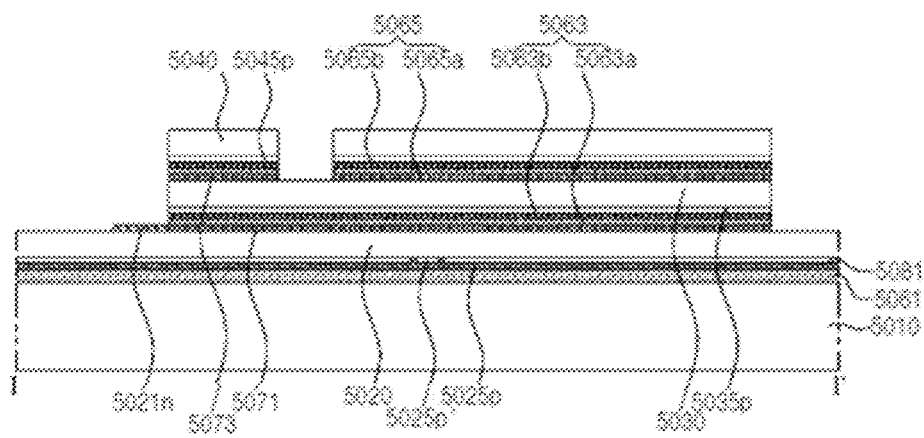
Figure 90D:
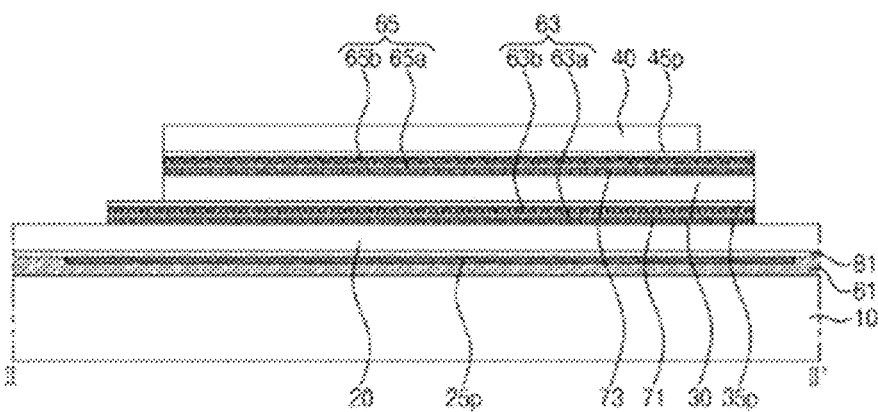

Referring to FIGS. 87, 88A, and 88B, the third p-type contact electrode 5045p, the second buffer layer 5065, and the second wavelength pass filter 5073 are removed from the region excluding the light emitting region. As such, a portion of the upper surface of the second epitaxial stack 5030 is exposed at the second contact 5030C.

The third p-type contact electrode 5045p, the second buffer layer 5065, and the second wavelength pass filter 5073 may be removed by various methods such as wet etching or dry etching using photolithography.

Referring to FIGS. 89, 90A, 90B, 90C, and 90D, a portion of the second epitaxial stack 5030 is removed, exposing a portion of the upper surface of the second p-type contact electrode 5035p at the second common contact 5050GC to the outside. The third p-type contact electrode 5045p serves as an etch stopper during etching.

Next, portions of the second p-type contact electrode 5035p, the first buffer layer 5063, and the first wavelength pass filter 5071 are etched. Accordingly, the upper surface of the first n-type contact electrode 5021n is exposed at the first contact 5020C, and the upper surface of the first epitaxial stack 5020 is exposed at the portions other than the light emitting region.

The second epitaxial stack 5030, the second p-type contact electrode 5035p, the first buffer layer 5063, and the first wavelength pass filter 5071 may be removed by various methods such as wet etching or dry etching using photolithography.

Figure 91:
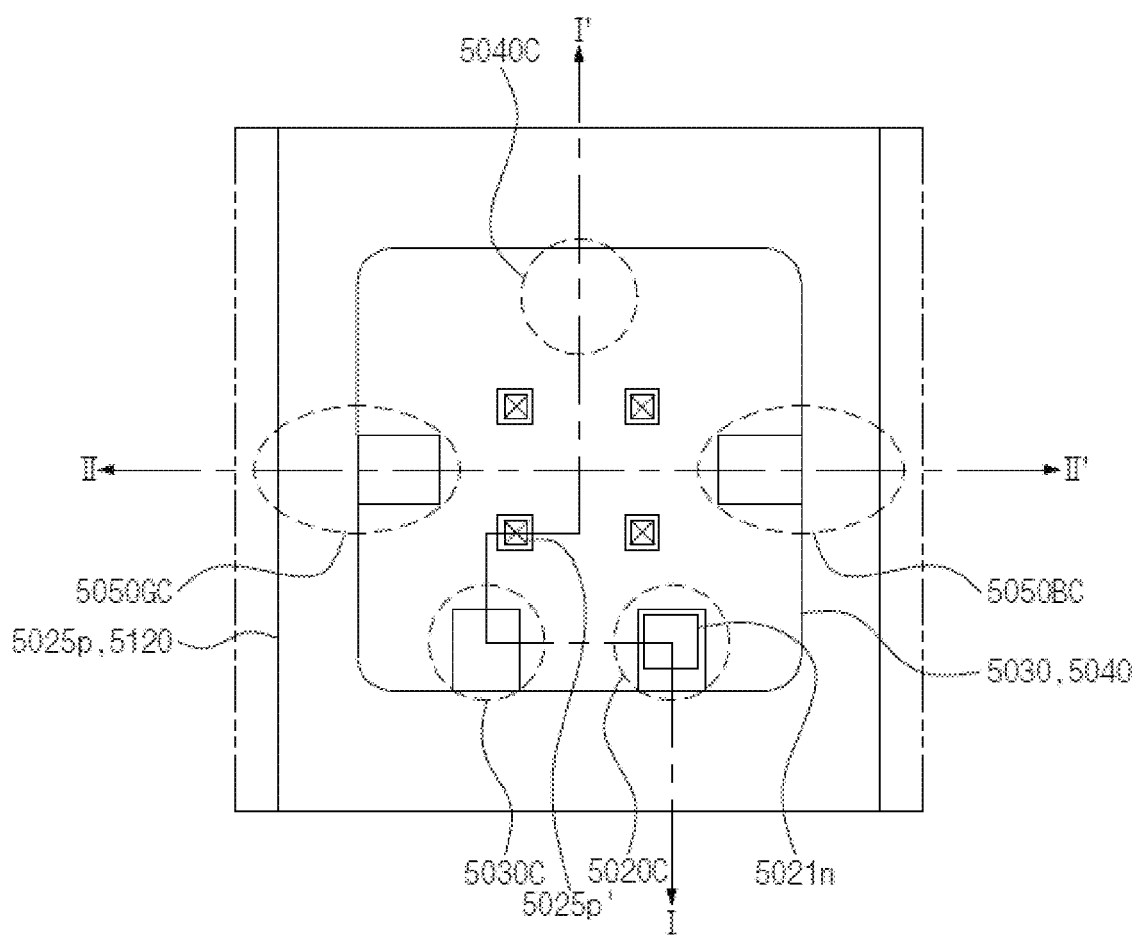
Figure 92A:
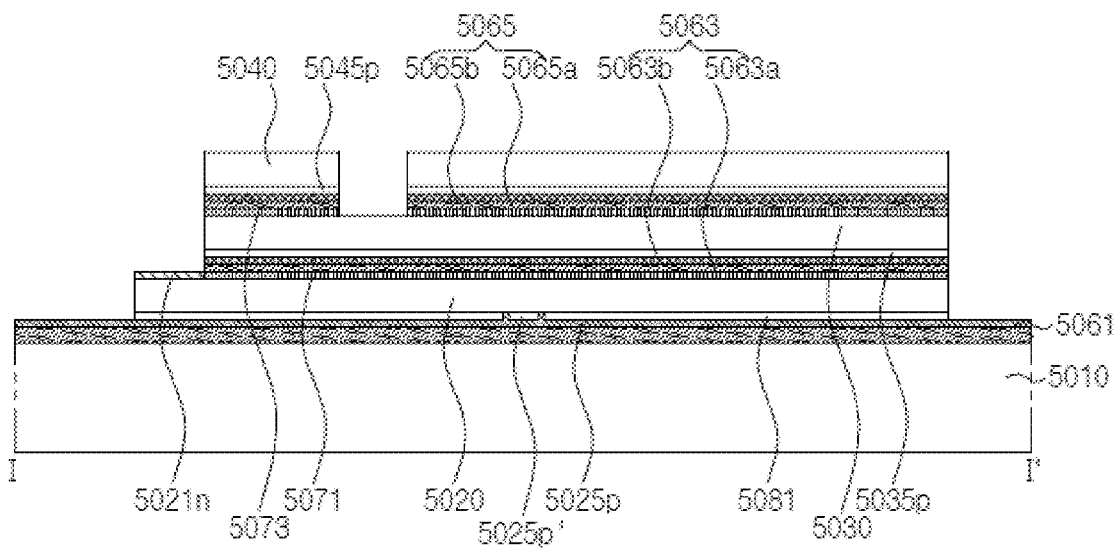
FIG. 92A and FIG. 92B are cross-sectional views taken along line I-I' and line II-II' of FIG. 91, respectively.
Figure 92B:
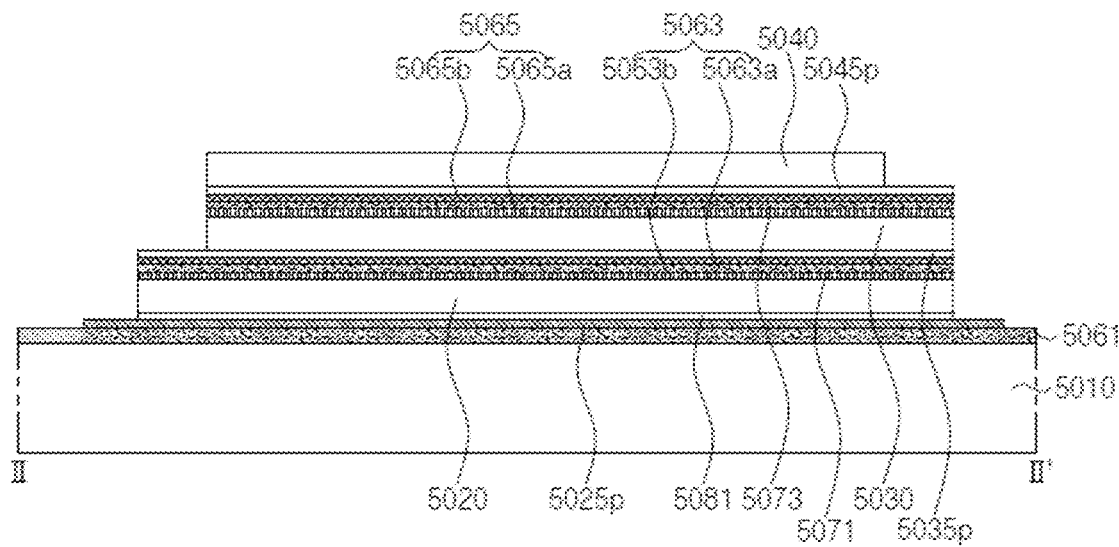

Referring to FIGS. 91, 92A, and 92B, the first epitaxial stack 5020 and the first insulating film 5081 are etched in the region excluding the light emitting region. The upper surface of the first p-type contact electrode 5025p is exposed at the first and second common contacts 5050GC and 5050BC.

Figure 93:
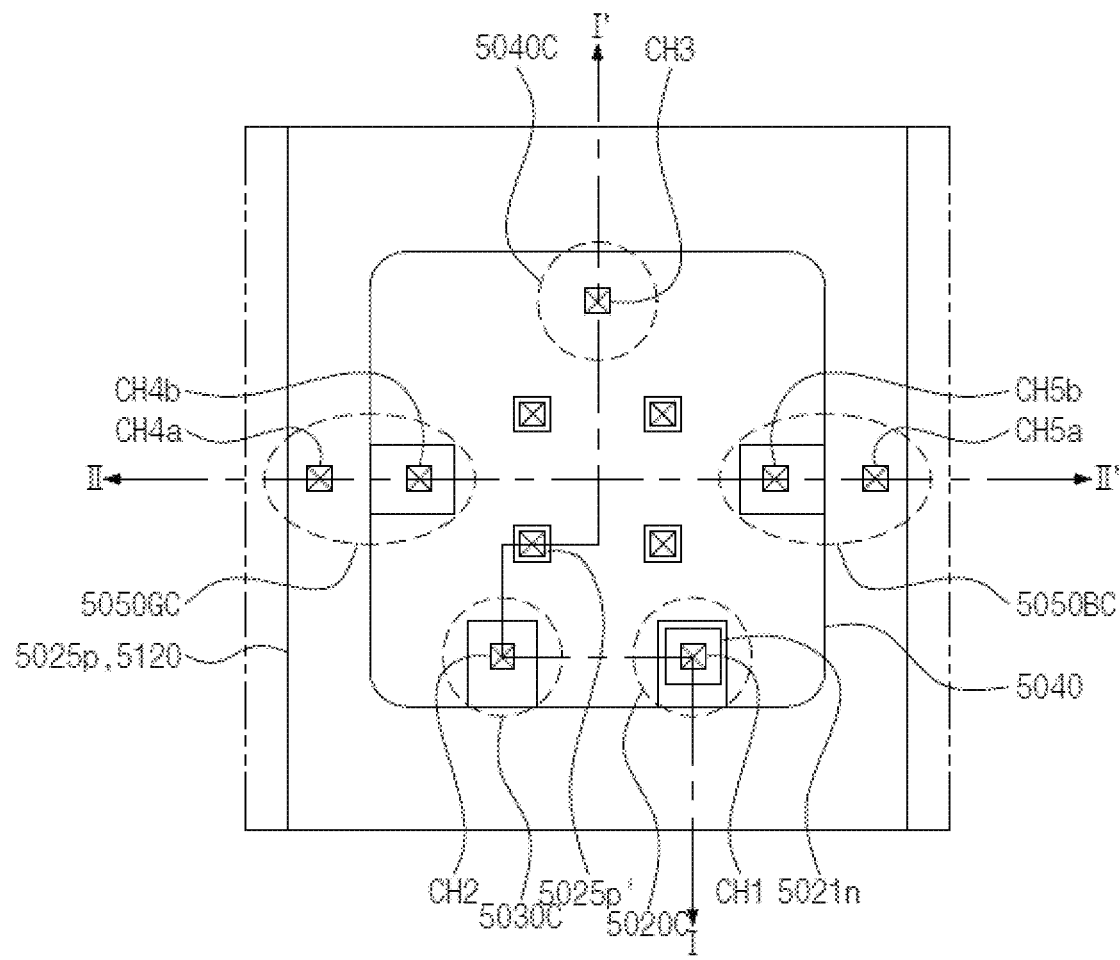
Figure 94A:
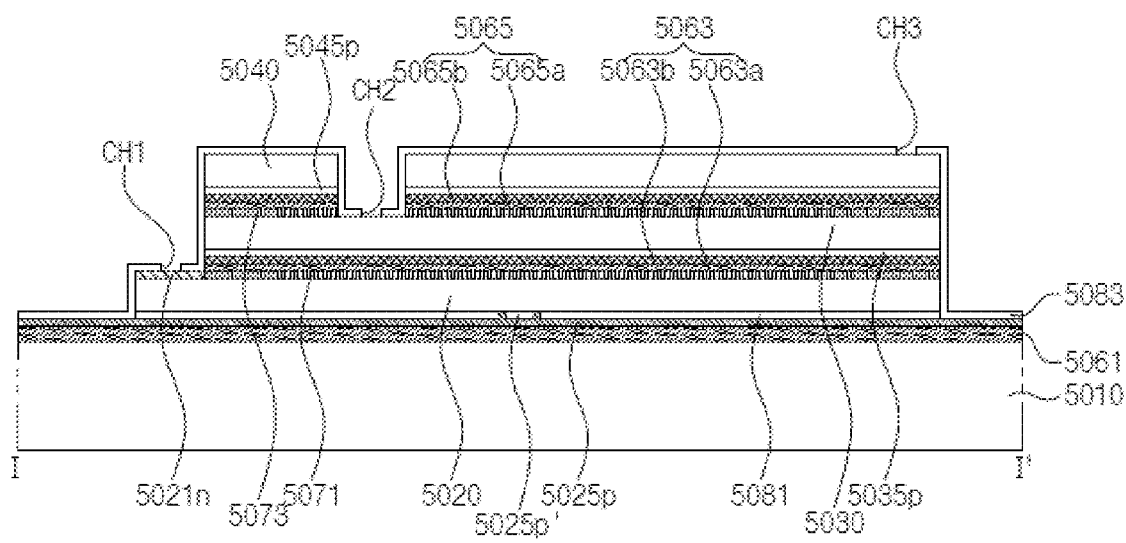
FIG. 94A and FIG. 94B are cross-sectional views taken along line I-I' and line II-II' of FIG. 93, respectively.
Figure 94B:
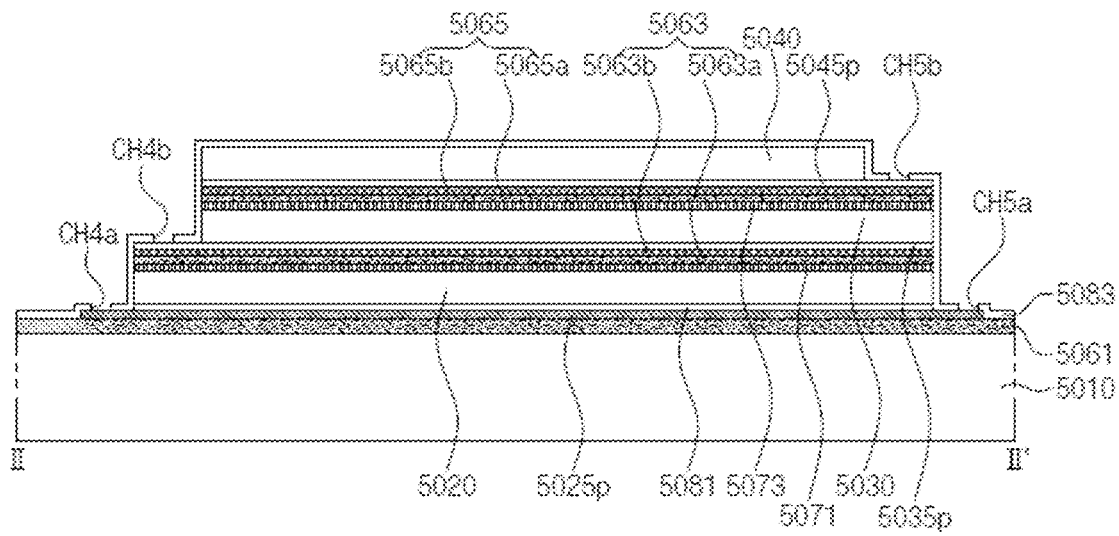
Figure 95:
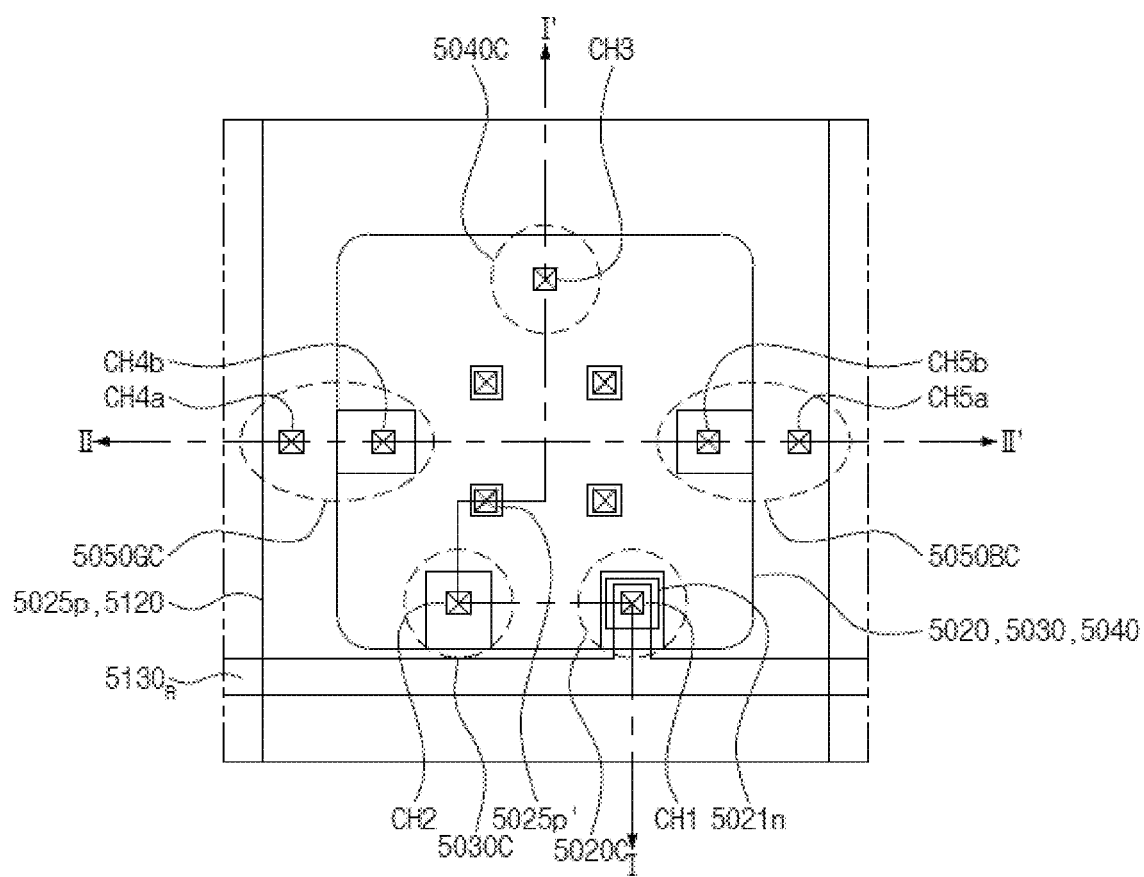
Figure 96A:
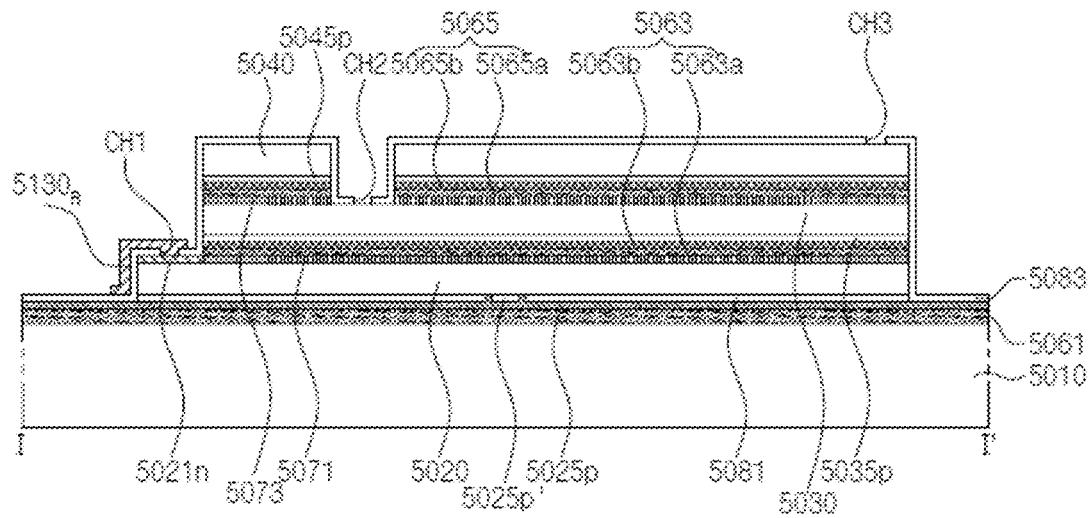
FIG. 96A, FIG. 96B, FIG. 96C, and FIG. 96D are cross-sectional views taken along line I-I' and line II-IF of FIG. 95, respectively.
Figure 96B:
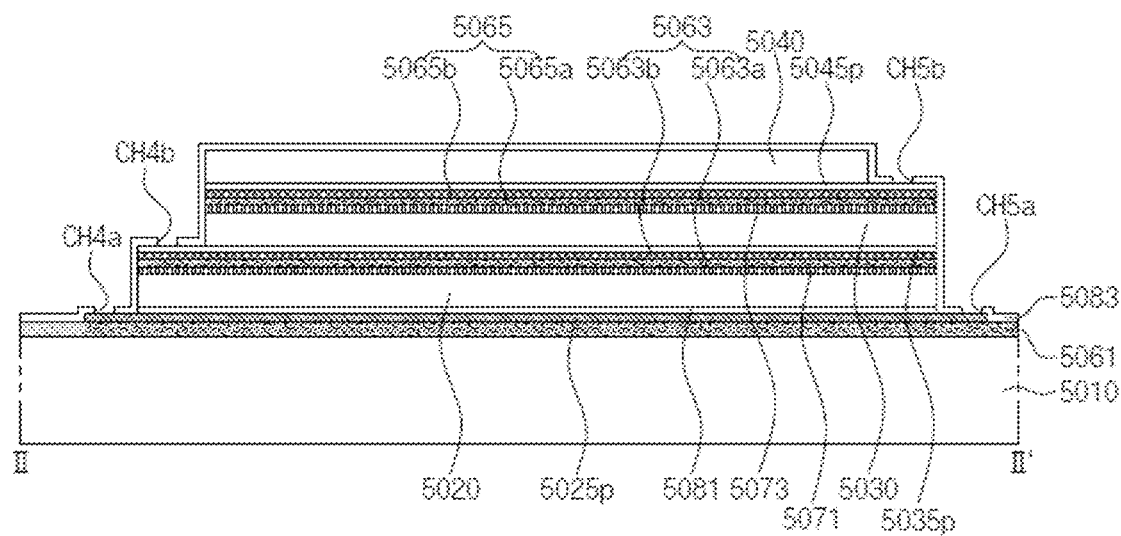
Figure 96C:
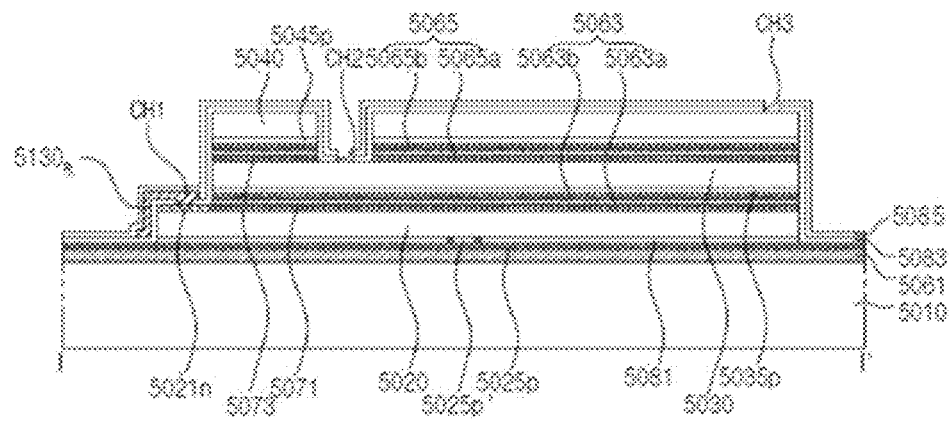
Figure 96D:
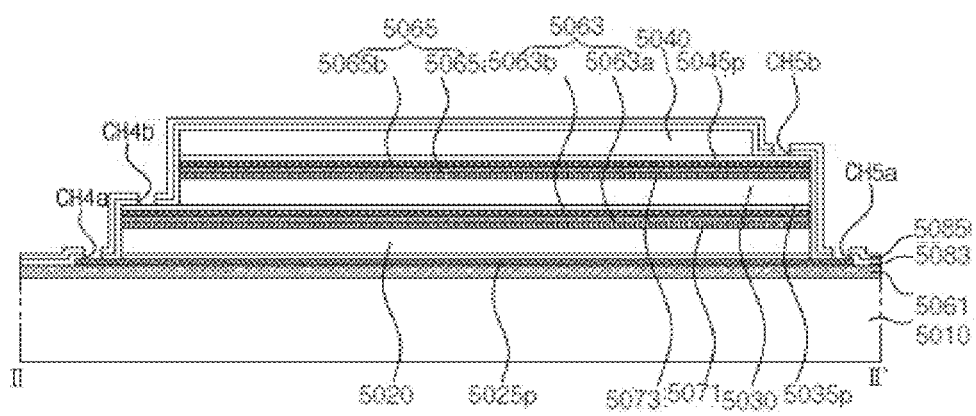

Referring to FIGS. 93, 94A, and 94B, the second insulating film 5083 is formed on the front side of the substrate 5010, and first to third contact holes CH1, CH2, CH3, the $4a^{th}$ and $4b^{th}$ contact holes CH4a and CH4b, and the $5a^{th}$ and $5b^{th}$ contact holes CH5a and CH5b are formed.

After deposition, the second insulating film 5083 may be patterned by various methods such as wet etching or dry etching using photolithography.

Referring to FIGS. 95, 96A, 96B, 96C, and 96D, the first scan line 5130R is formed on the patterned second insulating film 5083. The first scan line 5130R is connected to the first n-type contact electrode 5021n through the first contact hole CH1 at the first contact 5020C.

The first scan line 5130R may be formed in various ways. For example, the first scan line 5130R may be formed by photolithography using a plurality of sheets of masks.

Next, the third insulating film 5085 is formed on the front side of the substrate 5010, and the second and third contact holes CH2 and CH3, the $4a^{th}$ and $4b^{th}$ contact holes CH4a and CH4b, and the $5a^{th}$ and $5b^{th}$ contact holes CH5a and CH5b are formed.

After deposition, the third insulating film 5085 may be patterned by various methods such as wet etching or dry etching using photolithography.

Figure 97:
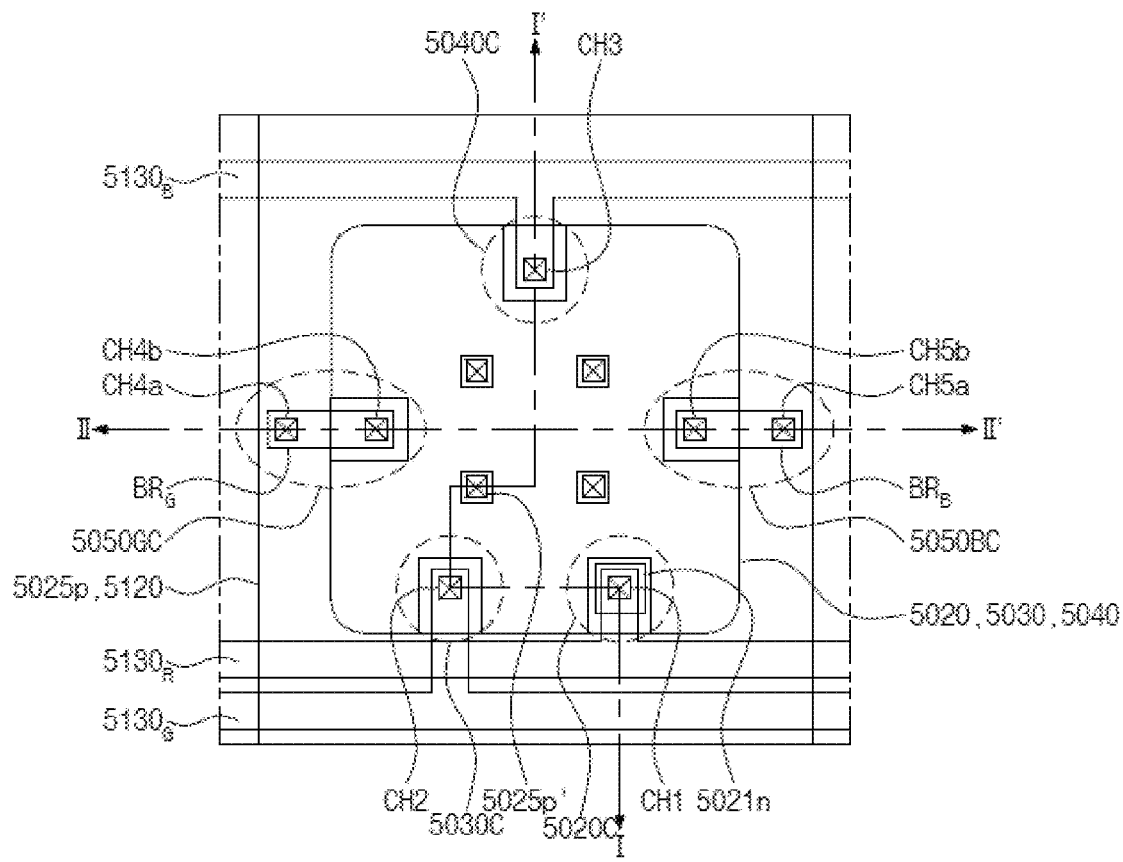
Figure 98A:
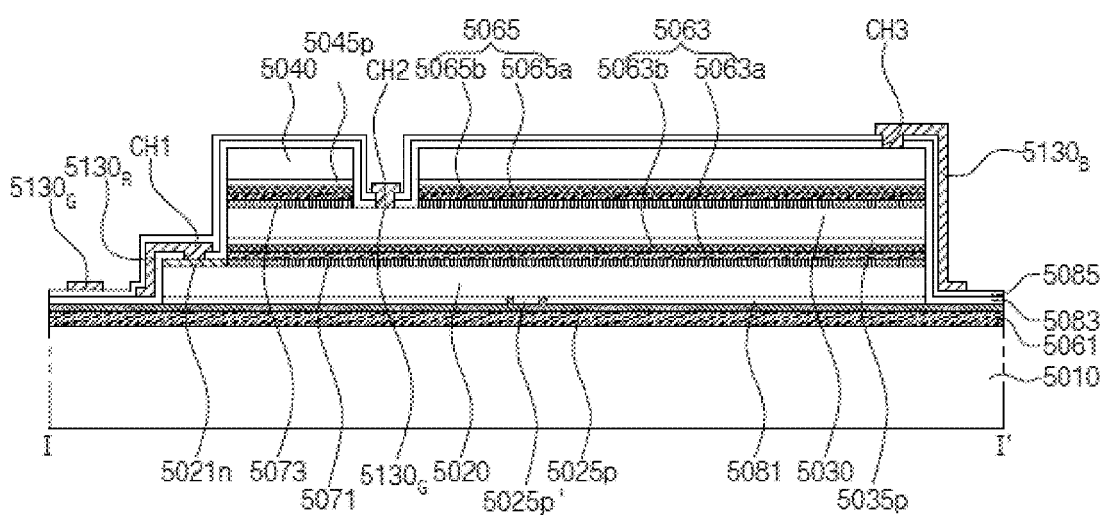
FIG. 98A and FIG. 98B are cross-sectional views taken along line I-I' and line II-II' of FIG. 97, respectively.
Figure 98B:
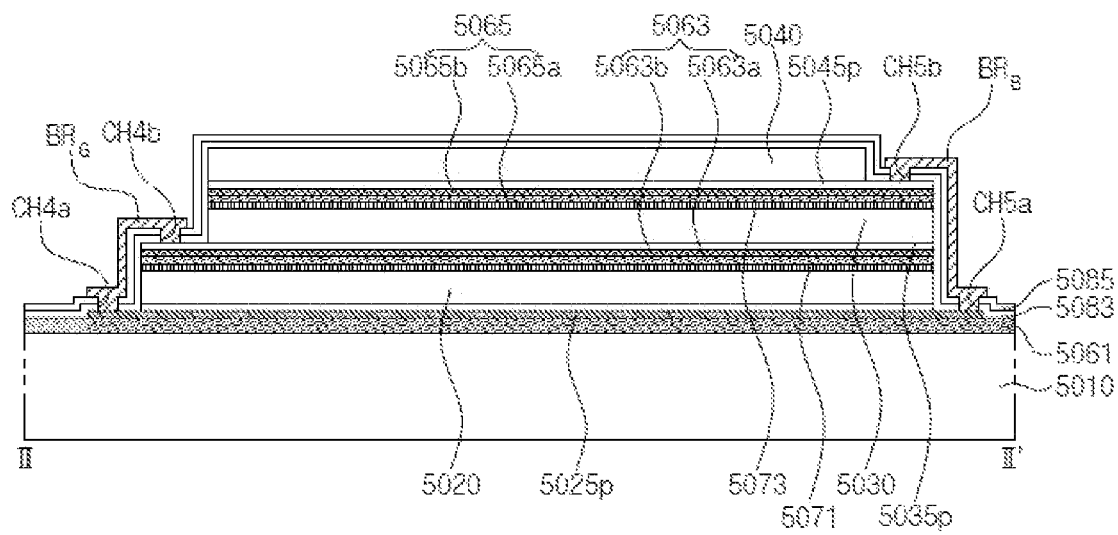

Referring to FIGS. 97, 98A, and 98B, the second scan line 5130G, the third scan line 5130B, the first bridge electrode $BR_G$, and the second bridge electrode $BR_B$ are formed on a patterned third insulating film 5085.

The second scan line 5130G is connected to the n-type semiconductor layer of the second epitaxial stack 5030 through the second contact hole CH2 at the second contact 5030C. The third scan line 5130B is connected to the n-type semiconductor layer of the fourth epitaxial stack 5040 through a third contact hole CH3 at the third contact 5040C. The first bridge electrode $BR_G$ is connected to the first p-type contact electrode 5025p through the $4a^{th}$ and $4b^{th}$ contact holes CH4a and CH4b at the first common contact 5050GC. The second bridge electrode $BR_B$ is connected to the first p-type contact electrode 5025p through the $5a^{th}$ and $5b^{th}$ contact holes CH5a and CH5b at the second common contact 5050BC.

The second scan line 5130G, the third scan line 5130B and the bridge electrode 5120b may be formed on the third insulating film 5085 in various ways, for example, by photolithography using a plurality of sheets of masks.

The second scan line 5130G, the third scan line 5130B and the first and second bridge electrodes $BR_G$ and $BR_B$ may be formed by applying photoresist on the substrate 5010 on which the third insulating film 5085 is formed, and then patterning the photoresist, and depositing materials of the second scan line, the third scan line, and the bridge electrode on the patterned photoresist and then lifting off the photoresist pattern.

According to an exemplary embodiment, the order of forming the first to third scan lines 5130R, 5130G, and 5130B and the first and second bridge electrodes $BR_G$ and $BR_B$ of the wiring part is not particularly limited, and may be formed in various sequences. For example, it is illustrated that the second scan line 5130G, the third scan line 5130B, and the first and second bridge electrodes $BR_G$ and $BR_B$ are formed on the third insulating film 5085 in the same stage, but they may be formed in a different order. For example, the first scan line 5130R and the second scan line 5130G may be first formed in the same step, followed by the formation of the additional insulating film and then the third scan line 5130B. Alternatively, the first scan line 5130R and the third scan line 5130B may be formed first in the same step, followed by the formation of the additional insulating film, and then the formation of the second scan line 5130G. In addition, the first and second bridge electrodes $BR_G$ and $BR_B$ may be formed together at any of the steps of forming the first to third scan lines 5130R, 5130G, and 5130B.

In addition, in an exemplary embodiment, the positions of the contacts of the respective epitaxial stacks 5020, 5030, and 5040 may be formed differently, in which case the positions of the first to third scan lines 5130R, 5130G, and 5130B and the first and second bridge electrodes $BR_G$ and $BR_B$ may also be changed.

In an exemplary embodiment, an optically non-transmissive film may be further provided on the second insulating film 5083 or the third insulating film 5085, on the fourth insulating film corresponding to the side of the pixel. The optically non-transmissive film may be formed of a DBR dielectric mirror, a metal reflective film on an insulating film, or an organic polymer film. When a metal reflective film is used as the optically non-transmissive film, it is manufactured in a floating state that is electrically insulated from the components in other pixels. In an exemplary embodiment, the optically non-transmissive film may be formed by depositing two or more insulating films with refractive indices different from each other. For example, the optically non-transmissive film may be formed by stacking a material having a low refractive index and a material having a high refractive index in sequence, or alternatively, formed by alternately stacking insulating films having different refractive indices from each other. Materials having different refractive indices are not particularly limited, but examples thereof include $SiO_2$ and $SiN_x$.

As described above, in a display device according to an exemplary embodiment, it is possible to sequentially stack a plurality of epitaxial stacks and then form contacts with a wiring part at a plurality of epitaxial stacks at the same time.

Figure 99:
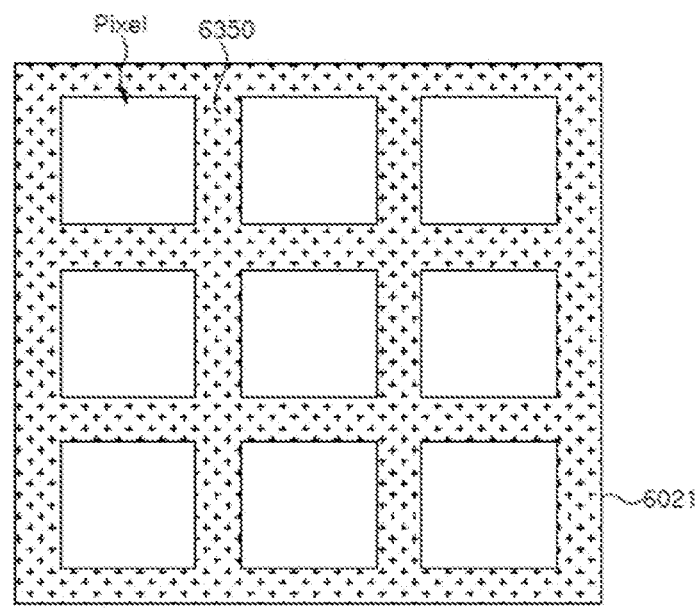
FIG. 99 is a schematic plan view of a display apparatus according to an exemplary embodiment.
Figure 100A:
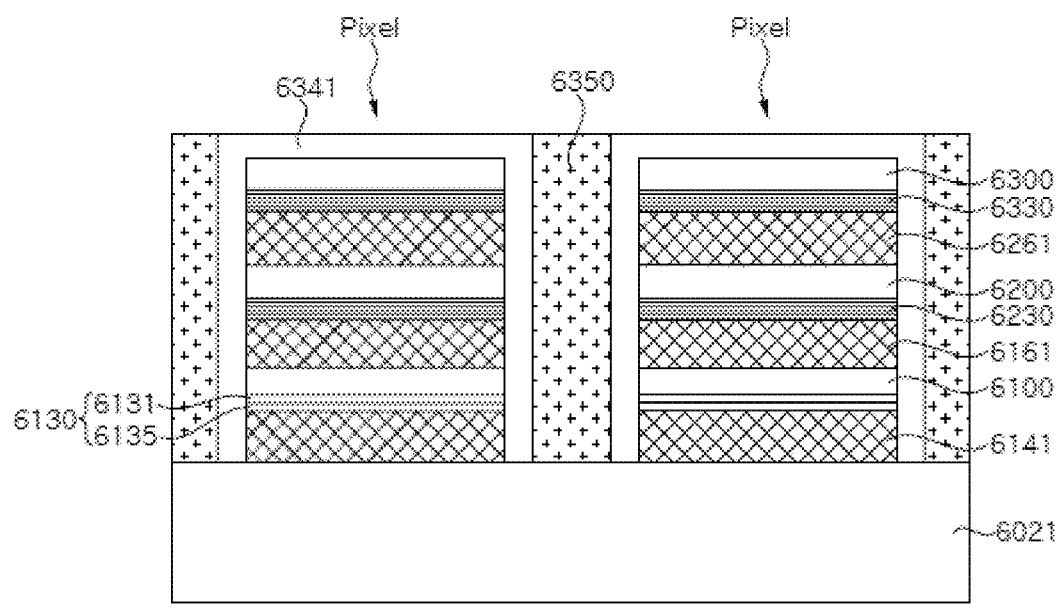
FIG. 100A is a partial cross-sectional view of the display apparatus of FIG. 99.
Figure 100B:
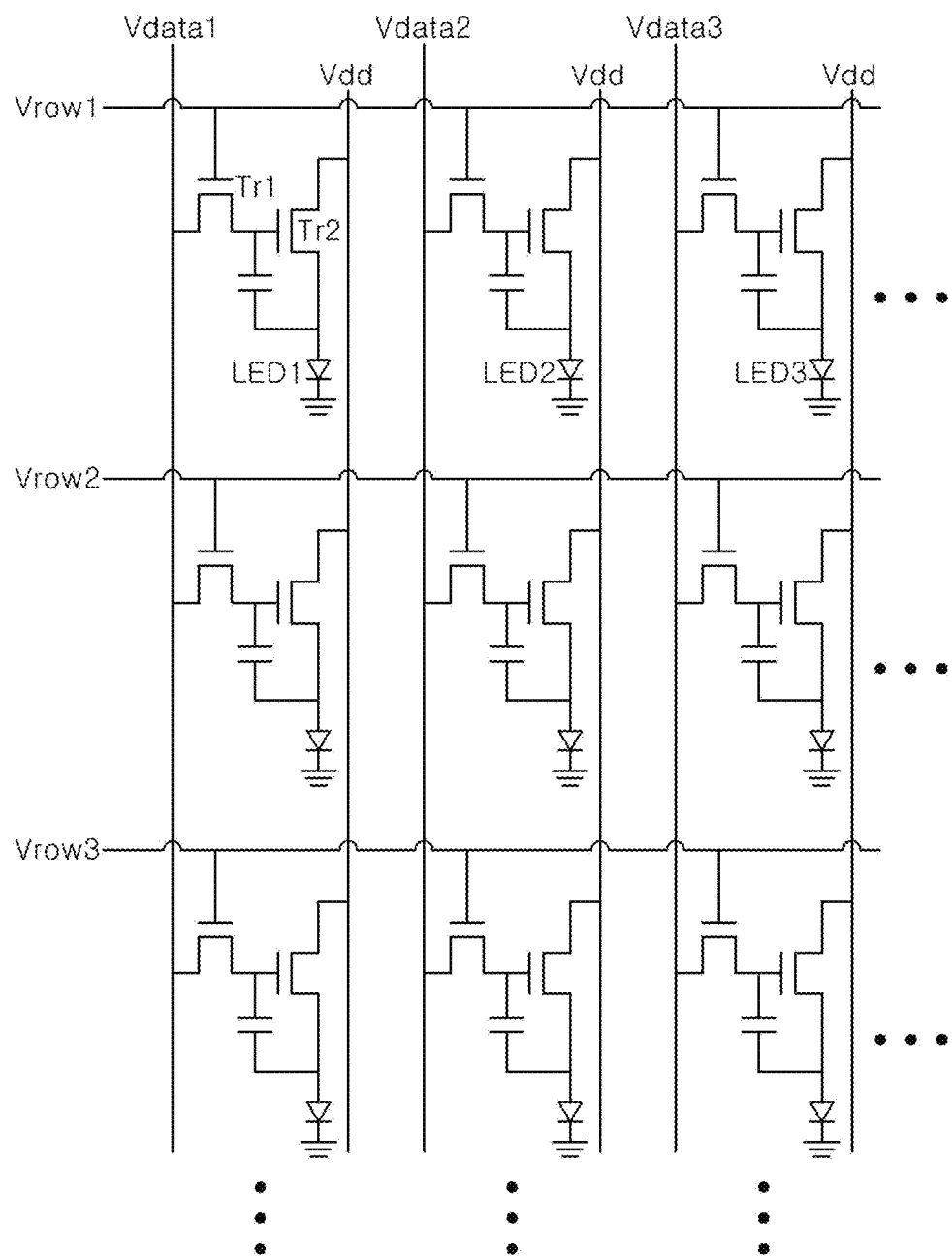
FIG. 100B is a schematic circuit diagram of a display apparatus according to an exemplary embodiment.

FIG. 99 is a schematic plan view of a display apparatus according to an embodiment, FIG. 100A is a partial cross-sectional view of FIG. 99, and FIG. 100B is a schematic circuit diagram.

Referring to FIGS. 99 and 100A, the display apparatus may include a substrate 6021, a plurality of pixels, a first LED stack 6100, a second LED stack 6200, a third LED stack 6300, an insulating layer (or a buffer layer) 6130 having a multilayer structure, a first color filter 6230, a second color filter 6330, a first adhesive layer 6141, a second adhesive layer 6161, a third adhesive layer 6261, and a barrier 6350. In addition, the display apparatus may include various electrode pads and connectors.

The substrate 6021 supports LED stacks 6100, 6200, and 6300. Further, the substrate 6021 may have a circuit therein. For example, the substrate 6021 may be a silicon substrate in which thin film transistors are formed therein. TFT substrates are widely used for active matrix driving of a display field, such as in an LCD display field, or the like. Since a configuration of a TFT substrate is well known in the art, detailed descriptions thereof will be omitted. A plurality of pixels may be driven in an active matrix manner, but the inventive concepts are not limited thereto. In another exemplary embodiment, the substrate 6021 may include a passive circuit including data lines and scan lines, and thus, the plurality of pixels may be driven in a passive matrix manner.

A plurality of pixels may be arranged on the substrate 6021. The pixels may be spaced apart from each other by a barrier 6350. The barrier 6350 may be formed of a light reflecting material, a light absorbing material, or a mixture thereof. The barrier 6350 may block light traveling toward a neighboring pixel region by reflection or absorption, thereby preventing light interference between pixels. Examples of the light reflecting material may include a light reflecting material, such as a white photo sensitive solder resistor (PSR), and examples of the light absorbing material may include black epoxy, or others.

Each pixel includes the first to third LED stacks 6100, 6200, and 6300. The second LED stack 6200 is disposed on the first LED stack 6100 and the third LED stack 6300 is disposed on the second LED stack 6200.

The first LED stack 6100 includes an n-type semiconductor layer 6123 and a p-type semiconductor layer 6125, the second LED stack 6200 includes an n-type semiconductor layer 6223 and a p-type semiconductor layer 6225, and the third LED stack 6300 includes an n-type semiconductor layer 6323 and a p-type semiconductor layer 6325. In addition, the first to third LED stacks 6100, 6200, and 6300 each include an active layer interposed between the n-type semiconductor layer 6123, 6223, or 6323 and the p-type semiconductor layer 6125, 6225 or 6325. The active layer may have, in particular, a multiple quantum well structure.

As an LED stack is positioned closer to the substrate 6021, the LED stack may emit light with a longer wavelength. For example, the first LED stack 6100 may be an inorganic light emitting diode that emits red light, the second LED stack 6200 may be an inorganic light emitting diode that emits green light, and the third LED stack 6300 may be an inorganic light emitting diode that emits blue light. For example, the first LED stack 6100 may include an AlGaInP-based well layer, the second LED stack 6200 may include an AlGaInP-based or AlGaInN-based well layer, and the third LED stack 6300 may include an AlGaInN-based well layer. However, the inventive concepts are not limited thereto. In particular, when LED stacks include micro LEDs, an LED stack disposed closer to the substrate 6021 may emit light with a shorter wavelength, and LED stacks disposed thereon may emit light with a longer wavelength without adversely affection operation or requiring color filters due to the small form factor of a micro LED.

An upper surface of each of the first to third LED stacks 6100, 6200, and 6300 may be n-type and a lower surface thereof may be p-type. According to some exemplary embodiments, however, that the semiconductor types of the upper surface and the lower surface of each of the LED stacks may be reversed.

When the upper surface of the third LED stack 6300 is n-type, the upper surface of the third LED stack 6300 may be surface textured through chemical etching to form a roughened surface (or irregularities). The upper surface of the first LED stack 6100 and the second LED stack 6200 may also be roughened by surface texturing. Meanwhile, when the second LED stack 6200 emits green light, since the green light has higher visibility than the red light or the blue light, it is preferable to increase light emitting efficiency of the first LED stack 6100 and the third LED stack 6300 as compared to that of the second LED stack 6200. Thus, surface texturing may be applied to the first LED stack 6100 and the third LED stack 6300 to improve light extraction efficiency, and the second LED stack 6200 may be used without surface texturing to adjust the intensity of red, green, and blue light to similar levels.

Light generated in the first LED stack 6100 may be transmitted through the second and third LED stacks 6200 and 6300 and emitted to the outside. In addition, since the second LED stack 6200 emits light at a longer wavelength than the third LED stack 6300, light generated in the second LED stack 6200 may be transmitted through the third LED stack 6300 and emitted to the outside.

The first color filter 6230 may be disposed between the first LED stack 6100 and the second LED stack 6200. In addition, the second color filter 6330 may be disposed between the second LED stack 6200 and the third LED stack 6300. The first color filter 6230 transmits light generated in the first LED stack 6100 and reflects light generated in the second LED stack 6200. The second color filter 6330 transmits light generated in the first and second LED stacks 6100 and 6200 and reflects light generated in the third LED stack 6300. Thus, light generated in the first LED stack 6100 may be emitted to the outside through the second LED stack 6200 and the third LED stack 6300, and light generated in the second LED stack 6200 may be emitted to the outside through the third LED stack 6300. Further, it is possible to prevent light generated in the second LED stack 6200 from being incident on the first LED stack 6100 and lost, or light generated in the third LED stack 6300 from being incident on the second LED stack 6200 and lost.

In some exemplary embodiments, the first color filter 6230 may reflect light generated in the third LED stack 6300.

The first and second color filters 6230 and 6330 may be, for example, a low pass filter that passes through only a low frequency region, that is, a long wavelength region, a band pass filter that passes through only a predetermined wavelength band, or a band stop filter that blocks only the predetermined wavelength band. In particular, the first and second color filters 6200 and 6300 may be formed by alternately stacking the insulating layers having different refractive indices. For example, the first and second color filters 6200 and 6300 may be formed by alternately stacking $TiO_2$ and $SiO_2$. In particular, the first and second color filters 6200 and 6300 may include a distributed Bragg reflector (DBR). The stop band of the distributed Bragg reflector may be controlled by adjusting a thickness of $TiO_2$ and $SiO_2$. The low pass filter and the band pass filter may also be formed by alternately stacking the insulating layers having different refractive indices.

The first adhesive layer 6141 is disposed between the substrate 6021 and the first LED stack 6100 and bonds the first LED stack 6100 to the substrate 6021. The second adhesive layer 6161 is disposed between the first LED stack 6100 and the second LED stack 6200 and bonds the second LED stack 6200 to the first LED stack 6100. Further, the third adhesive layer 6261 is disposed between the second LED stack 6200 and the third LED stack 6300 and bonds the third LED stack 6300 to the second LED stack 6200.

As shown, the second adhesive layer 6161 may be disposed between the first LED stack 6100 and the first color filter 6230, and may contact the first color filter 6230. The second adhesive layer 6161 transmits light generated in the first LED stack 6100.

The third adhesive layer 6261 may be disposed between the second LED stack 6200 and the second color filter 6330, and may contact the second color filter 6330. The second adhesive layer 6161 transmits light generated in the first LED stack 6100 and the second LED stack 6200.

Each of the first to third adhesive layers 6141, 6161, and 6261 is formed of an adhesive material that may be patterned. These adhesive layers 6141, 6161, and 6261 may include, for example, epoxy, polyimide, SUB, spin-on glass (SOG), benzocyclobutene (BCB), or others, but are not limited thereto.

A metal bonding material may be disposed in each of the adhesive layers 6141, 6161, and 6261, which is described in more detail below.

The insulating layer 6130 is disposed between the first adhesive layer 6141 and the first LED stack 6100. The insulating layer 6130 has a multilayer structure and may include a first insulating layer 6131 in contact with the first LED stack 6100 and a second insulating layer 6135 in contact with the first adhesive layer 6141. The first insulating layer 6131 may be formed of a silicon nitride film ($SiN_x$ layer), and the second insulating layer 6135 may be formed of a silicon oxide film ($SiO_2$ layer). Since the silicon nitride film has strong adhesive force to the GaP-based semiconductor layer and the $SiO_2$ layer has strong adhesive force to the first adhesive layer 6141, the first LED stack 6100 may be stably fixed on the substrate 6021 by stacking the silicon nitride film and the $SiO_2$ layer.

According to an exemplary embodiment, a distributed Bragg reflector may be further disposed between the first insulating layer 6131 and the second insulating layer 6135. The distributed Bragg reflector prevents light generated in the first LED stack 6100 from being absorbed into the substrate 6021, thereby improving light efficiency.

In FIG. 100A, while the first adhesive layer 6141 is shown and described as being divided into each pixel unit by the barrier 6350, the first adhesive layer 6141 may be continuous over a plurality of pixels in some exemplary embodiments. The insulating layer 6130 may also be continuous over a plurality of pixels.

The first to third LED stacks 6100, 6200, and 6300 may be electrically connected to a circuit in the substrate 6021 using electrode pads, connectors, and ohmic electrodes, and thus, for example, a circuit as shown in FIG. 100B may be implemented. The electrode pads, connectors, and ohmic electrodes are described in more detail below.

FIG. 100B is a schematic circuit diagram of a display apparatus according to an exemplary embodiment.

Referring to FIG. 100B, a driving circuit according to an exemplary embodiment may include two or more transistors Tr1 and Tr2 and a capacitor. When power supply is connected to selection lines Vrow1 to Vrow3 and a data voltage is applied to the data lines Vdata1 to Vdata3, a voltage is applied to the corresponding light emitting diode. Further, charges are charged in the corresponding capacitor in accordance with the values of Vdata1 to Vdata3. A turn-on state of the transistor Tr2 may be maintained by the charged voltage of the capacitor, and thus even when power is cut off to the selection line Vrow1, voltage of the capacitor may be maintained and the voltage may be applied to the light emitting diodes LED1 to LED3. Further, currents flowing through the LED1 to the LED3 may be changed according to values of Vdata1 to Vdata3. The current may always be supplied through Vdd, and thus, continuous light emission is possible.

The transistors Tr1 and Tr2 and the capacitor may be formed in the substrate 6021. Here, the light emitting diodes LED1 to LED3 may correspond to the first to third LED stacks 6100, 6200 and 6300 stacked in one pixel, respectively. Anodes of the first to third LED stacks 6100, 6200 and 6300 are connected to the transistor Tr2, and cathodes thereof are grounded. The first to third LED stacks 6100, 6200, and 6300 may be electrically grounded in common.

FIG. 100B exemplarily shows for a circuit diagram for an active matrix driving, but other circuits for the active matrix driving may be used. In addition, according to an exemplary embodiment, passive matrix driving may also be implemented.

Hereinafter, a manufacturing method of a display apparatus will be described in detail.

FIGS. 101A to 107 are schematic plan views and cross-sectional views illustrating a method of manufacturing a display apparatus according to an exemplary embodiment. In each of the drawings, the cross-sectional view is taken along line shown in the corresponding plan view.

Figure 101A:
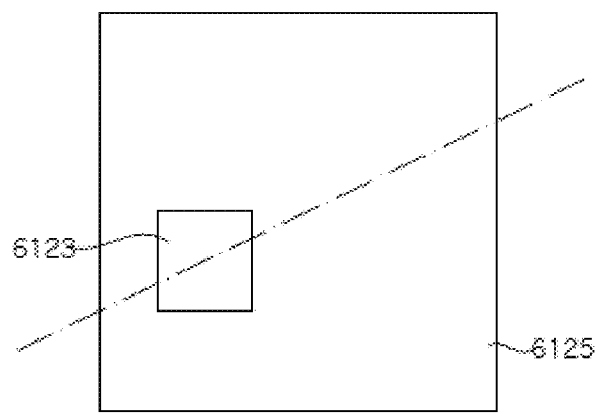
FIG. 101A, FIG. 101B, FIG. 101C, FIG. 101D, FIG. 101E, FIG. 102A, FIG. 102B, FIG. 102C, FIG. 102D, FIG. 102E, FIG. 103A, FIG. 103B, FIG. 103C, FIG. 103D, FIG. 104A, FIG. 104B, FIG. 104C, FIG. 104D, FIG. 105A, FIG. 105B, FIG. 105C, FIG. 105D, FIG. 106A, FIG. 106B, and FIG. 107 are schematic plan views and cross-sectional views illustrating a manufacturing method of the display apparatus according to an exemplary embodiment.
Figure 101A:
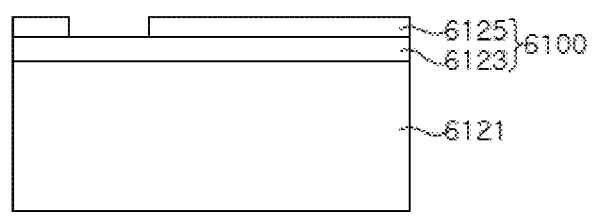

First, referring to FIG. 101A, the first LED stack 6100 is grown on the first substrate 6121. The first substrate 6121 may be, for example, a GaAs substrate. The first LED stack 6100 is formed of AlGaInP-based semiconductor layers, and includes an n-type semiconductor layer 6123, an active layer, and a p-type semiconductor layer 6125. The first LED stack 6100 may have, for example, a composition of Al, Ga, and In to emit red light.

The p-type semiconductor layer 6125 and the active layer are etched to expose the n-type semiconductor layer 6123. The p-type semiconductor layer 6125 and the active layer may be patterned using photolithography and etching techniques. In FIG. 101A, although a portion corresponding to one pixel region is shown, the first LED stack 6100 may be formed over the plurality of pixel regions on the substrate 6121, and the n-type semiconductor layer 6123 will be exposed corresponding to each pixel region.

Figure 101B:
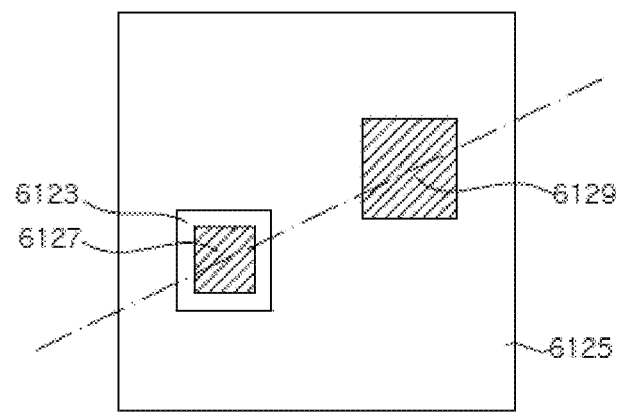
Figure 101B:
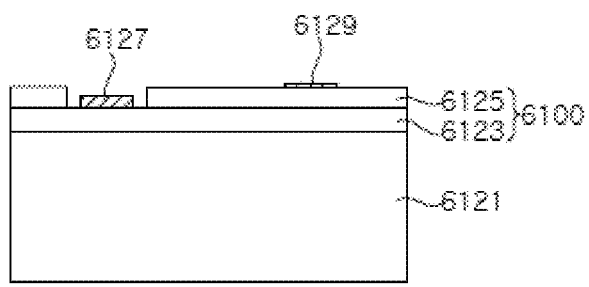

Referring to FIG. 101B, ohmic contact layers 6127 and 6129 are formed. The ohmic contact layers 6127 and 6129 may be formed for each pixel region. The ohmic contact layer 6127 is in ohmic contact with the n-type semiconductor layer 6123, and the ohmic contact layer 6129 is in ohmic contact with the p-type semiconductor layer 6125. For example, the ohmic contact layer 6127 may include AuTe or AuGe, and the ohmic contact layer 6129 may include AuBe or AuZn.

Figure 101C:
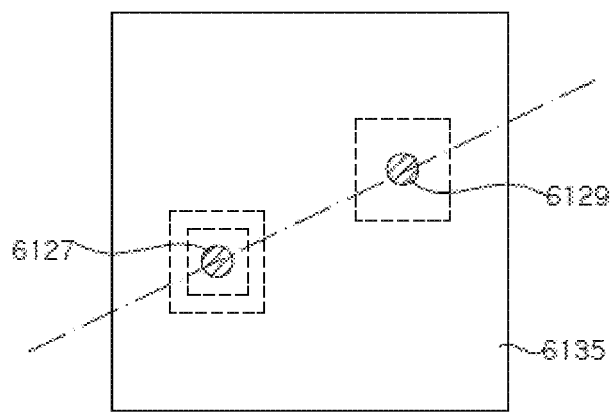
Figure 101C:
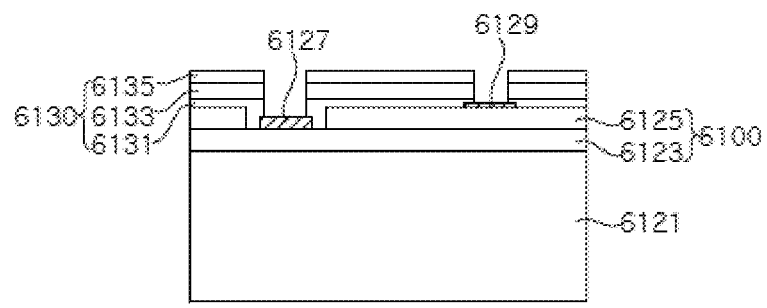

Referring to FIG. 101C, an insulating layer 6130 is formed on the first LED stack 6100. The insulating layer 6130 has a multilayer structure and is patterned to have openings that expose the ohmic contact layers 6127 and 6129. The insulating layer 6130 may include a first insulating layer 6131 and a second insulating layer 6135, and may also include a distributed Bragg reflector 6133. The second insulating layer 6135 may be incorporated into the distributed Bragg reflector 6133 as a part of the distributed Bragg reflector 6133.

The first insulating layer 6131 may include, for example, a silicon nitride film, and the second insulating layer 6135 may include a silicon oxide film. The silicon nitride film exhibits good adhesion properties to the AlGaInP-based semiconductor layer, but the silicon oxide film has poor adhesion properties to the AlGaInP-based semiconductor layer. The silicon oxide film has good adhesion to the first adhesive layer 6141, which will be described below, while the silicon nitride film has poor adhesion properties to the first adhesive layer 6141. Since the silicon nitride film and the silicon oxide film exhibit mutually complementary stress characteristics, it is possible to improve process stability by using the silicon nitride film and the silicon oxide film together, thereby preventing occurrence of defects.

While the ohmic contact layers 6127 and 6129 are described as being formed first, and the insulating layer 6130 is formed thereafter, according to some exemplary embodiments, the insulating layer 6130 may be formed first, and the ohmic contact layers 6127 and 6129 may be formed in the openings of the insulating layer 6130 that expose the n-type semiconductor layer 6123 and the p-type semiconductor layer 6125.

Figure 101D:
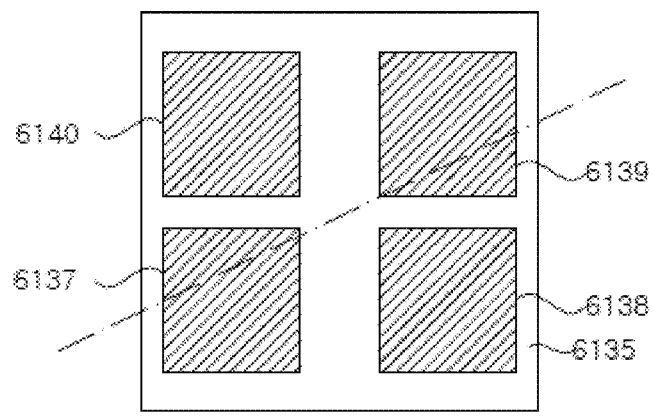
Figure 101D:
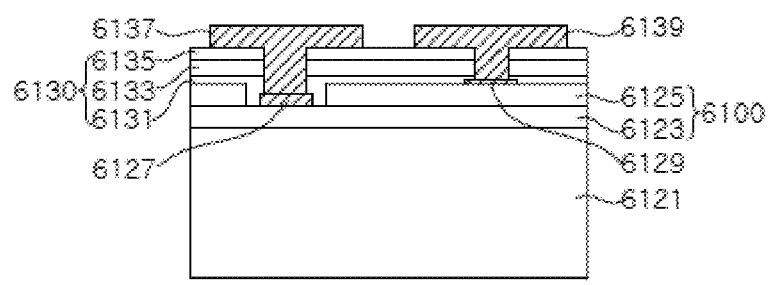

Referring to FIG. 101D, subsequently, first electrode pads 6137, 6138, 6139, and 6140 are formed. The first electrode pads 6137 and 6139 are connected to the ohmic contact layers 6127 and 6129 through the openings of the insulating layer 6130, respectively. The first electrode pads 6138 and 6140 are disposed on the insulating layer 6130 and are insulated from the first LED stack 6100. As described below, the first electrode pads 6138 and 6140 will be electrically connected to the p-type semiconductor layers 6225 and 6325 of the second LED stack 6200 and the third LED stack 6300, respectively. The first electrode pads 6137, 6138, 6139, and 6140 may have a multilayer structure, and particularly, may include a barrier metal layer on an upper surface thereof.

Figure 101E:
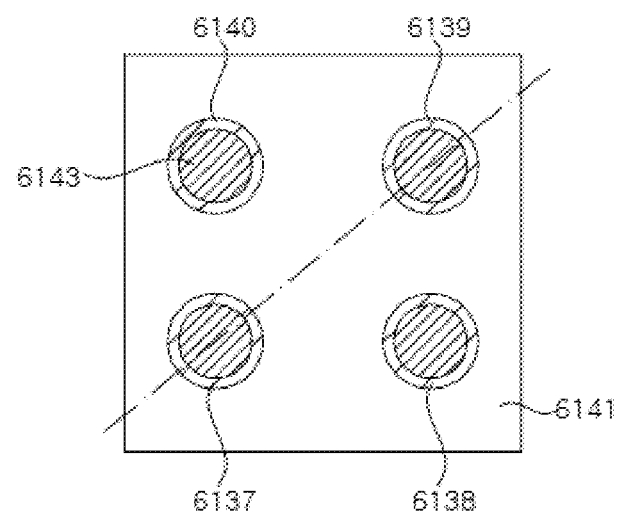
Figure 101E:
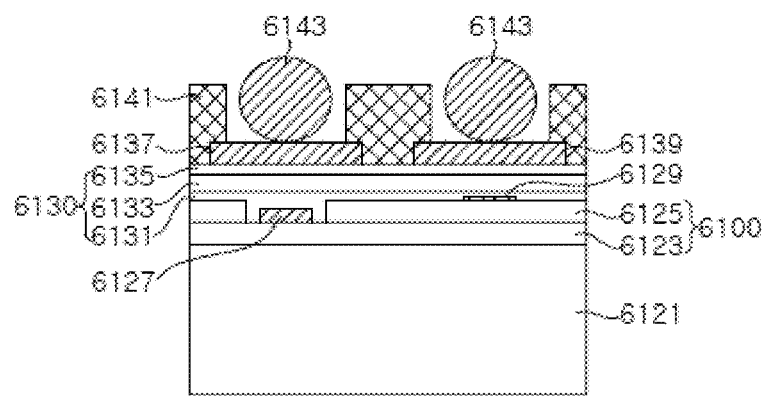

Referring to FIG. 101E, a first adhesive layer 6141 is then formed on the first electrode pads 6137, 6138, 6139, and 6140. The first adhesive layer 6141 may contact the second insulating layer 6135.

The first adhesive layer 6141 is patterned to have openings that expose the first electrode pads 6137, 6138, 6139, and 6140. As such, the first adhesive layer 6141 is formed of a material that may be patterned, and may be formed of, for example, epoxy, polyimide, SUB, SOG, BCB, or others.

Metal bonding materials 6143 having substantially a ball shape are formed in the openings of the first adhesive layer 6141. The metal bonding material 6143 may be formed of, for example, an indium ball or a solder ball, such as AuSn, Sn, or the like. The metal bonding materials 6143 having substantially a ball shape may have substantially the same height as a surface of the first adhesive layer 6141 or higher height than the surface of the first adhesive layer 6141. However, a volume of each metal bonding material may be smaller than a volume of the opening in the first adhesive layer 6141.

Figure 102A:
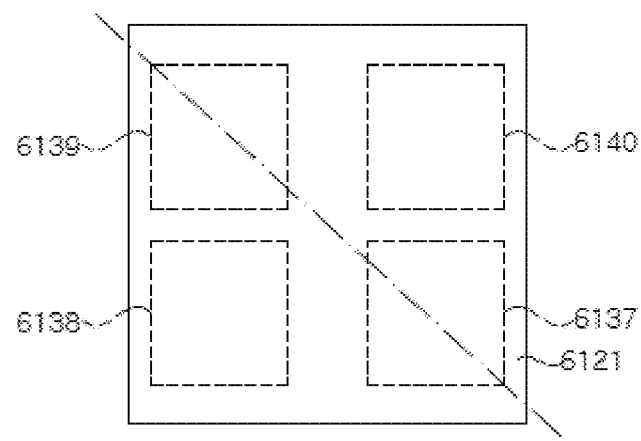
Figure 102A:
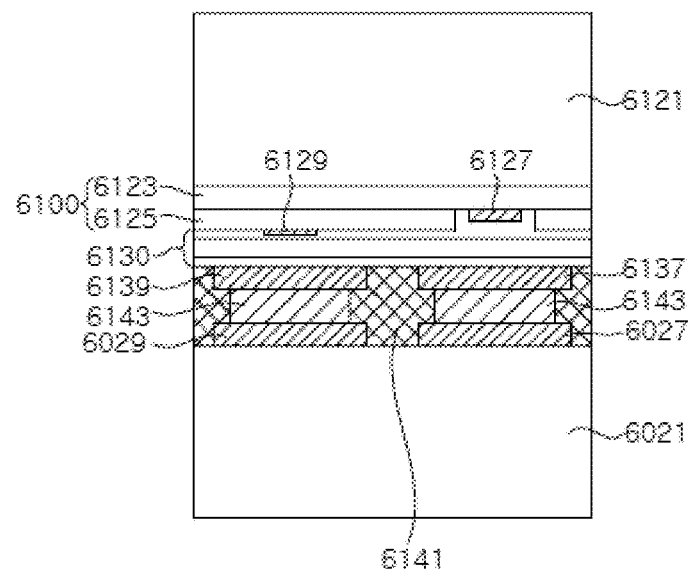

Referring to FIG. 102A, subsequently, the substrate 6021 and the first LED stack 6100 are bonded. The electrode pads 6027, 6028, 6029 and 6030 are disposed on the substrate 6021 in correspondence with the first electrode pads 6137, 6138, 6139 and 6140, and the metal bonding materials 6143 bond the first electrode pads 6137, 6138, 6139, and 6140 with the electrode pads 6027, 6028, 6029, and 6030. Further, the first adhesive layer 6141 bonds the substrate 6021 and the insulating layer 6130.

The substrate 6021 may be a glass substrate on which a thin film transistor is formed, a Si substrate on which a CMOS transistor is formed, or others, for active matrix driving.

While the first electrode pads 6137 and 6139 are shown as being spaced apart from the ohmic contact layers 6127 and 6129, the first electrode pads 6137 and 6139 are electrically connected to the ohmic contact layers 6127 and 6129 through the insulating layer 6130, respectively.

Although the first adhesive layer 6141 and the metal bonding materials 6143 are described as being formed at the first substrate 6121 side, the first adhesive layer 6141 and the metal bonding materials 6143 may be formed at the substrate 6021 side, or adhesive layers may be formed at the first substrate 6121 side and the substrate 6021 side, respectively, and these adhesive layers may be bonded to each other.

The metal bonding materials 6143 are pressed by these pads between the first electrode pads 6137, 6138, 6139, and 6140, and the electrode pads 6027, 6028, 6029, and 6030 on the substrate 6021, and thus, upper and lower surfaces are deformed to have a flat shape according to the shape of the electrode pads. Since the metal bonding materials 6143 are deformed in the openings of the first adhesive layer 6141, the metal bonding materials 6143 may substantially completely fill the openings of the first adhesive layer 6141 to be in close contact with the first adhesive layer 6141, or an empty space may be formed in the openings of the first adhesive layer 6141. The first adhesive layer 6141 may contract in a vertical direction and may expand in a horizontal direction under heating and pressurizing condition, and thus a shape of an inner wall of the openings may be deformed.

The shapes of the metal bonding members 6143 and the first adhesive layer 6141 are described below with reference to FIGS. 108A, 108B, and 108C.

Figure 102B:
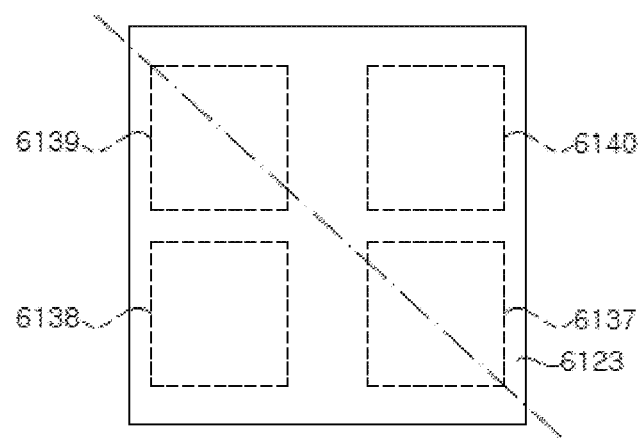
Figure 102B:
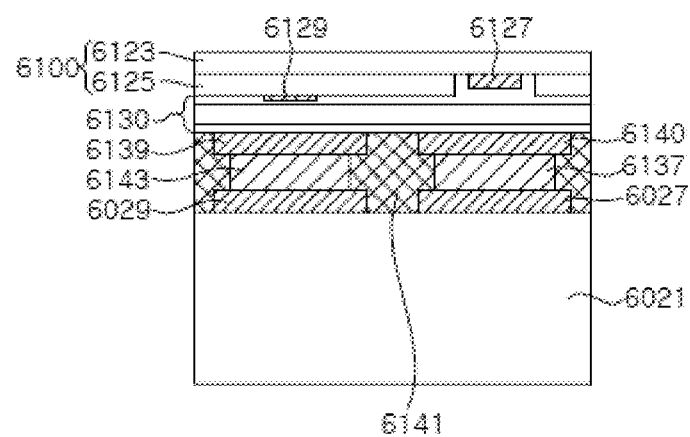

Referring to FIG. 102B, the first substrate 6121 is removed, and the n-type semiconductor layer 6123 is exposed. The first substrate 6121 may be removed using a wet etching technique or the like. A surface roughened by surface texturing may be formed on the surface of the exposed n-type semiconductor layer 6123.

Figure 102C:
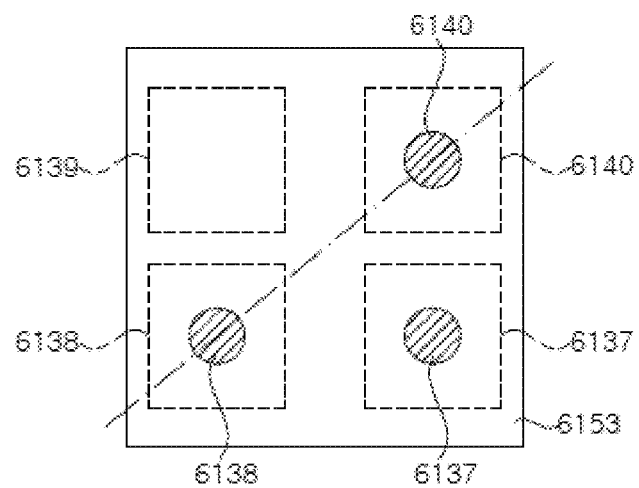
Figure 102C:
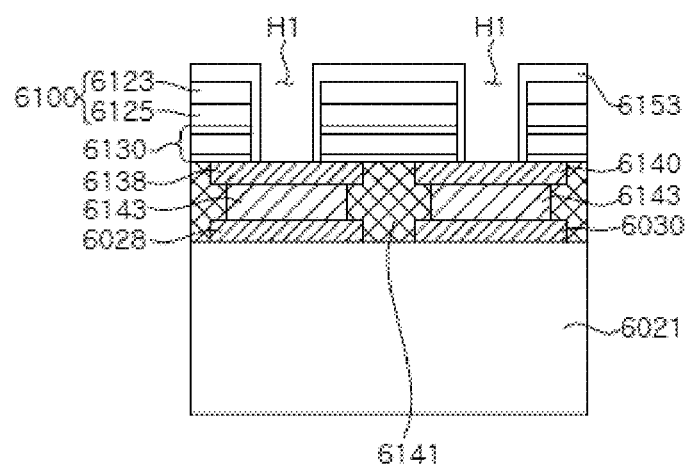

Referring to FIG. 102C, holes H1 passing through the first LED stack 6100 and the insulating layer 6130 may be formed using a hard mask or the like. The holes H1 may expose the first electrode pads 6137, 6138, and 6140, respectively. The hole H1 is not formed on the first electrode pad 6139, and thus the first electrode pad 6139 is not exposed through the first LED stack 6100.

Then, an insulating layer 6153 is formed to cover the surface of the first LED stack 6100 and side walls of the holes H1. The insulating layer 6153 is patterned to expose the first electrode pads 6137, 6138, 6139, and 6140 in the holes H1. The insulating layer 6153 may include a silicon nitride film or a silicon oxide film.

Figure 102D:
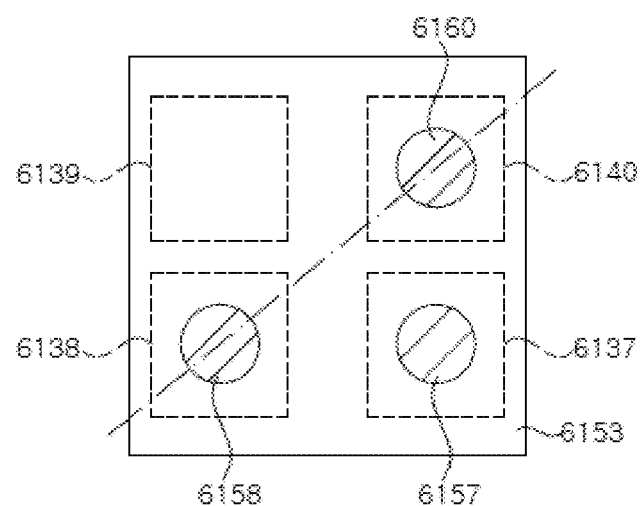
Figure 102D:
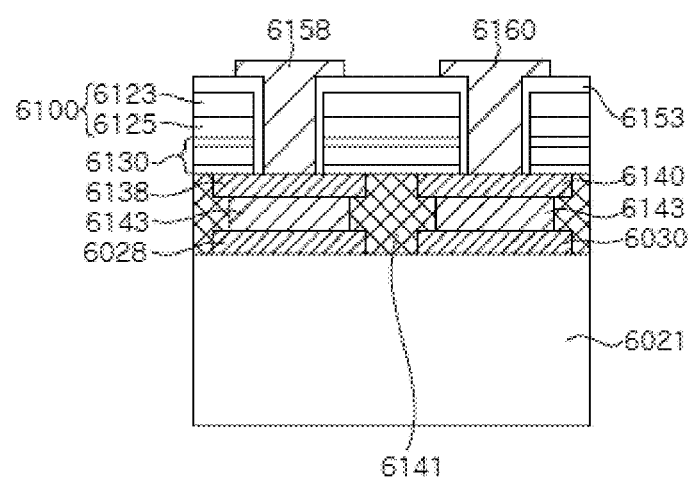

Referring to FIG. 102D, first connectors 6157, 6158, and 6160 that are electrically connected to the first electrode pads 6137, 6138, and 6140 through the holes H1, respectively, are formed.

The first-1 connector 6157 is connected to the first electrode pad 6137, the first-2 connector 6158 is connected to the first electrode pad 6138, and the first-3 connector 6160 is connected to the first electrode pad 6140. The first electrode pad 6140 is electrically connected to the n-type semiconductor layer 6123 of the first LED stack 6100, and thus the first connector 6157 is also electrically connected to the n-type semiconductor layer 6123. The first-2 connector 6158 and the first-3 connector 6160 are electrically insulated from the first LED stack 6100.

Figure 102E:
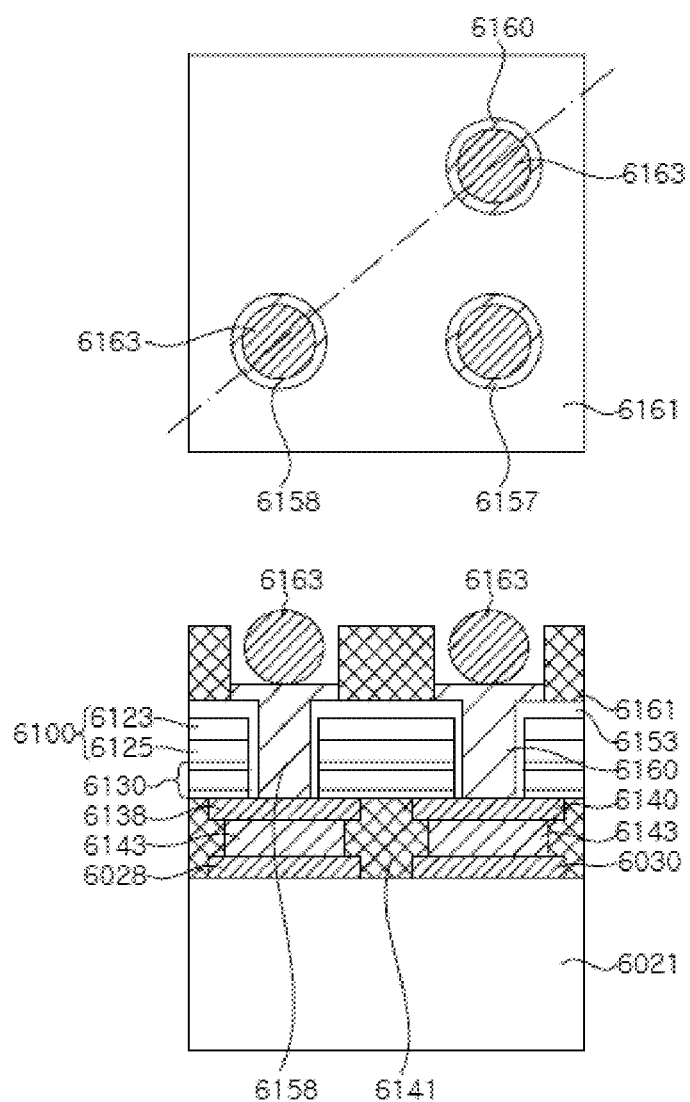

Referring to FIG. 102E, a second adhesive layer 6161 is then formed on the first connectors 6157, 6158, and 6160. The second adhesive layer 6161 may contact the insulating layer 6153.

The second adhesive layer 6161 is patterned to have openings that expose the first connectors 6157, 6158, and 6160. As such, the second adhesive layer 6161 is formed of a material that may be patterned similarly to the first adhesive layer 6141, and may be formed of, for example, epoxy, polyimide, SUB, SOG, BCB, or others.

Metal bonding materials 6163 having substantially a ball shape are formed in the openings of the second adhesive layer 6161. The material and shape of the metal bonding material 6163 are similar to those of the metal bonding material 6143 described above, and thus, detailed descriptions thereof are omitted.

Figure 103A:
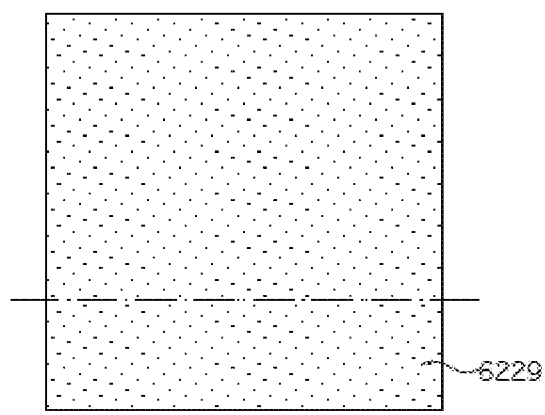
Figure 103A:
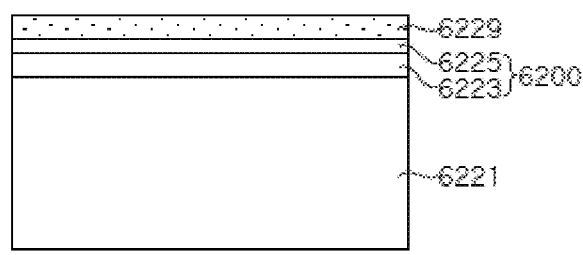

Referring to FIG. 103A, the second LED stack 6200 is grown on a second substrate 6221, and a second transparent electrode 6229 is formed on the second LED stack 6200.

The second substrate 6221 may be a substrate capable of growing the second LED stack 6200, for example, a sapphire substrate or a GaAs substrate.

The second LED stack 6200 may be formed of AlGaInP-based semiconductor layers or AlGaInN-based semiconductor layers. The second LED stack 6200 may include an n-type semiconductor layer 6223, a p-type semiconductor layer 6225, and an active layer, and the active layer may have a multiple quantum well structure. A composition ratio of the well layer in the active layer may be determined so that the second LED stack 6200 emits green light, for example.

The second transparent electrode 6229 is in ohmic contact with the p-type semiconductor layer. The second transparent electrode 6229 may be formed of a metal layer or a conductive oxide layer which is transparent to red light and green light. Examples of the conductive oxide layer may include $SnO_2$, $InO_2$, ITO, ZnO, IZO, or others.

Figure 103B:
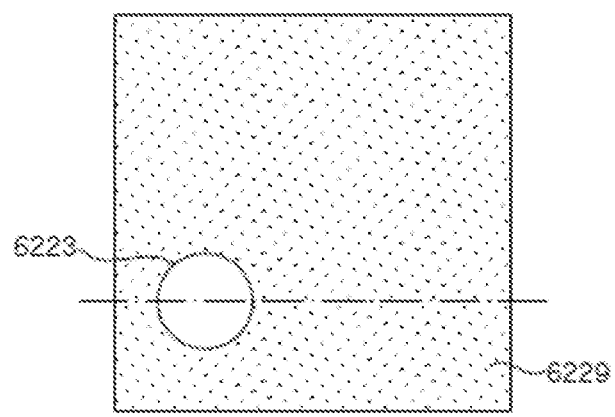
Figure 103B:
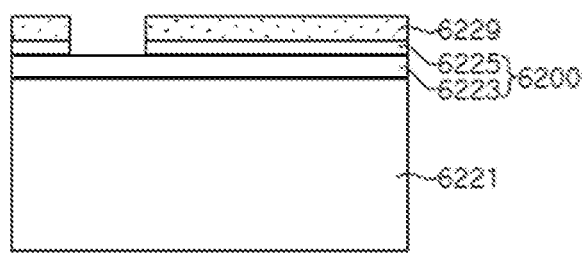

Referring to FIG. 103B, the second transparent electrode 6229, the p-type semiconductor layer 6225, and the active layer are patterned to partially expose the n-type semiconductor layer 6223. The n-type semiconductor layer 6223 will be exposed in a plurality of regions corresponding to a plurality of pixel regions on the second substrate 6221.

Although the n-type semiconductor layer 6223 is described as being exposed after the second transparent electrode 6229 is formed, in some exemplary embodiments, the n-type semiconductor layer 6223 may be exposed first and the second transparent electrode 6229 may be formed thereafter.

Figure 103C:
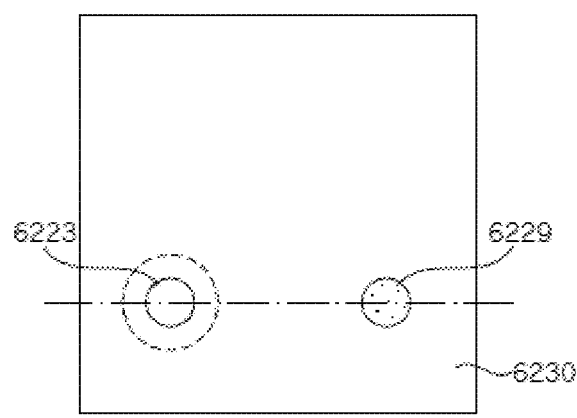
Figure 103C:
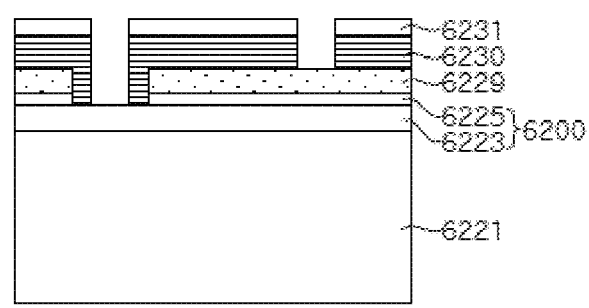

Referring to FIG. 103C, a first color filter 6230 is formed on the second transparent electrode 6229. The first color filter 6230 is formed to transmit light generated in the first LED stack 6100 and to reflect light generated in the second LED stack 6200.

Then, an insulating layer 6231 may be formed on the first color filter 6230. The insulating layer 6231 may be formed to control stress and may be formed of, for example, a silicon nitride film ($SiN_x$) or a silicon oxide film ($SiO_2$). The insulating layer 6231 may be formed first before the first color filter 6230 is formed.

Openings exposing the n-type semiconductor layer 6223 and the second transparent electrode 6229 are formed by patterning the insulating layer 6231 and the first color filter 6230.

Although the first color filter 6230 is described as being formed after the n-type semiconductor layer 6223 is exposed, according to some exemplary embodiments, the first color filter 6230 may be formed first, and then, the first color filter 6230, the second transparent electrode 6229, the p-type semiconductor layer 6225, and the active layer may be patterned to expose the n-type semiconductor layer 6223. Then, the insulating layer 6231 may be formed to cover side surfaces of the p-type semiconductor layer 6225 and the active layer.

Figure 103D:
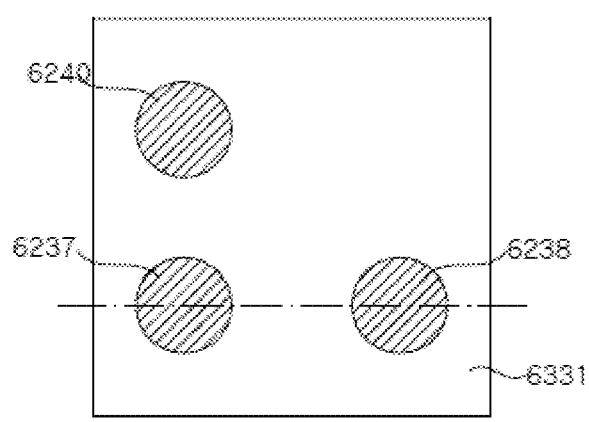
Figure 103D:
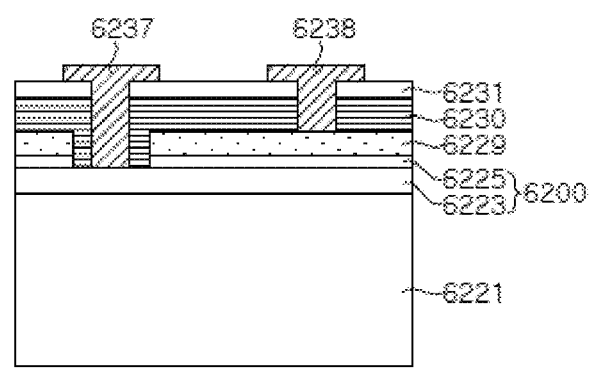

Referring to FIG. 103D, subsequently, the second electrode pads 6237, 6238, and 6240 are formed on the first color filter 6230 or the insulating layer 6231. The second electrode pad 6237 may be electrically connected to the n-type semiconductor layer 6223 through the opening of the first color filter 6230, and the second electrode pad 6238 may be electrically connected to the second transparent electrode 6229 through the opening of the first color filter 6230. The second electrode pad 6240 is disposed on the first color filter 6240 and is insulated from the second LED stack 6200.

Figure 104A:
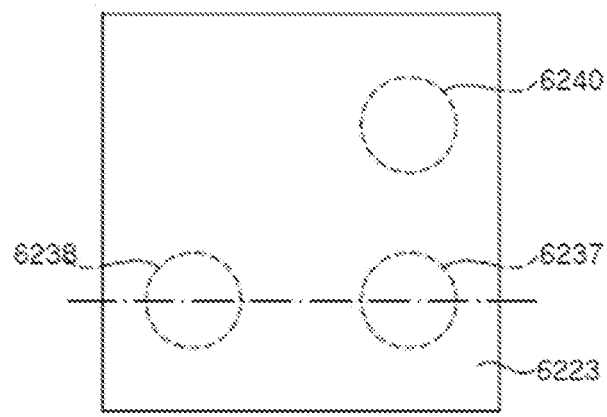
Figure 104A:
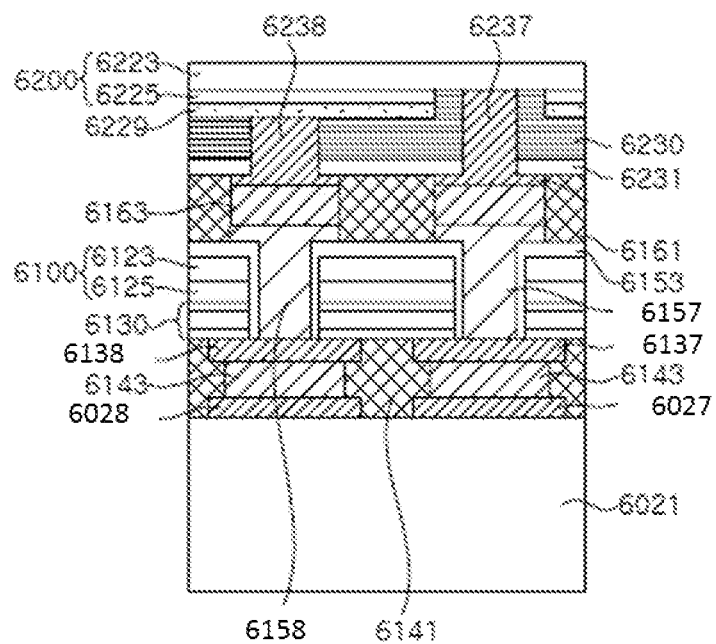

Referring to FIG. 104A, the second LED stack 6200 and the second electrode pads 6237, 6238, and 6240 that are described with reference to FIG. 103D, are coupled on the second adhesive layer 6161 and the metal bonding materials 6163 that are described with reference to FIG. 102E. The metal bonding materials 6163 may bond the first connectors 6157, 6158, and 6160 and the second electrode pads 6237, 6238, and 6240, respectively, and the second adhesive layer 6161 may bond the insulating layer 6231 and the insulating layer 6153. The bonding using the second adhesive layer 6161 and the metal bonding materials 6163 is similar to that described with reference to FIG. 102A, and thus, detailed description thereof are omitted.

The second substrate 6221 is separated from the second LED stack 6200, and the surface of the second LED stack 6200 is exposed. The second substrate 6221 may be separated using a technique such as etching, laser lift-off, or the like. A surface roughened by surface texturing may be formed on the surface of the exposed second LED stack 6200, that is, the surface of the n-type semiconductor layer 6223.

Although the second adhesive layer 6161 and the metal bonding materials 6163 are described as being formed on the first LED stack 6100 to bond the second LED stack 6200, according to some exemplary embodiments, the second adhesive layer 6161 and the metal bonding materials 6163 may be formed at the second LED stack 6200 side. Further, an adhesive layer may be formed on the first LED stack 6100 and the second LED stack 6200, respectively, and these adhesive layers may be bonded to each other.

Figure 104B:
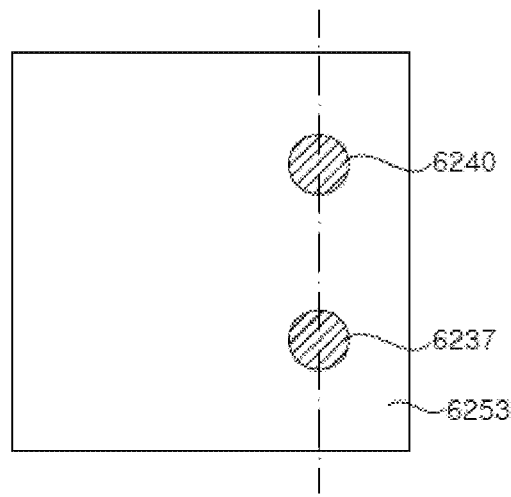
Figure 104B:
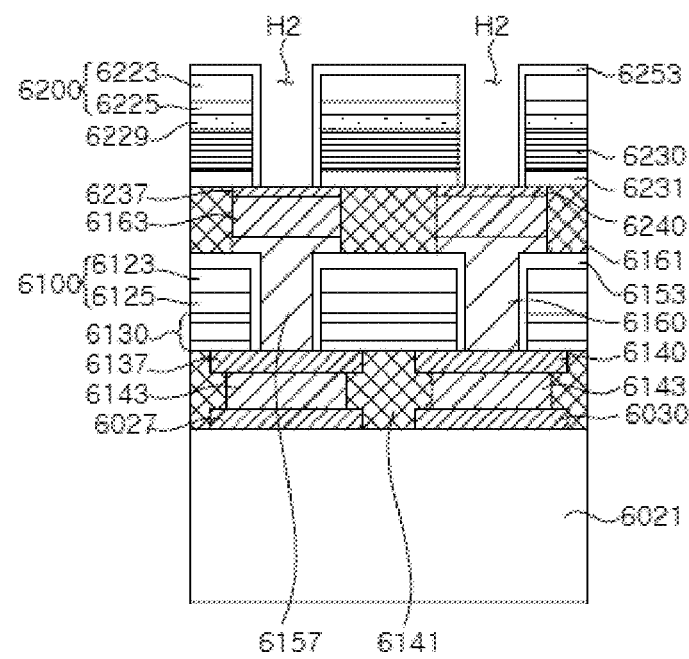

Referring to FIG. 104B, holes H2 passing through the second LED stack 6200, the second transparent electrode 6229, the first color filter 6230, and the insulating layer 6231 may be formed using a hard mask or the like. The holes H2 may expose the second electrode pads 6237 and 6240, respectively. The hole H2 is not formed on the second electrode pad 238, and thus, the second electrode pad 238 is not exposed through the second LED stack 6200.

Then, an insulating layer 6253 is formed to cover the surface of the second LED stack 6200 and side walls of the holes H2. The insulating layer 6253 is patterned to expose the second electrode pads 6237 and 6240 in the holes H2. The insulating layer 6253 may include a silicon nitride film or a silicon oxide film.

Figure 104C:
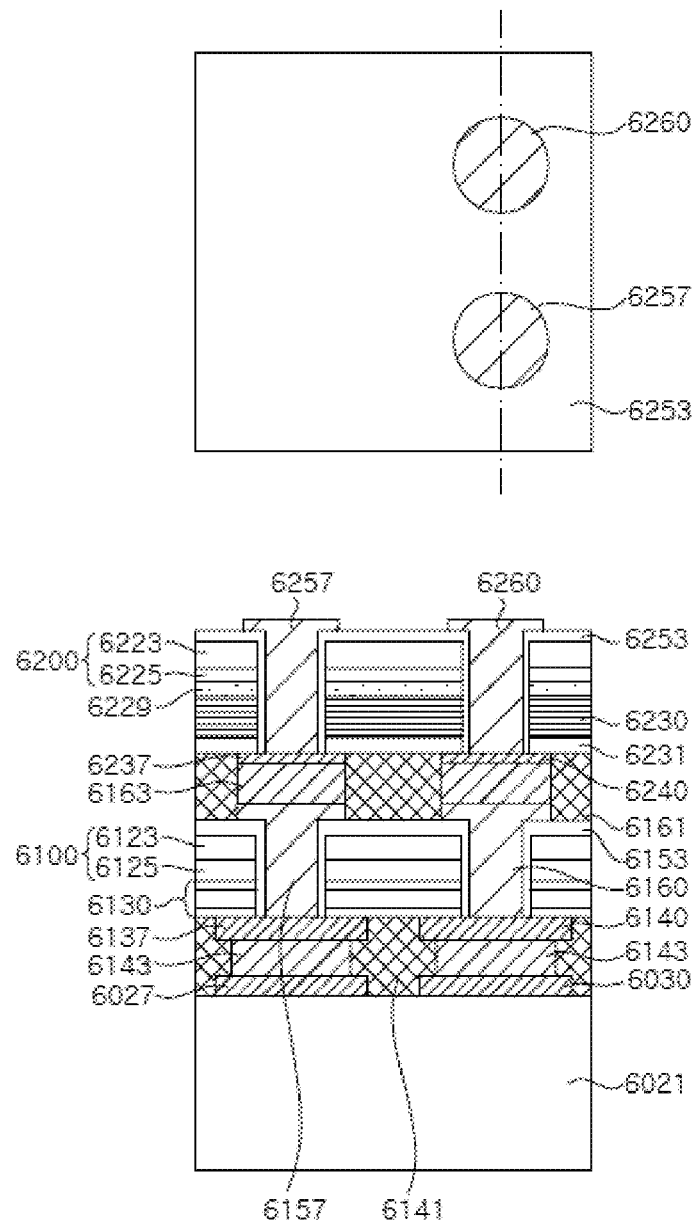

Referring to FIG. 104C, second connectors 6257 and 6260 that are electrically connected to the second electrode pads 6237 and 6240 through the holes H2, respectively, are formed. The second-1 connector 6257 is connected to the second electrode pad 6237 and thus electrically connected to the n-type semiconductor layer 6223. The second-2 connector 6260 is insulated from the second LED stack 6200 and insulated from the first LED stack 6100.

Further, the second-1 connector 6257 is electrically connected to the electrode pad 6027 through the first-1 connector 6157, and the second-2 connector 6260 is electrically connected to the electrode pad 6030 through the first-3 connector 6160. The second-1 connector 6257 may be stacked in a vertical direction to the first-1 connector 6157, and the second-2 connector 6260 may be stacked in a vertical direction to the first-3 connector 6160. However, the inventive concepts are not limited thereto.

Figure 104D:
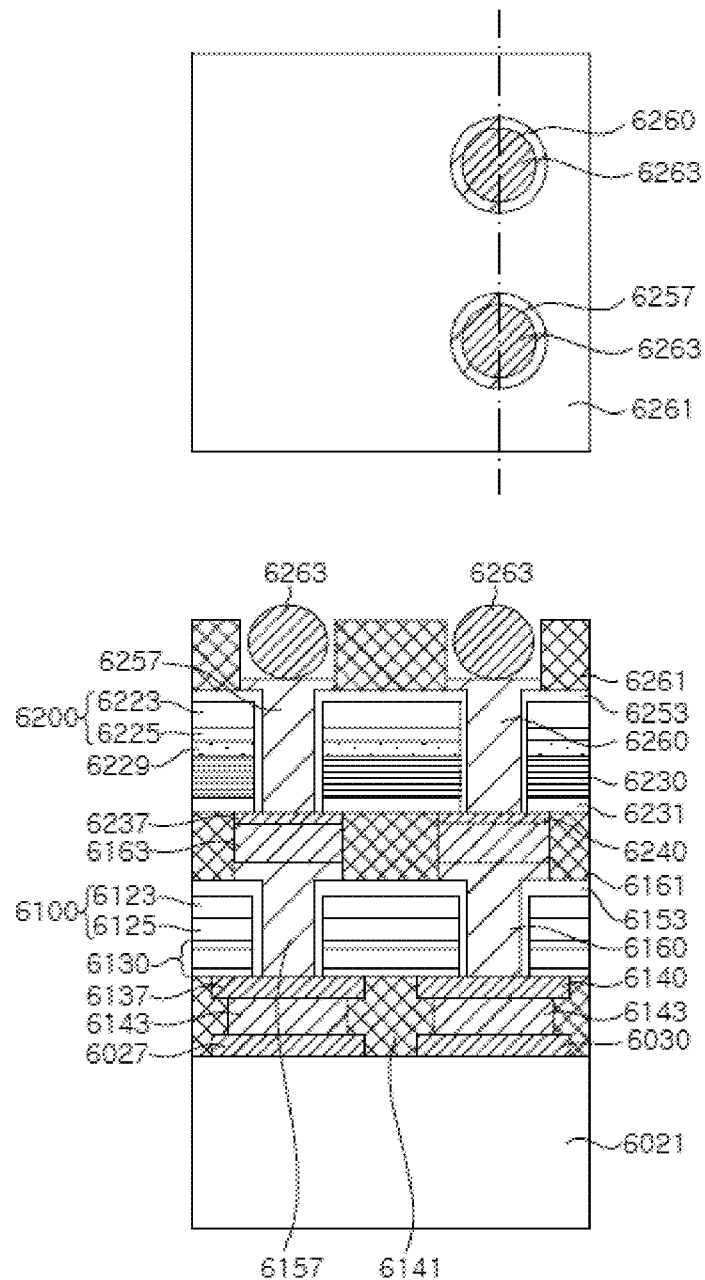

Referring to FIG. 104D, a third adhesive layer 6261 is then formed on the second connectors 6257 and 6260. The third adhesive layer 6261 may contact the insulating layer 6253.

The third adhesive layer 6261 is patterned to have openings that expose the second connectors 6257 and 6260. As such, the third adhesive layer 6261 is formed of a material that may be patterned similarly to the first adhesive layer 6141, and may be formed of, for example, epoxy, polyimide, SUB, SOG, BCB, or others.

Metal bonding materials 6263 having substantially a ball shape are formed in the openings of the third adhesive layer 6261. The material and shape of the metal bonding material 6263 are similar to those of the metal bonding material 6143 described above, and thus, detailed descriptions thereof are omitted.

Figure 105A:
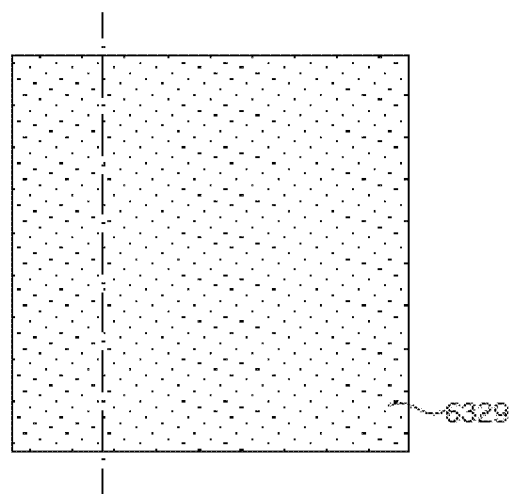
Figure 105A:
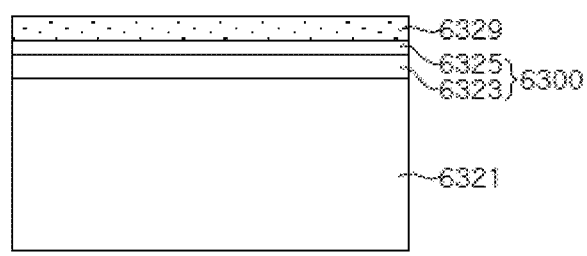

Referring to FIG. 105A, the third LED stack 6300 is grown on a third substrate 6321, and a third transparent electrode 6329 is formed on the third LED stack 6300.

The third substrate 6321 may be a substrate capable of growing the third LED stack 6300, for example, a sapphire substrate. The third LED stack 6300 may be formed of AlGaInN-based semiconductor layers. The third LED stack 6300 may include an n-type semiconductor layer 6323, a p-type semiconductor layer 6325, and an active layer, and the active layer may have a multiple quantum well structure. A composition ratio of the well layer in the active layer may be determined so that the third LED stack 6300 emits blue light, for example.

The third transparent electrode 6329 is in ohmic contact with the p-type semiconductor layer 6325. The third transparent electrode 6329 may be formed of a metal layer or a conductive oxide layer which is transparent to red light, green light, and blue light. Examples of the conductive oxide layer may include $SnO_2$, $InO_2$, ITO, ZnO, IZO, or others.

Figure 105B:
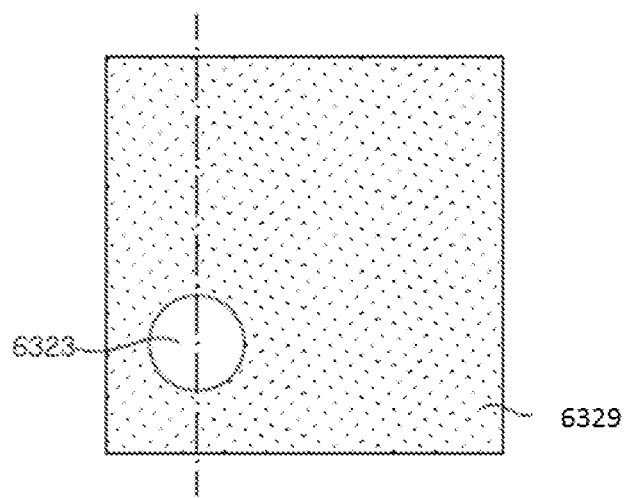
Figure 105B:
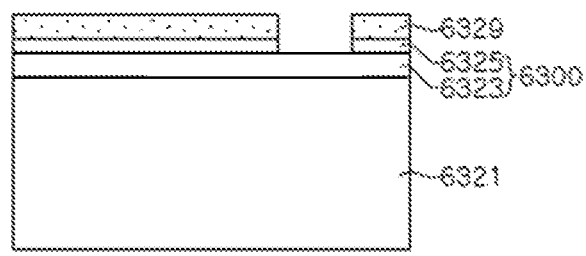

Referring to FIG. 105B, the third transparent electrode 6329, the p-type semiconductor layer 6325, and the active layer are patterned to partially expose the n-type semiconductor layer 6323. The n-type semiconductor layer 6323 will be exposed in a plurality of regions corresponding to a plurality of pixel regions on the third substrate 6321.

Although the n-type semiconductor layer 6323 is described as being exposed after the third transparent electrode 6329 is formed, according to some exemplary embodiments, the n-type semiconductor layer 6323 may be exposed before the first and the third transparent electrode 6329 may be formed.

Figure 105C:
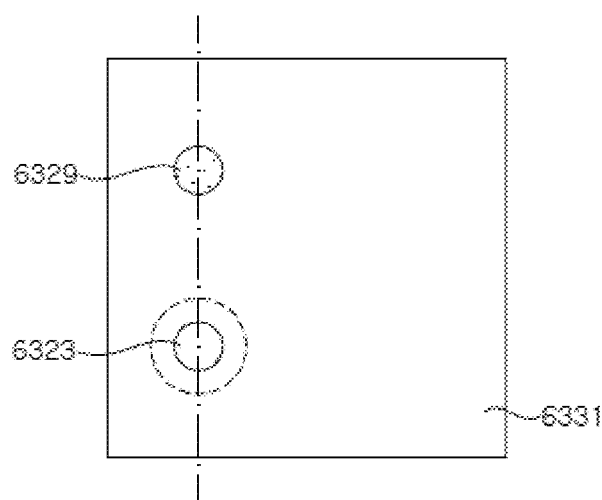
Figure 105C:
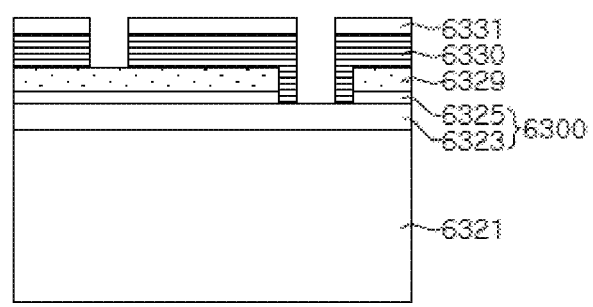

Referring to FIG. 105C, a second color filter 6330 is formed on the third transparent electrode 6329. The second color filter 6330 is formed to transmit light generated in the first LED stack 6100 and the second LED stack 6200, and to reflect light generated in the third LED stack 6300.

Then, an insulating layer 6331 may be formed on the second color filter 6330. The insulating layer 6331 may be formed to control stress and may be formed of, for example, a silicon nitride film ($SiN_x$) or a silicon oxide film ($SiO_2$). The insulating layer 6331 may be formed first before the second color filter 6330 is formed. Meanwhile, openings exposing the n-type semiconductor layer 6323 and the second transparent electrode 6329 are formed by patterning the insulating layer 6331 and the second color filter 6330.

Although the second color filter 6330 is described as being formed after the n-type semiconductor layer 6323 is exposed, according to some exemplary embodiments, the second color filter 6330 may be formed first, and the second color filter 6330, the third transparent electrode 6329, the p-type semiconductor layer 6325, and the active layer may be patterned to expose the n-type semiconductor layer 6323 thereafter. Then, the insulating layer 6331 may be formed to cover side surfaces of the p-type semiconductor layer 6325 and the active layer.

Figure 105D:
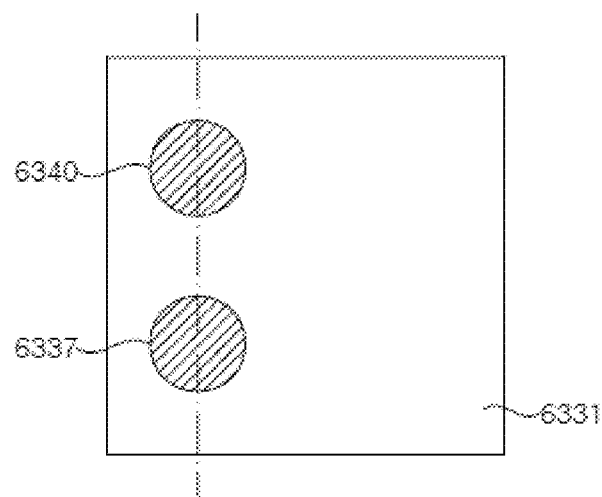
Figure 105D:
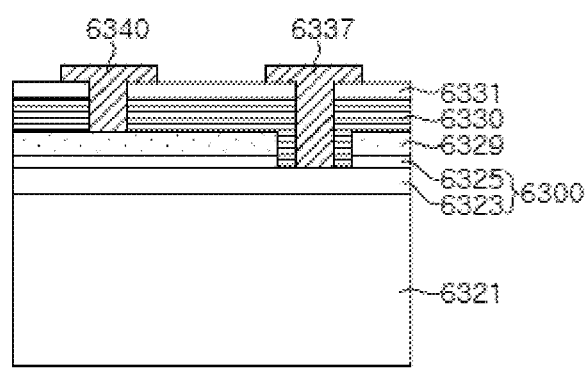

Referring to FIG. 105D, subsequently, the third electrode pads 6337 and 6340 are formed on the second color filter 6330 or the insulating layer 6331. The third electrode pad 6337 may be electrically connected to the n-type semiconductor layer 6323 through the opening of the second color filter 6330, and the third electrode pad 6340 may be electrically connected to the third transparent electrode 6329 through the opening of the second color filter 6330.

Figure 106A:
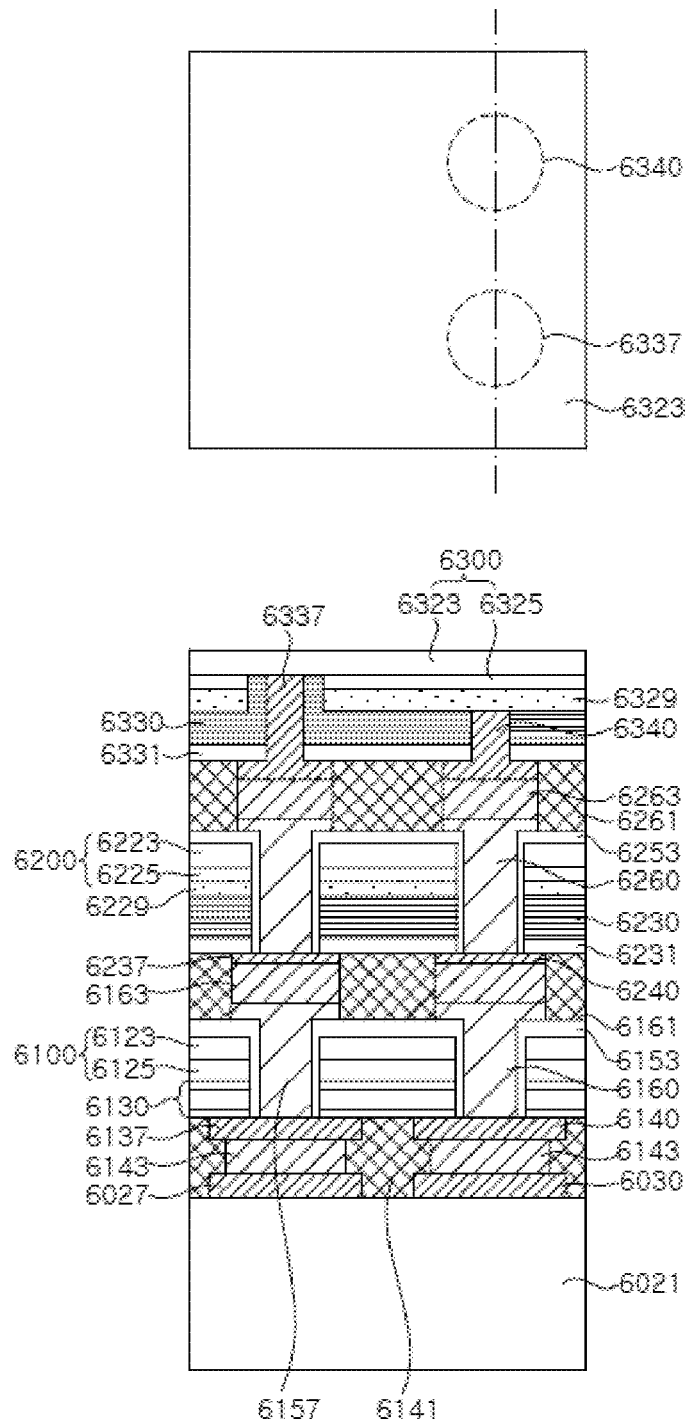

Referring to FIG. 106A, the third LED stack 6300 and the third electrode pads 6337 and 6340 that are described with reference to FIG. 105D, are coupled to the third adhesive layer 6261 by the metal bonding materials 6263 that are described with reference to FIG. 104E. The metal bonding materials 6263 may bond the second connectors 6257 and 6260 and the third electrode pads 6337 and 6340, respectively, and the third adhesive layer 6261 may bond the insulating layer 6331 and the insulating layer 6253. The bonding using the third adhesive layer 6261 and the metal bonding materials 6263 is similar to that described with reference to FIG. 102A, and thus, detailed descriptions thereof are omitted.

The third substrate 6321 is separated from the third LED stack 6300, and the surface of the third LED stack 6300 is exposed. The third substrate 6321 may be separated using a technique such as laser lift-off, chemical lift-off, or others. A surface roughened by surface texturing may be formed on the surface of the exposed third LED stack 6300, that is, the surface of the n-type semiconductor layer 6323.

Although the third adhesive layer 6261 and the metal bonding materials 6263 are described as being formed on the second LED stack 6200 to bond the third LED stack 6300, according to some exemplary embodiments, the third adhesive layer 6261 and the metal bonding materials 6263 may be formed at the third LED stack 6300 side. Further, an adhesive layer may be formed on the second LED stack 6200 and the third LED stack 6300, respectively, and these adhesive layers may be bonded to each other.

Figure 106B:
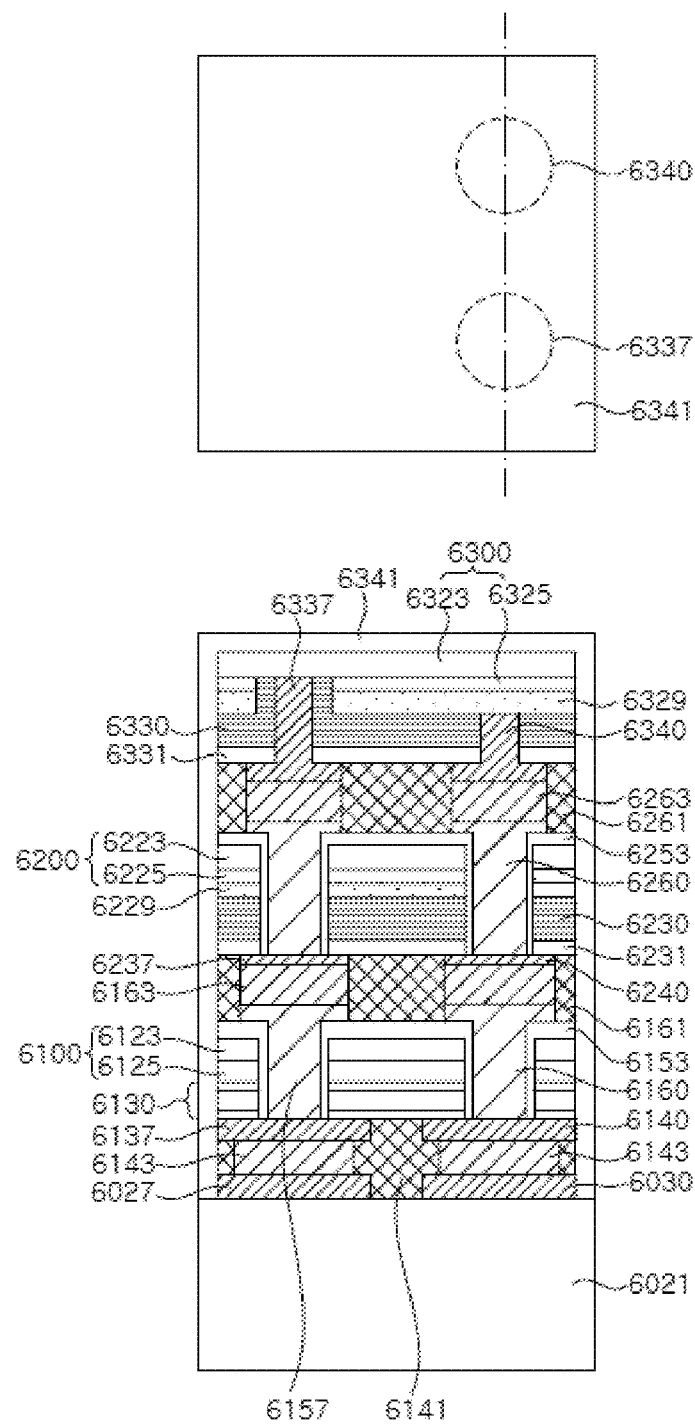

Referring to FIG. 106B, subsequently, regions between adjacent pixels are then etched to separate the pixels, and an insulating layer 6341 may be formed. The insulating layer 6341 may cover a side surface and an upper surface of each pixel. A region between adjacent pixels may be removed to expose the substrate 6021, but the inventive concepts are not limited thereto. For example, the first adhesive layer 6141 may be formed continuously over a plurality of pixel regions without being separated, and the insulating layer 6130 may also be continuous.

Figure 107:
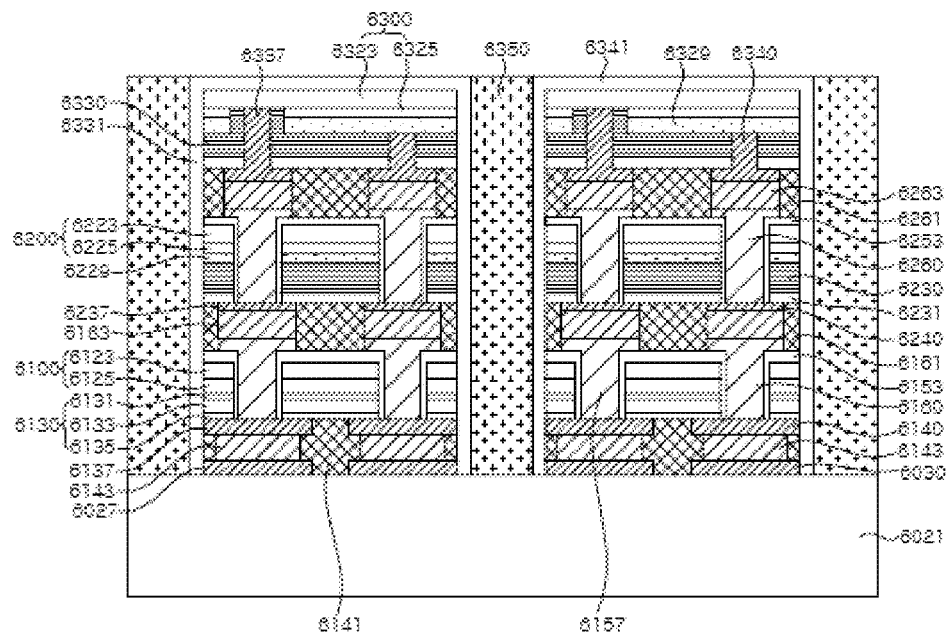

Referring to FIG. 107, subsequently, a barrier 6350 may be formed in a separation region between the pixel regions. The barrier 6350 may be formed of a light reflecting layer, a light absorbing layer, or a mixture thereof, and thus light interference between pixels may be prevented. The light reflecting layer may include, for example, a white PSR, a distributed Bragg reflector, an insulating layer such as $SiO_2$, and a reflective metal layer deposited thereon, or a highly reflective organic layer. For a light blocking layer, black epoxy, for example, may be used.

Thus, a display apparatus according to an exemplary embodiment, in which a plurality of pixels are arranged on the substrate 6021, may be provided. The first to third LED stacks 6100, 6200, and 6300 in each pixel may be independently driven by power input through the electrode pads 6027, 6028, 6029, and 6030.

Figure 108A:
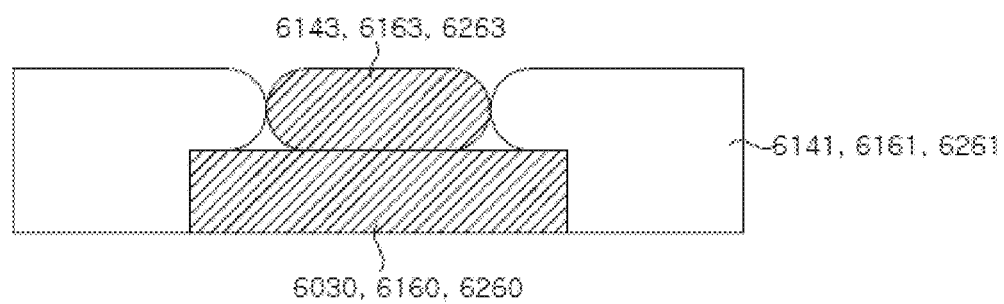
FIG. 108A, FIG. 108B, and FIG. 108C are schematic partial cross-sectional views of a metal bonding material according to exemplary embodiments.
Figure 108B:
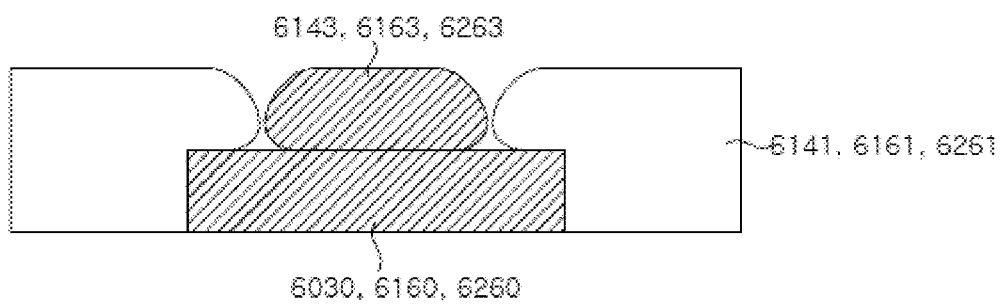
Figure 108C:
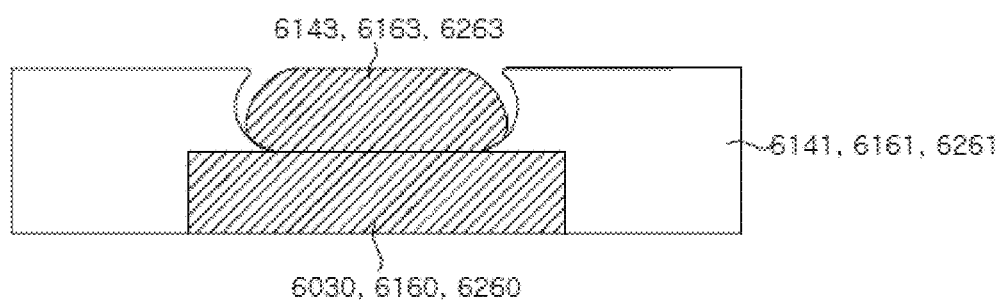

FIGS. 108A, 108B, and 108C are schematic cross-sectional views of the metal bonding materials 6143, 6163, and 6263.

Referring to FIG. 108A, the metal bonding materials 6143, 6163, and 6263 are disposed in the openings in the first to third adhesive layers 6141, 6161, and 6261. In some exemplary embodiments, at least one of the first to third adhesive layers 6141, 6161, and 6261 and at least one of the metal bonding materials 6143, 6163, and 6263 may be referred to as an adhesion layer. A lower surface of the metal bonding materials 6143, 6163, and 6263 is in contact with the electrode pads 6030 or the connector 6160 or 6260, and thus, the metal bonding materials 6143, 6163, and 6263 may have substantially a flat shape depending on an upper surface shape of the electrode pads or connectors. The upper surfaces of the metal bonding materials 6143, 6163, and 6263 may have substantially a flat shape depending on the shape of the electrode pads 6140, 6240, and 6340. A side surface of the metal bonding materials 6143, 6163, and 6263 may have a substantially curved shape. A central portion of the metal bonding materials 6143, 6163, and 6263 may have a convex shape to the outside.

An inner wall of the openings of the adhesive layers 6141, 6161, and 6261 may also have substantially a convex shape inward of the openings, and side surfaces of the metal bonding materials 6143, 6163 and 6263 may be in contact with side surfaces of the adhesive layers 6141, 6161 and 6261. However, if volume of the metal bonding materials 6143, 6163, and 6263 is less than volume of the openings of the adhesive layers 6141, 6161, and 6261, an empty space may be formed in the openings as shown.

Referring to FIG. 108B, the shapes of the metal bonding materials 6143, 6163, and 6263 and the adhesive layers 6141, 6161, and 6261 according to an exemplary embodiment are substantially similar to those described with reference to FIG. 108A, but there is a difference in that a convex portion of the side surface is disposed at a relatively lower position by heating.

Referring to FIG. 108C, the shapes of the metal bonding materials 6143, 6163, and 6263 according to an exemplary embodiment are similar to those described with reference to FIG. 108B, but are different from shapes of inner walls of the openings of the adhesive layers 6141, 6161, and 6261. In particular, the inner wall of the opening may be formed to be concave by the metal bonding material.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device for a display, comprising:
   a pixel region including:
      a first LED stack;
      a second LED stack disposed on the first LED stack;
      a third LED stack disposed on the second LED stack;
      a first adhesive layer disposed between the first LED stack and the second LED stack, or between the second LED stack and the third LED stack;
      a first metal bonding layer at least partially surrounded by the first adhesive layer, disposed between the first LED stack and the second LED stack, or the second LED stack and the third LED stack, and electrically connected to the first LED stack and the second LED stack, or the second LED stack and the third LED stack, the first metal bonding layer having a top surface and a bottom surface respectively facing the second LED stack and the first LED stack, or the third LED stack and the second LED stack, and a convex side surface connecting the top surface and the bottom surface in a vertical cross-section of the light emitting device; and
   upper electrode pads comprising a common electrode pad, a first electrode pad, a second electrode pad, and a third electrode pad,
   wherein:
      the common electrode pad is connected to the first, second, and third LED stacks;
      the first, second, and third electrode pads are connected to the first, second, and third LED stacks, respectively;
      the first, second, and third LED stacks are configured to be independently driven using the upper electrode pads; and
      an empty space is formed between the first metal bonding layer and the first adhesive layer.

2. The light emitting device of claim 1, wherein the first metal bonding layer has a thickness less than that of the first adhesive layer.

3. The light emitting device of claim 1, wherein:
the pixel region further includes connectors electrically connected to the upper electrode pads; and
the first metal bonding layer is disposed between the upper electrode pads and the connectors.

4. The light emitting device of claim 3, wherein the connectors pass through the first LED stack or the second LED stack.

5. The light emitting device of claim 3, further comprising:
a substrate;
a second adhesive layer disposed between the first LED stack and the substrate; and
a second metal bonding layer at least partially surrounded by the second adhesive layer.

6. The light emitting device of claim 5, further comprising lower electrode pads disposed on the substrate,
wherein the second metal bonding layer is disposed between one of the lower electrode pads disposed on the substrate and one of the upper electrode pads disposed on the first LED stack.

7. The light emitting device of claim 5, wherein the substrate comprises thin film transistors.

8. The light emitting device of claim 1, further comprising:
a first transparent electrode in ohmic contact with the first LED stack;
a second transparent electrode in ohmic contact with the second LED stack; and
a third transparent electrode disposed in ohmic contact the third LED stack.

9. The light emitting device of claim 8, wherein:
each of the first, second, and third LED stacks comprises a first conductivity type semiconductor layer and a second conductivity type semiconductor layer; and
the first, second, and third transparent electrodes are electrically connected to the second conductivity type semiconductor layers of the first, second, and third LED stacks, respectively.

10. The light emitting device of claim 1, wherein:
the first, second, and third LED stacks each have sides; and
the light emitting device further includes an optically non-transmissive film disposed on at least one of the sides of the first, second, and third LED stacks.

11. The light emitting device of claim 1, further comprising a substrate,
wherein the first adhesive layer has a top surface and a bottom surface respectively facing the second LED stack and the first LED stack, or the third LED stack and the second LED stack, and a side surface connecting the top surface and the bottom surface of the first adhesive layer, the side surface of the first adhesive layer having a convex cross-sectional shape in a direction normal to the top surface of the substrate.

12. The light emitting device of claim 1, wherein the top surface and the bottom surface of the first metal bonding layer are substantially flat.

13. A light emitting stacked structure comprising:
a substrate; and
a plurality of pixel regions defined on the substrate;
wherein each of the pixel regions includes:
a first LED stack;
a second LED stack disposed on the first LED stack;
a third LED stack disposed on the second LED stack;
an adhesion layer disposed between the first LED stack and the second LED stack or between the second LED stack and the third LED stack, the adhesion layer having conductivity at least in a partial area thereof;
a first insulating layer covering the first LED stack;
a second insulating layer covering the second LED stack; and
a third insulating layer covering the third LED stack,
wherein each of the first, second, and third LED stacks comprises a first conductivity type semiconductor layer and a second conductivity type semiconductor layer,
wherein at least one of the first, second, and third LED stacks has the first conductivity type semiconductor layer on top of the second conductivity type semiconductor layer, and the remaining ones of the first, second, and third LED stacks has the second conductivity type semiconductor layer on top of the first conductivity type semiconductor layer, and
wherein an empty space is formed between the partial area of the adhesion layer having conductivity and the remaining area of the adhesion layer.

14. The light emitting stacked structure of claim 13, further comprising a barrier disposed in a separation region defined between the pixel regions.

15. The light emitting stacked structure of claim 13, wherein the adhesion layer is disposed between and is electrically connected to the first LED stack and the second LED stack, or the second LED stack and the third LED stack.

16. The light emitting stacked structure of claim 13, wherein each of the pixel regions further includes:
electrode pads comprising a common electrode pad, a first electrode pad, a second electrode pad, and a third electrode pad;
the common electrode pad is connected to the first, second, and third LED stacks;
the first, second, and third electrode pads are connected to the first, second, and third LED stacks, respectively; and
the first, second, and third LED stacks are configured to be independently driven using the electrode pads.

17. The light emitting stacked structure of claim 16, wherein:
each of the pixel regions further includes connectors electrically connected to the electrode pads and passing through the first LED stack or the second LED stack; and
the adhesion layer is disposed between the electrode pads and the connectors.

18. The light emitting stacked structure of claim 13, wherein the adhesion layer comprises an organic material and a conductive material.

19. The light emitting stacked structure of claim 13, further comprising:
a first transparent electrode in ohmic contact with the first LED stack;
a second transparent electrode in ohmic contact with the second LED stack; and
a third transparent electrode in ohmic contact the third LED stack,
wherein the second transparent electrode is directly disposed on the second conductivity type semiconductor layer of the second LED stack.

* * * * *